(12) United States Patent
Ogiwara et al.

(10) Patent No.: US 8,912,531 B2
(45) Date of Patent: Dec. 16, 2014

(54) ORGANIC ELECTROLUMINESCENT DEVICE

(75) Inventors: Toshinari Ogiwara, Sodegaura (JP); Kazuki Nishimura, Sodegaura (JP); Toshihiro Iwakuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 359 days.

(21) Appl. No.: 12/477,387

(22) Filed: Jun. 3, 2009

(65) Prior Publication Data
US 2010/0163853 A1 Jul. 1, 2010

(30) Foreign Application Priority Data

Dec. 24, 2008 (JP) ................... 2008-328083
Apr. 2, 2009 (JP) ................... 2009-090379

(51) Int. Cl.
| | |
|---|---|
| *H01L 29/08* | (2006.01) |
| *H01L 35/24* | (2006.01) |
| *H01L 51/00* | (2006.01) |
| *H01J 1/62* | (2006.01) |
| *H01J 63/04* | (2006.01) |
| *H01L 51/50* | (2006.01) |

(52) U.S. Cl.
CPC ........ *H01L 51/5016* (2013.01); *H01L 51/0057* (2013.01); *H01L 51/0072* (2013.01); *H01L 51/5088* (2013.01); *H01L 2251/552* (2013.01)
USPC ...................... 257/40; 257/E51.018; 313/506

(58) Field of Classification Search
None
See application file for complete search history.

(56) References Cited

U.S. PATENT DOCUMENTS

| 6,097,147 | A | 8/2000 | Baldo et al. | |
|---|---|---|---|---|
| 7,466,074 | B2 * | 12/2008 | Okinaka et al. | 313/504 |
| 2005/0146268 | A1 | 7/2005 | Seo et al. | |

(Continued)

FOREIGN PATENT DOCUMENTS

| JP | 7-138561 | 5/1995 |
|---|---|---|
| JP | 8-239655 | 9/1996 |

(Continued)

OTHER PUBLICATIONS

Savenije, T in "Organic solar cells", Mar. 20, 2008, Opto-Electronic Materials Section DCT, TNW, Delft University of Technology. Accessed online on Jun. 18, 2011, <http://ocw.tudelft.nl/fileadmin/ocw/courses/SolarCells/res00023/!3132204f7267616e6963205343. pdf>.*

(Continued)

*Primary Examiner* — Michael Jung
(74) *Attorney, Agent, or Firm* — Oblon, Spivak, McClelland, Maier & Neustadt, LLP

(57) ABSTRACT

An organic electroluminescent device including an emitting layer, an electron-injecting controlling layer and an electron-transporting layer between an anode and a cathode in sequential order from the anode, bonding one to another, the emitting layer including a host material and a dopant, the ionization potential (Ips) of the main material forming the electron-injecting controlling layer and the ionization potential (Iph) of the host material of the emitting layer satisfying the following relationship (i), the electron mobility of the electron-transporting material forming the electron-transporting layer being $10^{-5}$ cm$^2$/Vs or more at the electric field intensity of 400 to 500 (V/cm)$^{1/2}$, and the affinity level (Af1) of the host material of the emitting layer, the affinity level (Af2) of the main material forming the electron-injecting controlling layer, and the affinity level (Af3) of the electron-transporting material forming the electron-transporting layer satisfying the following relationships (ii) and (iii).

$$0.5\ eV > Ips - Iph \geq 0\ eV \qquad (i)$$

$$Af2 - Af1 > 0\ eV \qquad (ii)$$

$$Af3 - Af2 > 0.2\ eV \qquad (iii).$$

16 Claims, 5 Drawing Sheets

(56) References Cited

U.S. PATENT DOCUMENTS

2006/0227079 A1* 10/2006 Kashiwabara ............... 345/76
2007/0221912 A1*  9/2007 Jeong et al. ................. 257/40
2007/0296328 A1  12/2007 Matsuura et al.
2010/0096622 A1*  4/2010 Iizumi et al. ................ 257/40

FOREIGN PATENT DOCUMENTS

| JP | 2005-197262 | 7/2005 | |
|---|---|---|---|
| WO | WO 01/41512 A1 | 6/2001 | |
| WO | WO 2005/076668 A1 | 8/2005 | |
| WO | WO 2005/076669 A1 | 8/2005 | |
| WO | WO2008/102644 A1 * | 8/2008 | ............. H01L 51/50 |

OTHER PUBLICATIONS

C. W. Tang, et al., "Organic electroluminescent diodes", Applied Physics Letters, vol. 51, No. 12, Sep. 21, 1987, 2 Pages.

M. A. Baldo, et al., "Very high-efficiency green organic light-emitting devices based on electrophosphorescence", Applied Physics Letters, vol. 75, No. 1, Jul. 5, 1999, pp. 4-6 with cover page.

W. Brütting, "Introduction to the Physics of Organic Semiconductors", Physics of Organic Semiconductors, 2005, pp. 1-14 with 5 additional pages.

Japanese Office Action issued Feb. 26, 2013 in Patent Application No. 2009-090379.

* cited by examiner

ORGANIC ELECTROLUMINESCENT DEVICE

TECHNICAL FIELD

The invention relates to an organic electroluminescence device, particularly to an organic electroluminescence device having a prolonged lifetime even when it is driven at high temperatures.

BACKGROUND ART

An organic electroluminescence device (hereinafter the term "electroluminescence" is often abbreviated as "EL") is a self-emission device utilizing the principle that a fluorescent compound emits light by the recombination energy of holes injected from an anode and electrons injected from a cathode when an electric field is impressed. Since C. W. Tang et al. of Eastman Kodak Co. reported a low-voltage driven organic EL device in the form of a stacked type device (Non-patent Document 1, or the like), studies on organic EL devices wherein organic materials are used as the constituent materials have actively been conducted. Tang et al. used tris(8-hydroxyquinolinol aluminum) (hereinafter referred to as $Alq_3$) for the emitting layer and a triphenyl diamine derivative for the hole-transporting layer. The advantages of the stack structure are to increase injection efficiency of holes to the emitting layer, to increase generation efficiency of excitons generated by recombination by blocking electrons injected in the cathode, to confine the generated excitons in the emitting layer, and so on. Like this example, as the structure of the organic EL device, a two-layered type of a hole-transporting (injecting) layer and an electron-transporting emitting layer, and a three-layered type of a hole-transporting (injecting) layer, an emitting layer and an electron-transporting (injecting) layer are widely known. In such stack structure devices, their device structures and fabrication methods have been contrived to increase recombination efficiency of injected holes and electrons.

As luminescent materials for an organic EL device, a chelate complex such as tris(8-quinolinorate) aluminum complex, and luminescent materials such as a cumarin derivative, a tetraphenyl butadiene derivative, a bistyryl arylene derivative and an oxadiazole derivative has been known. It was reported that those materials emit light in a visible region from blue to red, and realization of a full color display device has been expected (for instance, see Patent Documents 1 and 2). Also, a phosphorescent-type organic EL device using an organic phosphorescent material in addition to the luminescent material in the emitting layer is proposed recently (for instance, see Non-Patent Document 2). In the emitting layer of this phosphorescent-type organic EL device, higher luminous efficiency has been attained by the use of the singlet state and the triplet state which are exited states of the organic phosphorescent material. It is considered that singlet excitons and triplet excitons are generated in a ratio of 1:3 depending upon the difference in the spin multiplicity at the time of recombination of electrons and holes in the phosphorescent-type organic EL device. Therefore, it is considered that if the phosphorescent material is used, the luminous efficiency of 3 to 4 times as high as that of the device using a fluorescent material alone can be attained.

Further, in such a phosphorescent-type organic EL device, the structure in which an anode, an organic emitting layer, a hole blocking layer, an electron-transporting layer and a cathode are stacked in sequential order has been used, in order to maintain the triplet exited state or not to quench triplet excitons. By providing a hole blocking layer between the organic emitting layer and the cathode, which limits the movement of holes out of the organic emitting layer and has an ionization potential (Ip) larger than that of the emitting layer, holes are efficiently accumulated within the emitting layer, probability of recombination with electrons can be increased and higher luminous efficiency can be attained (for instance, see Patent Documents 3 and 4).

It was reported that a well-known phenanthroline derivative (BCP and Bphen, for example) was used for the above hole blocking layer so that the luminous efficiency increases. However, BCP, Bphen and the like have poor oxidation resistance, and there is the necessity of improve on the lifetime of the organic EL device using them. Then, an organic El device using a fused polycyclic aromatic compound having a phenanthrene and adding $Ir(ppy)_3$ to the emitting layer is disclosed, and it is improved in the lifetime at room temperature to some degree (Patent Document 5). However, in view of practical use of the phosphorescent-type organic EL device, it is required to improve the lifetime under a driving condition at high temperatures. It is considered that under a driving condition at high temperatures, the injecting properties and transporting properties of holes and electrons from the electrodes vary from those at room temperature (for instance, Non-patent Document 3), and carrier balance within the device is much different from that at room temperature. Thus, the conditions for constituting a device to maintain a desired carrier balance under a driving condition at high temperatures have not yet been found, thus posing a large problem to obtain an organic EL device having a prolonged lifetime.

RELATED ART DOCUMENTS

Patent Documents

[Patent Document 1] JP-A-H08-239655
[Patent Document 2] JP-A-H07-138561
[Patent Document 3] U.S. Pat. No. 6,097,147
[Patent Document 4] WO01/41512
[Patent Document 5] JP-A-2005-197262
[Patent Document 6] WO05/076668

Non-Patent Documents

Non-Patent Document 1 C. W. Tang, S. A. Vanslyke, Applied Physics Letters, vol. 51, p. 913, 1987
Non-Patent Document 2 D. F. O'Brien and M. A. Baldo et al "Improved energy transferrin electrophosphorescent devices" Applied Physics letters Vol. 74 No. 3, pp 442-444, Jan. 18, 1999, M. A. Baldo et al "Very high-efficiency green organic light-emitting devices based on electrophosphorescence" Applied Physics letters Vol. 75 No. 1, pp 4-6, Jul. 5, 1999
Non-Patent Document 3 W. Bruetting (Eds.) "Physics of Organic Semiconductors" 2005 WILEY-VCH Verlag GmbH & Co. KGaA, Weinheim.

SUMMARY OF INVENTION

In view of the above-mentioned problem, an object of the invention is to provide an organic EL device improved in luminous efficiency and lifetime (at room temperature and at high temperatures).

In particular, an object of the invention is to provide an organic EL device which utilizes phosphorescent emission having a high luminous efficiency and has a prolonged lifetime under a driving condition at high temperatures.

It was reported that, in the organic EL device disclosed in Patent Document 5, a prolonged lifetime at room temperature could be attained by using a fused polycyclic aromatic compound for the hole-blocking layer. However, at high temperatures, the carrier balance significantly varies from that at room temperature due to heat, thus, a clear solution of the problem at high temperatures cannot be easily proposed. In fact, the lifetime of the organic EL device of Patent Document 5, in which a fused polycyclic aromatic compound is used for the hole-blocking layer was significantly short at high temperatures. Although both the electron mobility and the hole mobility increase due to heat, it is predicted that increase of the hole mobility is much larger than that of the electron mobility. Furthermore, in the organic EL device of Patent Document 5, an electron-transporting material ($Alq_3$) having a small electron mobility was used, therefore, it is considered that the difference between the electron mobility and hole mobility at high temperatures becomes much larger. Hence, it is predicted that a large amount of holes accumulate at the interface of the emitting layer and the hole blocking layer at high temperatures. As a result, it is considered that the emitting layer and the hole blocking layer are damaged so that an organic EL device having a prolonged lifetime could not be obtained.

Then, the inventors considered that an organic EL device having a prolonged lifetime can be obtained by constructing a device in which holes do not excessively accumulate at the interface of the emitting layer under a condition at high temperatures.

The inventors found that an organic EL device having a prolonged lifetime at high temperatures obtained when the organic electroluminescence device comprises an emitting layer, an electron-injecting controlling layer and an electron-transporting layer between an anode and a cathode in sequential order from the anode, bonding one to another, the ionization potential (Ips) of a main material forming the electron-injecting controlling layer and the ionization potential (Iph) of a host material of the emitting layer satisfying the relationship indicated in FIG. 2, the electron mobility of the electron-transporting material forming the electron-transporting layer is as high as $10^{-5}$ cm$^2$/Vs or more at the electric field intensity of 400 to 500 (V/cm)$^{1/2}$, and the affinity (Af1) of the host material of the emitting layer, the affinity (Af2) of the main material forming the electron-injecting controlling layer, and the affinity (Af3) of the electron-transporting material forming the electron-transporting layer satisfying the predetermined relationships. In particular, carrier balance of electrons and holes injected into the emitting layer was improved in the case where heat was applied to the organic EL device, when the affinity of the emitting layer, the electron-injecting controlling layer and the electron-transporting layer satisfy the following relationships.

$$Af2-Af1>0 \text{ eV}$$

$$Af3-Af2>0.2 \text{ eV}$$

As a result, it is considered that accumulation of holes at the interface of the emitting layer is eliminated.

Namely, the inventors confirmed that the lifetime of the device at high temperatures increased, when the organic electroluminescence device comprises an emitting layer, an electron-injecting controlling layer and an electron-transporting layer between an anode and a cathode in sequential order from the anode, bonding one to another, the emitting layer comprises a host material and a dopant, the ionization potential (Ips) of the main material forming the electron-injecting controlling layer and the ionization potential (Iph) of the host material of the emitting layer satisfy the following relationship (i), the electron mobility of the electron-transporting material forming the electron-transporting layer is $10^{-5}$ cm$^2$/Vs or more at the electric field intensity of 400 to 500 (V/cm)$^{1/2}$, and the affinity (Af1) of the host material of the emitting layer, the affinity (Af2) of the main material forming the electron-injecting controlling layer, and the affinity (Af3) of the electron-transporting material forming the electron-transporting layer all satisfy the following relationships (ii) and (iii).

$$0.5 \text{ eV} > Ips - Iph \geq 0 \text{ eV} \quad (i)$$

$$Af2 - Af1 > 0 \text{ eV} \quad (ii)$$

$$Af3 - Af2 > 0.2 \text{ eV} \quad (iii)$$

Patent Document 6 describes the affinity in the device structure which appears to be close to the following condition of the affinity defined in the invention.

$$Af3 - Af2 > 0.2 \text{ eV} \quad (iii)$$

However, the device structure used in Examples of Patent Document 6 gave a short lifetime at high temperatures. Further, in the device structure of Patent Document 6, the emitting layer and the electron-transporting layer are bonded to each other, and it has no electron-injecting controlling layer as employed in the device structure of the invention. Namely, the device of Patent Document 6 has a layer stack structure different from that of the organic EL device of the invention and cannot dissolve the problem that holes accumulate at high temperatures. Then, it is considered that in the device structure of Patent Document 6, the emitting layer and the electron-transporting layer are damaged so that an organic EL device having a prolonged lifetime could not be obtained. As a result, it becomes clear that the definition of the affinity of the emitting layer and the electron-transporting layer as disclosed in Patent Document 6 is insufficient for solving the problem in carrier dynamics at high temperatures against deterioration of the device.

As mentioned above, the inventors found that holes are prevented from excessive accumulation at the interface of the emitting layer under circumstances at high temperatures by satisfying the conditions defined by the invention, to obtain an organic EL device having a prolonged lifetime. The invention was accomplished based on this finding.

Namely, the invention provides the following organic electroluminescence device.

1. An organic electroluminescence device comprising an emitting layer, an electron-injecting controlling layer and an electron-transporting layer between an anode and a cathode in sequential order from the anode, bonding one to another,
   the emitting layer comprising a host material and a dopant,
   the ionization potential (Ips) of the main material forming the electron-injecting controlling layer and the ionization potential (Iph) of the host material of the emitting layer satisfying the following relationship (i),
   the electron mobility of the electron-transporting material forming the electron-transporting layer being $10^{-5}$ cm$^2$/Vs or more at the electric field intensity of 400 to 500 (V/cm)$^{1/2}$, and
   the affinity (Af1) of the host material of the emitting layer, the affinity (Af2) of the main material forming the electron-injecting controlling layer, and the affinity (Af3) of the electron-transporting material forming the electron-transporting layer satisfying the following relationships (ii) and (iii).

$$0.5 \text{ eV} > Ips - Iph \geq 0 \text{ eV} \quad (i)$$

$$Af2 - Af1 > 0 \text{ eV} \quad (ii)$$

$$Af3 - Af2 > 0.2 \text{ eV} \quad (iii)$$

2. The organic electroluminescence device according to 1, wherein the affinity (Af1) of the host material of the emitting layer, the affinity (Af2) of the main material forming the electron-injecting controlling layer, and the affinity (Af3) of the electron-transporting material forming the electron-transporting layer satisfy the following relationship (iv).

Af1<Af2<2.75 eV<Af3 (iv)

3. The organic electroluminescence device according to 1 or 2, wherein the lowest excited triplet energy (EgT(S)) of the main material forming the electron-injecting controlling layer and the lowest excited triplet energy (EgT(H)) of the host material of the emitting layer satisfy the following relationship (v).

0.5 eV>EgT(S)−EgT(H)≥0 eV (v)

4. The organic electroluminescence device according to any one of 1 to 3, wherein the ionization potential (Iph) of the host material of the emitting layer and the ionization potential (Ipd) of the dopant of the emitting layer satisfy the following relation ship (vi).

Iph−Ipd>0.5 eV (vi)

5. The organic electroluminescence device according to any one of 1 to 4, wherein the dopant of the emitting layer is a phosphorescent material.

6. The organic electroluminescence device according to 5, wherein the electron-injecting controlling layer comprises a phosphorescent dopant same as or different from the dopant of the emitting layer, and concentrations of the phosphorescent dopant in the emitting layer and the electron-injecting controlling layer satisfy the following relationship (vii).

Concentration of dopant: emitting layer>electron-injecting controlling layer (vii)

7. The organic electroluminescence device according to 5 or 6, wherein the phosphorescent dopant comprises a metal complex composed of a metal selected from the group consisting of Ir, Pt, Os, Au, Cu, Re and Ru, and a ligand.

8. The organic electroluminescence device according to any one of 1 to 7, which comprises a hole-injecting/transporting layer adjacent to the emitting layer between the anode and the emitting layer.

9. The organic electroluminescence device according to any one of 1 to 8, wherein the electron-transporting material forming the electron-transporting layer is a nitrogen-containing heterocyclic derivative other than a metal complex.

10. The organic electroluminescence device according to any one of 1 to 9, wherein one or both of the host material of the emitting layer and the main material forming the electron-injecting controlling layer is one or more compound selected from the group consisting of fused polycyclic aromatic compounds represented by the following formulas (A), (B) and (C),

Ra-Ar$^{101}$-Rb (A)

Ra-Ar$^{101}$—Ar$^{102}$-Rb (B)

Ra-Ar$^{101}$—Ar$^{102}$—Ar$^{103}$-Rb (C)

wherein Ar$^{101}$, Ar$^{102}$, Ar$^{103}$, Ra and Rb are independently a substituted or unsubstituted benzene ring, or a fused polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring; provided that Ar$^{101}$, Ar$^{102}$, Ar$^{103}$, Ra and Rb are not a substituted or unsubstituted benzene ring at the same time.

11. The organic electroluminescence device according to 10, wherein one or both of the Ra and Rb is a group selected from a substituted or unsubstituted phenanthrene ring, a substituted or unsubstituted benzo[c]phenanthrene ring and a substituted or unsubstituted fluoranthene ring.

12. The organic electroluminescence device according to any one of 1 to 9, wherein one or both of the host material of the emitting layer and the main material forming the electron-injecting controlling layer is a fused polycyclic aromatic compound, and the fused polycyclic aromatic skeleton part is contained in the chemical structure as a group of divalent or more valences.

13. The organic electroluminescence device according to any one of 1 to 9, wherein one or both of the host material of the emitting layer and the main material forming the electron-injecting controlling layer is a fused polycyclic aromatic compound, the fused polycyclic aromatic skeleton part has a substituent, and the substituent is a substituted or unsubstituted aryl group or a substituted or unsubstituted heteroaryl group.

14. The organic electroluminescence device according to 13, wherein the substituent of the fused polycyclic aromatic compound dose not contain a carbazole skeleton.

15. The organic electroluminescence device according to any one of 1 to 9, wherein one or both of the host material of the emitting layer and the main material forming the electron-injecting controlling layer is represented by the following formulas (5) or (6),

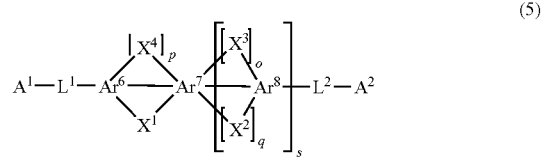

(5)

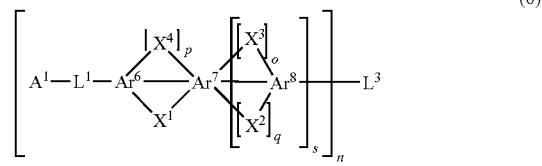

(6)

wherein in the formulas (5) and (6), Ar$^6$, Ar$^7$ and Ar$^8$ are independently a substituted or unsubstituted aromatic hydrocarbon group having 6 to 24 carbon atoms that form a ring (hereinafter referred to as ring carbon atoms) or a substituted or unsubstituted aromatic heterocyclic group having 3 to 24 ring atoms that form a ring (hereinafter referred to as ring atoms), provided that Ar$^6$, Ar$^7$ and Ar$^8$ may have one or plural substituent Y, plural Ys may be the same or different, and Y is an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms and bonding to $Ar^6$, $Ar^7$ and $Ar^8$ via a carbon-carbon bond; in the formulas (5) and (6), $X^1$, $X^2$, $X^3$ and $X^4$ are independently O, S, N—$R^1$ or $CR^2R^3$, o, p and q is 0 or 1, s is 1, 2 or 3, where $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms;

in the formulas (5) and (6), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms and bonding to $Ar^6$ via a carbon-carbon bond;

in the formula (5), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms and bonding to $Ar^8$ via a carbon-carbon bond;

in the formula (6), n is 2, 3 or 4, and in each case a dimer, a trimer or a tetramer is formed via $L^3$ as a linking group;

in the formula (6), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms and bonding to $Ar^8$ via a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms or a substituted or unsubstituted trivalent aromatic heterocyclic group having 3 to 24 ring atoms and bonding to $Ar^8$ via a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms or a substituted or unsubstituted tetravalent aromatic heterocyclic group having 3 to 24 ring atoms and bonding to $Ar^8$ via a carbon-carbon bond;

in the formulas (5) and (6), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms and bonding to $L^1$ via a carbon-carbon bond;

in the formula (5), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms and bonding to $L^2$ via a carbon-carbon bond.

The invention can provide an organic EL device having an improved luminous efficiency and a prolonged lifetime (under conditions at room temperature and at high temperatures).

Further, the invention can provide an organic EL device having a high luminous efficiency by the use of phosphorescent emission, and particularly, having a prolonged lifetime even when it is derived at high temperatures.

BEST MODE OF CARRYING OUT THE INVENTION

Figure 1:
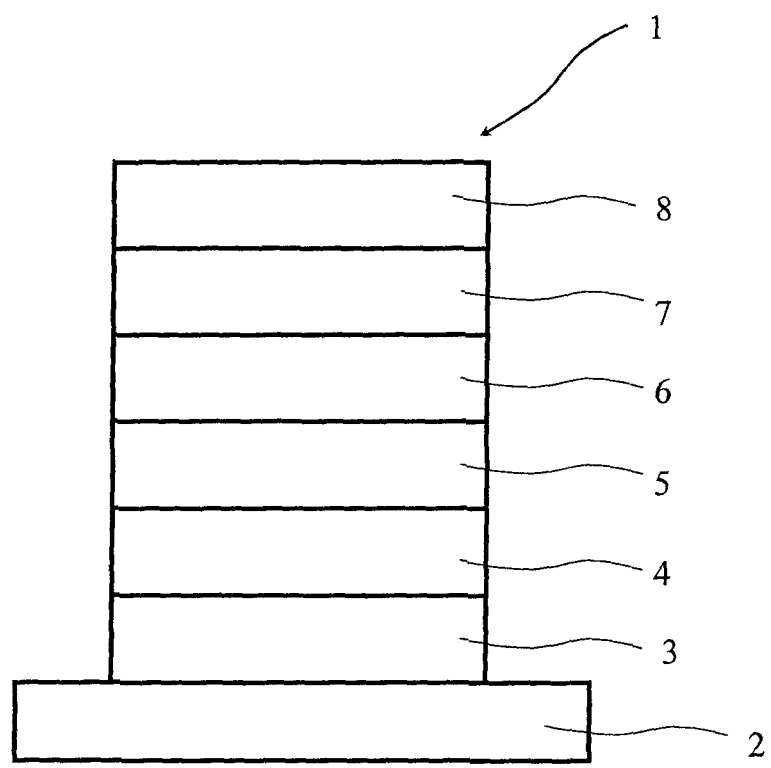
FIG. 1 shows a schematic structural view of the organic EL device according to the invention.

Now, the invention will be explained in detail.

The organic EL device of the invention is characterized in that it comprises an emitting layer, an electron-injecting controlling layer and an electron-transporting layer between an anode and a cathode in sequential order from the anode, bonding one to another, the emitting layer comprises a host material and a dopant, the ionization potential (Ips) of the main material forming the electron-injecting controlling layer and the ionization potential (Iph) of the host material of the emitting layer satisfy the following relationship (i), the electron mobility of the electron-transporting material forming the electron-transporting layer is $10^{-5}$ cm$^2$/Vs or more at the electric field intensity of 400 to 500 (V/cm)$^{1/2}$, and the affinity (Af1) of the host material of the emitting layer, the affinity (Af2) of the main material forming the electron-injecting controlling layer, and the affinity (Af3) of the electron-transporting material forming the electron-transporting layer satisfy the following relationships (ii) and (iii).

$$0.5 \text{ eV} > \text{Ip}s - \text{Ip}h \geq 0 \text{ eV} \quad \text{(i)}$$

$$\text{Af2} - \text{Af1} > 0 \text{ eV} \quad \text{(ii)}$$

$$\text{Af3} - \text{Af2} > 0.2 \text{ eV} \quad \text{(iii)}$$

In the invention, the electron-injecting controlling layer is an organic layer disposed between the emitting layer and the electron-transporting layer. The electron-injecting controlling layer plays a role of controlling the amount of electrons to be injected to the emitting layer. In particular, it plays a role of balancing the amount of electrons to be injected to the emitting layer in proper quantities relative to the amount of holes at high temperatures. The electron-injecting controlling layer is desirable to also function as a hole-blocking layer.

In the invention, the "main material forming the electron-injecting controlling layer" means the material which occupies about 80 wt % or more, relative to 100 wt % of the total amount of the material forming the electron-injecting controlling layer, and which contributes to form a thin film. Although the electron-injecting controlling layer may contain materials such as a dopant, such materials are added in a small amount, therefore, they are not included in the main material forming the electron-injecting controlling layer. Incidentally, in this description, the "main material forming the electron-injecting controlling layer" may be referred to simply as the electron-injecting controlling layer-forming material.

The ionization potential, Ip, means the energy required to remove an electron from a material compound to ionize the compound. In the invention, a value measured by an ultraviolet photoelectron spectrometer (AC-3, Riken Keiki Co., Ltd.) is used as the ionization potential.

The item (i) defines the relationship of the ionization potential of the material forming the electron-injecting controlling layer (hereinafter referred to as an electron-injecting controlling layer-forming material) (Ips) and the ionization potential of the host material of the emitting layer (Iph). In particular, Ips has to be the same as or smaller than Ips. The reason is that the effect as the hole-blocking layer, which keeps holes injected from the anode at the interface between the emitting layer and the electron-injecting controlling layer is sought for. The difference between Iph and Ips has to be smaller than 0.5 eV. The reason is that when employing a combination of the materials in which the difference between Iph and Ips is larger than 0.5 eV, driving voltage of the EL device becomes higher and charge concentration to the electron-injecting controlling layer occurs so that deterioration of the EL device may be very likely accelerated.

The electron mobility is a value which indicates easiness of electrons moving in a solid substance. The determination method of the electron mobility includes Time of flight method (a method wherein the electron mobility is calculated from a measured moving time of charge in an organic film, and a method wherein the electron mobility is calculated from voltage characteristics of space limited current [see Electronic Processing Organic Crystals (M. Pope, C. E. Swenberg), Organic Molecular Solids (W. Jones)].

In the invention, the electron mobility of the material forming the electron-transporting layer (hereinafter referred to as an electron-transporting material) is calculated by Time of flight method (Optel Kabushiki Kaisha (present Sumitomo Heavy Industries, Ltd., Mechatronics Division), Model number: TOF-401).

Concretely, with respect to the structure of ITO/organic layer (electron-transporting layer)/Al, the time property of transient current caused by light irradiation (transition performance duration) at room temperature (25° C.) is measured, and the electron mobility is calculated by the following equation:

Electron mobility=(Electron-transporting layer)$^2$/(Transition performance duration×Applied voltage).

Electron-transporting materials of metal complexes such as $Alq_3$, which have a lower electron mobility, have been mainly used as materials forming the electron-transporting layer. Holes injected and transported from the anode side under driving at high temperatures do not promptly recombine with electrons within the emitting layer, whereby hole accumulation results in, since the electron-transporting material such as Alq3, which has a lower electron mobility, is used for the electron-transporting layer. In particular, when a hole-blocking layer is provided, holes and electrons do not promptly recombine and accumulate at the interface between the emitting layer and the hole-blocking layer, whereby the device deteriorates. Then, the invention uses nitrogen-containing heterocyclic derivatives or the like which have high electron mobility. Thus, performance of electron injection into the emitting layer from the cathode side under a driving condition at high temperatures significantly increases, and accumulation of holes at the interface between the emitting layer and the hole-blocking layer is dissolved, so that the problem of decrease in the lifetime of the device under a driving condition at high temperatures can be solved.

In the invention, the electron mobility of the material forming the electron-transporting layer is $10^{-5}$ cm$^2$/Vs or higher, preferably $5 \times 10^{-4}$ cm$^2$/Vs or more, under an electric field intensity of 400 to 500 (V/cm)$^{1/2}$.

Affinity, Af, means an amount of energy to be released or absorbed when an electron is added to a molecular of a material, and is defined as a positive value in the case of releasing energy and a negative value in the case of absorbing energy.

The affinity of a certain compound, Af, is defined by the following equation using the ionization potential of the compound, Ip, and the singlet energy gap thereof, Eg(S):

$$\text{Af} = \text{Ip} - \text{Eg}(S)$$

The singlet energy gap of a material, Eg(S), is defined, for instance, on the basis of the absorption spectrum, and in the invention, it is defined as below, for instance. Namely, each material is dissolved in an EPA solvent (diethyl ether:isopentane:ethanol=5:5:2 in volume ratio) in a concentration of 10 μmol/L, to obtain a sample for determination of the absorption spectrum.

A quartz cell is charged with the sample for determination of the absorption spectrum and irradiated by excitation light at room temperature, and wavelength of absorption is measured.

A tangent line is drawn against the initial rise on the longer wavelength side of the absorption spectrum obtained, and the value obtained by converting the wavelength of the intersecting point of the tangent line and the baseline to energy is defined as the singlet energy gap, Eg(S).

In the invention, the singlet energy gap was measured by a commercial measuring equipment of F-4500 (manufactured by Hitachi).

However, the method for determining the singlet energy gap, Eg (S), is not limited to that mentioned above, and any method can be used so long as it does not depart from the spirit of the invention.

When the device using the above-mentioned electron-transporting layer having a high electron mobility is driven at high temperatures, as mentioned above, electrons pass through the "emitting layer/electron-injecting controlling layer", and are highly likely to deteriorate the "hole-injecting/transporting layer" side. Then, as the results of various experiments, in the case where the electron-transporting layer formed of a material having high electron mobility is used, holes injected and transported from the anode are recombined with electrons in proper quantities, whereby in the "emitting layer/electron-injecting controlling layer", the affinity of the host material of the emitting layer (Af1) and the affinity of the electron-injecting controlling layer (Af2) satisfy the relationship of Af2−Af1>0 eV, and in the "electron-injecting controlling layer/electron-transporting layer", the relationship of Af3−Af2>0.2 eV is satisfied.

In the invention, it is required that the affinity (Af) of the entire combination of the "emitting layer/electron-injecting controlling layer/electron-transporting layer" satisfies the following relationships.

$$Af2-Af1>0 \quad (ii)$$

$$Af3-Af2>0.2 \text{ eV} \quad (iii)$$

More specifically, it is necessary that the affinity of the electron-injecting controlling layer, Af2, is larger than the affinity of the host material of the emitting layer, Af1.

More preferred relationship of the affinity (Af) in the combination of the "electron-injecting controlling layer/electron transporting layer" is as follows:

$$Af3-Af2>0.3 \text{ eV} \quad (iii-2)$$

More preferred affinity (Af) in the entire combination of the "emitting layer/electron-injecting controlling layer/electron-transporting layer" is as follows:

$$Af1<Af2<2.75 \text{ eV}<Af3 \quad (iv)$$

In the invention, the lowest excited triplet energy of the electron-injecting controlling layer-forming material (EgT(S)) and the lowest excited triplet energy of the host material of the emitting layer (EgT(H)) preferably satisfy the following relationship:

$$0.5 \text{ eV}>EgT(S)-EgT(H)\geq 0 \text{ eV} \quad (v)$$

By satisfying the above relationship (v), the triplet excitons generated by electric excitation can be kept within the emitting layer. By this, it is considered that the luminous efficiency of the organic EL device increases.

Here, the lowest excited triplet energy of a material, Eg(T), can be defined on the basis of the phosphorescence spectrum, and in the invention, it can be defined below, for instance. Namely, each material is dissolved in an EPA solvent (a solvent mixture of diethyl ether:isopentane:ethanol=5:5:2 in volume ratio) in a concentration of 10 μmol/L to obtain a sample for measurement of phosphorescence.

A quartz cell is charged with the sample for measurement of phosphorescence, cooled to a temperature of 77K, excitation light is irradiated, and a wavelength of the phosphorescence emitted is measured.

A tangent line is drawn against the initial rise on the shorter wavelength side of the phosphorescence spectrum obtained, and a value obtained by converting the wavelength of the intersecting point of the tangent line and the baseline to energy is defined as the lowest excited triplet energy, Eg(T).

The lowest excited triplet energy can be measured by commercial measuring equipment such as F-4500 (manufactured by Hitachi).

However, the method for defining the lowest excited triplet energy, Eg(T), is not limited to that mentioned above, and any method can be used so long as it does not depart from the spirit of the invention.

The organic EL device of the invention contains a host material and a dopant in the emitting layer, and the ionization potential of the host material of the emitting layer (Iph) and the ionization potential of the dopant of the emitting layer (Ipd) preferably satisfy the following relationship.

$$Iph-Ipd>0.5 \text{ eV} \quad (vi)$$

In the invention, the ionization potential of the host material of the emitting layer (Iph) and the ionization potential of the dopant of the emitting layer (Ipd) satisfy the above relationship (vi), thereby, transport of holes via the dopant can be efficiently confined in the emitting layer, and the luminous efficiency can be improved.

Further, holes transported via the dopant under a driving condition at high temperatures hardly reach the electron-transporting layer across the electron-injecting controlling layer, so that the lifetime of the device can be more prolonged.

More preferred relationship is as follows:

$$Iph-Ipd>0.7 \text{ eV} \quad (vi-2)$$

Figure 2:
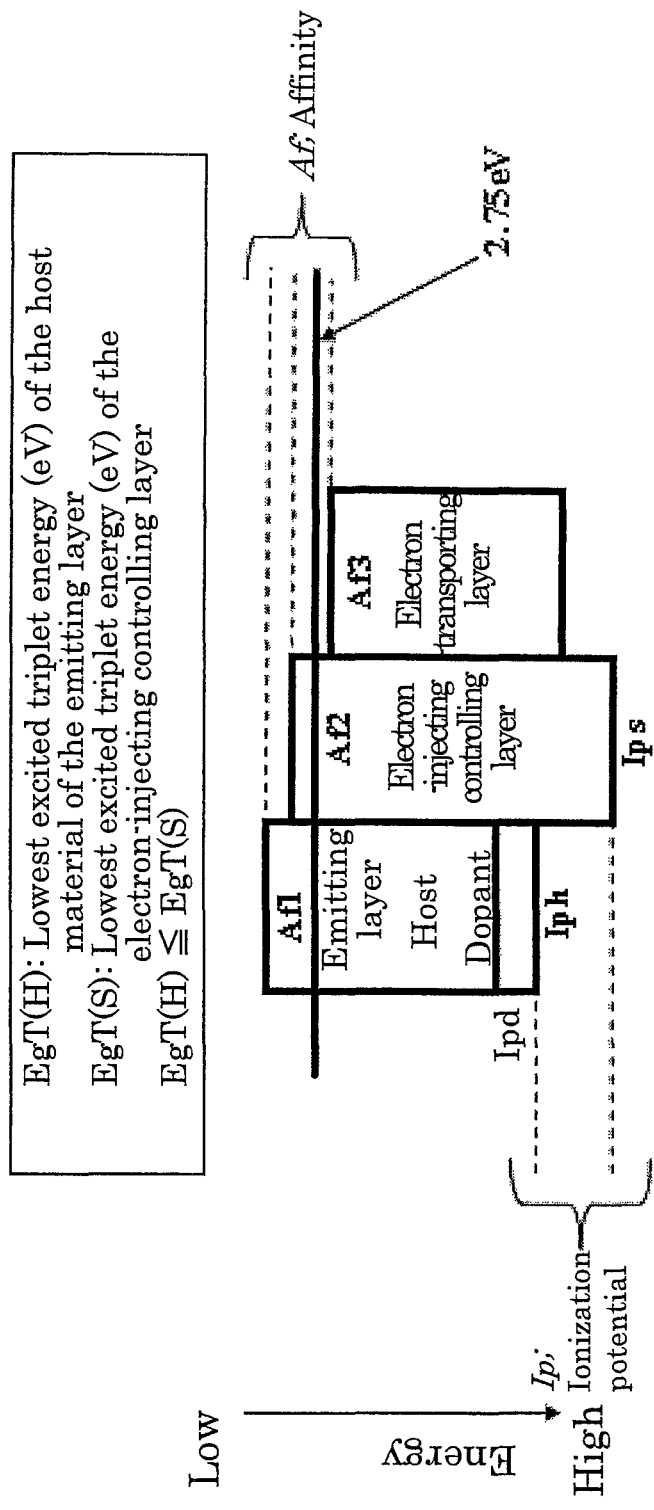
FIG. 2 shows an energy diagram of the organic EL device according to the invention, which has the structure of the "emitting layer/electron-injecting controlling layer/electron-transporting layer".
Figure 3:
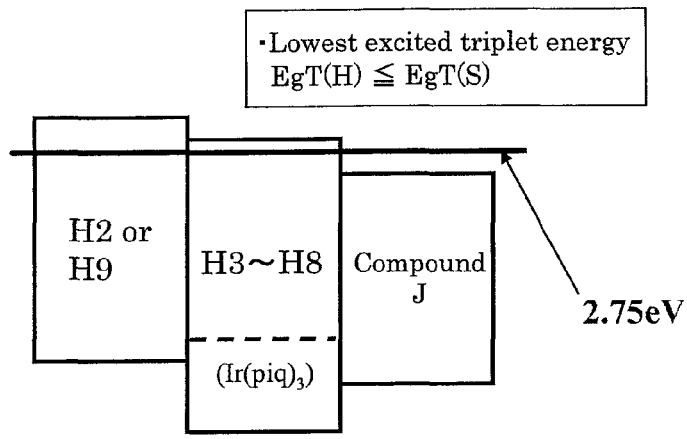
FIG. 3 shows an energy diagram of the organic EL device according to the embodiment in Examples 1 to 8, which has the structure of the "emitting layer/electron-injecting controlling layer/electron-transporting layer". Here, the dopant in the electron-injecting controlling layer is depicted by a dotted line, and this means that the dopant is added only in Example 8, and no dopant is added in Examples 1 to 7. The dotted lines in the drawings hereinafter have the same meanings.
Figure 4:
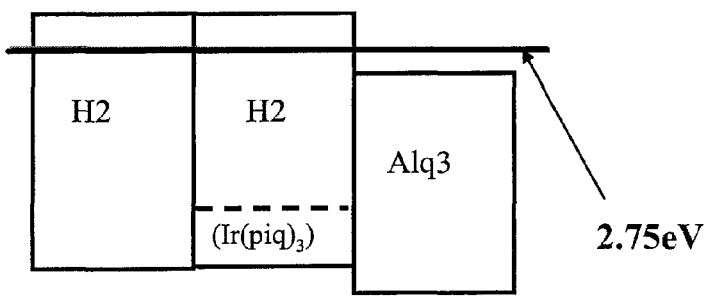
FIG. 4 shows an energy diagram of the organic EL device according to the embodiment in Comparative Examples 1 and 7, which has the structure of the "emitting layer/electron-injecting controlling layer/electron-transporting layer".
Figure 5:
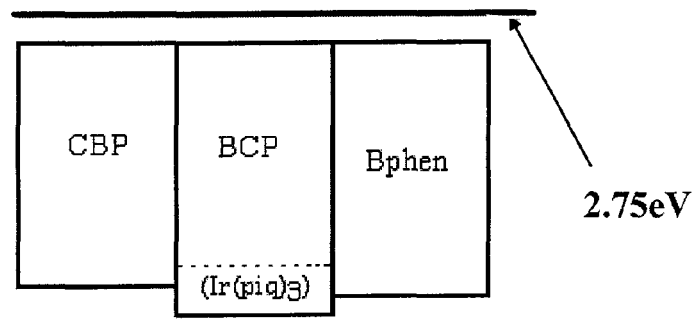
FIG. 5 shows an energy diagram of the organic EL device according to the embodiment in Comparative Examples 2 and 8, which has the structure of the "emitting layer/electron-injecting controlling layer/electron-transporting layer".
Figure 6:
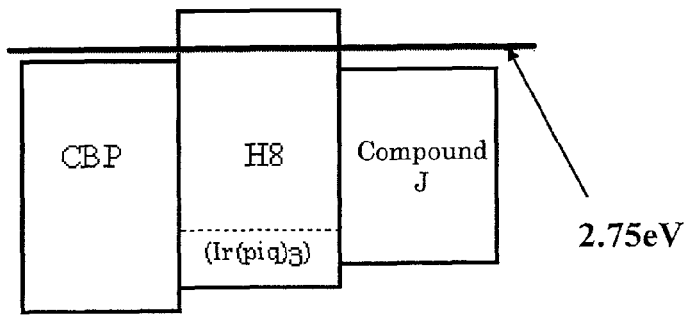
FIG. 6 shows an energy diagram of the organic EL device according to the embodiment in Comparative Examples 3 and 9, which has the structure of the "emitting layer/electron-injecting controlling layer/electron-transporting layer".
Figure 7:
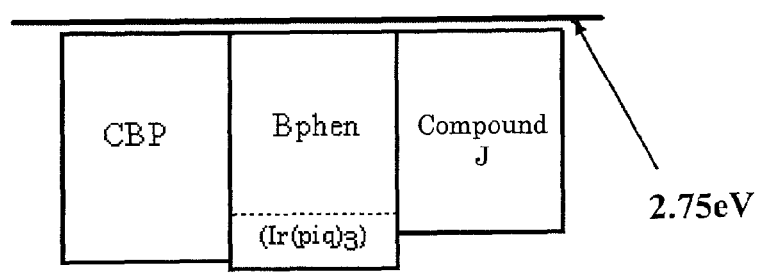
FIG. 7 shows an energy diagram of the organic EL device according to the embodiment in Comparative Examples 4 and 10, which has the structure of the "the emitting layer/electron-injecting controlling layer/electron-transporting layer".
Figure 8:
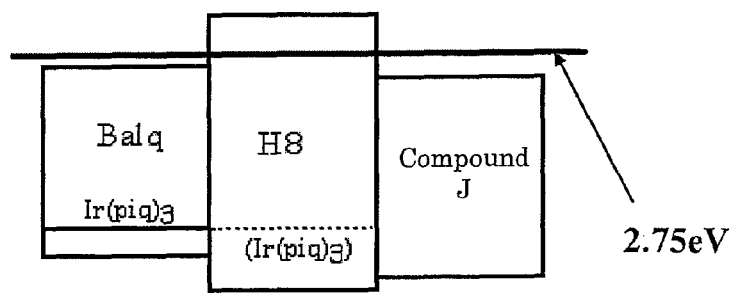
FIG. 8 shows an energy diagram of the organic EL device according to the embodiment in Comparative Examples 5 and 11, which has the structure of the "emitting layer/electron-injecting controlling layer/electron-transporting layer".
Figure 9:
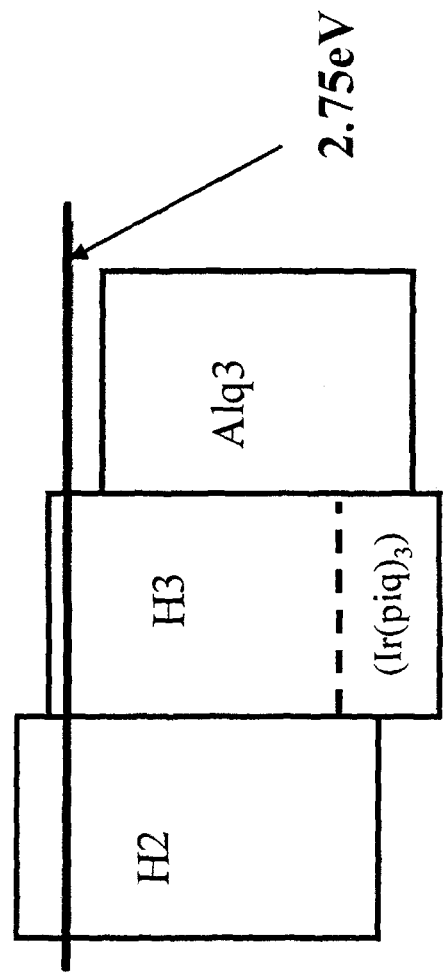
FIG. 9 shows an energy diagram of the organic EL device according to the embodiment in Comparative Examples 6 and 12, which has the structure of the "emitting layer/electron-injecting controlling layer/electron-transporting layer".

FIG. 2 expresses the outline of the above-mentioned characteristic relationships in the invention together with the energy diagram.

In the organic EL device of the invention, the dopant of the emitting layer is preferably a phosphorescent material.

A dopant having phosphorescence means a material which emits light after receiving energy transmitted from the host material of the emitting layer, or a material which emits light after excitons directly generate on a phosphorescent dopant.

In the organic EL device of the invention, it is preferred that the electron-injecting controlling layer contain a phosphorescent dopant same as or different from the dopant of the emitting layer, and the concentration of the phosphorescent dopant in the emitting layer and the electron-injecting controlling layer satisfy the following relationship.

$$\text{Concentration of dopant: Emitting layer>Electron-injection controlling layer} \quad (vii)$$

In the organic EL device of the invention, one or both of the dopant contained in the emitting layer and the electron-injecting controlling layer is preferably a metal complex composed of a metal selected from the group consisting of Ir, Pt, Os, Au, Cu, Re and Ru, and a ligand.

Specific examples of such dopant materials include PQIr (iridium (III) bis(2-phenyl quinolyl-N,$C^{2'}$)acetylacetonate) and Ir(ppy)$_3$ (fac-tris(2-phenylpyridine)iridium), as well as the following compounds.

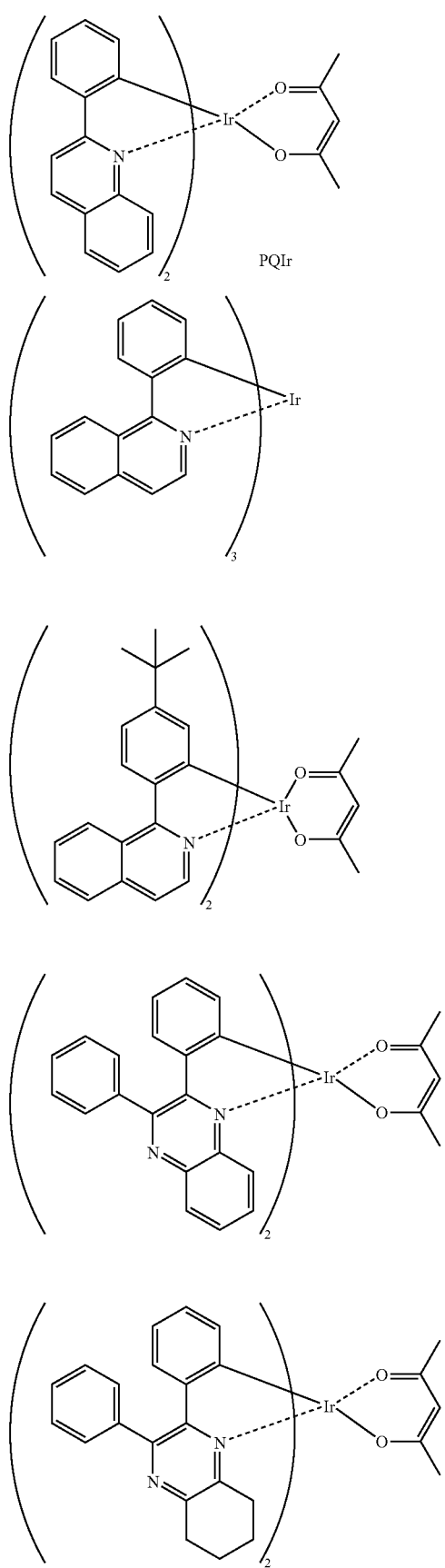
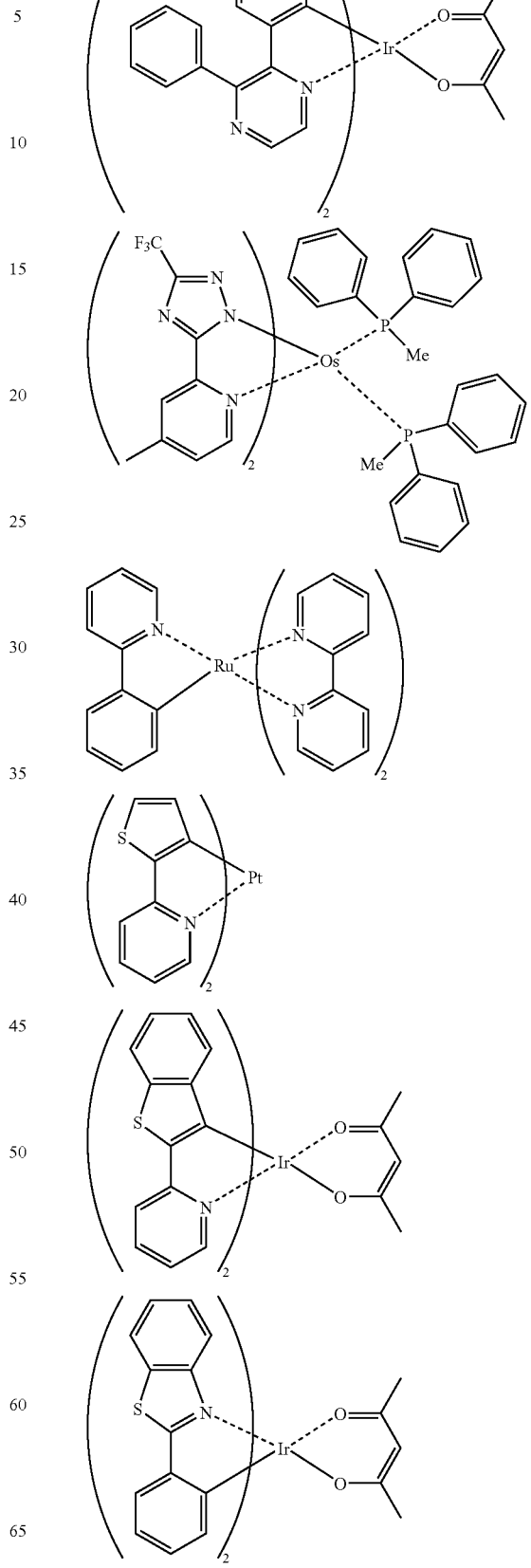

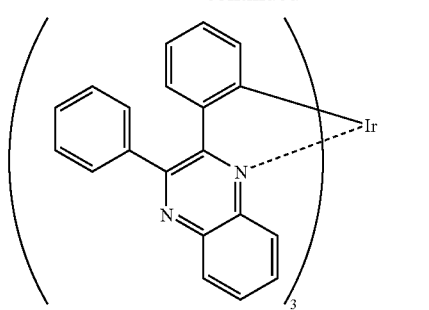
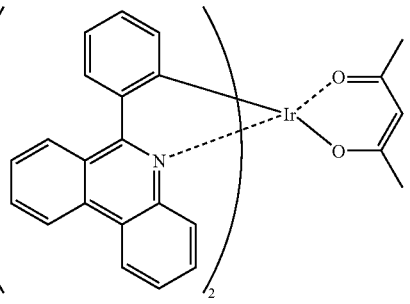
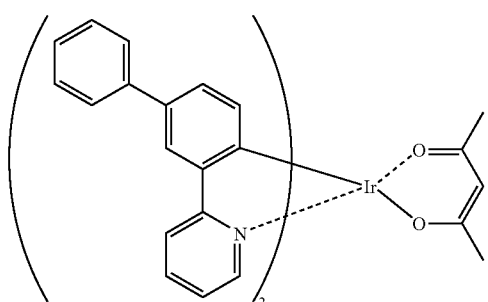
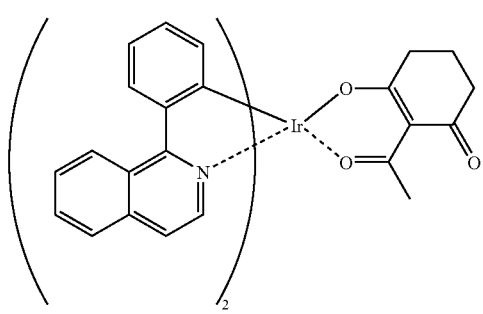
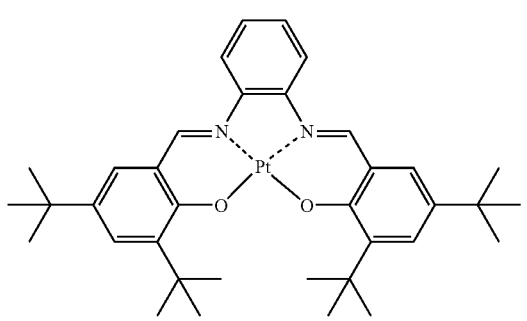
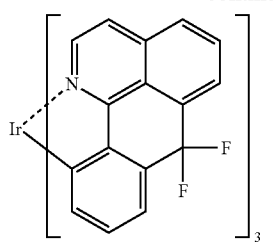
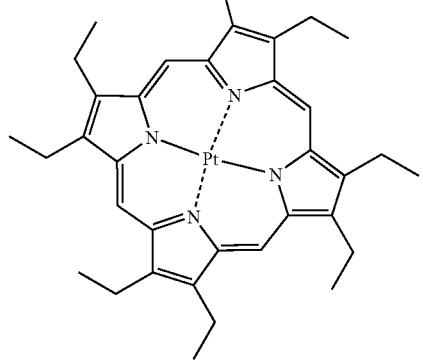
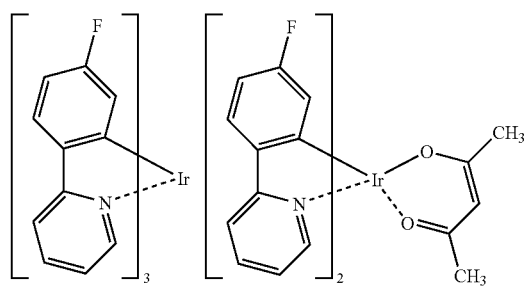
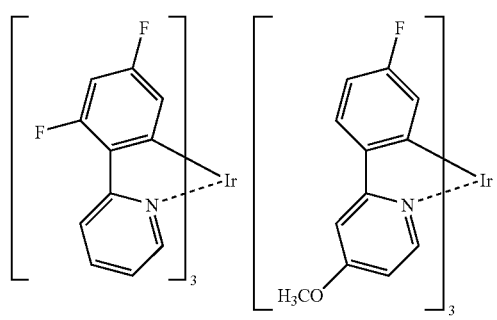
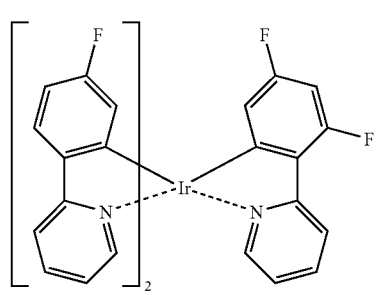

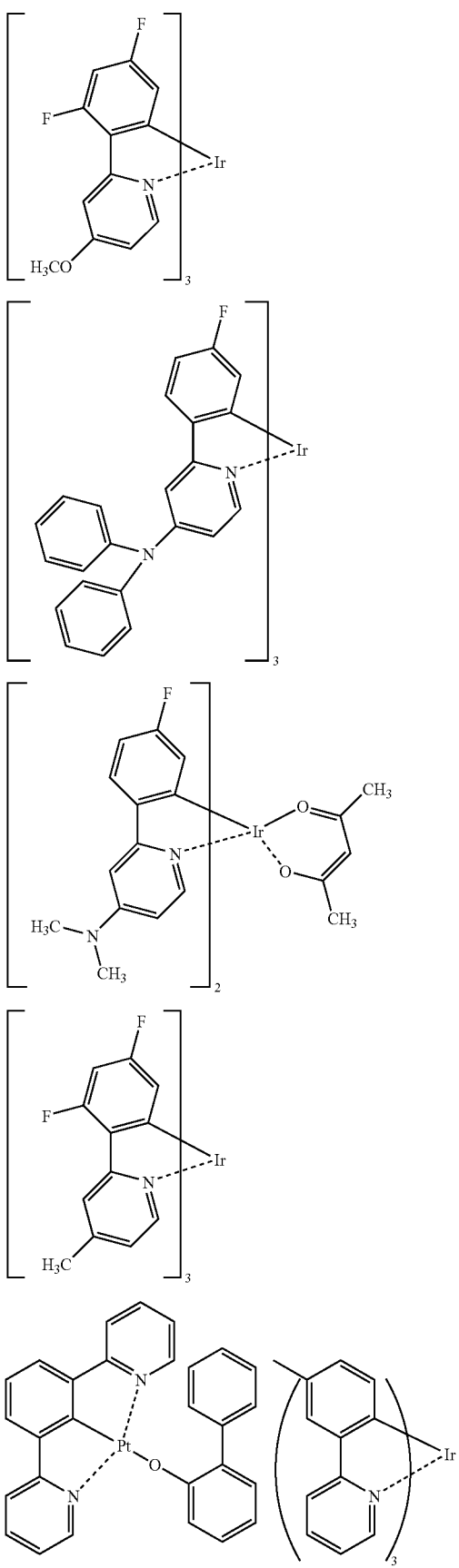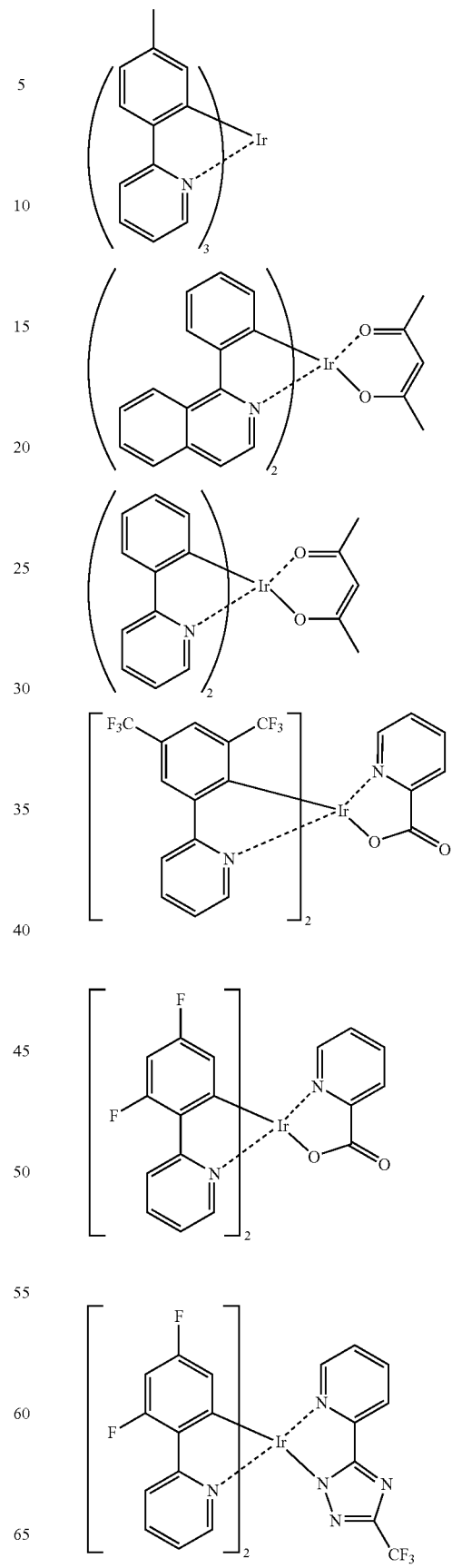

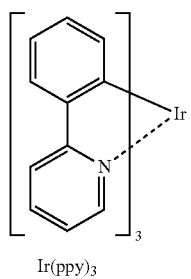
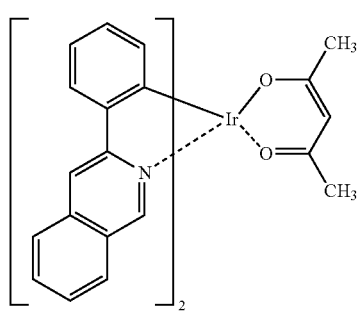
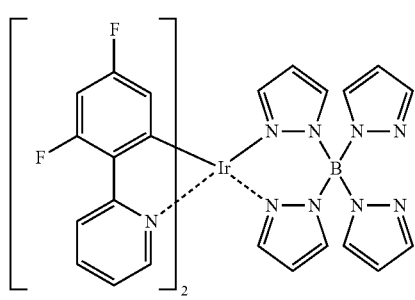
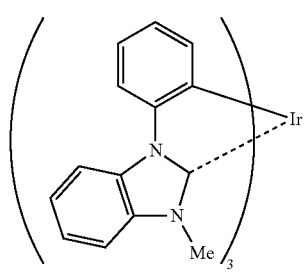
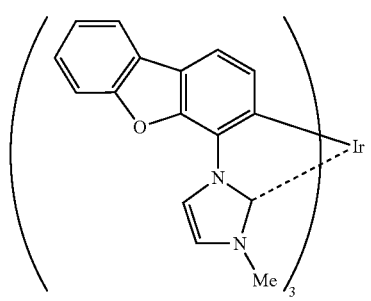
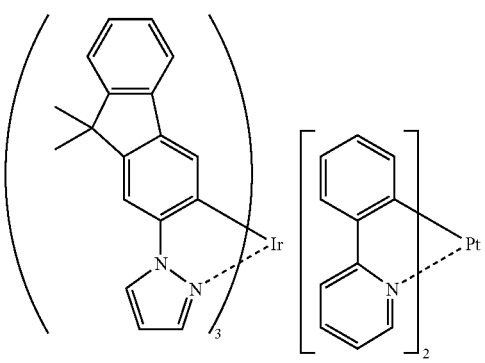
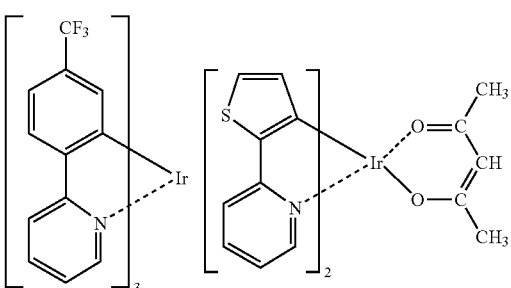
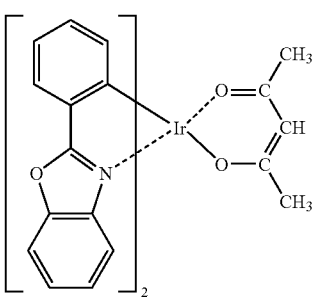
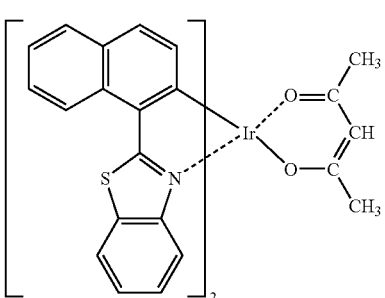
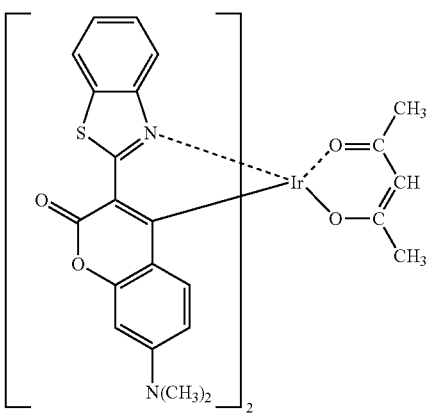

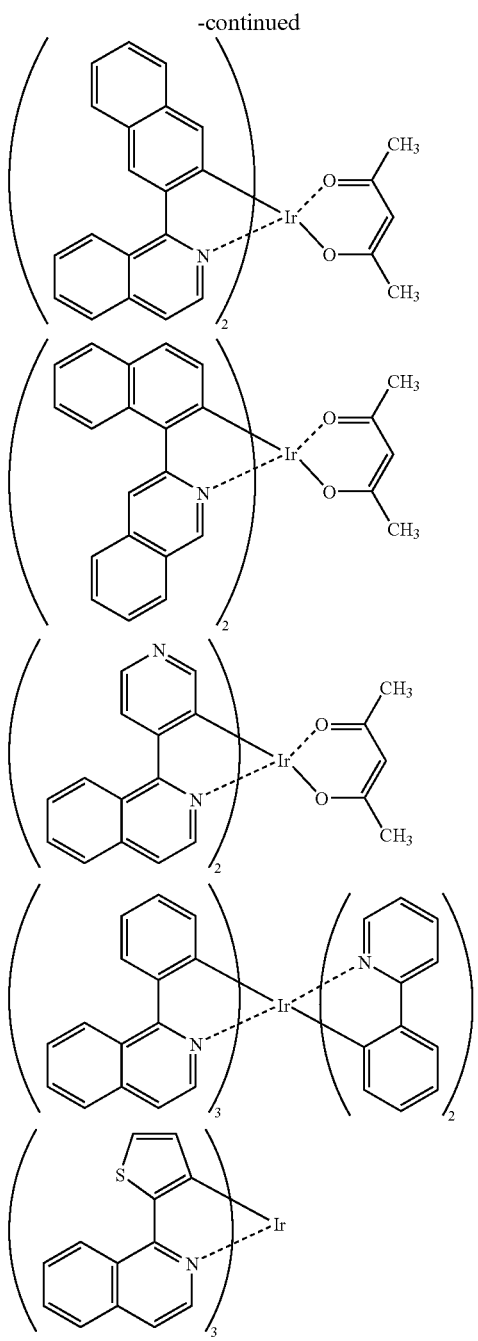

In the organic EL device of the invention, it is preferred that a hole-injecting/transporting layer which is adjacent to the emitting layer be provided between the anode and the emitting layer.

Specific examples of the material used in each layer are given below.

The organic EL device of the invention has, between the anode and the cathode, an emitting layer, an electron-injecting controlling layer and an electron-transporting layer, bonding one to another, in sequential order from the anode. As mentioned above, the electron-transporting layer is a layer which helps injection of electrons to the emitting layer, and a material having a large electron mobility is used. As the electron-transporting material, a nitrogen-containing heterocyclic derivative which is not a metal complex is preferable.

As the electron-transporting material, an oxadiazole derivative, a nitrogen-containing heterocyclic derivative or the like are preferable. Examples of the oxadiazole derivative include the following:

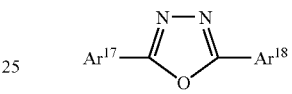

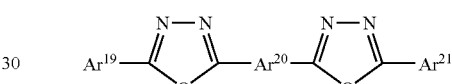

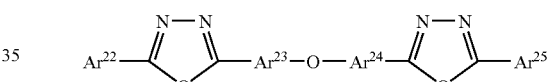

wherein $Ar^{17}$, $Ar^{18}$, $Ar^{19}$, $Ar^{21}$, $Ar^{22}$ and $Ar^{25}$ each represent a substituted or unsubstituted aryl group. $Ar^{17}$ and $Ar^{18}$, $Ar^{19}$ and $Ar^{21}$, and $Ar^{22}$ and $Ar^{25}$ may be either the same as or different from each other. $Ar^{20}$, $Ar^{23}$ and $Ar^{24}$ each represent an arylene group which may or may not have a substituent. $Ar^{23}$ and $Ar^{24}$ may be either the same as or different from each other.

Examples of the arylene group include phenylene, naphthylene, biphenylene, anthranylene, perylenylene, and pyrenylene groups. Examples of the substituents for these include alkyl groups with 1 to 10 carbon atoms, alkoxy groups with 1 to 10 carbon atoms, and a cyano group. The following compounds can be given as specific examples of these compounds.

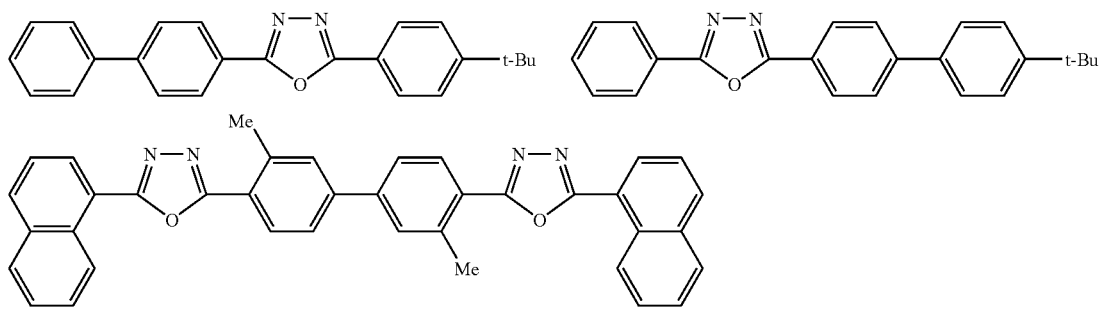

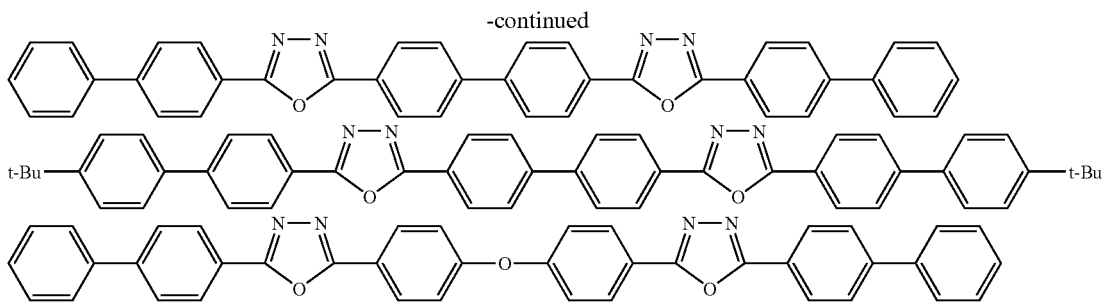

As the nitrogen-containing heterocyclic derivative, a nitrogen-containing heterocyclic derivative which is not a metal complex and is formed of an organic compound shown by the following general formula. For example, a five-membered or six-membered ring compound having a skeleton shown by formulas (A) and (C) or a compound having a structure shown by formula (B) can be given.

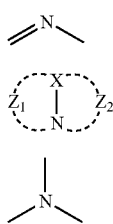

(A)

(B)

(C)

In the above formula (B), X is a carbon atom or a nitrogen atom. $Z_1$ and $Z_2$ are independently a group of atoms capable of forming a nitrogen-containing heterocycle.

Preferred is an organic compound having a nitrogen-containing aromatic polycyclic group comprising a five-membered ring or a six-membered ring. Further, in the case of a nitrogen-containing aromatic polycyclic group having a plurality of nitrogen atoms, the organic compound is a nitrogen-containing aromatic polycyclic organic compound having a skeleton which is obtained by combining (A) and (B) or combining (A) and (C).

The nitrogen-containing group of the nitrogen-containing compound can be selected from a nitrogen-containing heterocyclic group shown by the following formula, for example.

(2)

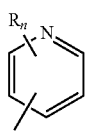

(3)

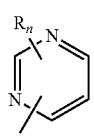

(4)

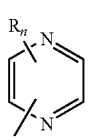

(5)

(6)

(7)

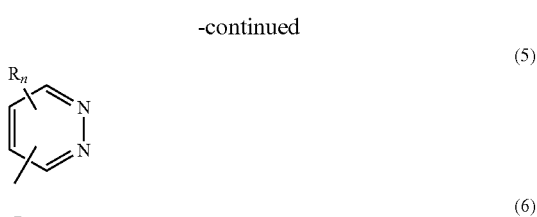

(8)

(9)

(10)

(11)

(12)

(13)

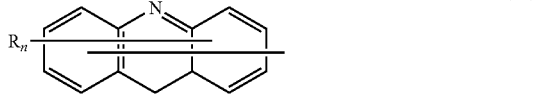

(14)

(15) 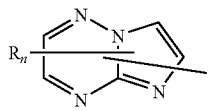

(16) 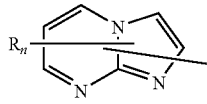

(17) 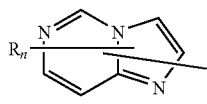

(18) 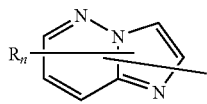

(19) 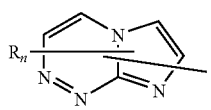

(20) 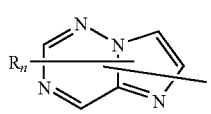

(21) 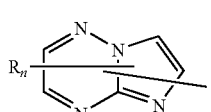

(22) 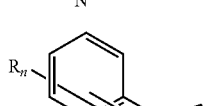

(23) 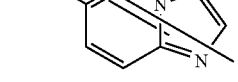

(24) 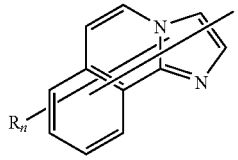

In the above formulas (2) to (24), R is an aryl group having 6 to 40 carbon atoms, a heteroaryl group having 3 to 40 carbon atoms, an alkyl group having 1 to 20 carbon atoms or an alkoxy group having 1 to 20 carbon atoms. n is an integer of 0 to 5, and when n is an integer of 2 or more, plural Rs may be the same as or different from each other.

As specific preferable compounds, a nitrogen-containing heterocyclic derivative can be given.

wherein HAr is a substituted or unsubstituted nitrogen-containing heterocyclic ring having 3 to 40 carbon atoms; $L^1$ is a single bond, a substituted or unsubstituted arylene group having 6 to 40 carbon atoms, or a substituted or unsubstituted heteroarylene group having 3 to 40 carbon atoms; $Ar^1$ is a substituted or unsubstituted divalent aromatic hydrocarbon group having 6 to 40 carbon atoms; and $Ar^2$ is a substituted or unsubstituted aryl group having 6 to 40 carbon atoms or a substituted or unsubstituted heteroaryl group having 3 to 40 carbon atoms.

HAr is selected from the following group, for example.

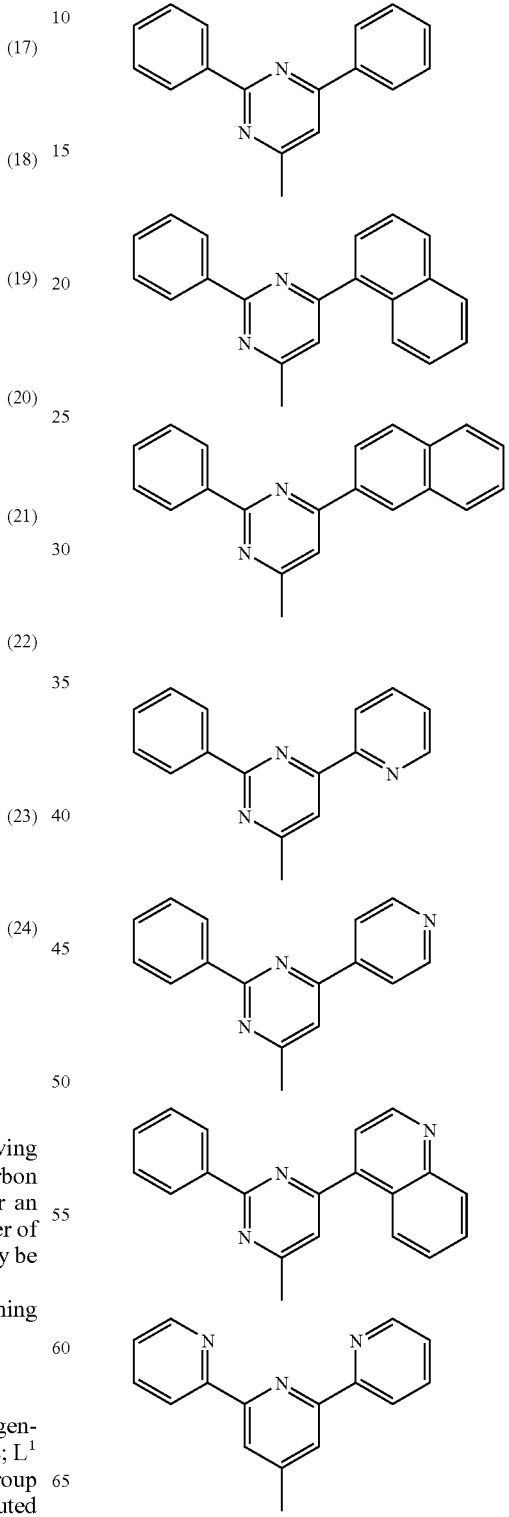

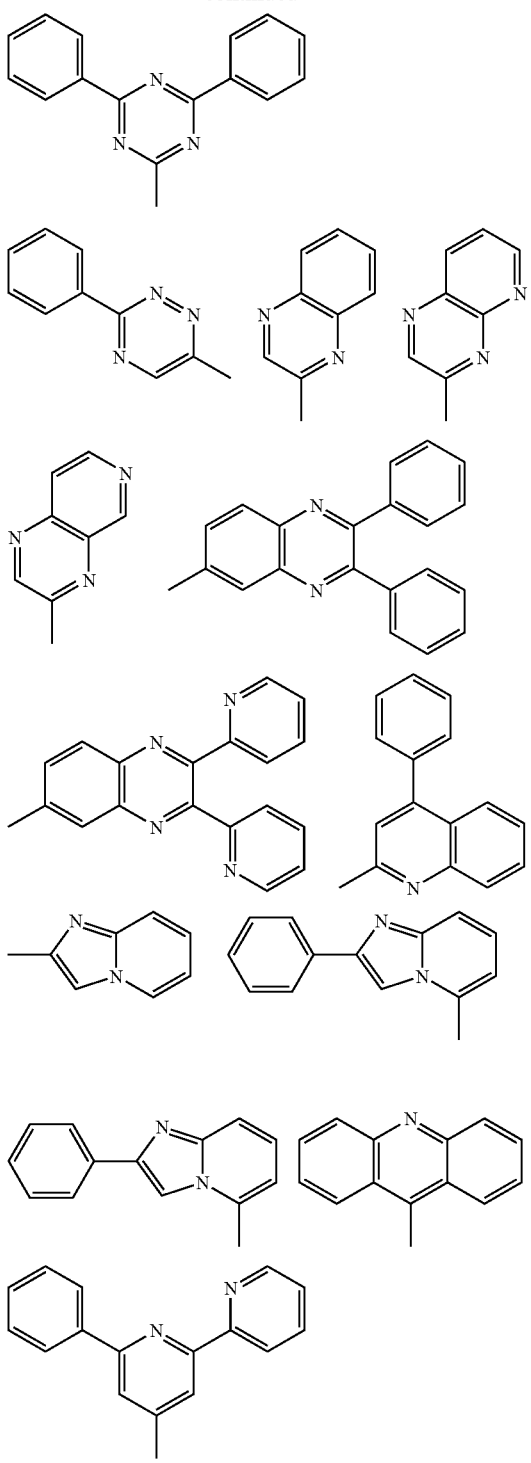

L¹ is selected from the following group, for example.

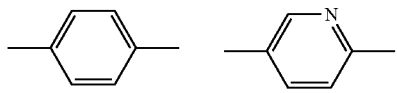

Ar² is selected from the following group, for example.

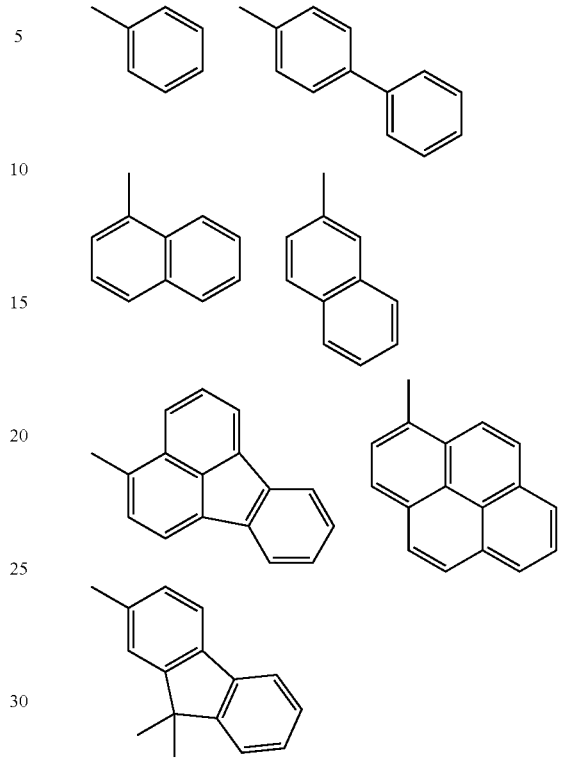

Ar¹ is selected from the following arylanthranyl groups, for example.

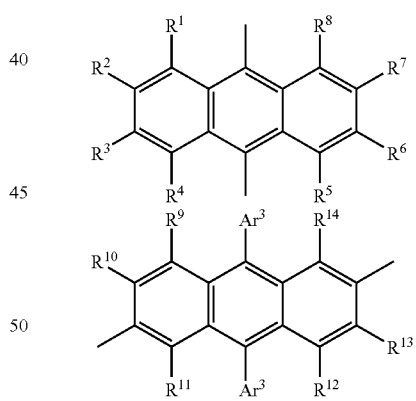

wherein $R^1$ to $R^{14}$ are independently a hydrogen atom, a halogen atom, an alkyl group having 1 to 20 carbon atoms, an alkoxy group having 1 to 20 carbon atoms, an aryloxy group having 6 to 40 carbon atoms, an aryl group having 6 to 40 carbon atoms which may have a substituent or a heteroaryl group having 3 to 40 carbon atoms which may have a substituent, and $Ar^3$ is an aryl group having 6 to 40 carbon atoms which may have a substituent or a heteroaryl group having 3 to 40 carbon atoms which may have a substituent.

In addition to the above, the following compounds (see JP-A-H09-3448) are used preferably as an electron-transporting material.

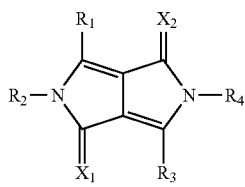

wherein $R_1$ to $R_4$ are independently a hydrogen atom, a substituted or unsubstituted aliphatic group, a substituted or unsubstituted aliphatic ring group, a substituted or unsubstituted carbocyclic aromatic ring group, or a substituted or unsubstituted heterocyclic group, and $X_1$ and $X_2$ are independently an oxygen atom, a sulfur atom or a dicyanomethylene group.

The following compounds (see JP-A-2000-173774) can be preferably used as the electron-transporting material.

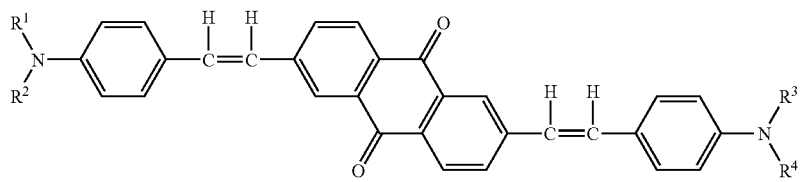

wherein $R^1$, $R^2$, $R^3$ and $R^4$, which may be the same or different, are an aryl group shown by the following formula:

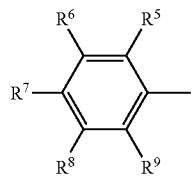

wherein $R^5$, $R^6$, $R^7$, $R^8$ and $R^9$, which may be the same or different, are a hydrogen atom or at least one of $R^5$, $R^6$, $R^7$, $R^8$ and $R^9$ is a saturated or unsaturated alkoxy group, alkyl group, amino group or alkylamino group.

As the nitrogen-containing heterocyclic derivative, compounds shown by the following formulas (201) to (203) can be given.

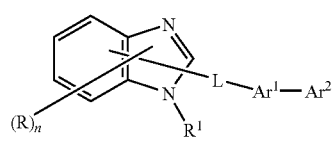

(201)

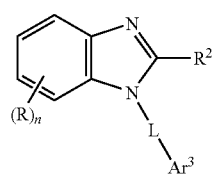

(202)

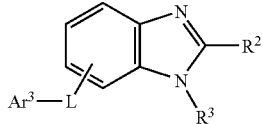

(203)

In formulas (201) to (203), R is a hydrogen atom, an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms which may have a substituent.

n is an integer of 0 to 4.

$R^1$ is an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms.

$R^2$ and $R^3$ are independently a hydrogen atom, an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms which may have a substituent.

L is an arylene group having 6 to 60 carbon atoms which may have a substituent, a pyridinylene group which may have a substituent, a quinolinylene group which may have a substituent or a fluorenylene group which may have a substituent.

$Ar^1$ is an arylene group having 6 to 60 carbon atoms which may have a substituent, a pyridinylene group which may have a substituent or a quinolinylene group which may have a substituent.

$Ar^2$ is an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms.

$Ar^3$ is an aryl group having 6 to 60 carbon atoms which may have a substituent, a pyridyl group which may have a substituent, a quinolyl group which may have a substituent, an alkyl group having 1 to 20 carbon atoms which may have a substituent, an alkoxy group having 1 to 20 carbon atoms which may have a substituent or a group shown by —$Ar^1$—$Ar^2$ (wherein $Ar^1$ and $Ar^2$ are the same as those mentioned above (—$Ar^3$=—$Ar^1$—$Ar^2$)).

Further, as the substituent for $Ar^1$, $Ar^2$ and $Ar^3$, an aryl group having 6 to 20 carbon atoms, a pyridyl group, a quinolyl group and an alkyl group are preferable.

Since the nitrogen-containing heterocyclic derivative is shown by formulas (201) to (203) have good electron-injection properties, an organic EL device can be driven at a lower voltage by incorporating them into an electron-transporting layer.

In the above-mentioned formulas (201) to (203), R is a hydrogen atom, an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms which may have a substituent.

As the above-mentioned aryl group having 6 to 60 carbon atoms, an aryl group having 6 to 40 carbon atoms is preferable, with an aryl group having 6 to 20 carbon atoms being further preferable. Specific examples include phenyl, naphthyl, anthryl, phenanthryl, naphthacenyl, chrycenyl, pyrenyl, biphenyl, terphenyl, tolyl, t-butylphenyl, (2-phenylpropyl)phenyl, fluoranthenyl, fluorenyl, a monovalent group formed of spirobifluorene, perfluorophenyl, perfluoronaphthyl, perfluoroanthryl, perfluorobiphenyl, a monovalent group formed of 9-phenylanthracene, a monovalent group formed of 9-(1'-naphthyl)anthracene, a monovalent group formed of 9-(2'-naphthyl)anthracene, a monovalent group formed of 6-phenylchrysene, a monovalent group formed of 9-[4-(diphenylamino)phenyl]anthracene or the like can be given. Of these, a phenyl group, a naphthyl group, a biphenyl group, a terphenyl group, a 9-(10-phenyl)anthryl group, a 9-[10-(1'-naphthyl)]anthryl group, 9-[10-(2'-naphthyl)]anthryl group or the like are preferable.

As the alkyl group having 1 to 20 carbon atoms, an alkyl group having 1 to 6 carbon atoms is preferable. Specific examples include methyl, ethyl, propyl, butyl, pentyl and hexyl. In addition to these, a haloalkyl group such as a trifluoromethyl group can be given. The alkyl group having 3 or more carbon atoms may be linear, cyclic or branched.

As the alkoxy group having 1 to 20 carbon atoms, an alkoxy group having 1 to 6 carbon atoms is preferable. Specific examples thereof include methoxy, ethoxy, propoxy, butoxy, pentyloxy and hexyloxy. The alkoxy group having 3 or more carbon atoms may be linear, cyclic or branched.

As the substituent for each group shown by R, a halogen atom, an alkyl group having 1 to 20 carbon atoms which may have a substituent, an alkoxy group having 1 to 20 carbon atoms which may have a substituent, an aryloxy group having 6 to 40 carbon atoms which may have a substituent, an aryl group having 6 to 40 carbon atoms which may have a substituent or a heteroaryl group having 3 to 40 carbon atoms which may have a substituent.

As the halogen atom, fluorine, chlorine, bromine, iodine or the like can be given.

As the alkyl group having 1 to 20 carbon atoms, the alkoxy group having 1 to 20 carbon atoms and the aryl group having 6 to 40 carbon atoms, the same groups as those mentioned above can be given.

As the aryloxy group having 6 to 40 carbon atoms, a phenoxy group, a biphenyloxy group or the like can be given, for example.

As the heteroaryl group having 3 to 40 carbon atoms, a pyrrolyl group, a furyl group, a thienyl group, a silolyl group, a pyridyl group, a quinolyl group, an isoquinolyl group, a benzofuryl group, an imidazolyl group, a pyrimidyl group, a carbazolyl group, a selenophenyl group, an oxadiazolyl group, a triazolyl group or the like can be given.

n is an integer of 0 to 4, preferably 0 to 2.

In the above-formula (201), $R^1$ is an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms.

The specific examples of each group, the preferable number of carbon atoms and the preferable substituent are the same as those as mentioned above regarding R.

In the above formulas (202) and (203), $R^2$ and $R^3$ are independently a hydrogen atom, an aryl group having 6 to 60 carbon atoms which may have a substituent, a pyridyl group which may have a substituent, a quinolyl group which may have a substituent, an alkyl group having 1 to 20 carbon atoms which may have a substituent or an alkoxy group having 1 to 20 carbon atoms which may have a substituent.

The specific examples of each group, the preferable number of carbon atoms and the preferable substituent are the same as those as mentioned above regarding R.

In the above formulas (201) to (203), L is an arylene group having 6 to 60 carbon atoms which may have a substituent, a pyridinylene group which may have a substituent, a quinolinylene group which may have a substituent or a fluorenylene group which may have a substituent.

As the arylene group having 6 to 60 carbon atoms, an arylene group having 6 to 40 carbon atoms is preferable, with an arylene group having 6 to 20 carbon atoms being more preferable. Specifically, a divalent group obtained by removing one hydrogen atom from the aryl group mentioned above regarding R can be given. The substituent of each group shown by L is the same as those mentioned above regarding R.

It is preferred that L be a group selected from the group consisting of:

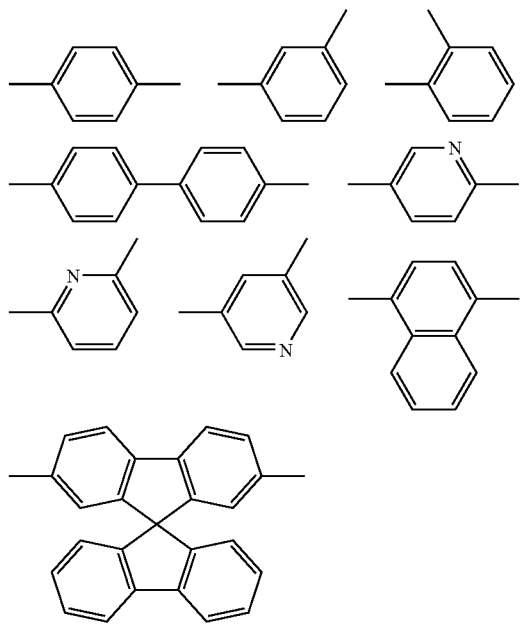

In the above formula (201), $Ar^1$ is an arylene group having 6 to 60 carbon atoms which may have a substituent, a pyridinylene group which may have a substituent or a quinolinylene group which may have a substituent. The specific examples the substituents of each group shown by $Ar^1$ and $Ar^3$ are the same as those as mentioned above regarding R.

It is preferred that $Ar^1$ be a group selected from fused ring groups shown by the following formulas (101) to (110).

(101)
(102)
(103)
(104)
(105)
(106)
(107)
(108)
(109)
(110)

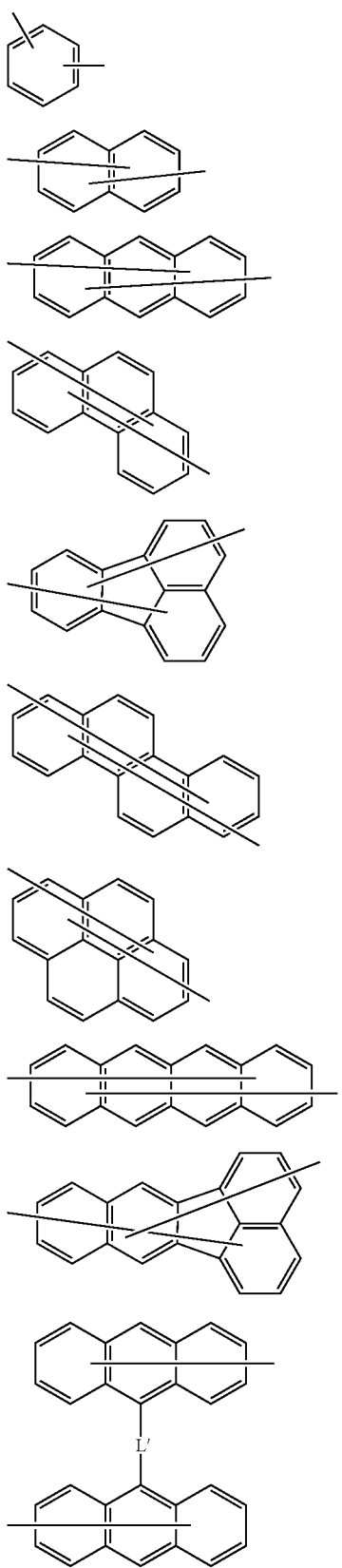

In the above-mentioned formulas (101) to (110), in each fused ring, a bonding group selected from a halogen atom, an alkyl group having 1 to 20 carbon atoms which may have a substituent, an alkoxy group having 1 to 20 carbon atoms which may have a substituent, an aryloxy group having 6 to 40 carbon atoms which may have a substituent, an aryl group having 6 to 40 carbon atoms which may have a substituent or a heteroaryl group having 3 to 40 carbon atoms which may have a substituent may be bonded. If plural bonding groups are present, these bonding groups may be the same as or different from each other. Specific examples of these groups are the same as those mentioned above.

In the above-mentioned formula (110), L' is a single bond or a group selected from the group consisting of:

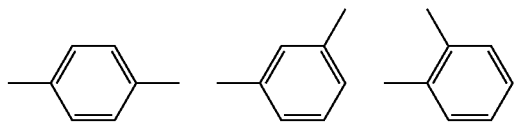

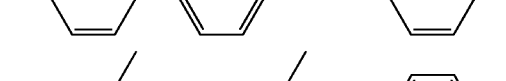

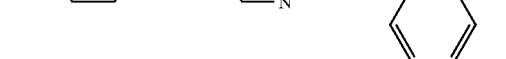

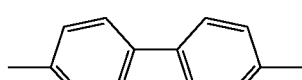

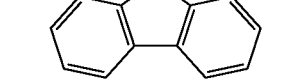

It is preferred that the above formula (103) showing $Ar^1$ be a fused ring group shown by the following formulas (111) to (125).

(111)

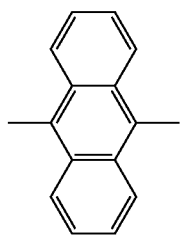

(112)

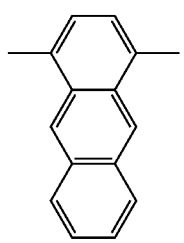

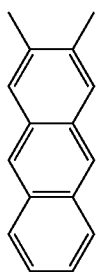 (113)
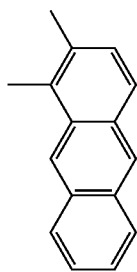 (114)
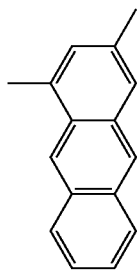 (115)
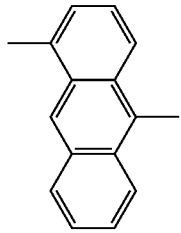 (116)
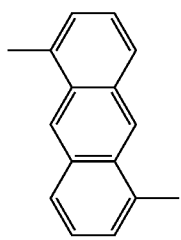 (117)
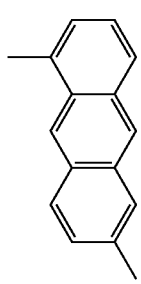 (118)
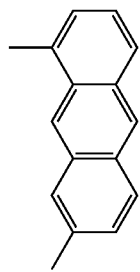 (119)
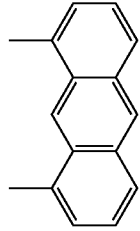 (120)
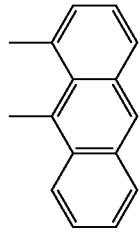 (121)
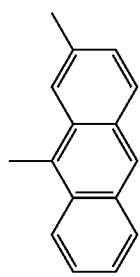 (122)
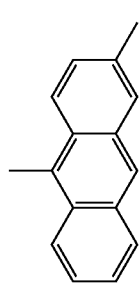 (123)
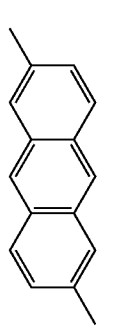 (124)

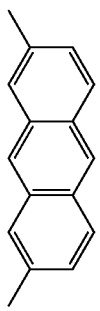
(125)

In the above formulas (111) to (125), in each fused ring, a bonding group selected from a halogen atom, an alkyl group having 1 to 20 carbon atoms which may have a substituent, an alkoxy group having 1 to 20 carbon atoms which may have a substituent, an aryloxy group having 6 to 40 carbon atoms which may have a substituent, an aryl group having 6 to 40 carbon atoms which may have a substituent or a heteroaryl group having 3 to 40 carbon atoms which may have a substituent may be bonded. If plural bonding groups are present, these bonding groups may be the same as or different from each other. Specific examples of these groups are the same as those mentioned above.

In the above formula (201), Ar² is an aryl group having 6 to 60 carbon atoms which may have a substituent, a pyridyl group which may have a substituent or a quinolyl group which may have a substituent, an alkyl group having 1 to 20 carbon atoms which may have a substituent or an alkoxy group having 1 to 20 carbon atoms which may have a substituent.

The specific examples of each group, the preferable number of carbon atoms and the preferable substituent are the same as those as mentioned above regarding R.

In the above formulas (202) and (203), Ar³ is an aryl group having 6 to 60 carbon atoms which may have a substituent, a pyridyl group which may have a substituent, a quinolyl group which may have a substituent, an alkyl group having 1 to 20 carbon atoms which may have a substituent, an alkoxy group having 1 to 20 carbon atoms which may have a substituent or a group shown by —Ar¹—Ar² (wherein Ar¹ and Ar² are as mentioned above).

The specific examples of each group, the preferable number of carbon atoms and the preferable substituent are the same as those as mentioned above regarding R.

It is preferred that Ar³ be a group selected from fused ring groups shown by the following formulas (126) to (135).

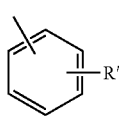
(126)

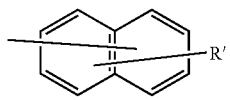
(127)

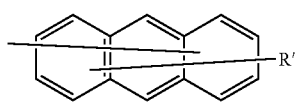
(128)

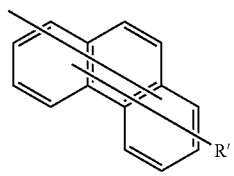
(129)

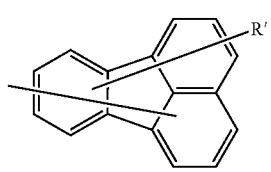
(130)

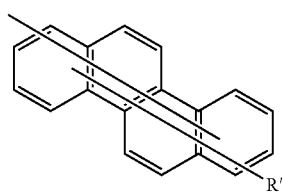
(131)

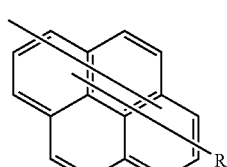
(132)

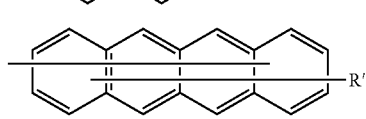
(133)

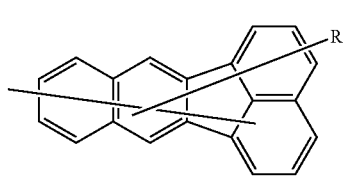
(134)

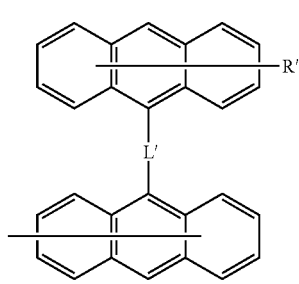
(135)

In the above formulas (126) to (135), in each fused ring, a bonding group selected from a halogen atom, an alkyl group having 1 to 20 carbon atoms which may have a substituent, an alkoxy group having 1 to 20 carbon atoms which may have a substituent, an aryloxy group having 6 to 40 carbon atoms which may have a substituent, an aryl group having 6 to 40 carbon atoms which may have a substituent or a heteroaryl group having 3 to 40 carbon atoms which may have a substituent may be bonded. If plural bonding groups are present, these bonding groups may be the same as or different from each other. Specific examples of these groups are the same as those mentioned above.

In the above formula (135), L' is the same as those mentioned above.

In the above formulas (126) to (135), R' is a hydrogen atom, an alkyl group having 1 to 20 carbon atoms which may have a substituent, an aryl group having 6 to 40 carbon atoms which may have a substituent or a heteroaryl group having 3 to 40 carbon atoms which may have a substituent. Specific examples of these groups are the same as those mentioned above.

It is preferred that formula (128) showing $Ar^3$ be a fused ring group shown by the following formulas (136) to (158).

(136)
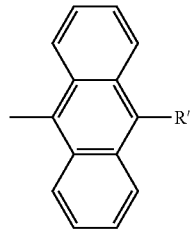

(137)
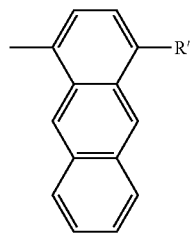

(138)
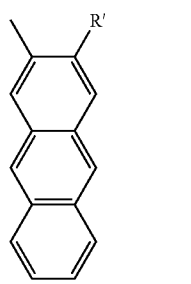

(139)
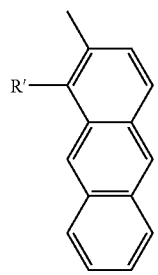

(140)
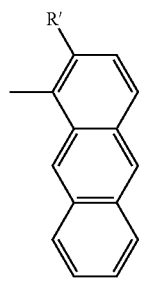

(141)
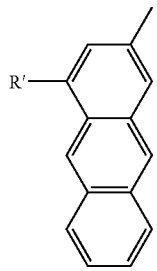

(142)
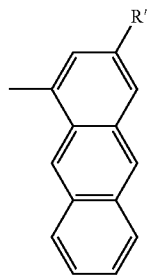

(143)
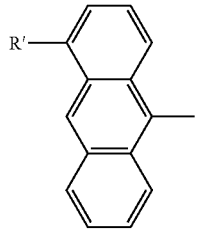

(144)
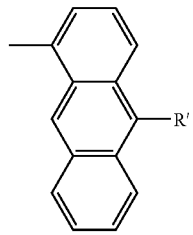

(145)
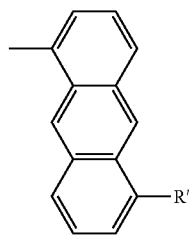

(146)
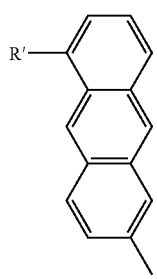

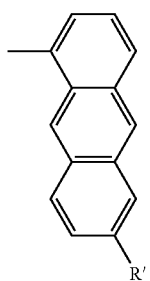 (147)
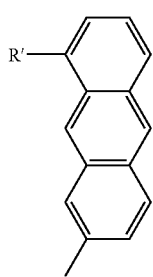 (148)
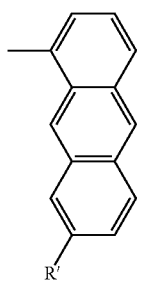 (149)
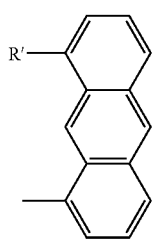 (150)
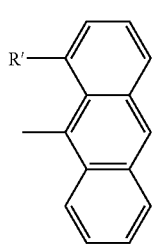 (151)
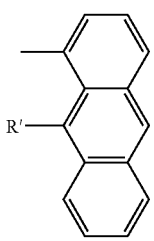 (152)
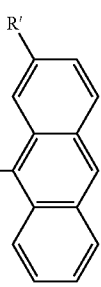 (153)
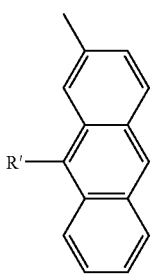 (154)
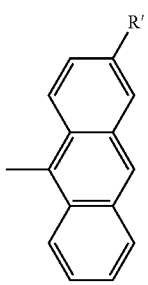 (155)

(156)

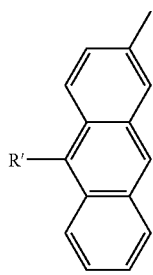

(157)

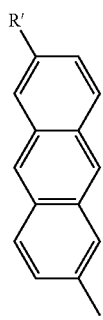

(158)

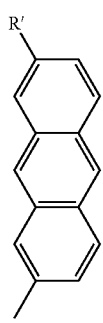

In the above formulas (136) to (158), in each fused ring, a bonding group selected from a halogen atom, an alkyl group having 1 to 20 carbon atoms which may have a substituent, an alkoxy group having 1 to 20 carbon atoms which may have a substituent, an aryloxy group having 6 to 40 carbon atoms which may have a substituent, an aryl group having 6 to 40 carbon atoms which may have a substituent, a heteroaryl group having 3 to 40 carbon atoms which may have a substituent may be bonded. If plural bonding groups are present, these bonding groups may be the same as or different from each other. Specific examples of these groups are the same as those mentioned above. R' is the same as those mentioned above.

It is preferred that $Ar^2$ and $Ar^3$ be independently a group selected from the group consisting of:

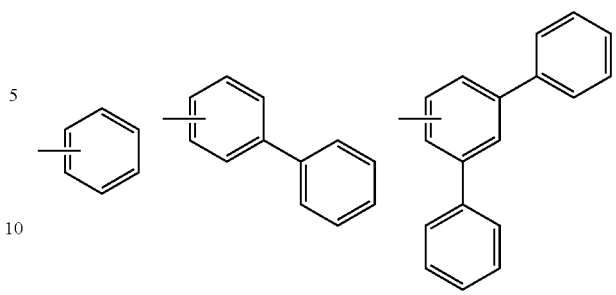

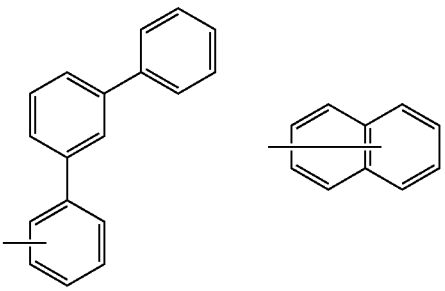

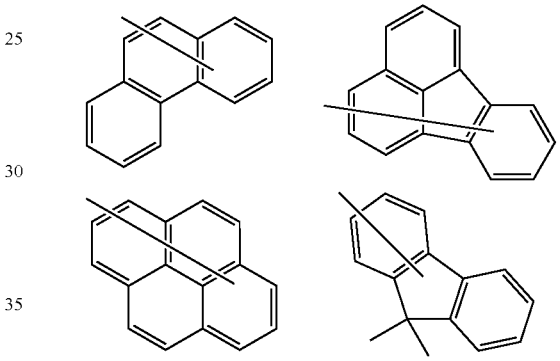

The specific examples of the nitrogen-containing heterocyclic derivative shown by formulas (201) to (203) are given below. The invention is, however, not limited to those exemplified compounds.

In the following table, HAr represents

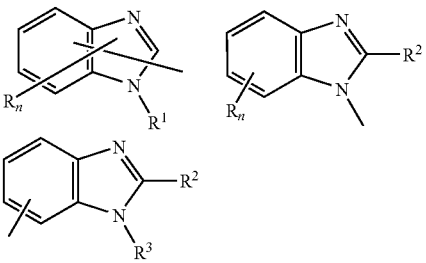

in the above-mentioned formulas (201) to (203). In the exemplified compounds given below, the exemplified compounds 1-1 to 1-17, 2-1 to 2-9, 3-1 to 3-6, 4-1 to 4-12, 5-1 to 5-6, 6-1 to 6-5 and 8-1 to 8-13 correspond to the above formula (201), the exemplified compounds 9-1 to 9-17, 10-1 to 10-9, 11-1 to 11-6, 12-1 to 12-11, 13-1 to 13-6 and 14-1 to 14-5 correspond to the above formula (202) and the exemplified compounds 7-1 to 7-10, 15-1 to 15-13, 16-1 to 16-8 and 17-1 to 17-8 correspond to the above formula (203).

| | HAr | L | Ar¹ | Ar² |
|---|---|---|---|---|
| 1-1 | 1-phenyl-2-methylbenzimidazole | p-phenylene | 9,10-dimethylanthracene | phenyl |
| 2 | 1-phenyl-2-methylbenzimidazole | p-phenylene | 9,10-dimethylanthracene | 2-biphenyl |
| 3 | 1-phenyl-2-methylbenzimidazole | p-phenylene | 9,10-dimethylanthracene | 3-biphenyl |
| 4 | 1-phenyl-2-methylbenzimidazole | p-phenylene | 9,10-dimethylanthracene | 4-biphenyl |
| 5 | 1-phenyl-2-methylbenzimidazole | p-phenylene | 9,10-dimethylanthracene | 3,5-diphenylphenyl |
| 6 | 1-phenyl-2-methylbenzimidazole | p-phenylene | 9,10-dimethylanthracene | 1-naphthyl |

-continued

| | HAr | L | Ar¹ | Ar² |
|---|---|---|---|---|
| 7 | 2-methyl-1-phenyl-benzimidazole | 1,4-phenylene | 9,10-dimethyl-anthracene | 2-naphthyl |
| 8 | 2-methyl-1-phenyl-benzimidazole | 1,4-phenylene | 9,10-dimethyl-anthracene | phenanthrenyl |
| 9 | 2-methyl-1-phenyl-benzimidazole | 1,4-phenylene | 9,10-dimethyl-anthracene | fluoranthenyl |
| 10 | 2-methyl-1-phenyl-benzimidazole | 1,4-phenylene | 9,10-dimethyl-anthracene | pyrenyl |
| 11 | 2-methyl-1-phenyl-benzimidazole | 1,4-phenylene | 9,10-dimethyl-anthracene | 9,9-dimethylfluorenyl |
| 12 | 2-methyl-1-phenyl-benzimidazole | 1,4-phenylene | 9,10-dimethyl-anthracene | 2-pyridyl |

-continued

| | HAr | L | Ar¹ | Ar² |
|---|---|---|---|---|
| 13 | 2-methyl-1-phenyl-benzimidazole | 1,4-phenylene | 9,10-dimethylanthracene | 3-pyridyl |
| 14 | 2-methyl-1-phenyl-benzimidazole | 1,4-phenylene | 9,10-dimethylanthracene | 4-pyridyl |
| 1-15 | 2-methyl-1-phenyl-benzimidazole | 1,4-phenylene | 9,10-diphenyl-2-methylanthracene | — |
| 16 | 2-methyl-1-phenyl-benzimidazole | 1,4-phenylene | 9,10-di(2-naphthyl)-2-methylanthracene | — |

-continued
| HAr | L | Ar¹ | Ar² |
|---|---|---|---|
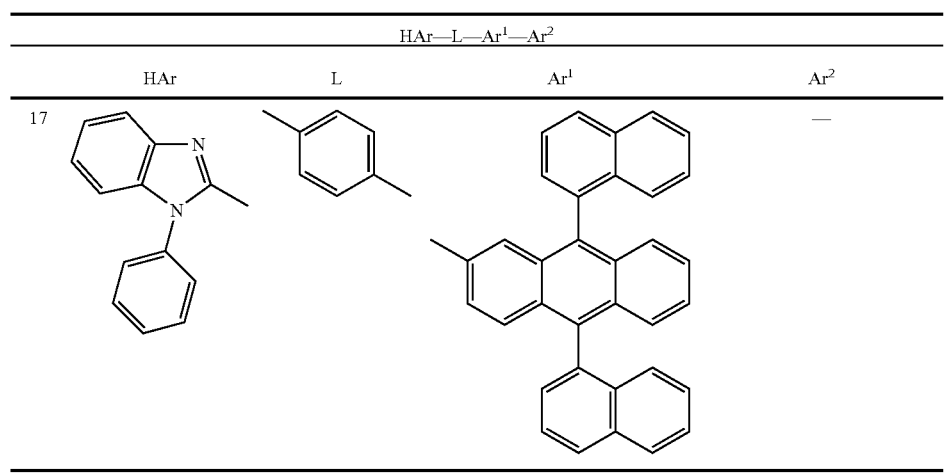
17 ... —
| HAr | L | Ar¹ | Ar² |
|---|---|---|---|
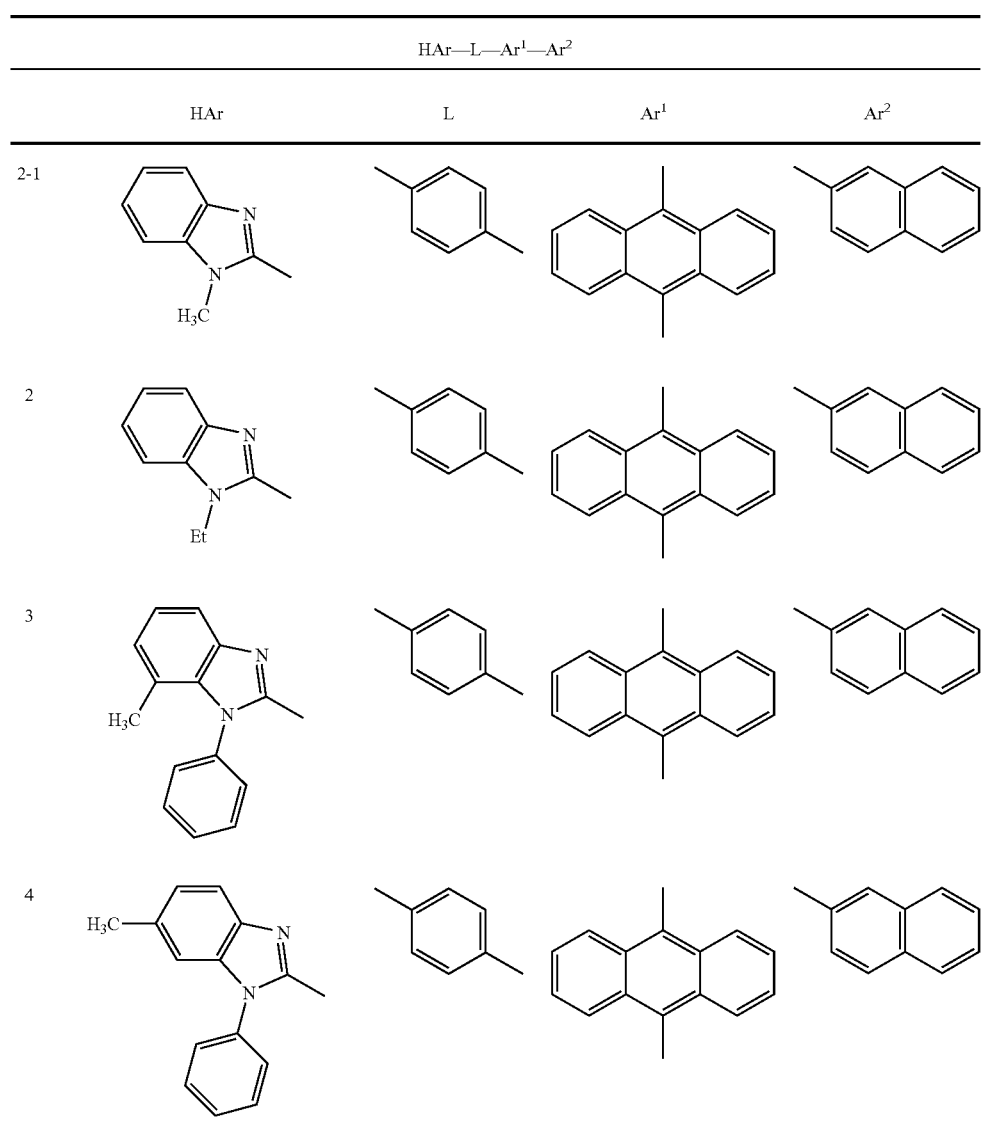

-continued

| | HAr | L | Ar¹ | Ar² |
|---|---|---|---|---|
| 5 | | | | |
| 6 | | | | |
| 7 | | | | |
| 8 | | | | |
| 9 | | | | |

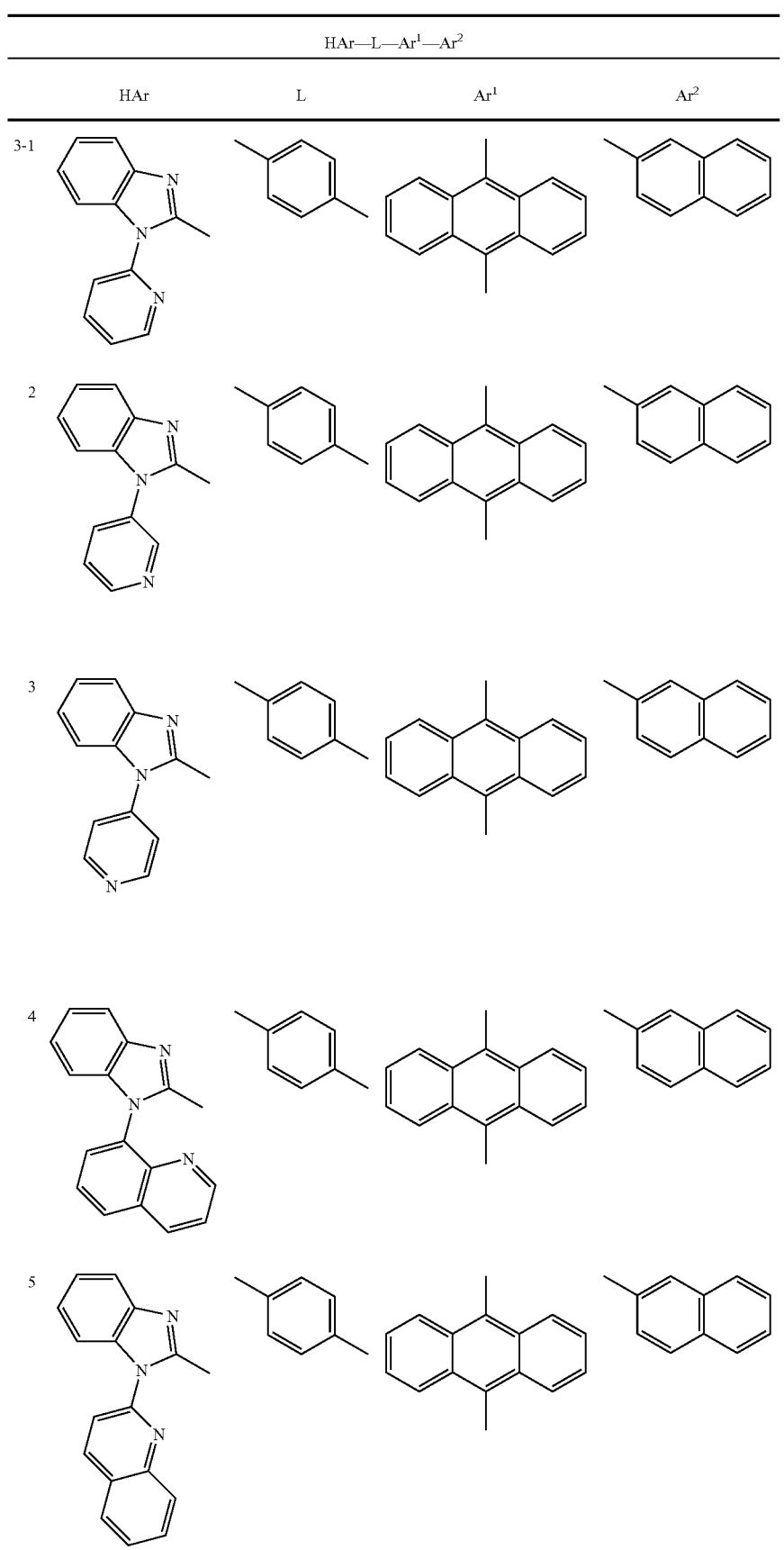

-continued
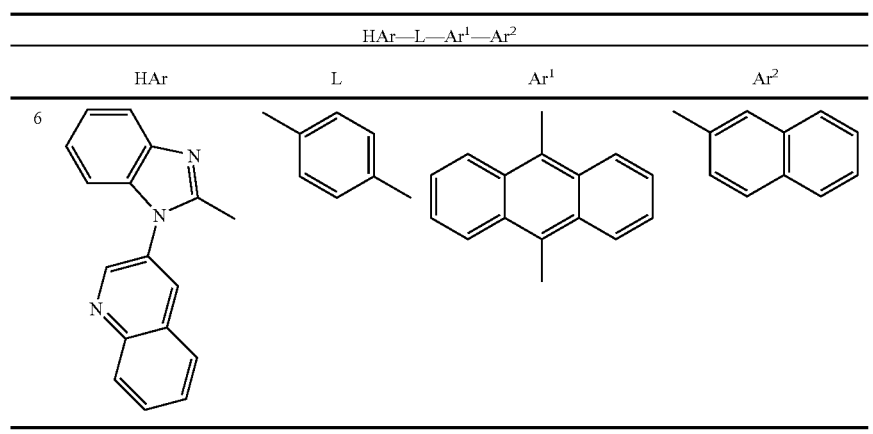
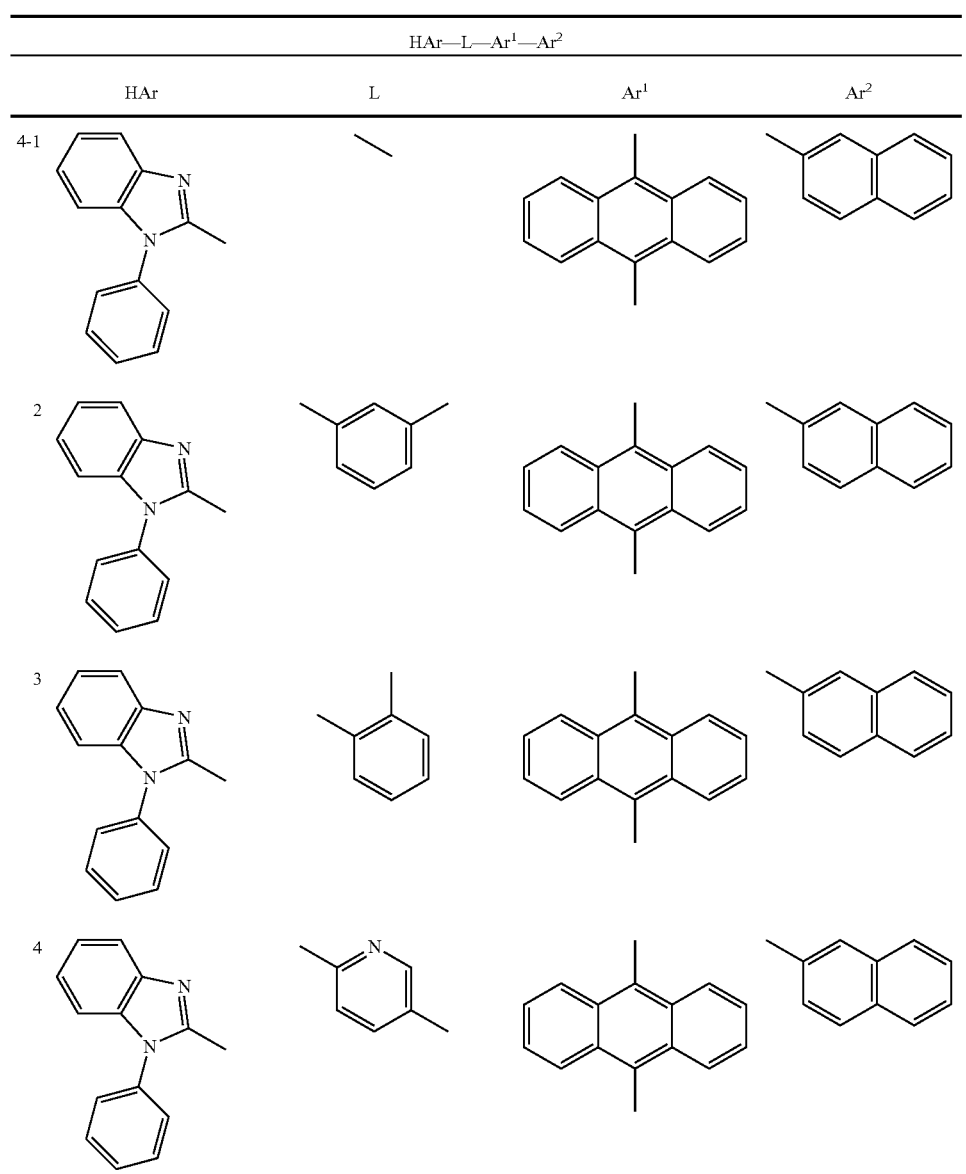

-continued
| | HAr—L—Ar¹—Ar² | | |
|---|---|---|---|
| HAr | L | Ar¹ | Ar² |
| 5 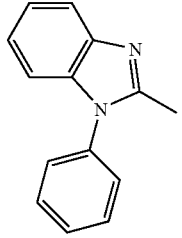 | 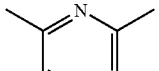 | 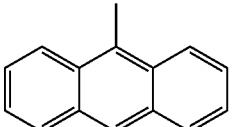 | 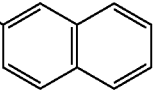 |
| 6 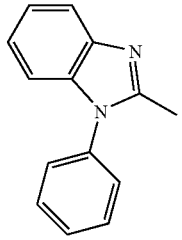 | 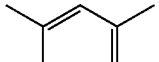 | 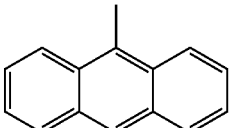 | 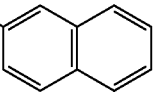 |
| 7 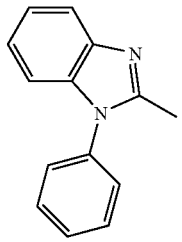 | 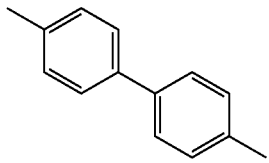 | 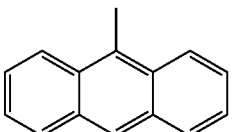 | 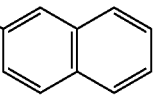 |
| 8 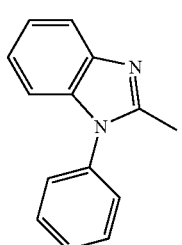 | 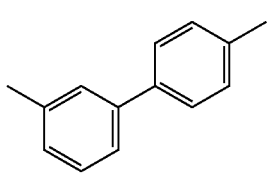 | 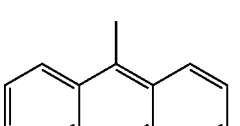 | 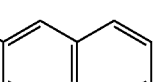 |
| 9 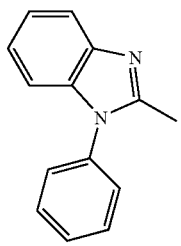 | 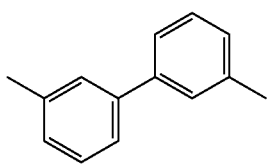 | 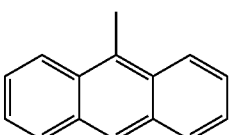 | 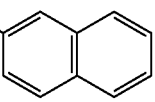 |
| 10 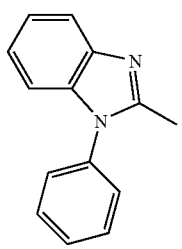 | 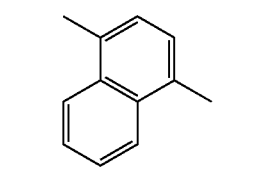 | 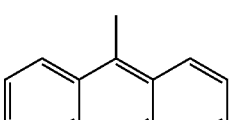 | 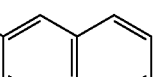 |

-continued
| HAr—L—Ar¹—Ar² | | | |
|---|---|---|---|
| HAr | L | Ar¹ | Ar² |
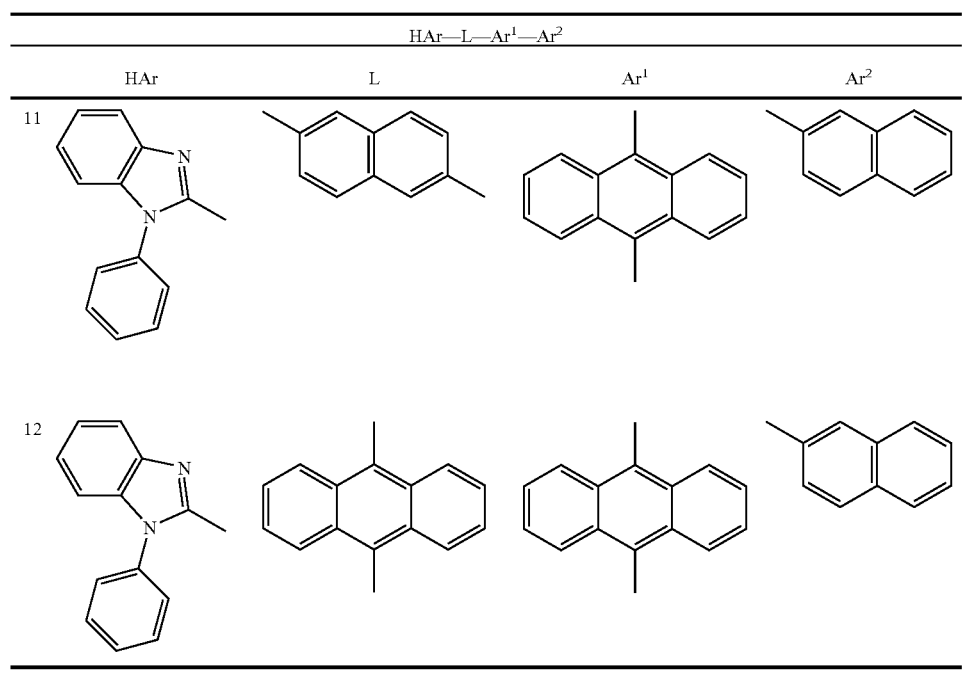
| HAr—L—Ar¹—Ar² | | | |
|---|---|---|---|
| HAr | L | Ar¹ | Ar² |
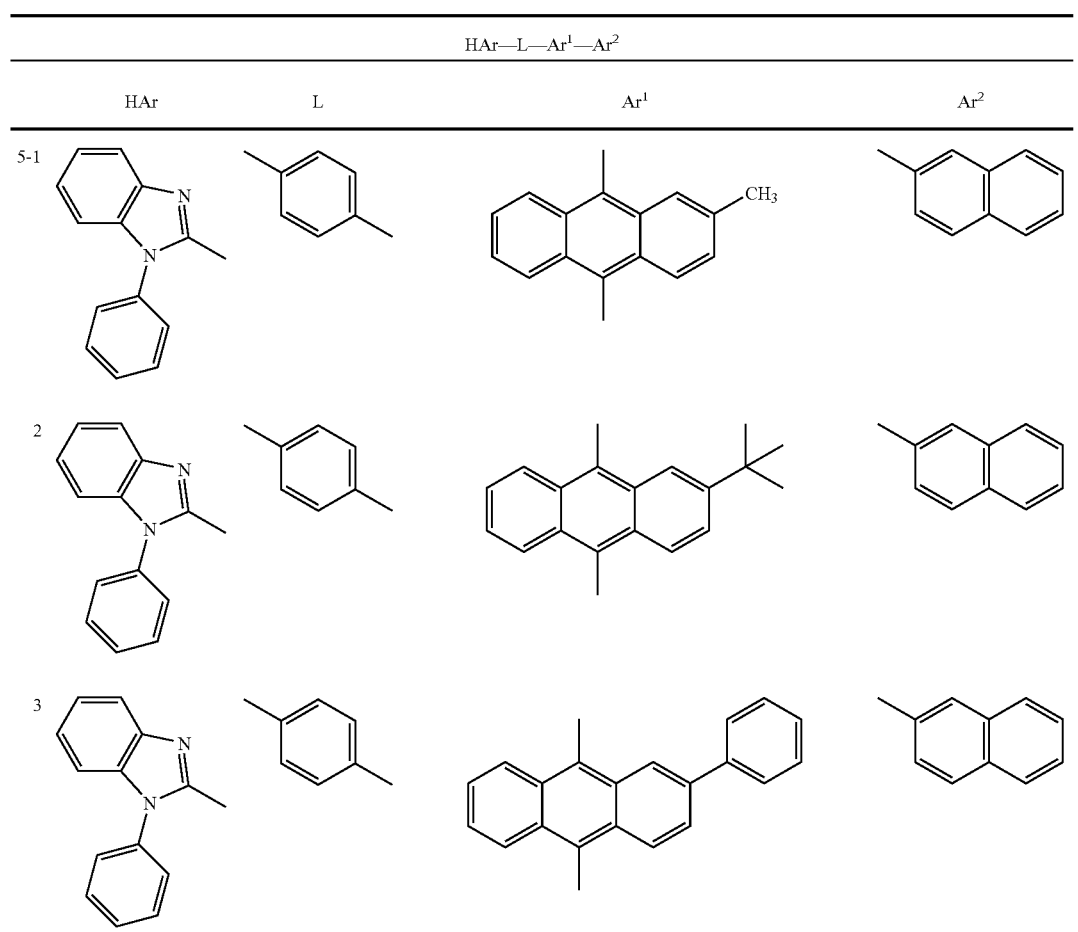

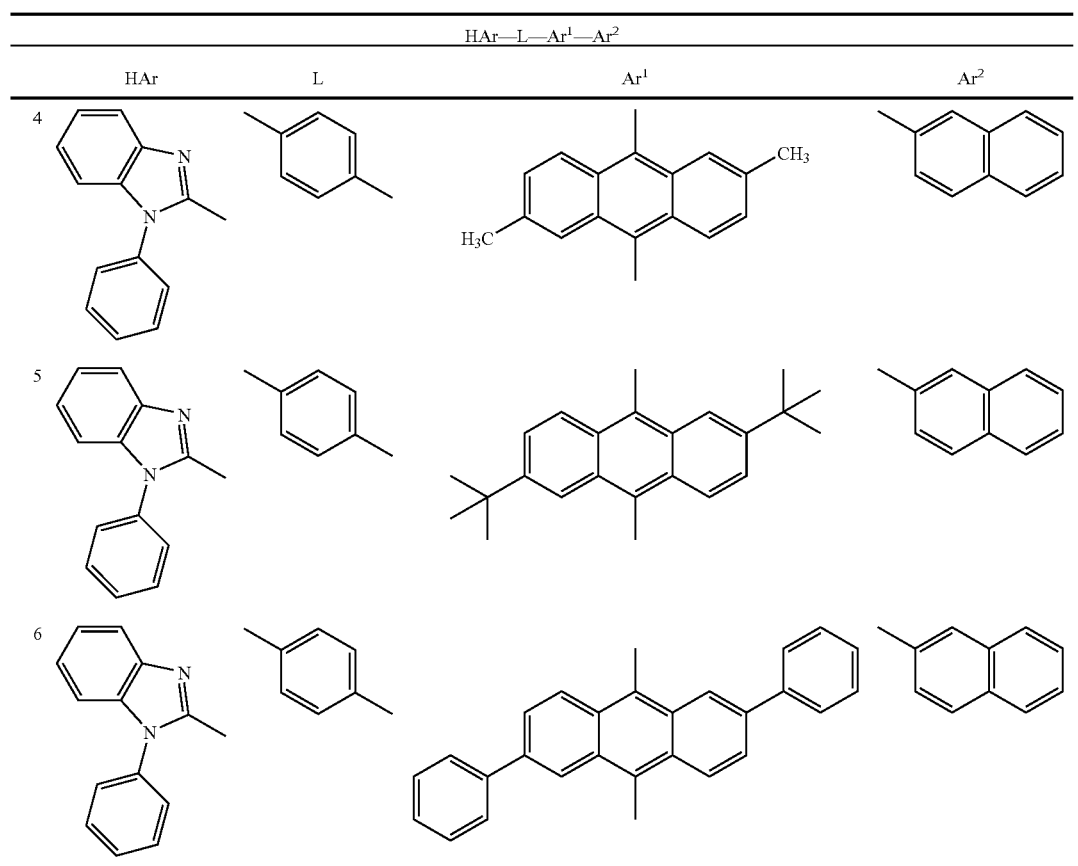
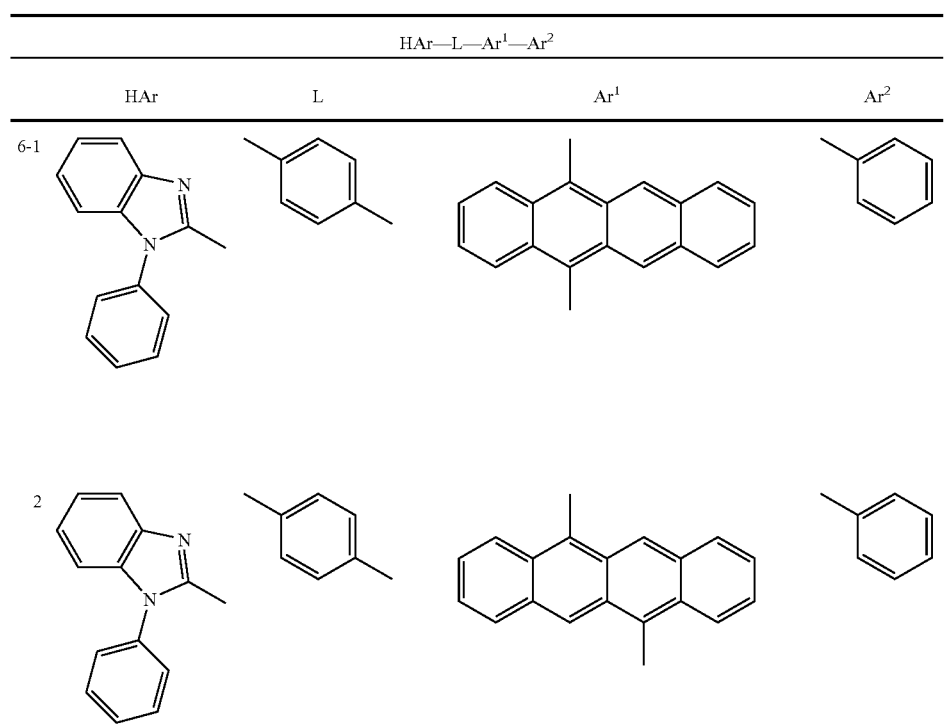

-continued
| HAr—L—Ar¹—Ar² | | | |
|---|---|---|---|
| HAr | L | Ar¹ | Ar² |
| 3 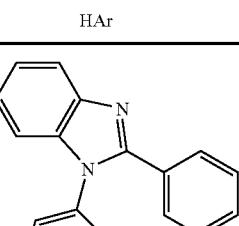 | 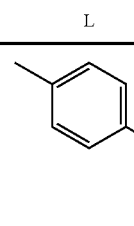 | 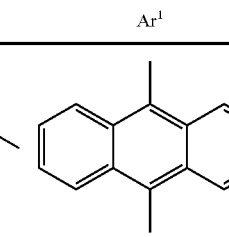 | 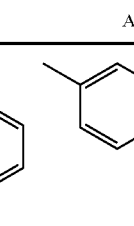 |
| 4 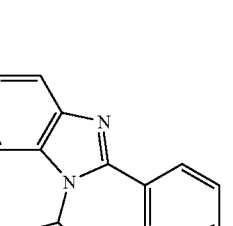 | | | |
| 5 | | | |
| HAr—L—Ar³(—Ar³=—Ar¹—Ar²) | | | |
|---|---|---|---|
| HAr | L | Ar¹ | Ar² |
| 7-1 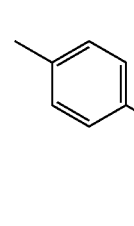 | | 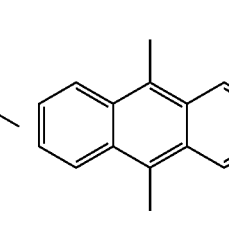 | 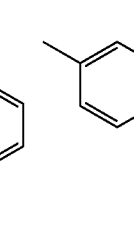 |
| 2 | | | |

-continued

| | HAr—L—Ar³(—Ar³=—Ar¹—Ar²) | | | |
|---|---|---|---|---|
| | HAr | L | Ar¹ | Ar² |
| 3 | 4-methyl-1,2-diphenyl-benzimidazole | p-phenylene | 9,10-anthracenyl | 2-naphthyl |
| 4 | 7-methyl-1,2-diphenyl-benzimidazole | p-phenylene | 9,10-anthracenyl | 2-naphthyl |
| 5 | 2-methyl-5,6-dimethyl-1-phenyl-benzimidazole | p-phenylene | 9,10-anthracenyl | 2-naphthyl |
| 6 | 1-methyl-6-methyl-2-phenyl-benzimidazole | p-phenylene | 9,10-anthracenyl | 2-naphthyl |
| 7 | 5-methyl-2-methyl-1-phenyl-benzimidazole | p-phenylene | 9,10-anthracenyl | 2-naphthyl |
| 8 | 1-methyl-5-methyl-2-phenyl-benzimidazole | p-phenylene | 9,10-anthracenyl | 2-naphthyl |

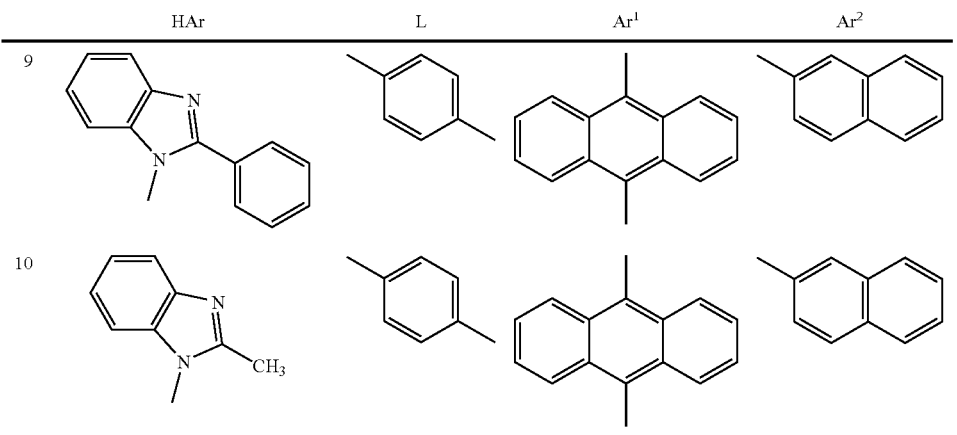
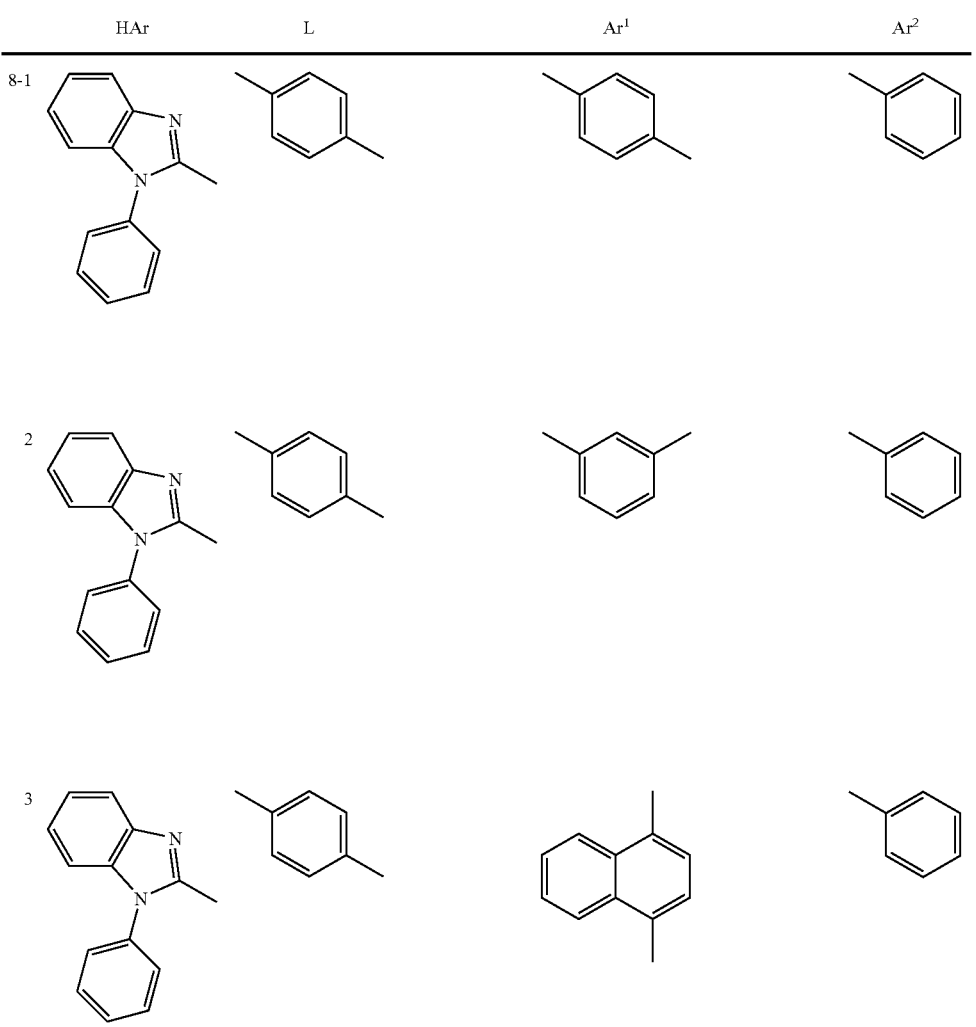

-continued

| | HAr | L | Ar¹ | Ar² |
|---|---|---|---|---|
| 4 | 1-phenyl-2-methylbenzimidazole | 1,4-phenylene | 2,7-naphthalenediyl | phenyl |
| 5 | 1-phenyl-2-methylbenzimidazole | 1,4-phenylene | 9,10-phenanthrenediyl | phenyl |
| 6 | 1-phenyl-2-methylbenzimidazole | 1,4-phenylene | 2,7-phenanthrenediyl | phenyl |
| 7 | 1-phenyl-2-methylbenzimidazole | 1,4-phenylene | 9-phenanthrenyl | H |
| 8 | 1-phenyl-2-methylbenzimidazole | 1,4-phenylene | 5,11-chrysenediyl | phenyl |
| 9 | 1-phenyl-2-methylbenzimidazole | 1,4-phenylene | 1,6-pyrenediyl | phenyl |

-continued
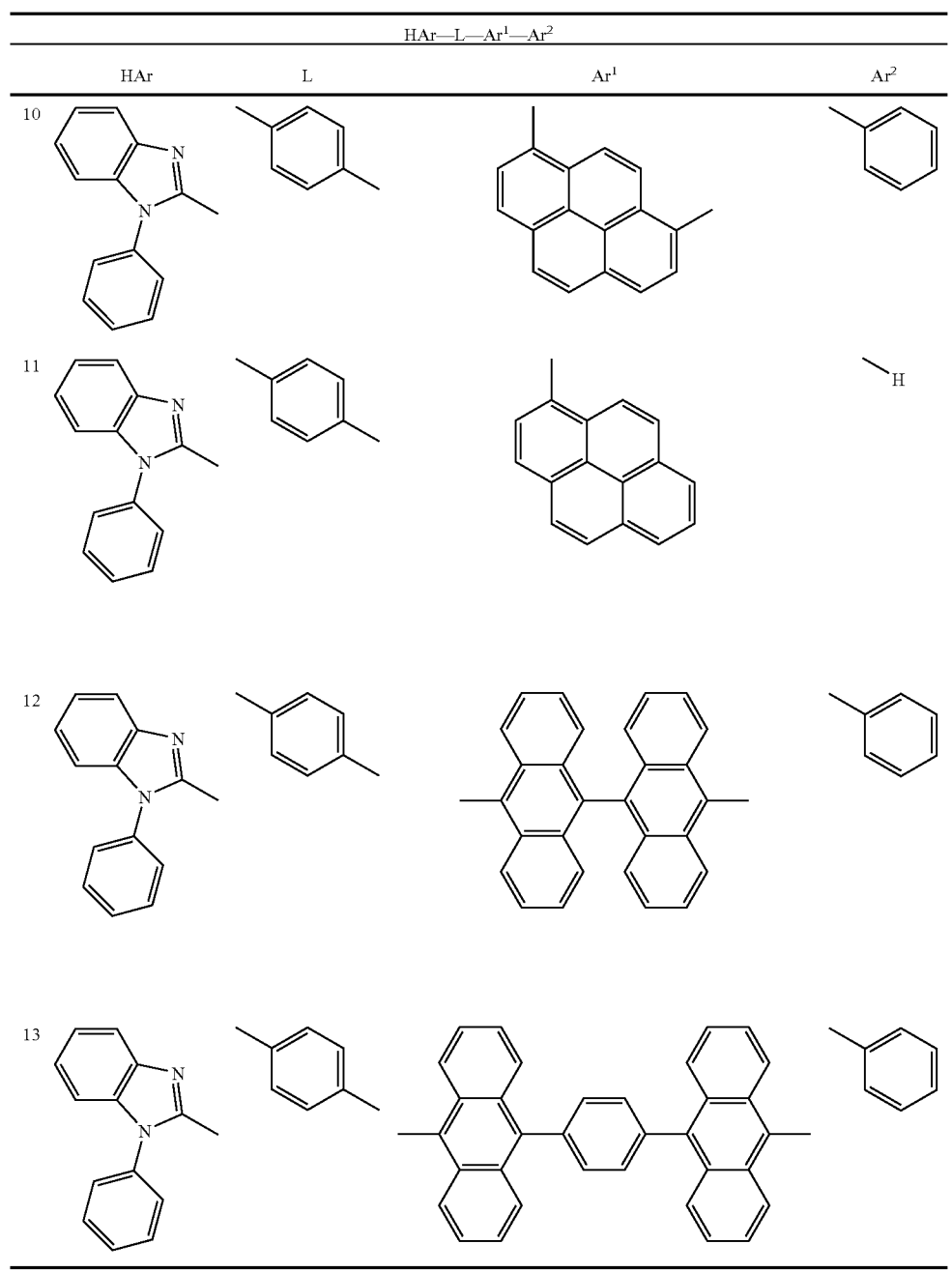
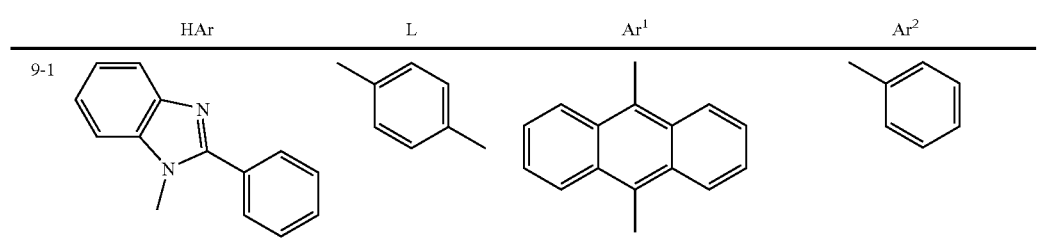

-continued

| | HAr | L | Ar³(—Ar³=—Ar¹—Ar²) | |
|---|---|---|---|---|
| | HAr | L | Ar¹ | Ar² |

2–8 (structures shown in image)

-continued

| | HAr—L—Ar³(—Ar³=—Ar¹—Ar²) | | | |
|---|---|---|---|---|
| | HAr | L | Ar¹ | Ar² |

-continued
| | HAr—L—Ar³(—Ar³=—Ar¹—Ar²) | | | |
|---|---|---|---|---|
| | HAr | L | Ar¹ | Ar² |
| 16 | | | | — |
| 17 | | | | — |
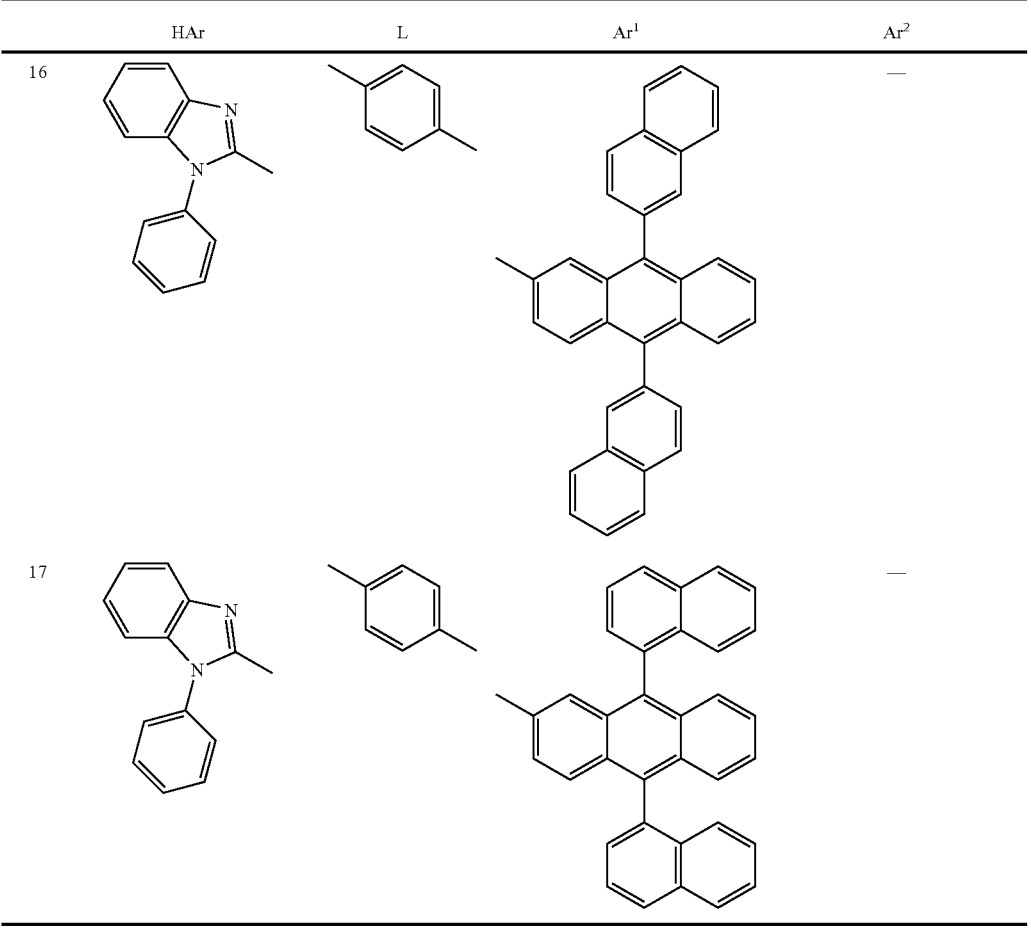
| | HAr—L—Ar³(—Ar³=—Ar¹—Ar²) | | | |
|---|---|---|---|---|
| | HAr | L | Ar¹ | Ar² |
| 10-1 | | | | |
| 2 | | | | |
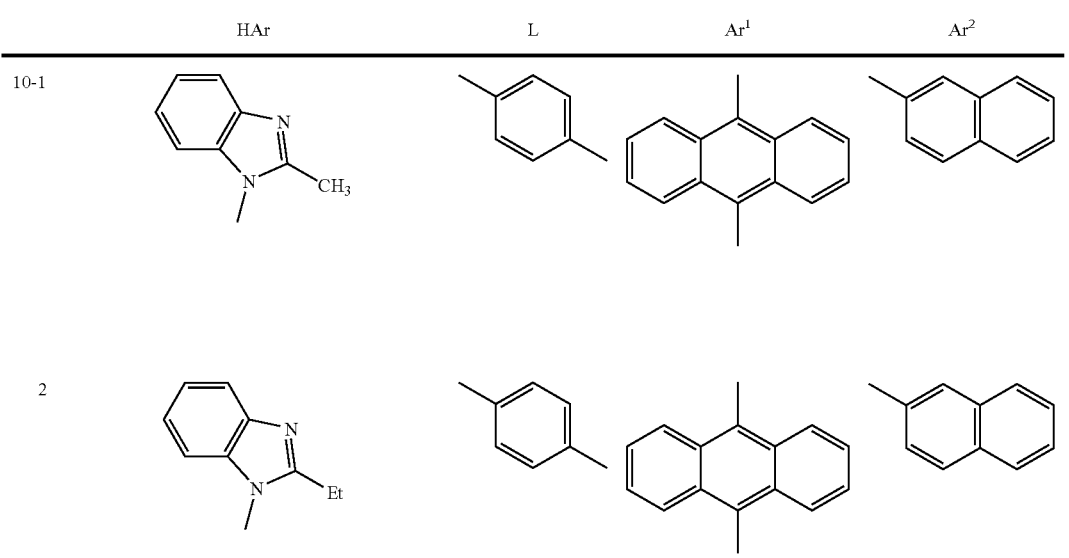

-continued

| | HAr—L—Ar³(—Ar³══—Ar¹—Ar²) | | | |
|---|---|---|---|---|
| | HAr | L | Ar¹ | Ar² |
| 3 | 1,7-dimethyl-2-phenyl-benzimidazole | p-phenylene | 9,10-anthracenediyl | 2-naphthyl |
| 4 | 1,6-dimethyl-2-phenyl-benzimidazole | p-phenylene | 9,10-anthracenediyl | 2-naphthyl |
| 5 | 1,5-dimethyl-2-phenyl-benzimidazole | p-phenylene | 9,10-anthracenediyl | 2-naphthyl |
| 6 | 1,4-dimethyl-2-phenyl-benzimidazole | p-phenylene | 9,10-anthracenediyl | 2-naphthyl |
| 7 | 1-methyl-2-phenyl-6-phenyl-benzimidazole | p-phenylene | 9,10-anthracenediyl | 2-naphthyl |
| 8 | 1-methyl-2-phenyl-5-phenyl-benzimidazole | p-phenylene | 9,10-anthracenediyl | 2-naphthyl |

-continued
| HAr—L—Ar³(—Ar³═—Ar¹—Ar²) | | | |
|---|---|---|---|
| HAr | L | Ar¹ | Ar² |
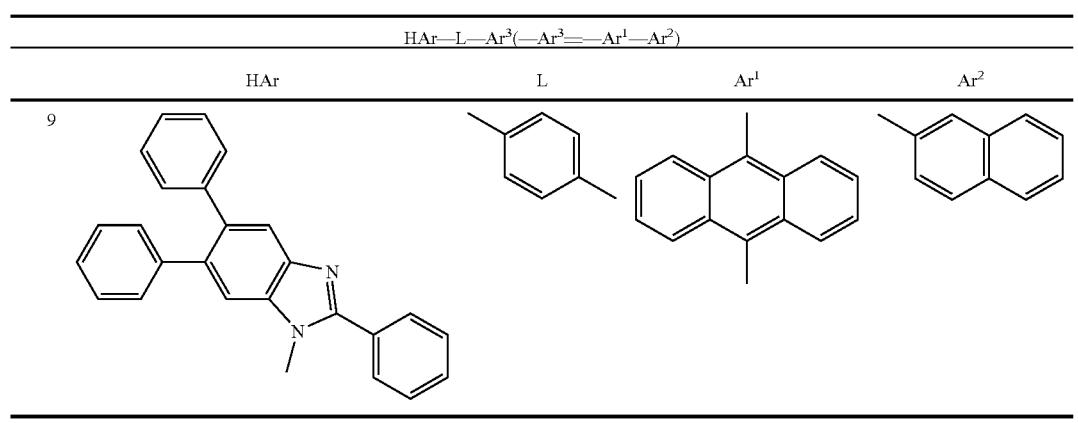
| HAr—L—Ar³(—Ar³═—Ar¹—Ar²) | | | |
|---|---|---|---|
| HAr | L | Ar¹ | Ar² |
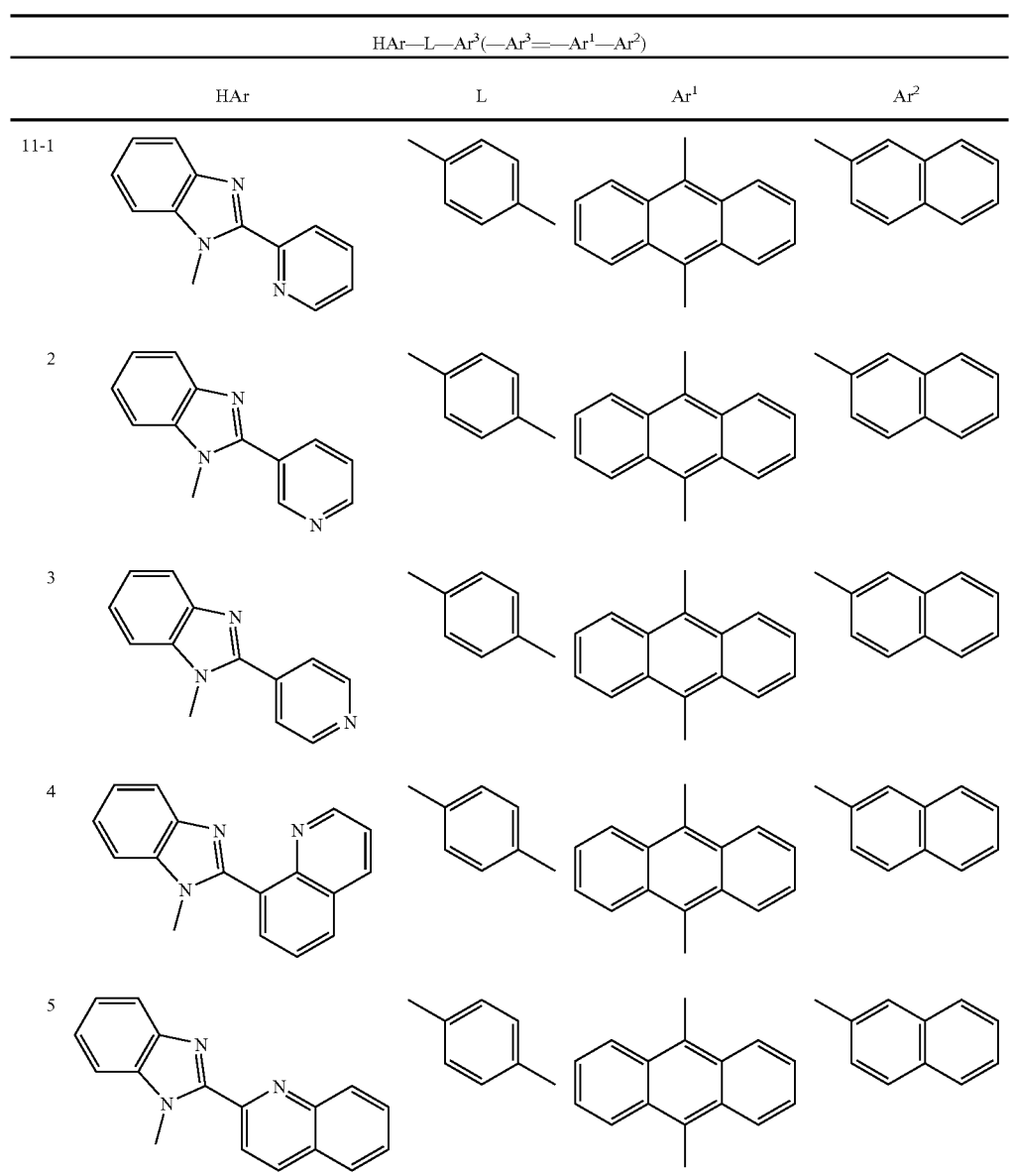

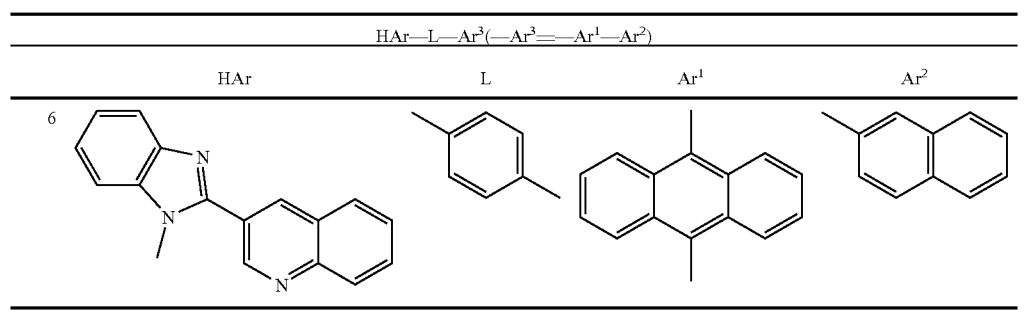
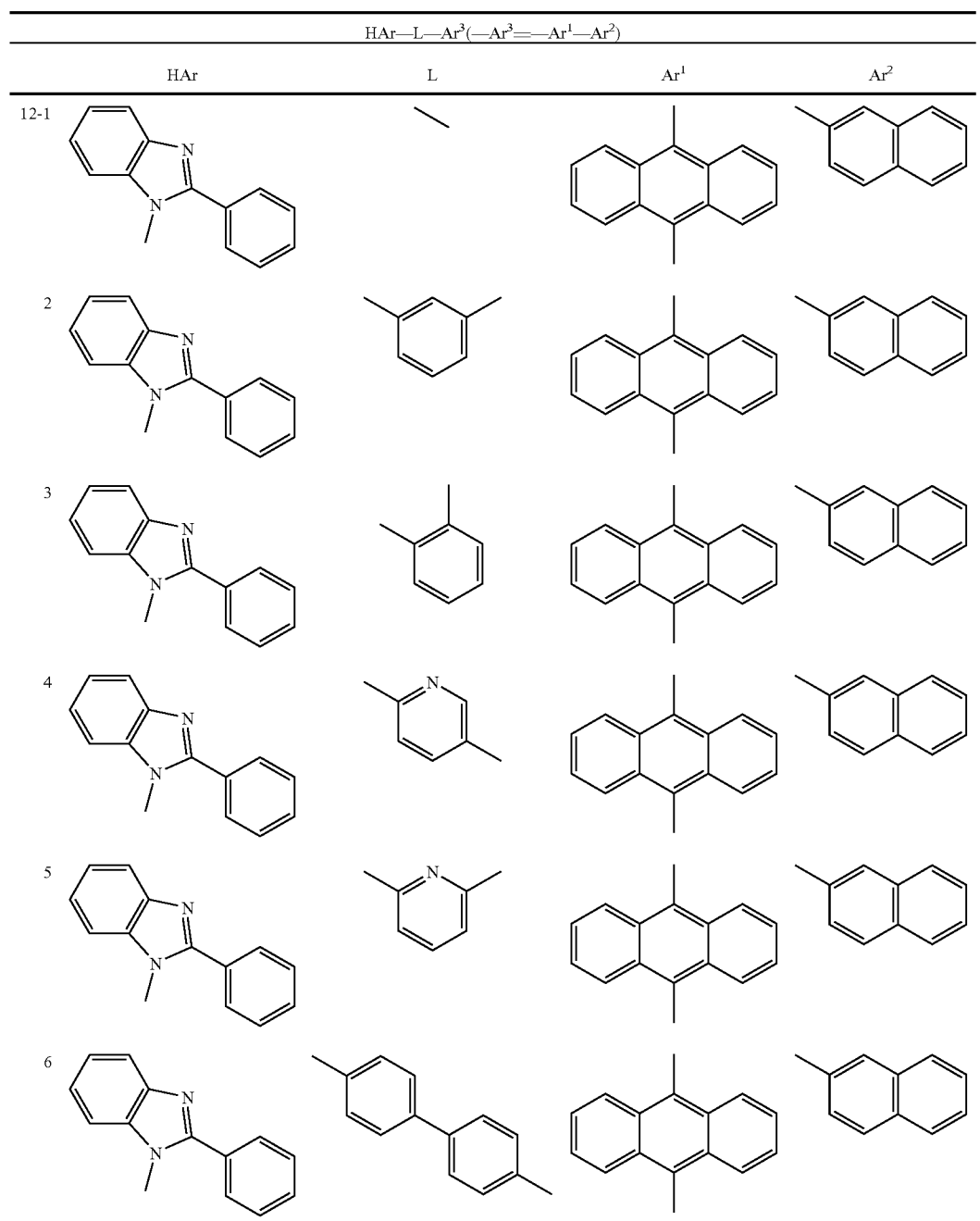

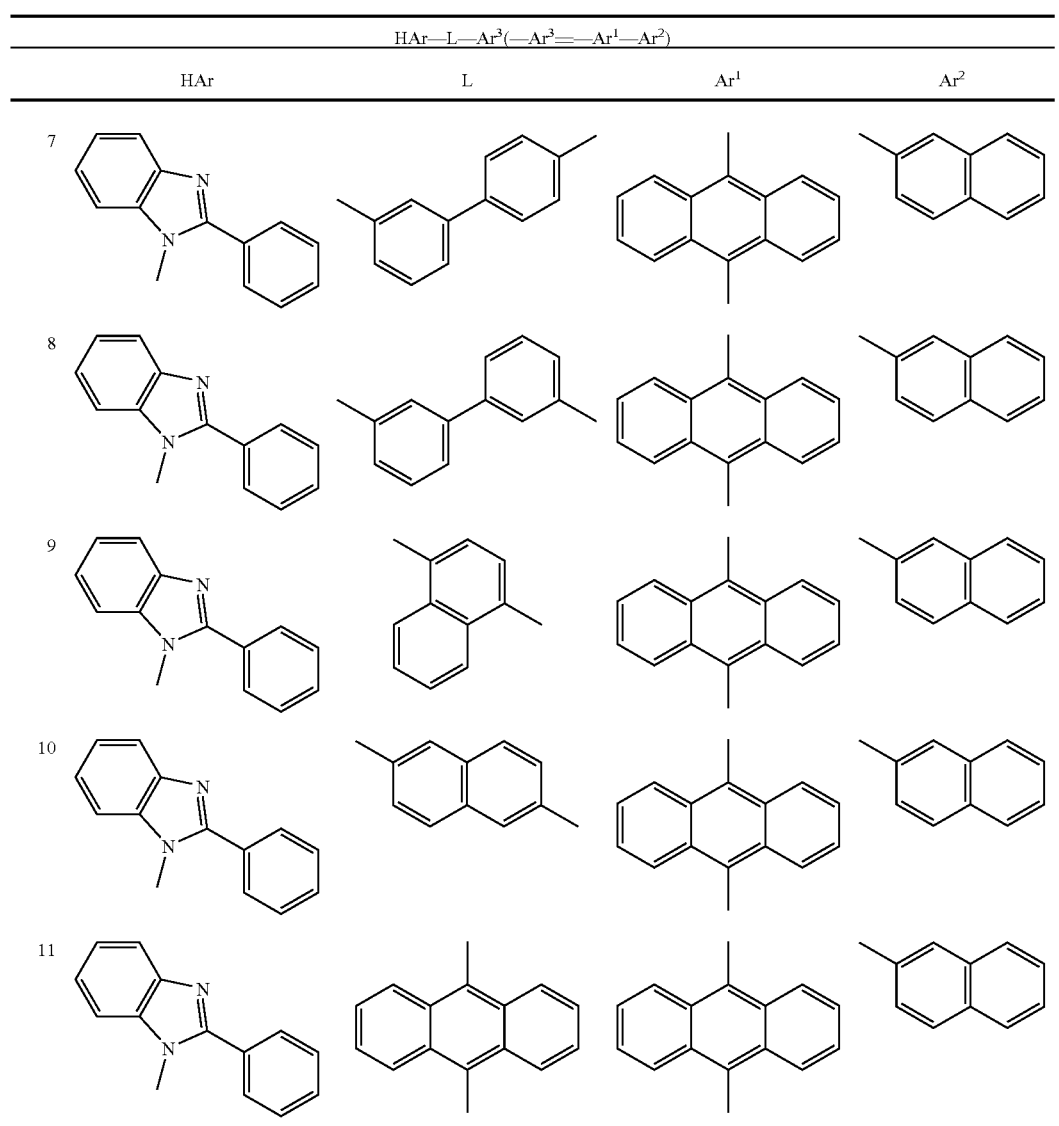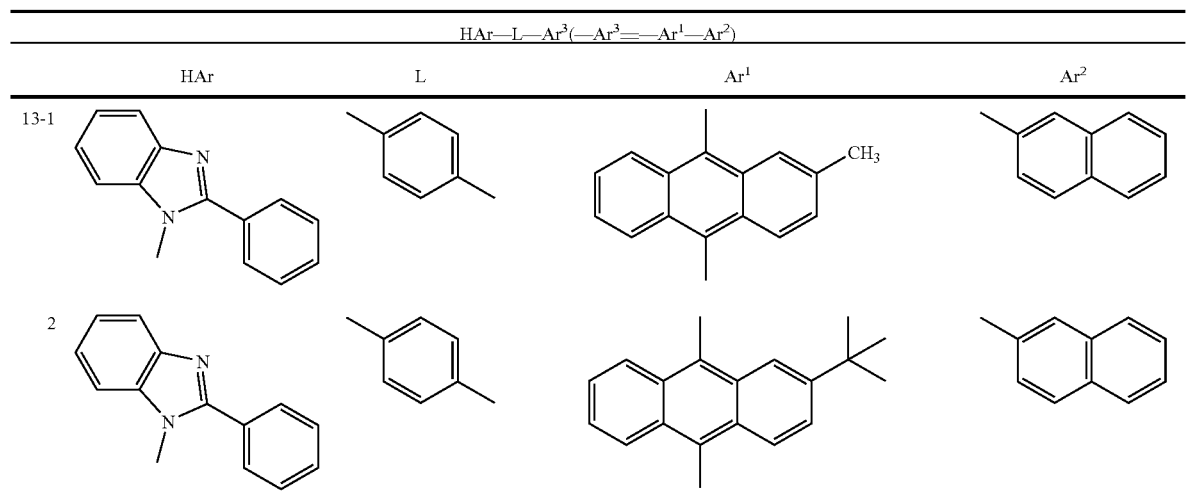

| HAr—L—Ar³(—Ar³=—Ar¹—Ar²) | | | |
|---|---|---|---|
| HAr | L | Ar¹ | Ar² |

(table contents are structural diagrams)

40

| HAr—L—Ar³(—Ar³=—Ar¹—Ar²) | | | |
|---|---|---|---|
| HAr | L | Ar¹ | Ar² |

-continued
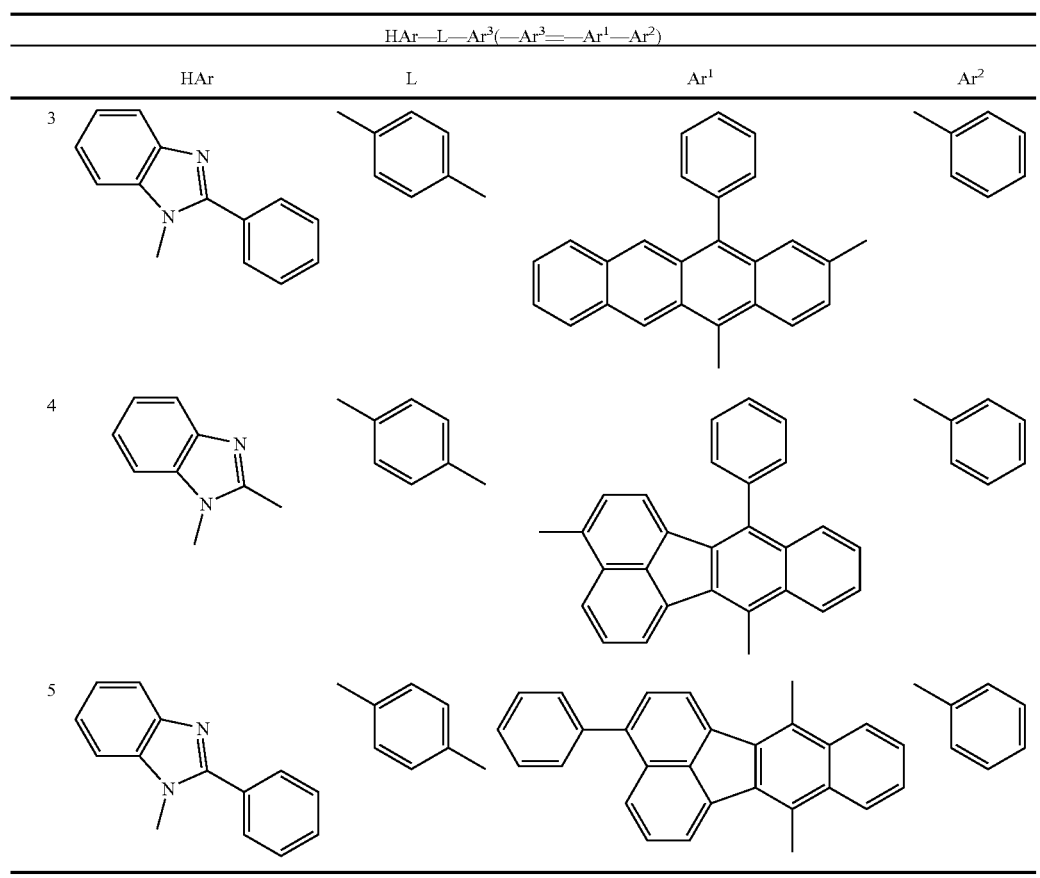
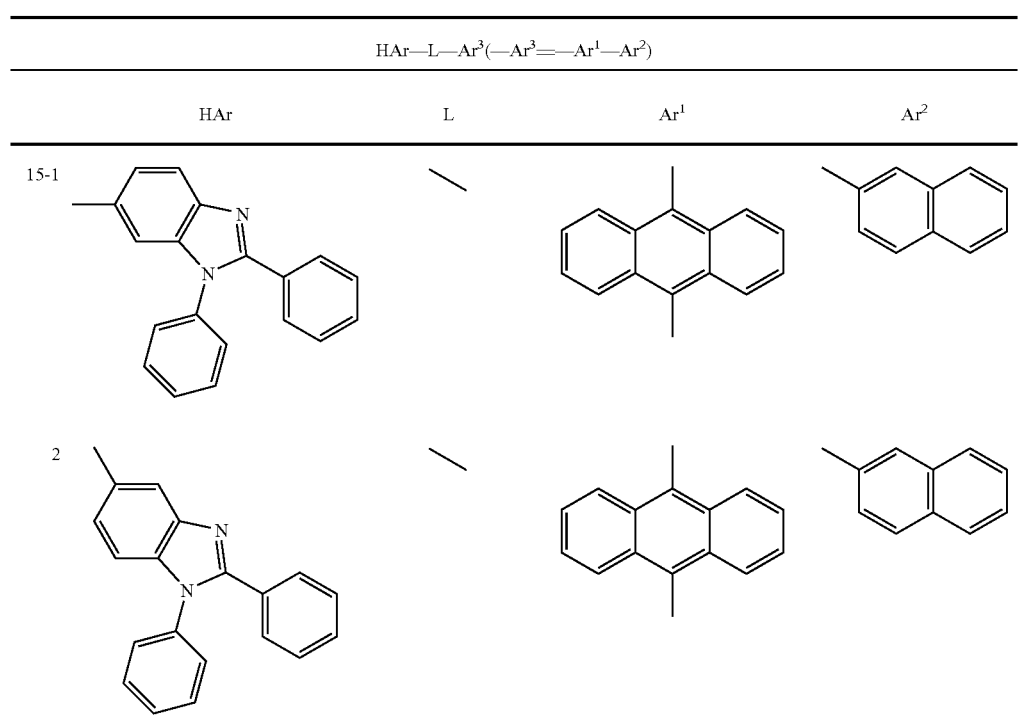

-continued
| HAr | L | Ar¹ | Ar² |
|---|---|---|---|
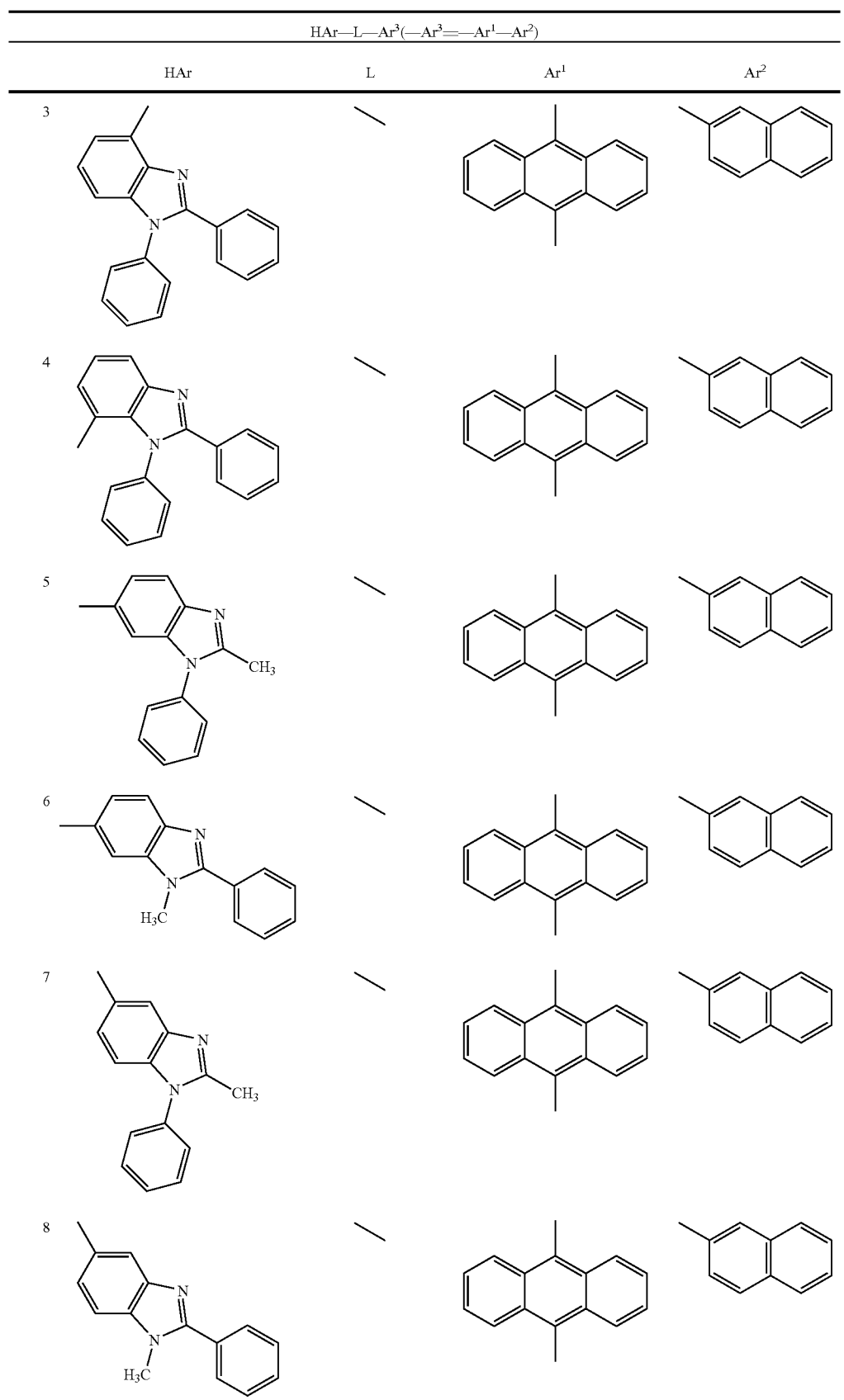

-continued
| HAr—L—Ar³(—Ar³══Ar¹—Ar²) | | | |
|---|---|---|---|
| HAr | L | Ar¹ | Ar² |
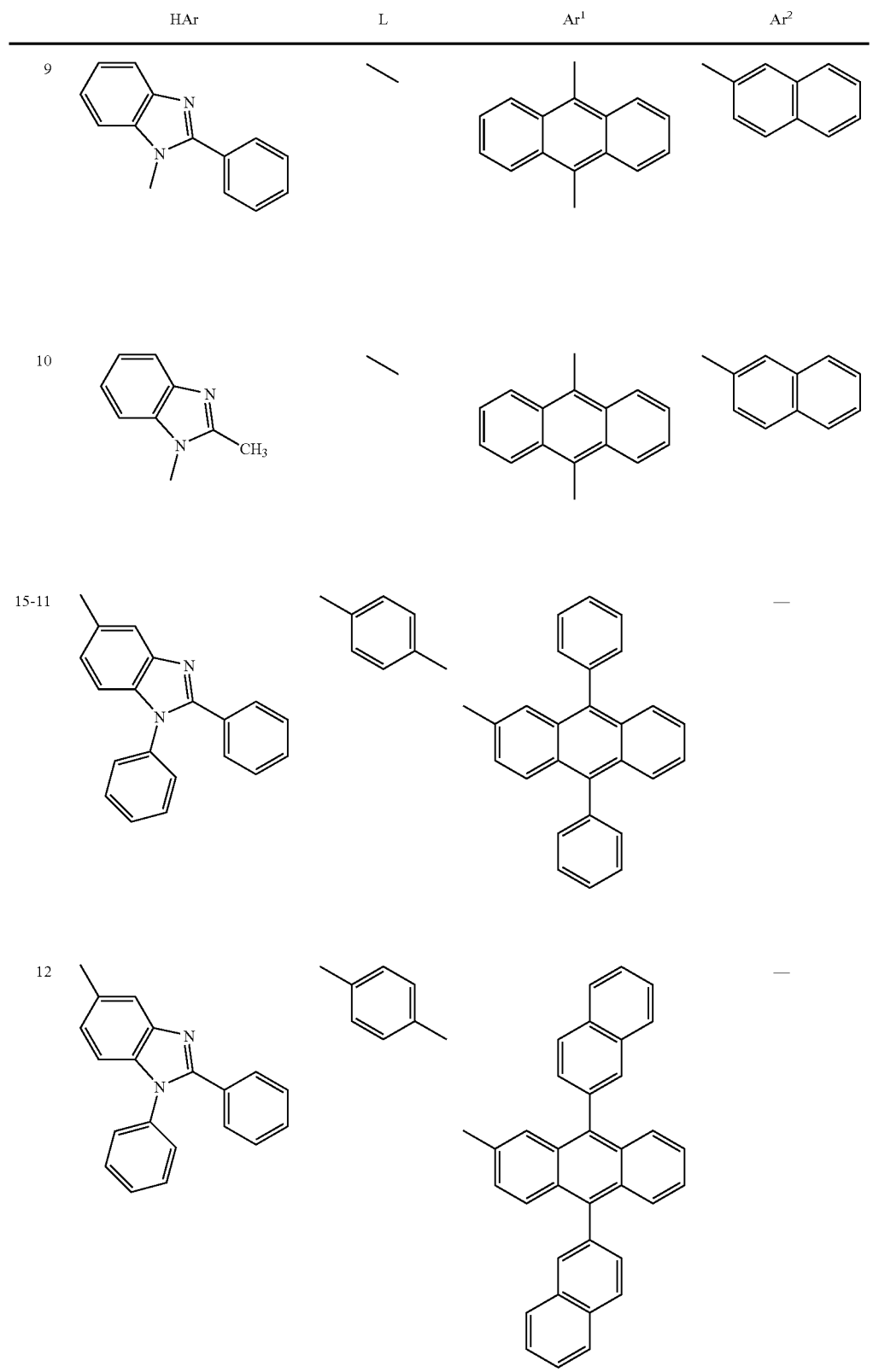

-continued
| HAr | L | Ar¹ | Ar² |
|---|---|---|---|
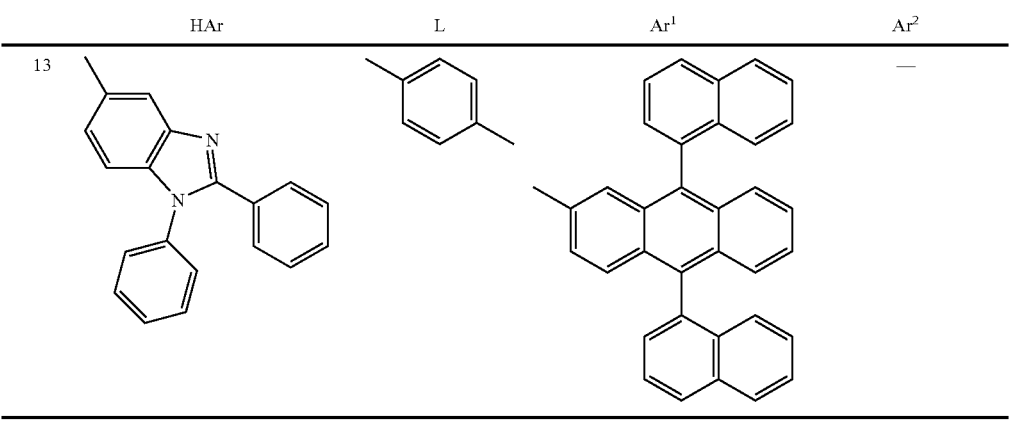
13
| HAr | L | Ar¹ | Ar² |
|---|---|---|---|
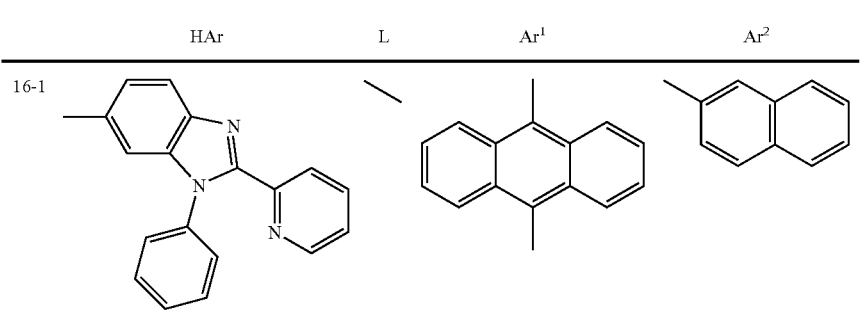
16-1
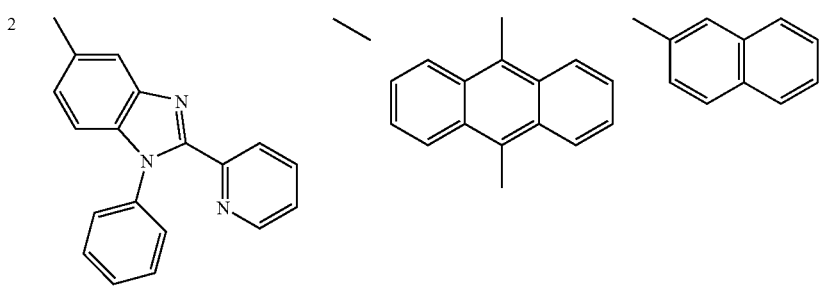
2
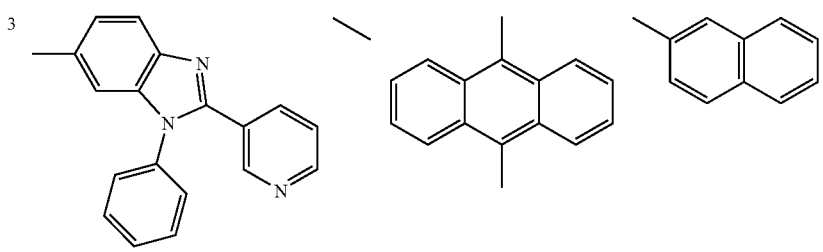
3

-continued
| HAr | L | Ar¹ | Ar² |
|---|---|---|---|
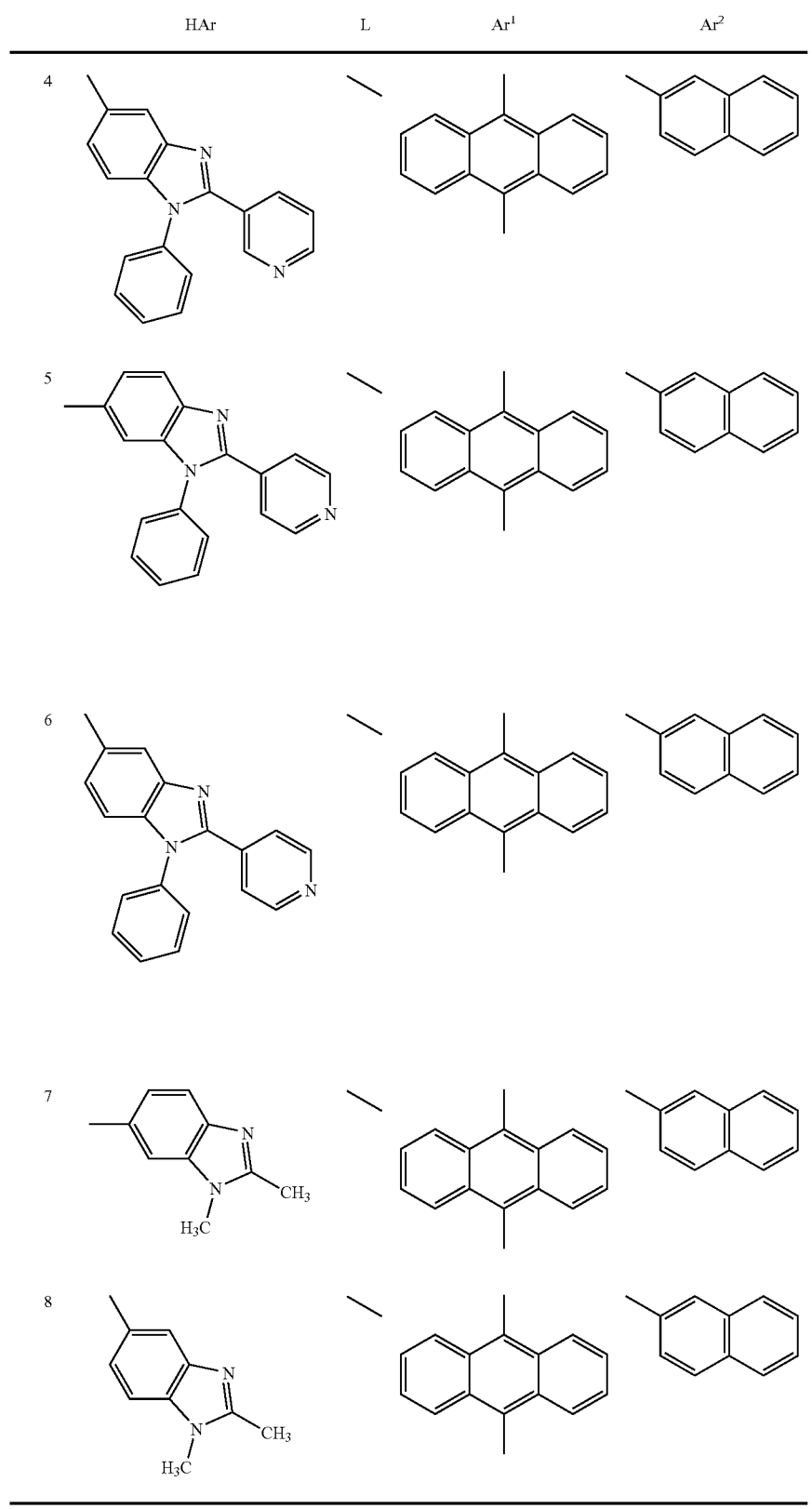

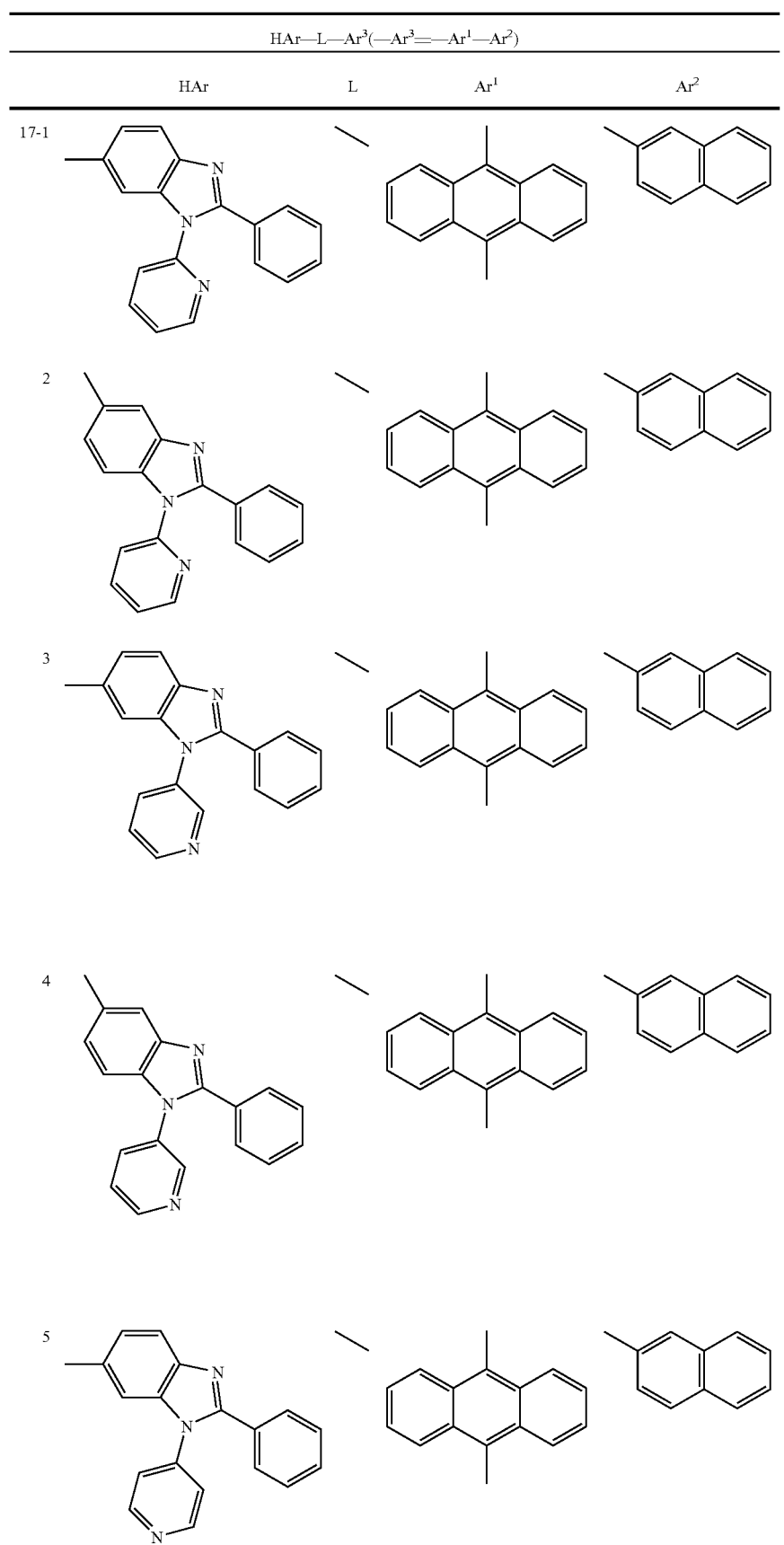

-continued

| HAr—L—Ar³(—Ar³=—Ar¹—Ar²) | | | |
|---|---|---|---|
| HAr | L | Ar¹ | Ar² |

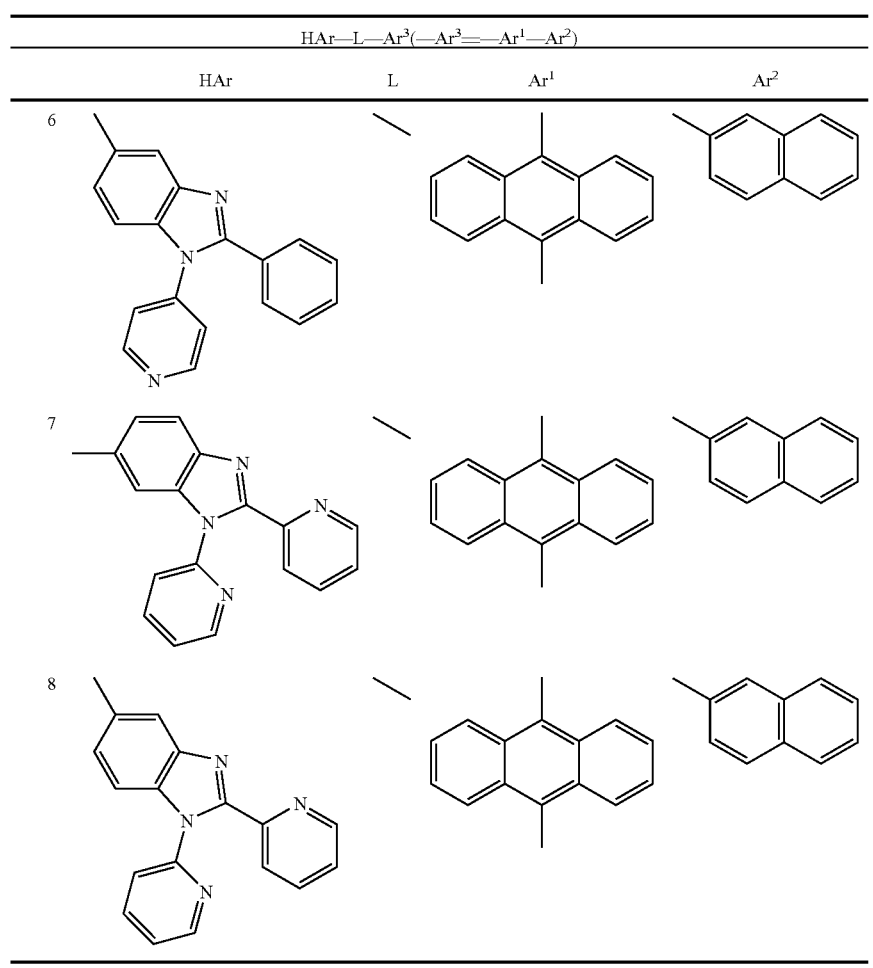

Of the above-mentioned specific examples, (1-1), (1-5), (1-7), (2-1), (3-1), (4-2), (4-6), (7-2), (7-7), (7-8), (7-9) and (9-7) are preferable, in particular.

The nitrogen-containing heterocyclic derivative of the invention may be a polymer compound containing the nitrogen-containing heterocyclic group or the nitrogen-containing heterocyclic derivative.

In the organic EL device of the invention, it is preferred that one or both of the host material of the emitting layer and the material forming the electron-injecting controlling layer be one or more compound selected from the group consisting of fused polycyclic aromatic compounds represented by the following formulas (A), (B) and (C), Ra-Ar¹⁰¹-Rb (A)

Ra-Ar¹⁰¹—Ar¹⁰²-Rb (B)

Ra-Ar¹⁰¹—Ar¹⁰²—Ar¹⁰³-Rb (C)

wherein $Ar^{101}$, $Ar^{102}$, $Ar^{103}$, Ra and Rb are independently a substituted or unsubstituted benzene ring, or a polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring; provided that the substituents of Ra and Rb are not an aryl group, and $Ar^{1}$, $Ar^{2}$, $Ar^{3}$, Ra and Rb are not a substituted or unsubstituted benzene ring at the same time.

In the above fused polycyclic aromatic ring compound, it is preferred that one or both of the Ra and Rb be a group selected from a substituted or unsubstituted phenanthrene ring, a substituted or unsubstituted benzo[c]phenanthrene ring and a substituted or unsubstituted fluoranthene ring.

Conventionally, unstable materials such as BAlq and BCP have been used as the hole-blocking layer. In the invention, the electron-injecting controlling layer is formed of a chemically stable fused polycyclic aromatic compound. Therefore, stability of molecules is enhanced to prolong the lifetime of the device. In addition, by using a chemically stable fused polycyclic aromatic compound in the electron-injecting controlling layer, significant degradation of peripheral materials (in particular, materials forming layers on the electron-transporting layer side), which is a serious problem caused by a change in carrier balance at the time of high-temperature driving, can be suppressed.

In the organic EL device of the invention, it is preferred that one or both of the host material of the emitting layer and the material forming the electron-injecting controlling layer be a fused polycyclic aromatic compound, and the fused polycyclic aromatic skeleton part be contained in the chemical structure as a group of divalent or more valences.

The fused polycyclic aromatic skeleton part of the above-mentioned fused polycyclic aromatic compound may have a substituent.

Examples of the substituent of the fused polycyclic aromatic skeleton part include a halogen atom, a hydroxyl group, a substituted or unsubstituted amino group, a nitro group, a cyano group, a substituted or unsubstituted alkyl group, a substituted or unsubstituted alkenyl group, a substituted or unsubstituted cycloalkyl group, a substituted or unsubstituted alkoxy group, a substituted or unsubstituted aromatic hydrocarbon group, a substituted or unsubstituted aromatic heterocyclic group, a substituted or unsubstituted aralkyl group, a substituted or unsubstituted aryloxy group, and a substituted or unsubstituted alkoxycarbonyl group or a carboxyl group.

If the fused polycyclic aromatic skeleton part has a plurality of substituent, these substituents may form a ring.

Specific examples of the substituent of the fused polycyclic aromatic skeleton part are given below.

As the halogen atom, fluorine, chlorine, bromine and iodine can be given.

The substituted or unsubstituted amino group is shown by —NX$^1$X$^2$. As examples of X$^1$ and X$^2$, X$^1$ and X$^2$ are independently a hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisopropyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4''-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 1-phenoxadinyl group, 2-phenoxadinyl group, 3-phenoxadinyl group, 4-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted alkyl group include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminoethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitroethyl, 1-nitroethyl, 2-nitroethyl, 2-nitroisobutyl, 1,2-dinitroethyl, 1,3-dinitroisopropyl, 2,3-dinitro-t-butyl and 1,2,3-trinitropropyl.

Examples of the substituted or unsubstituted alkenyl group include vinyl, allyl, 1-butenyl, 2-butenyl, 3-butenyl, 1,3-butandienyl, 1-methylvinyl, styryl, 4-diphenylaminostyryl, 4-di-p-tolylaminostyryl, 4-di-m-tolylaminostyryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl and 3-phenyl-1-butenyl.

Examples of the substituted or unsubstituted cycloalkyl group include cyclopropyl, cyclobutyl, cyclopentyl, cyclohexyl and 4-methylcyclohexyl.

The substituted or unsubstituted alkoxy group is a group shown by —OY. Examples of Y include a methyl group, ethyl group, propyl group, isopropyl group, n-butyl group, s-butyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisopropyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or unsubstituted aryl group include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group and 4''-t-butyl-p-terphenyl-4-yl group.

Examples of the substituted or unsubstituted heteroaryl group include 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 10-phenothiadinyl group, 1-phenoxadinyl group, 2-phenoxadinyl group, 3-phenoxadinyl group, 4-phenoxadinyl group, 10-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

Examples of the substituted or unsubstituted aralkyl group include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, p-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloroisopropyl-2-phenylisopropyl group.

The substituted or unsubstituted aryloxy group is shown by —OZ. Examples of Z include a phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiadinyl group, 2-phenothiadinyl group, 3-phenothiadinyl group, 4-phenothiadinyl group, 1-phenoxadinyl group, 2-phenoxadinyl group, 3-phenoxadinyl group, 4-phenoxadinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group, and 4-t-butyl-3-indolyl group.

The substituted or unsubstituted alkoxycarbonyl group is shown by —COOY. Examples of Y include a methyl group, ethyl group, propyl group, isopropyl group, n-butyl group, s-butyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

In the organic EL device of the invention, it is preferred that one or both of the host material of the emitting layer and the material forming the electron-injecting controlling layer be a fused polycyclic aromatic compound, and that the fused polycyclic aromatic skeleton part have a substituent. The substituent is preferably a substituted or unsubstituted aryl group or a substituted or unsubstituted heteroaryl group.

By introducing an aryl group or a heteroaryl group as the substituent, an energy gap can be adjusted or molecular agglomeration can be prevented, whereby the device life can be prolonged.

In the organic EL device of the invention, it is preferred that the substituent of the fused polycyclic aromatic skeleton have no carbazole skeleton. By incorporating a carbozole group as the substituent to a fused polycyclic aromatic compound, a singlet energy gap Eg(S) is increased by an increase in ionization potential, and as a result, it becomes difficult to realize a multilayer structure provided with a hole-transporting layer which helps injection of holes from an anode to an emitting layer, an electron-transporting layer which helps injection of electrons from a cathode, or the like. The reason therefor is considered to be as follows. The Eg(S) of the hole-transporting layer or the electron-transporting layer is not so large. Therefore, an excessively large energy gap Eg (S) is not preferable for the prolongation of a device life. In addition, if a carbazole group is introduced as a substituent into a fused polycyclic aromatic compound, it can be applied as a host material to a material which emits phosphorescence having a shorter wavelength. Introducing a carbazole group which is normally weak to oxidization is not preferable since it results in a shortened device life.

In the organic EL device of the invention, it is preferred that one or both of the host material of the emitting layer and the material for forming the electron-injecting controlling layer be a fused polycyclic aromatic compound, and that the fused polycyclic aromatic skeleton part be any one selected from the group consisting of compounds shown by the following formulas (1) to (4):

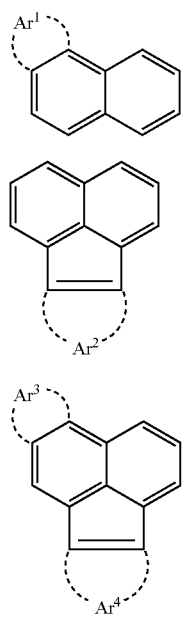

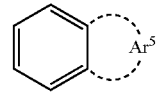

In formulas (1) to (4), $Ar^1$ to $Ar^5$ are a substituted or unsubstituted fused ring structure having 4 to 16 ring carbon atoms.

As the compound shown by formula (1), a substituted or unsubstituted phenanthrene, chrysene or the like can be given, for example.

As the compound shown by formula (2), a substituted or unsubstituted acenaphthylene, acenaphthene, fluoranthene or the like can be given, for example.

As the compound shown by formula (3), a substituted or unsubstituted benzofluoranthene or the like can be given, for example.

As the compound shown by formula (4), a simple substance, a derivative or the like of a substituted or unsubstituted naphthalene can be given, for example.

As the naphthalene derivative, a compound shown by formula (4A) can be given, for example.

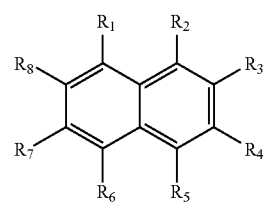

In formula (4A), $R_1$ to $R_8$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

Specific examples of the naphthalene derivative include the following:

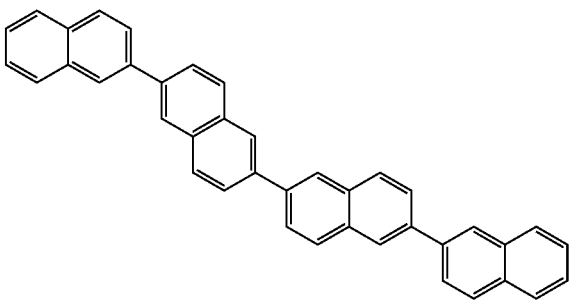

-continued

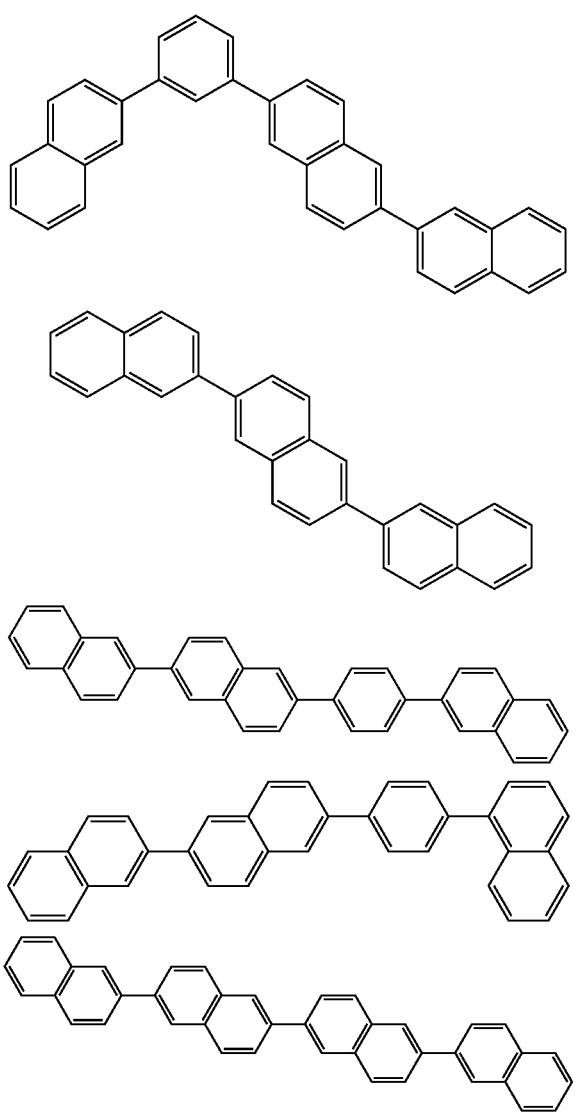

-continued

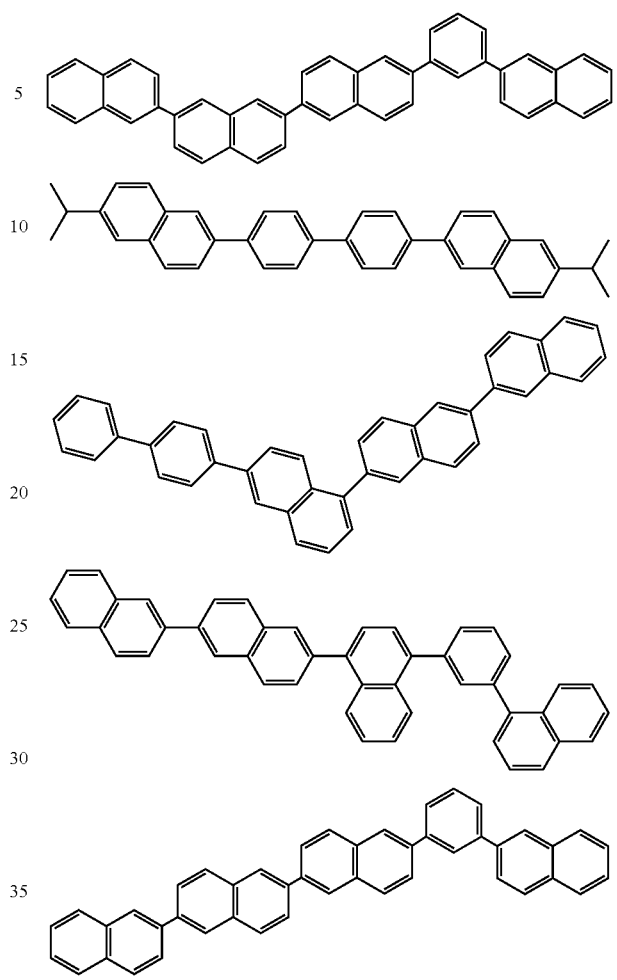

In the organic EL device of the invention, it is preferred that the above-mentioned fused polycyclic aromatic skeleton part be the phenanthrene shown by the following formula (5) or the derivative thereof.

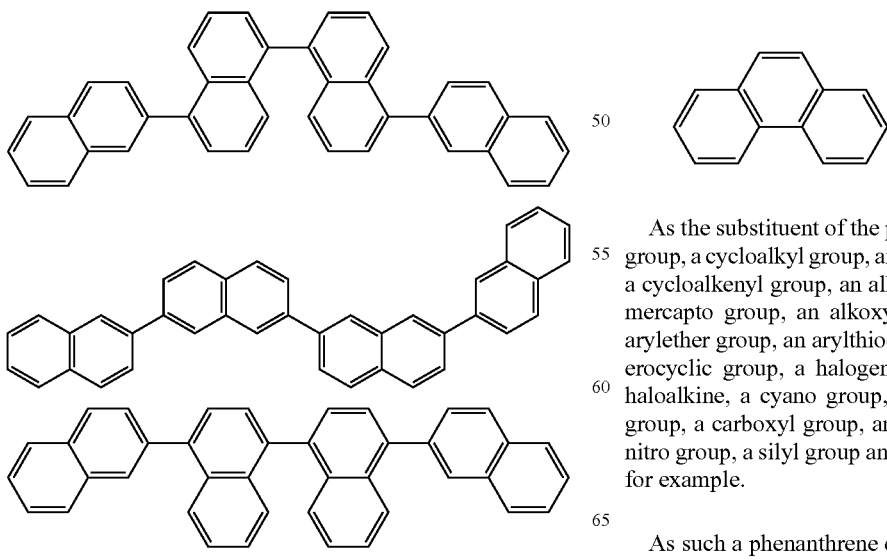

(5)

As the substituent of the phenanthrene derivative, an alkyl group, a cycloalkyl group, an aralkyl group, an alkenyl group, a cycloalkenyl group, an alkinyl group, a hydroxyl group, a mercapto group, an alkoxy group, an alkylthio group, an arylether group, an arylthioether group, an aryl group, a heterocyclic group, a halogen, a haloalkane, a haloalkene, a haloalkine, a cyano group, an aldehyde group, a carbonyl group, a carboxyl group, an ester group, an amino group, a nitro group, a silyl group and a siloxanyl group can be given, for example.

As such a phenanthrene derivative, one shown by the following formula (5A) can be given.

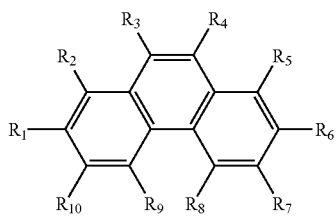
(5A)

In formula (5A), $R_1$ to $R_{10}$ are independently a hydrogen atom, a substituent selected from a substituted or unsubstituted aryl group having 5 to 30 ring carbon atoms, a branched or linear alkyl group having 1 to 30 carbon atoms, a substituted or unsubstituted cycloalkyl group having 3 to 20 carbon atoms or a substituent formed of a combination thereof.

Specific examples of the phenanthrene derivative shown by formula (5) include the following:

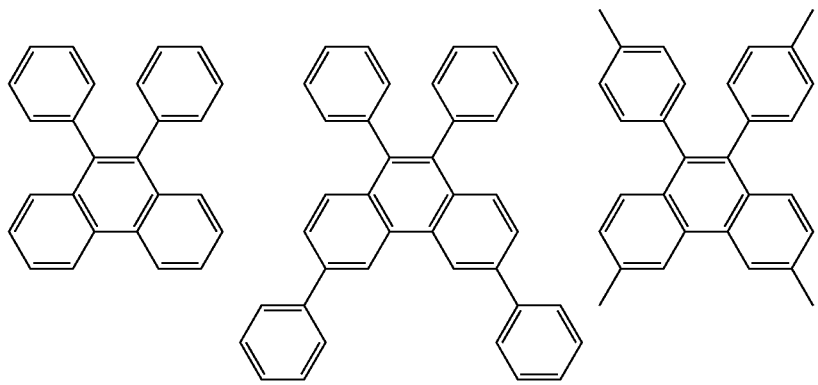

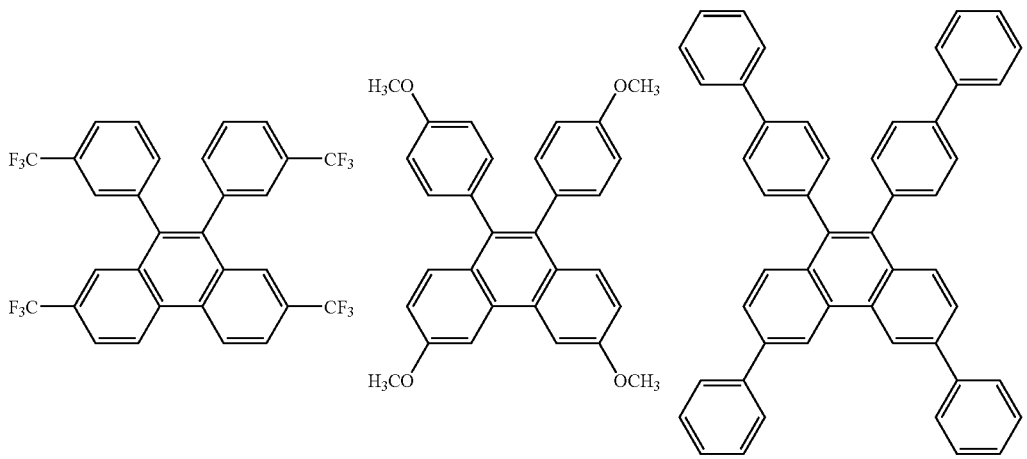

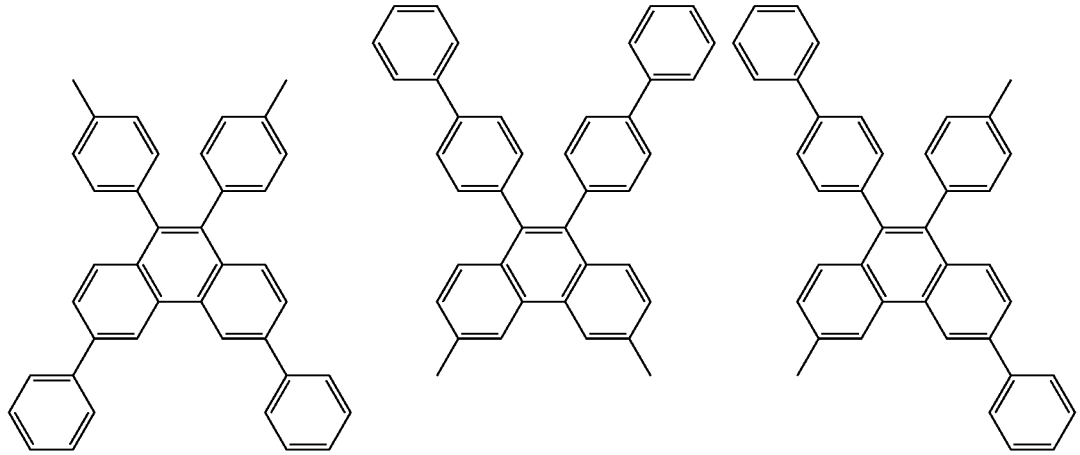

117
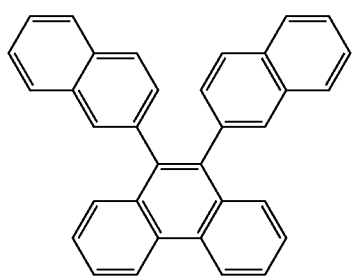
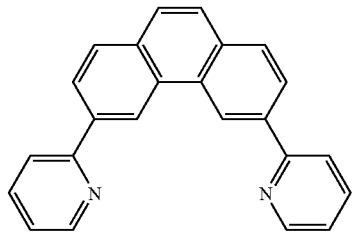
118
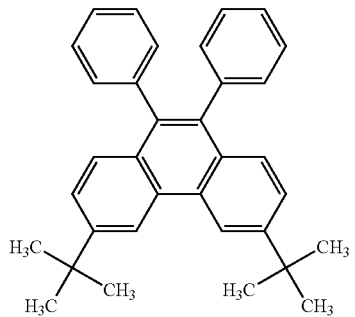
-continued
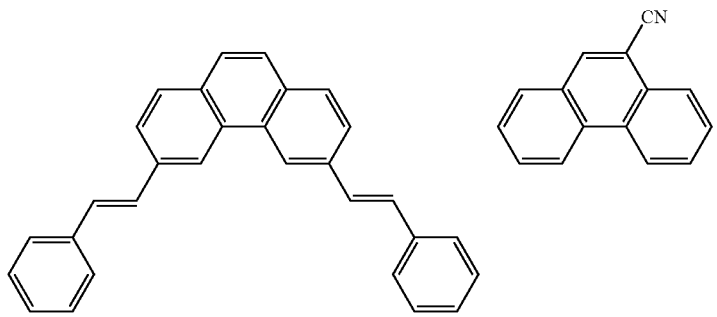
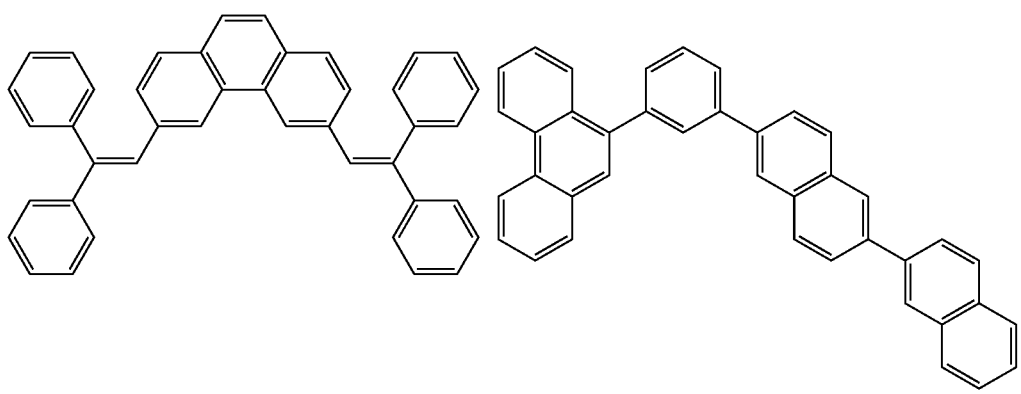
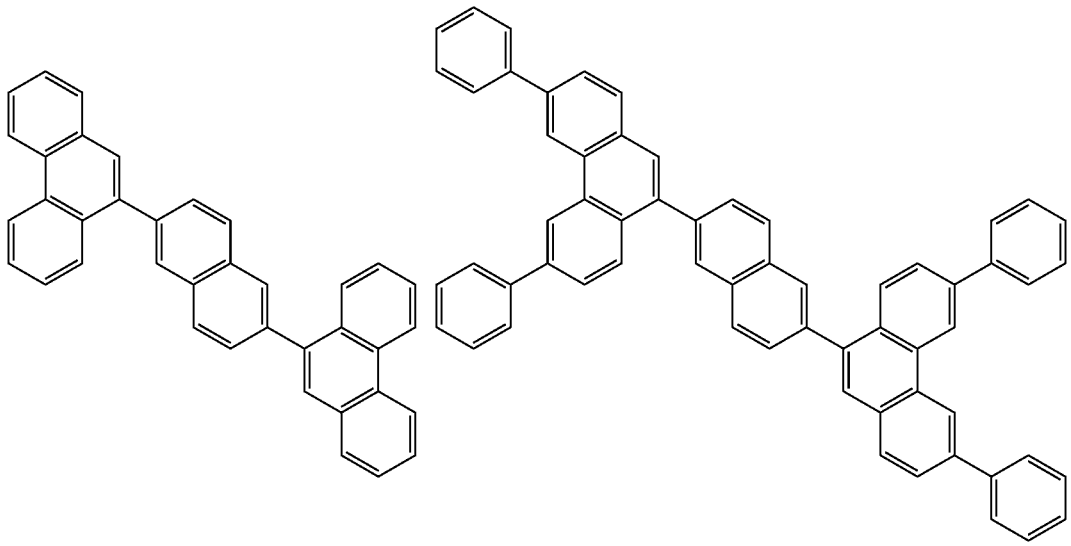

-continued
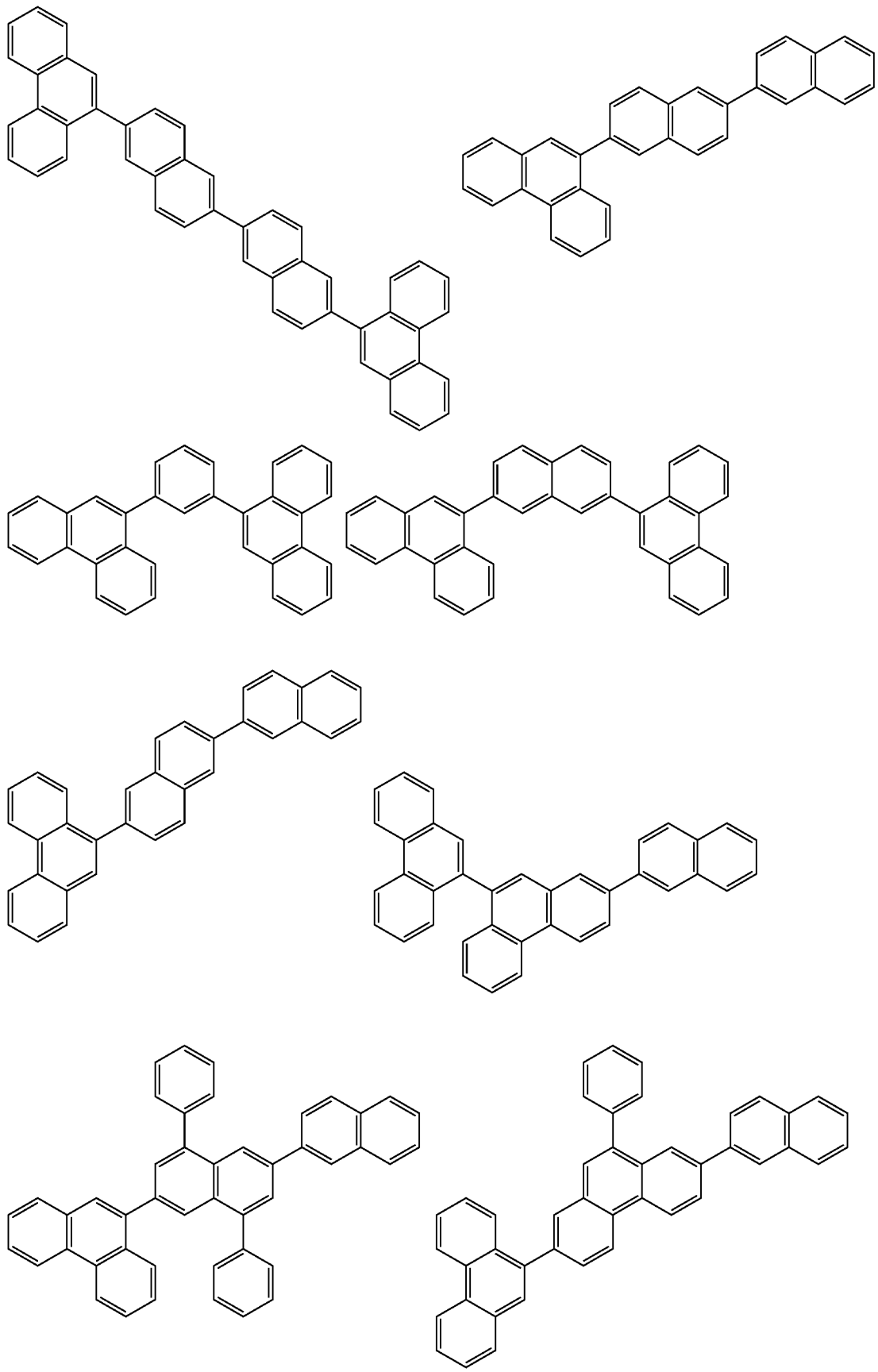

-continued
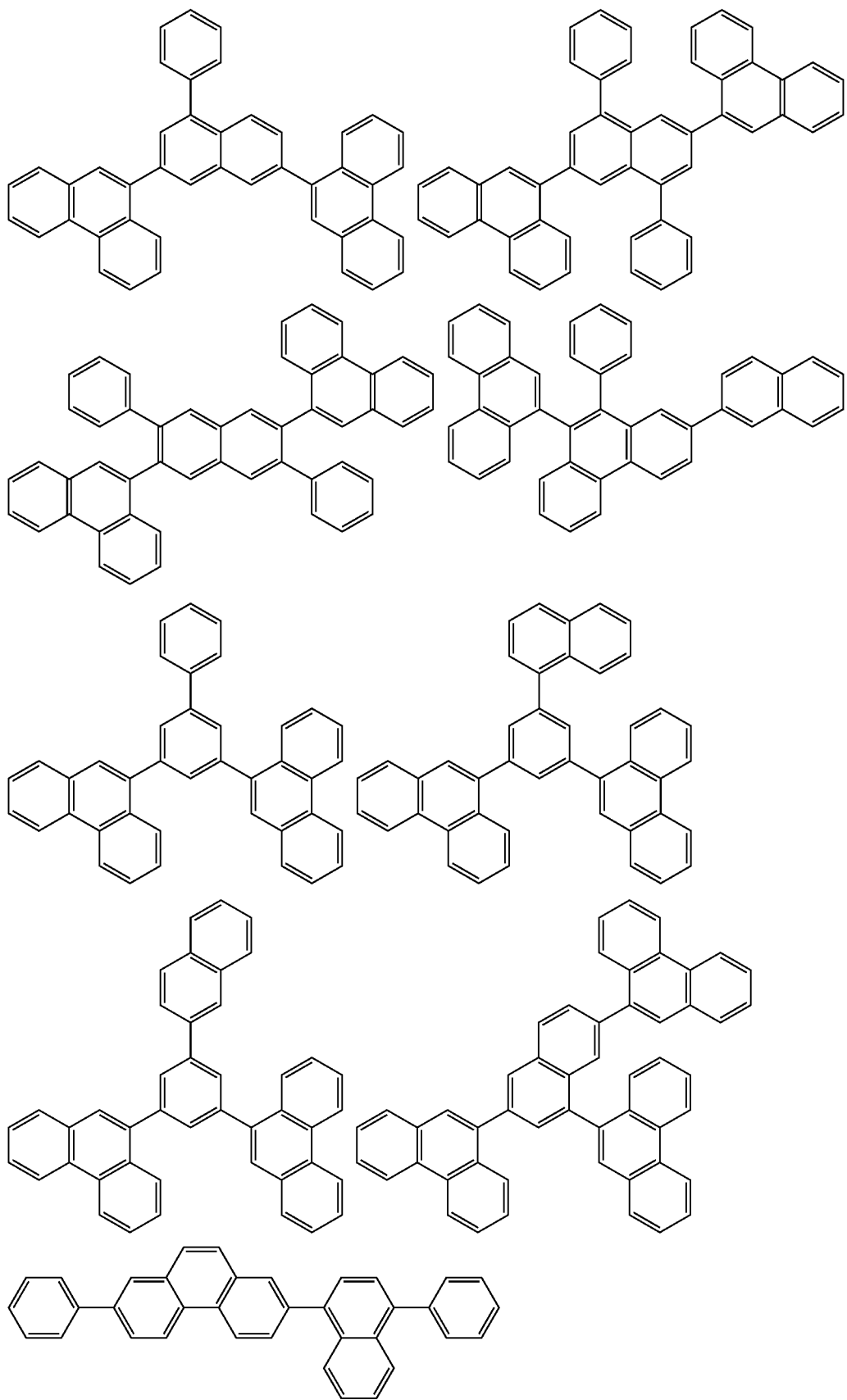

-continued
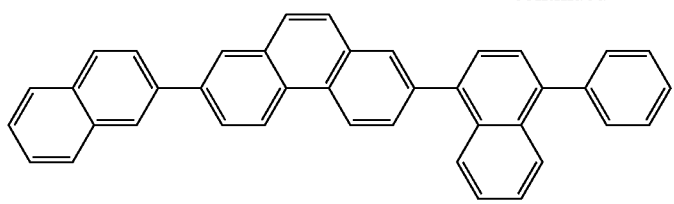
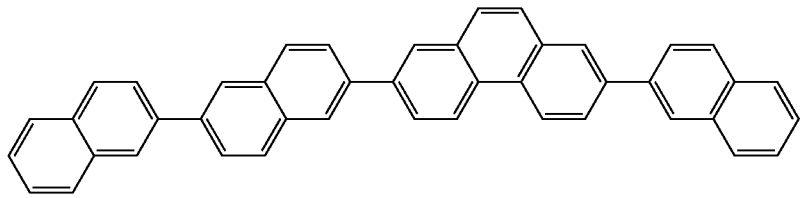
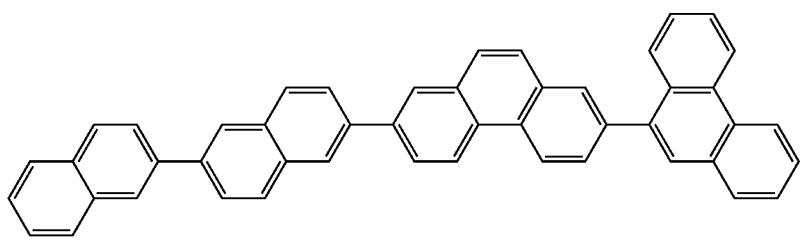
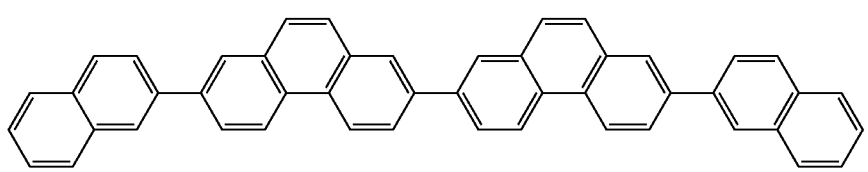
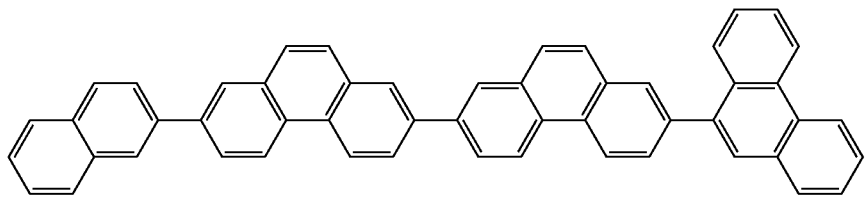
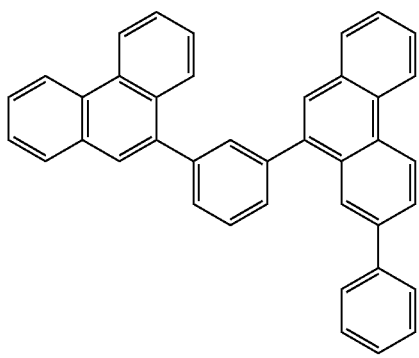
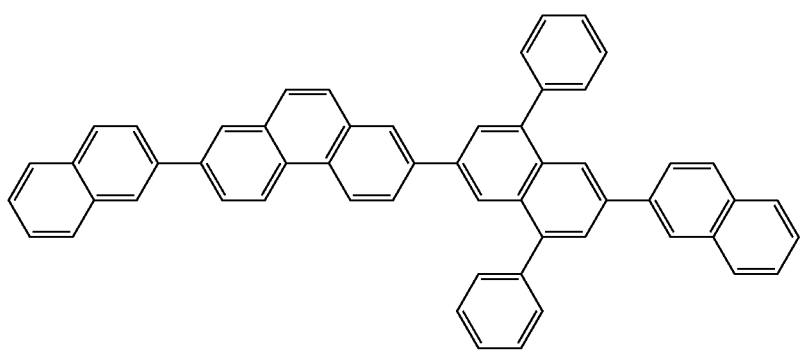

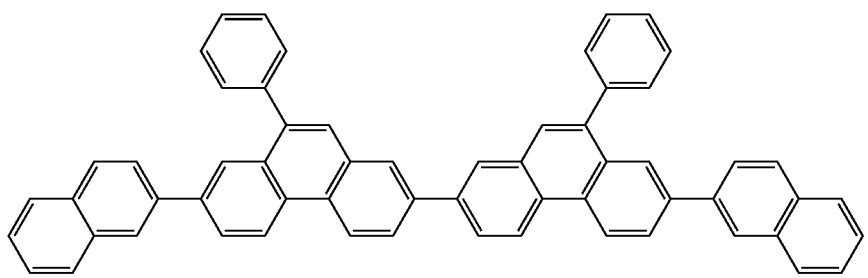
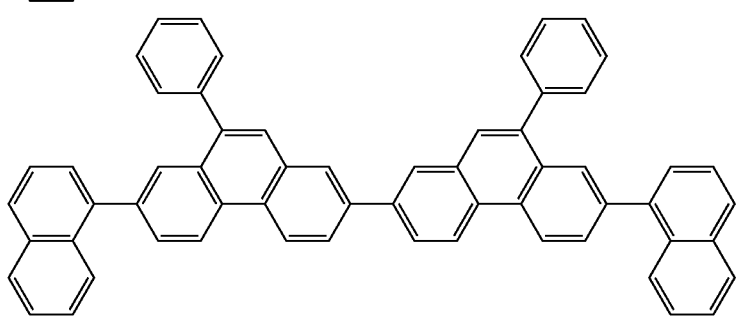
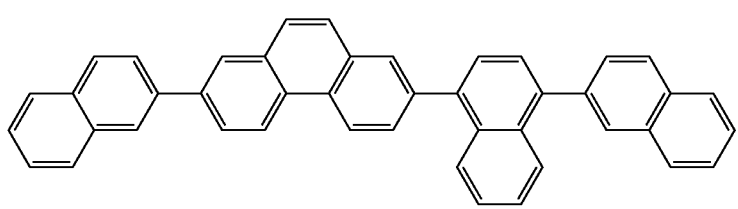
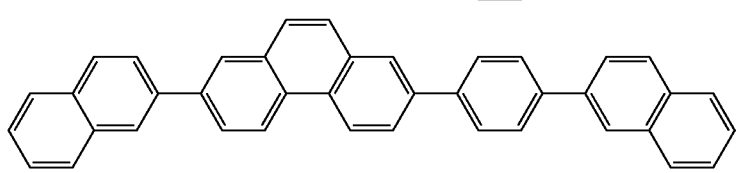
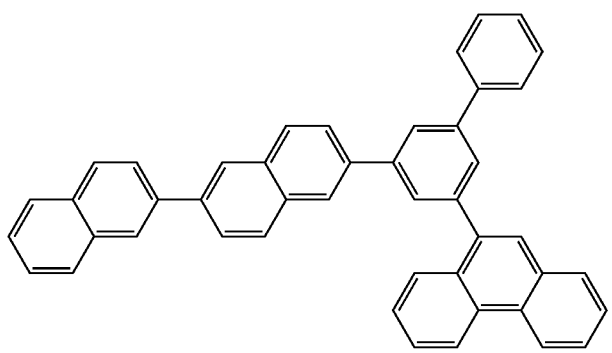
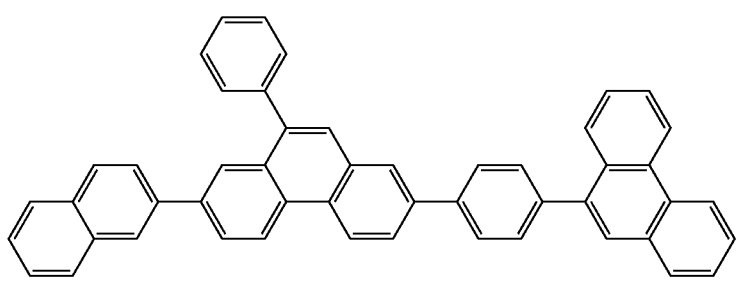

-continued
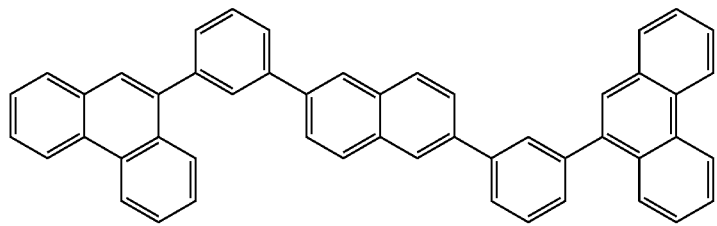

-continued
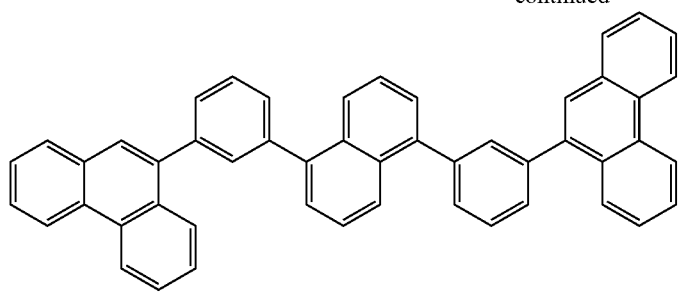

-continued
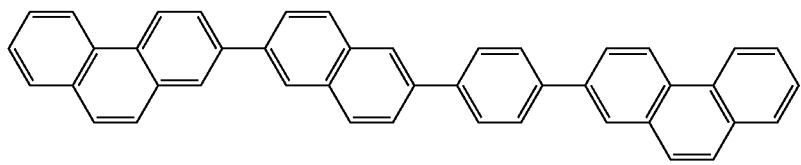
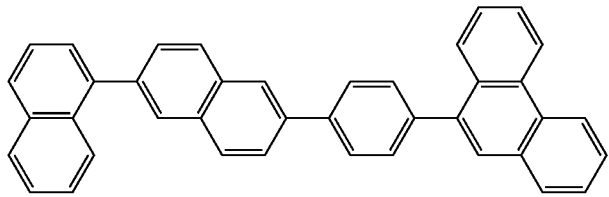
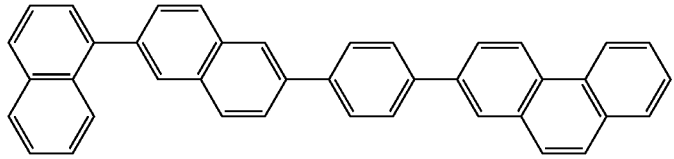
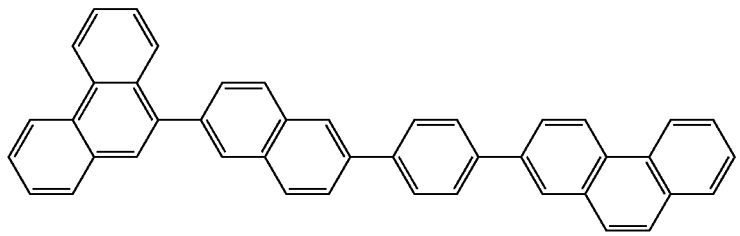
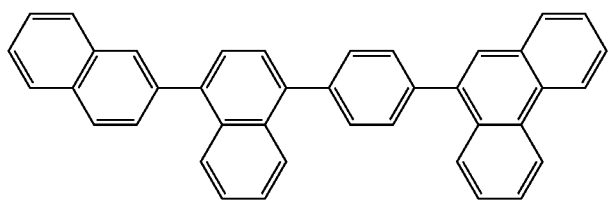
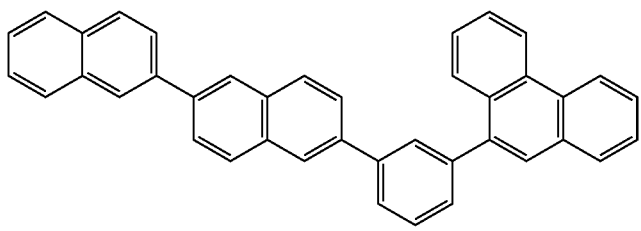
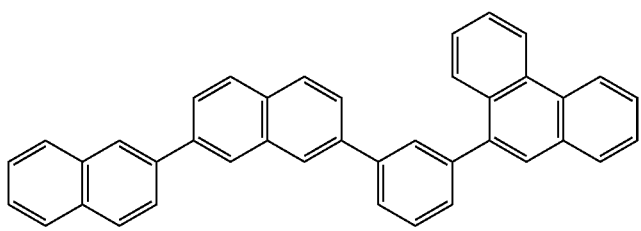
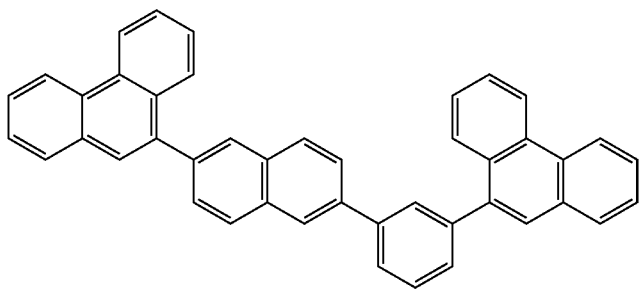

-continued
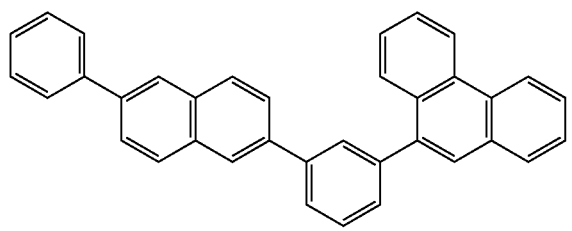
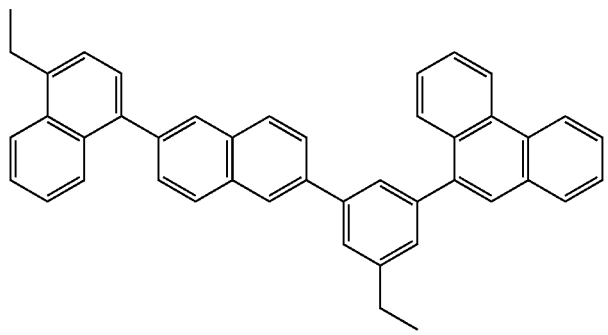
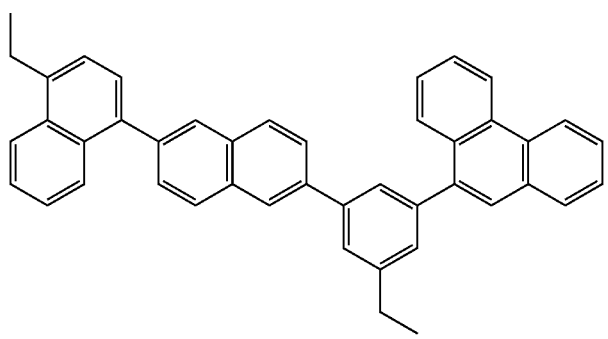
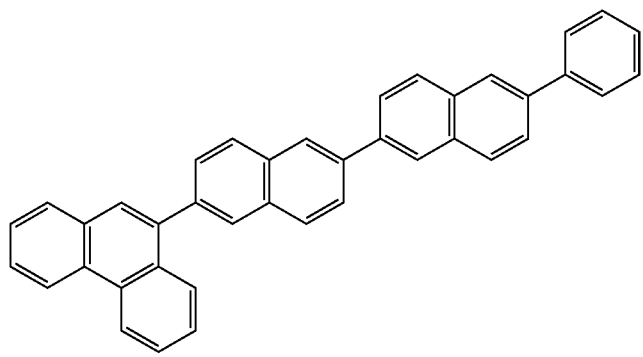
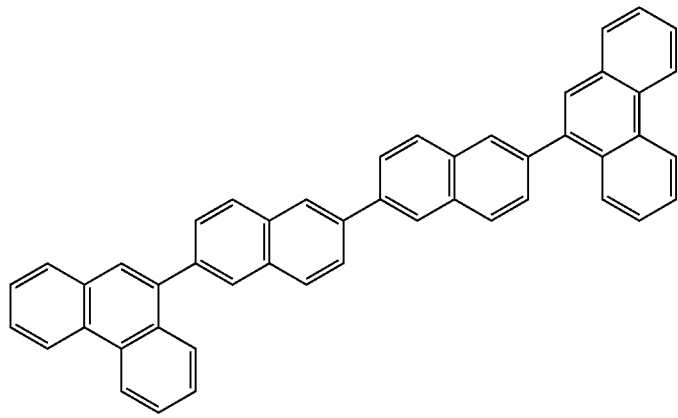

-continued
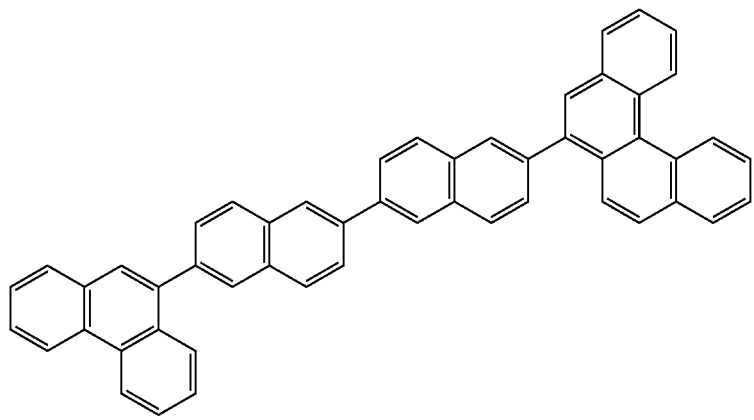
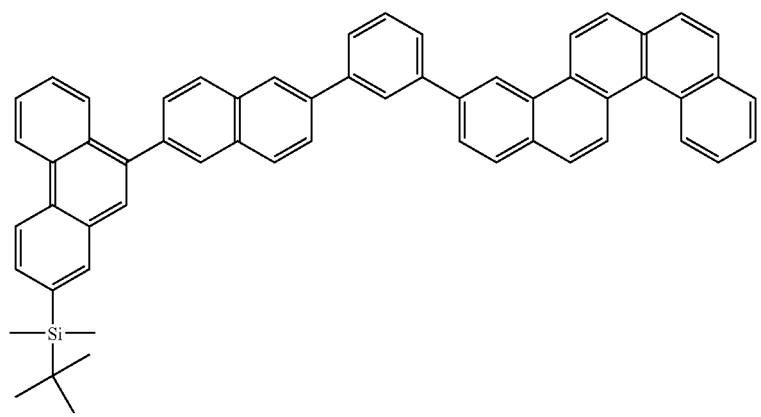
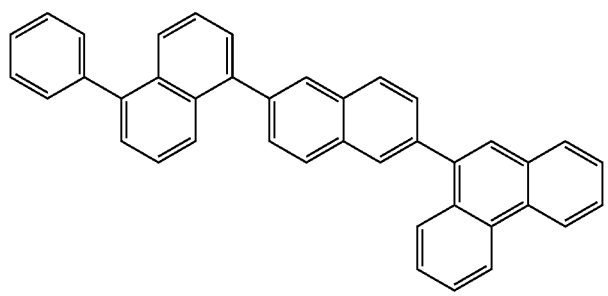
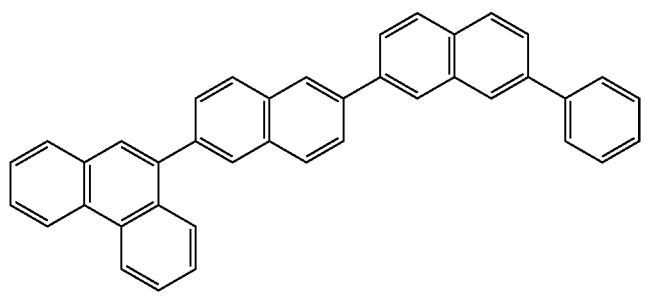

-continued
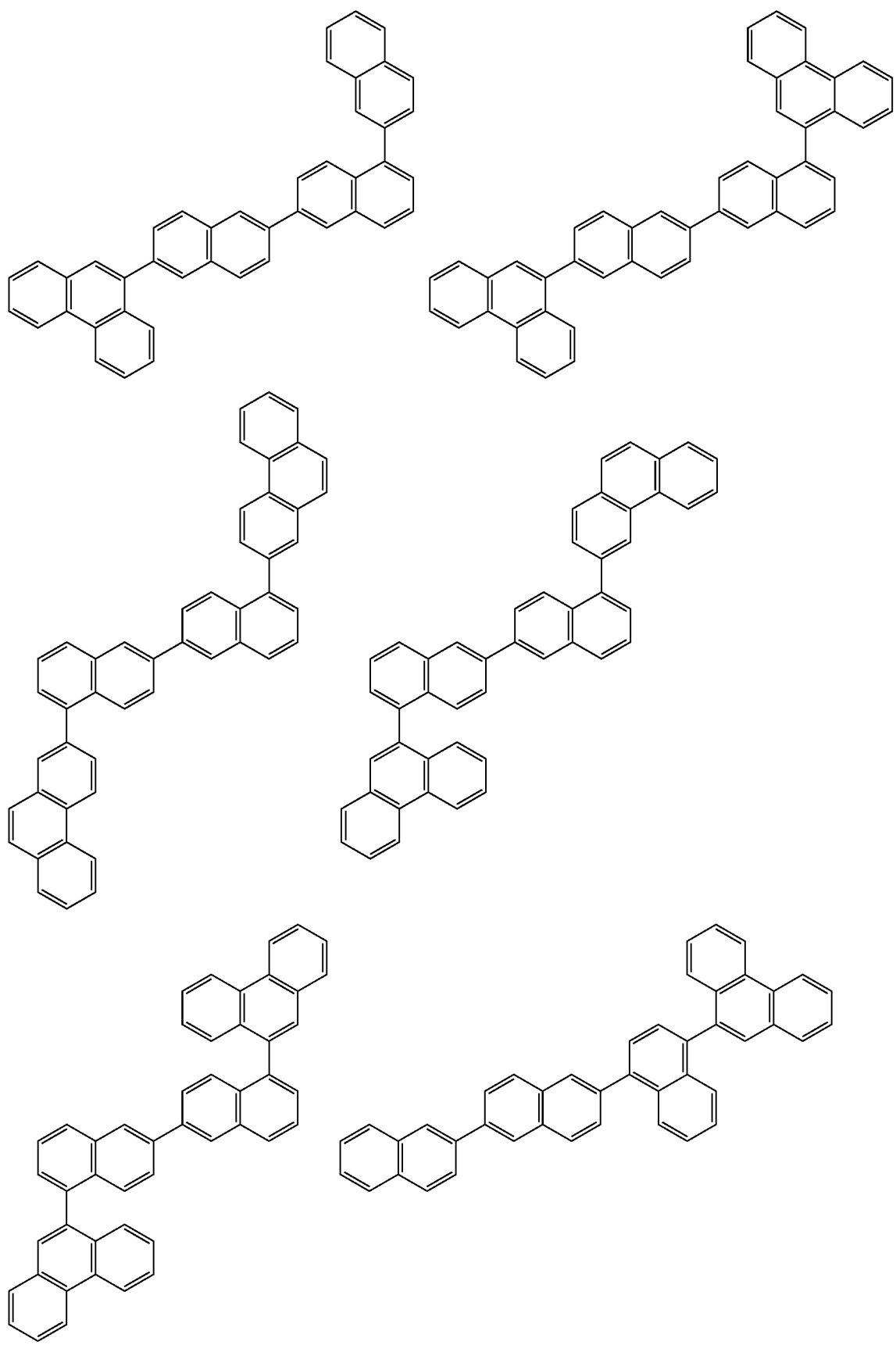

-continued
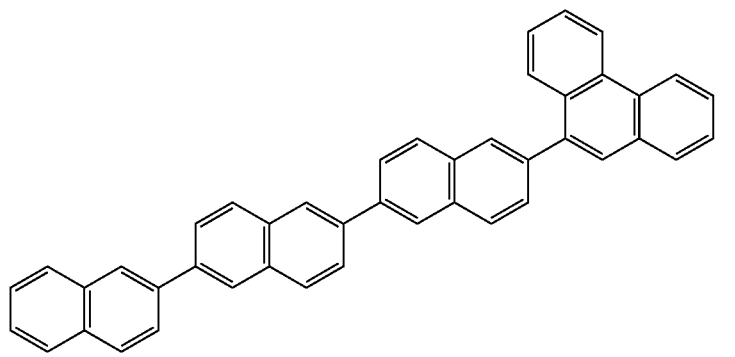
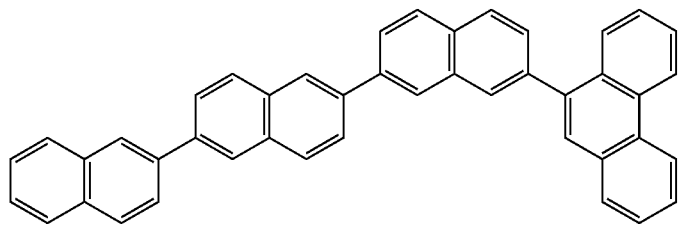
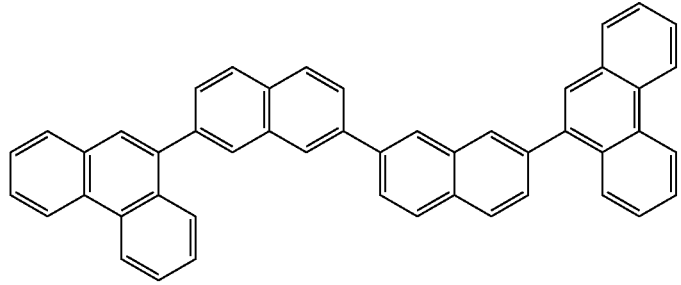
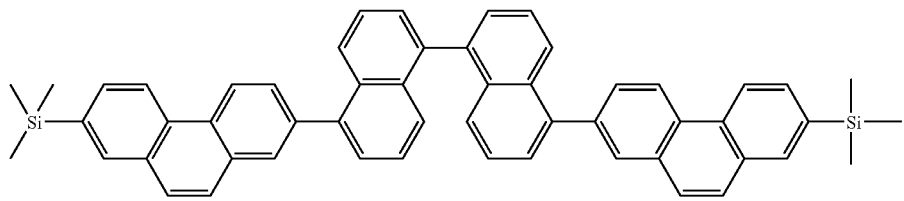
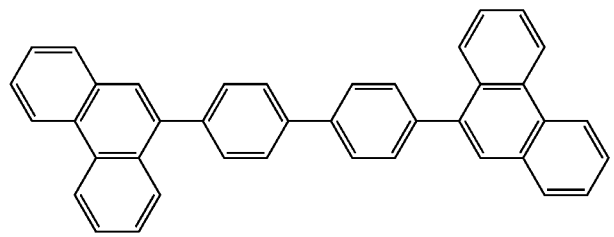
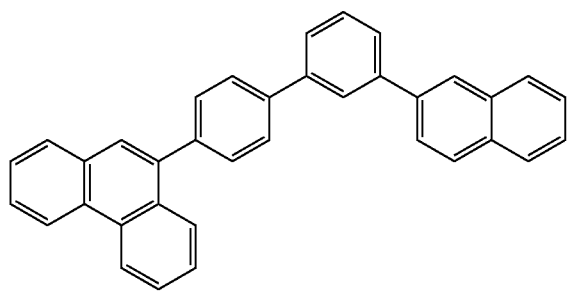

-continued
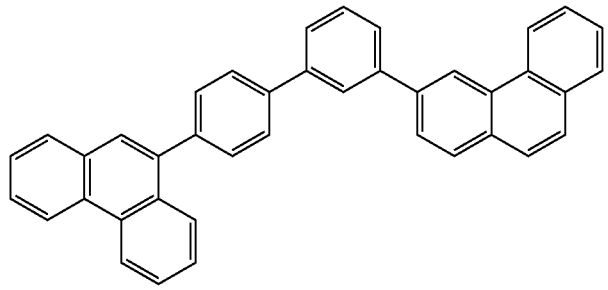
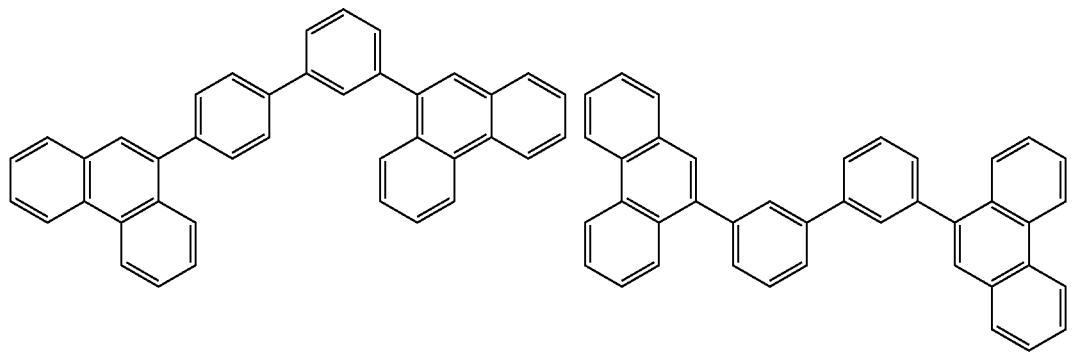
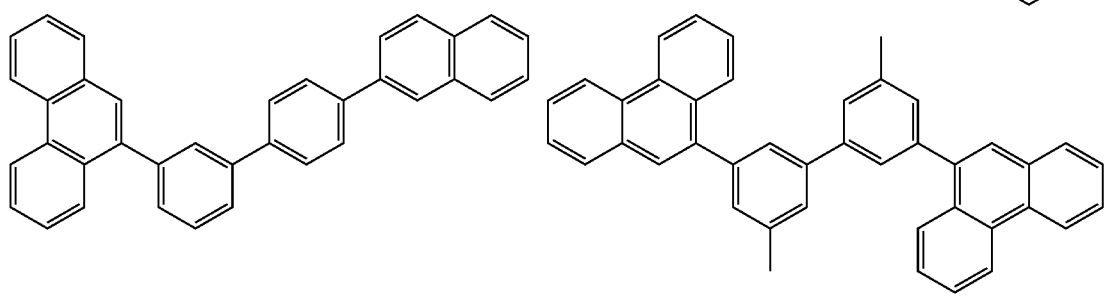
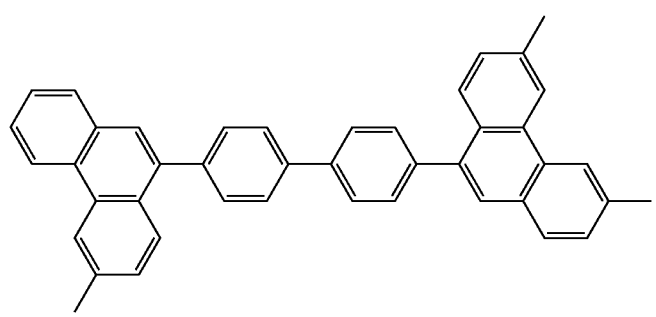
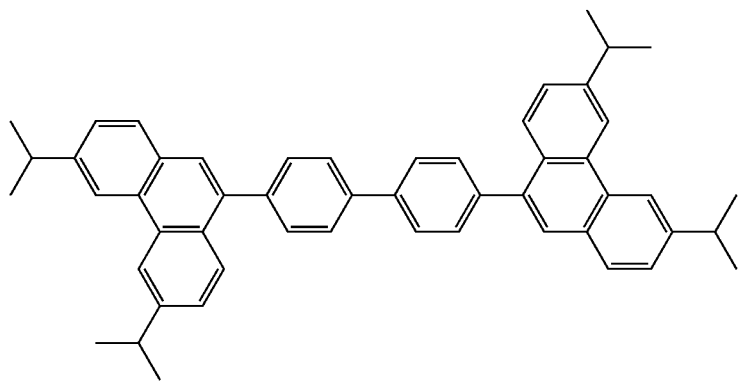

-continued
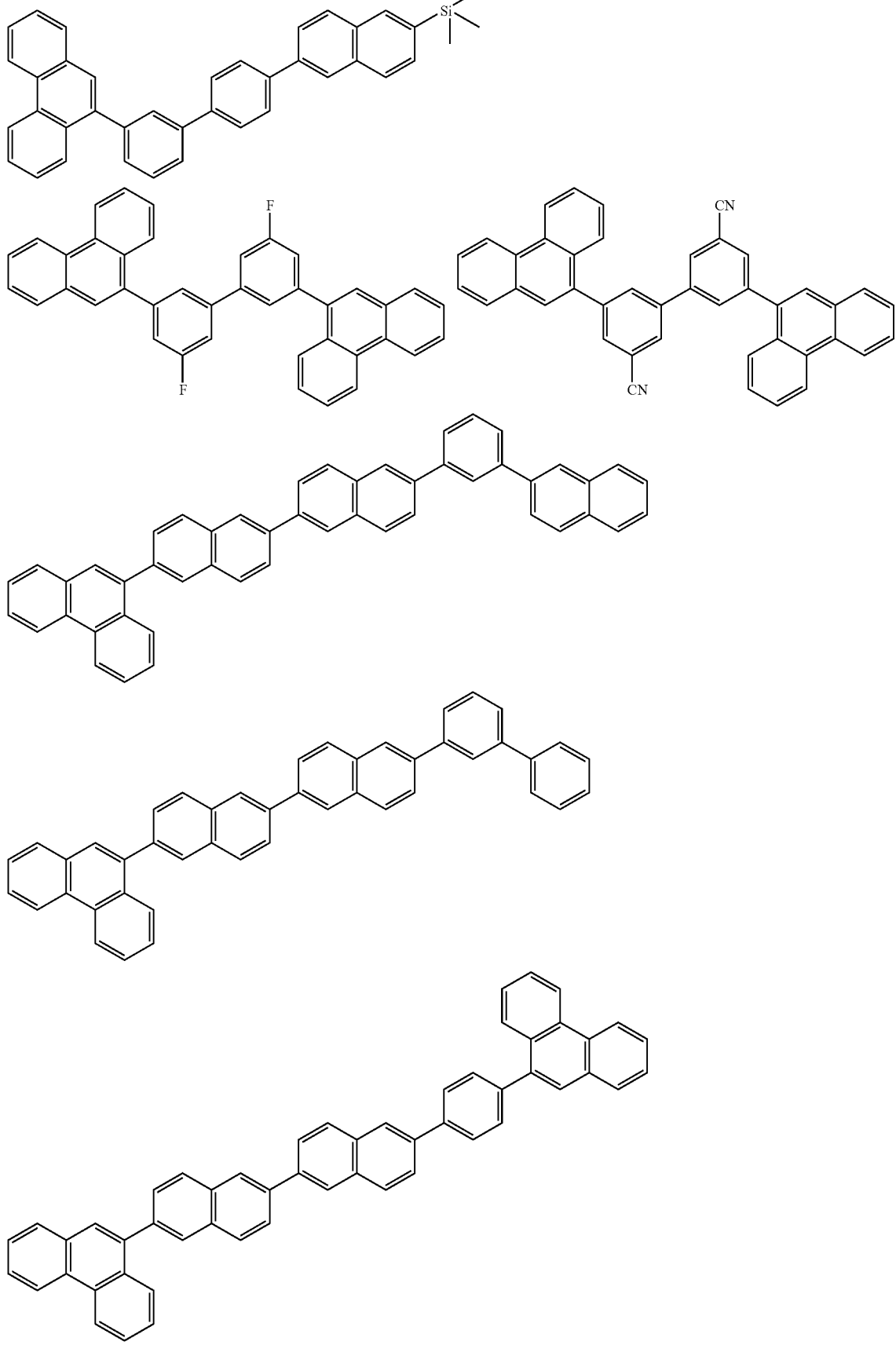

-continued

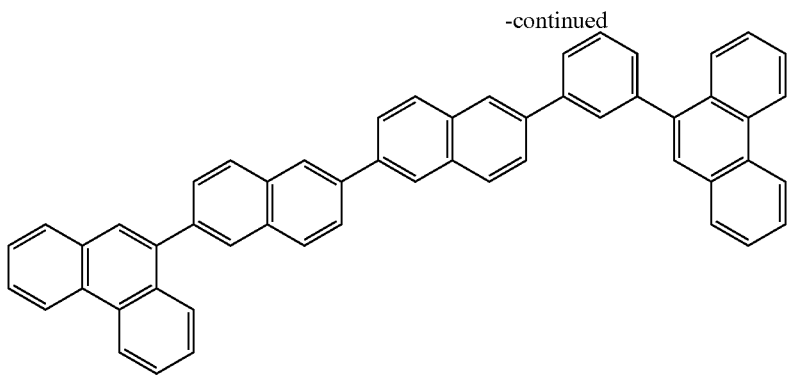

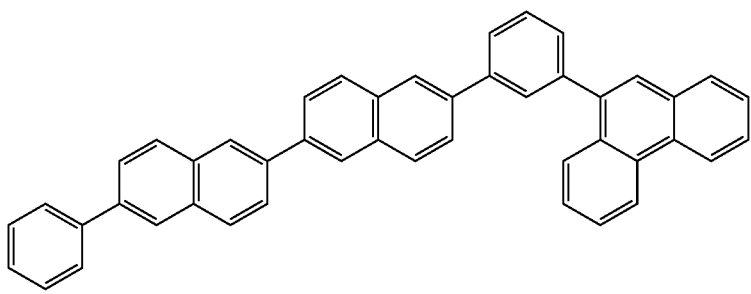

In the organic EL device of the invention, it is preferred that the above-mentioned fused polycyclic aromatic skeleton part be a chrysene shown by the following formula (6) or the derivative thereof.

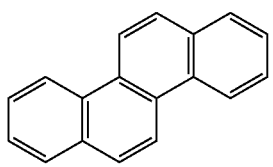

(6)

As such a chrysene derivative, one shown by the following formula (6A) can be given, for example.

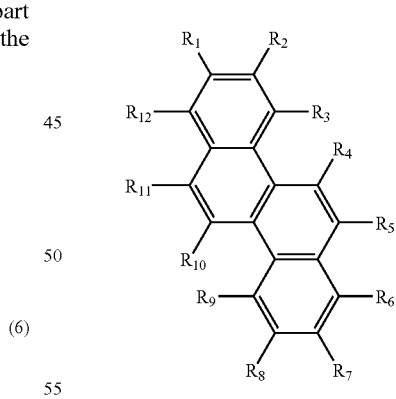

(6A)

In formula (6A), $R_1$ to $R_{12}$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

Specific examples of a chrysene derivative, one shown by the following formula (6) include the following.

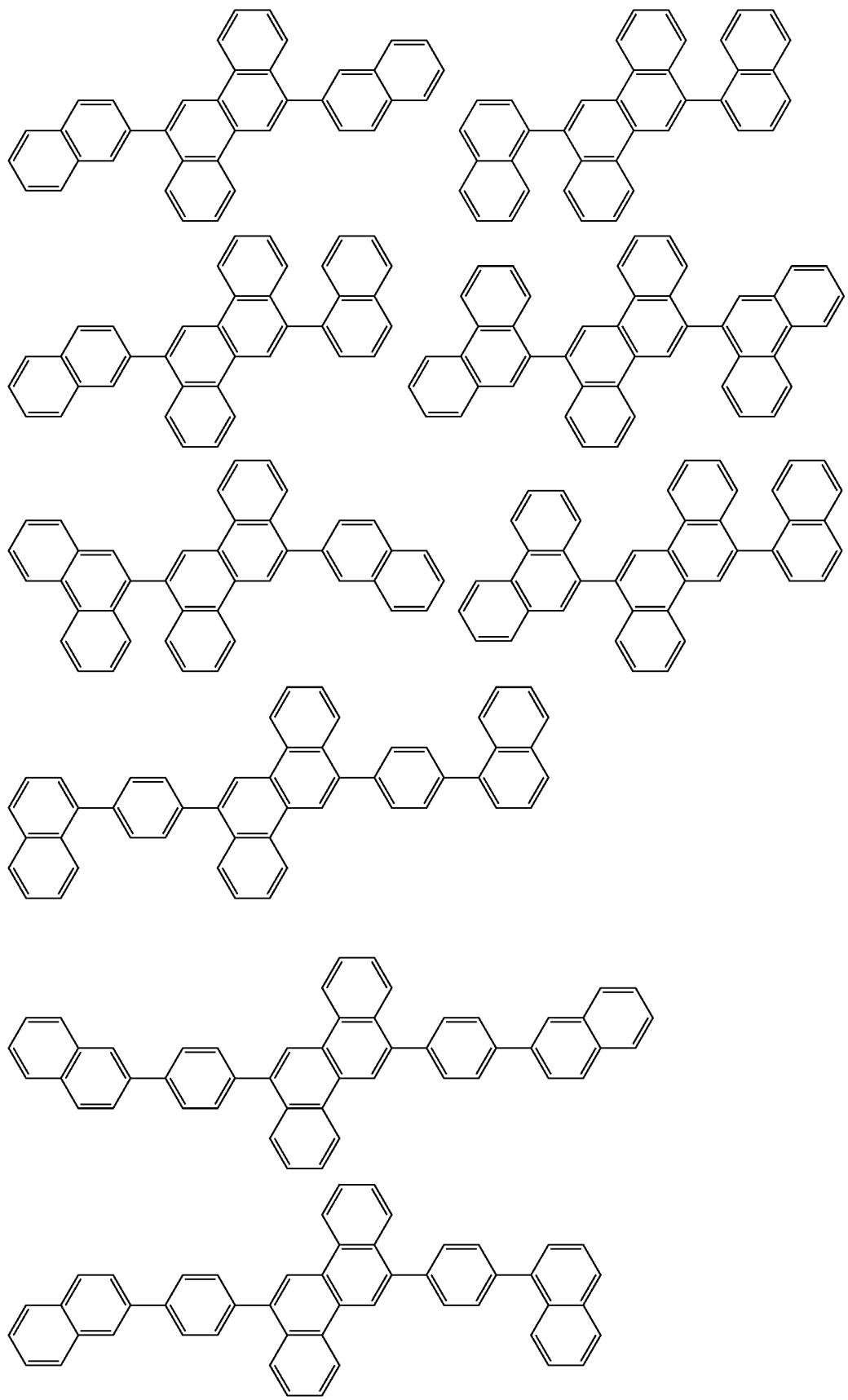

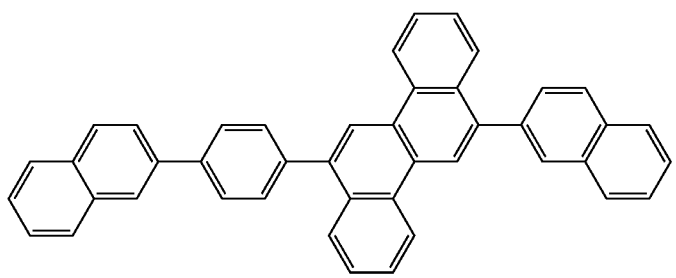
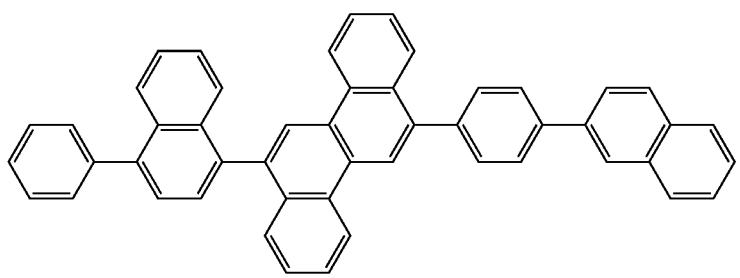
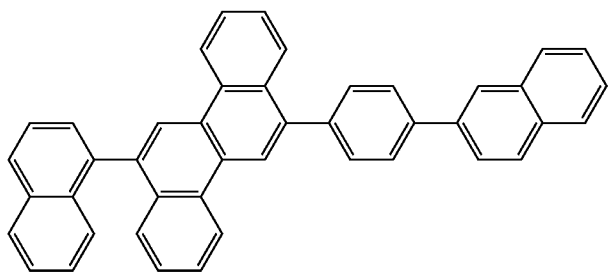
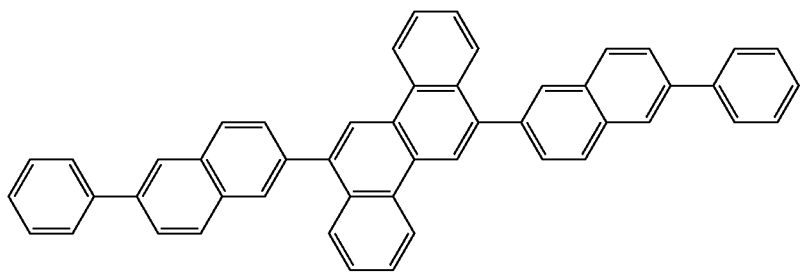
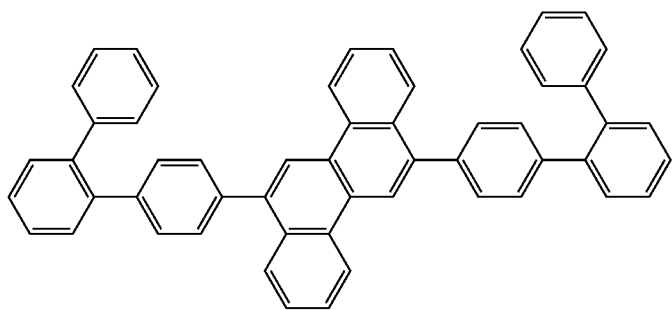

-continued
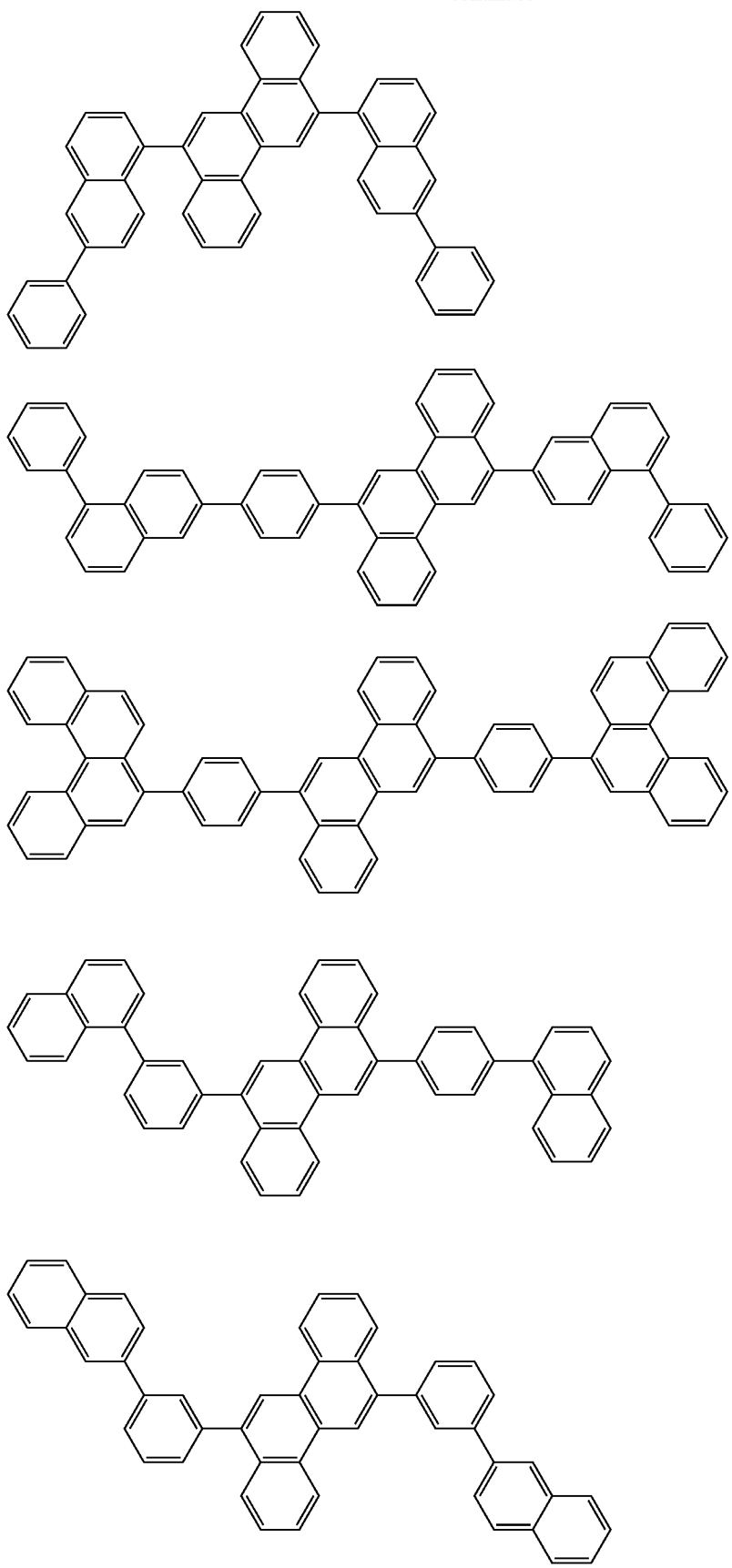

-continued
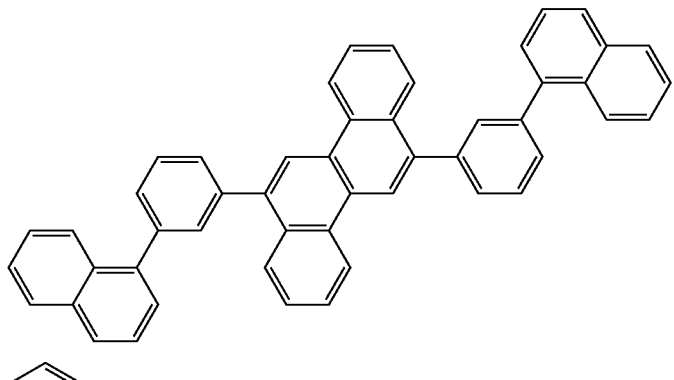
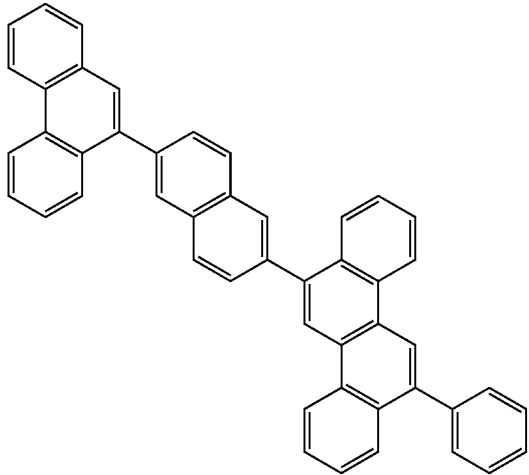
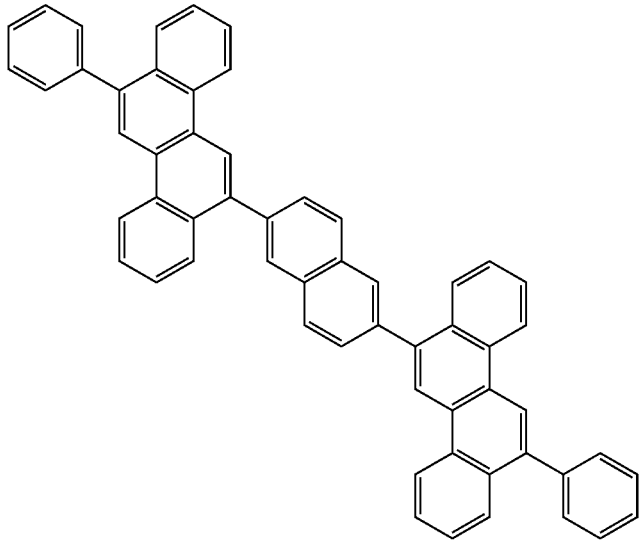
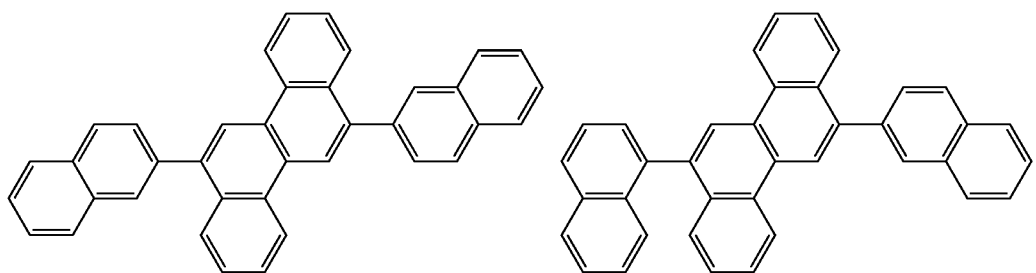

-continued
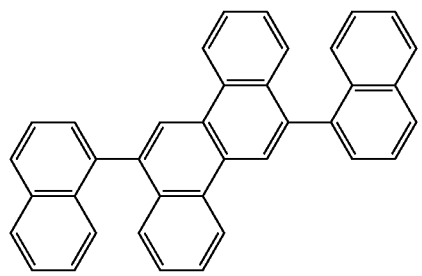
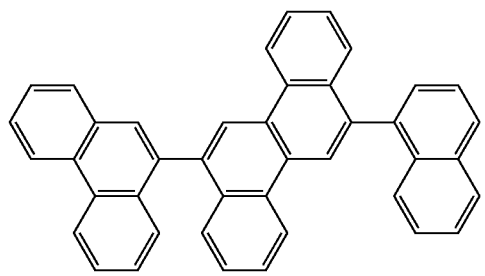
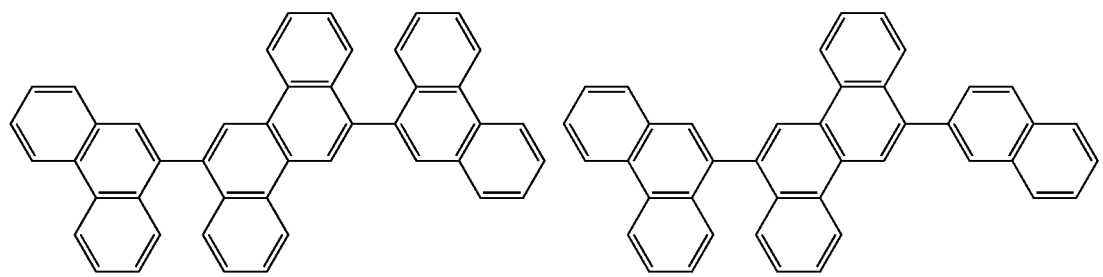
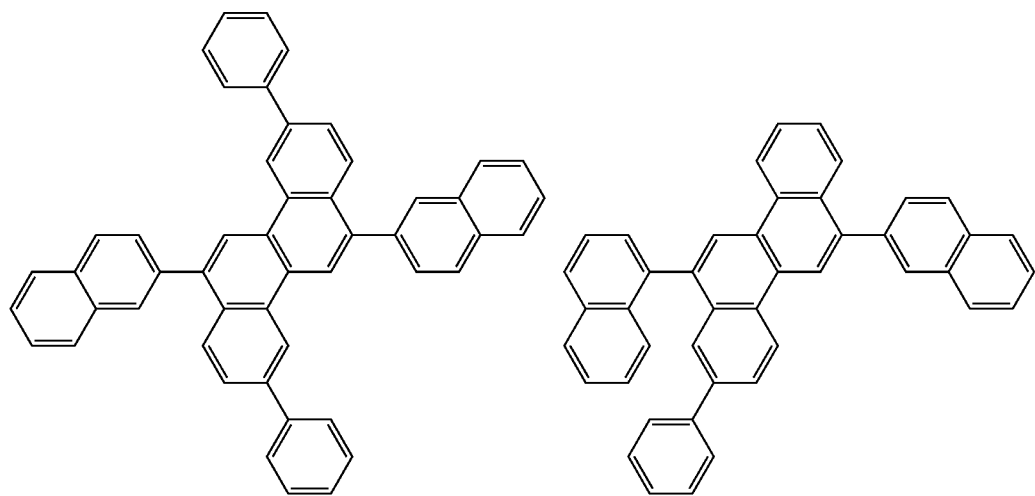
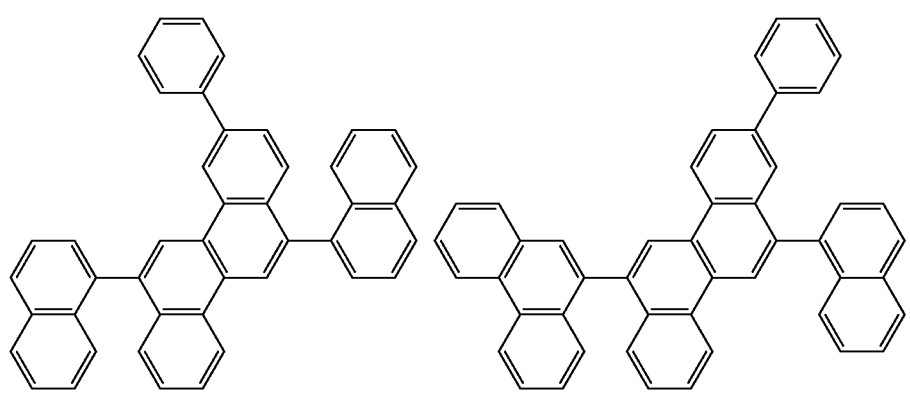

-continued
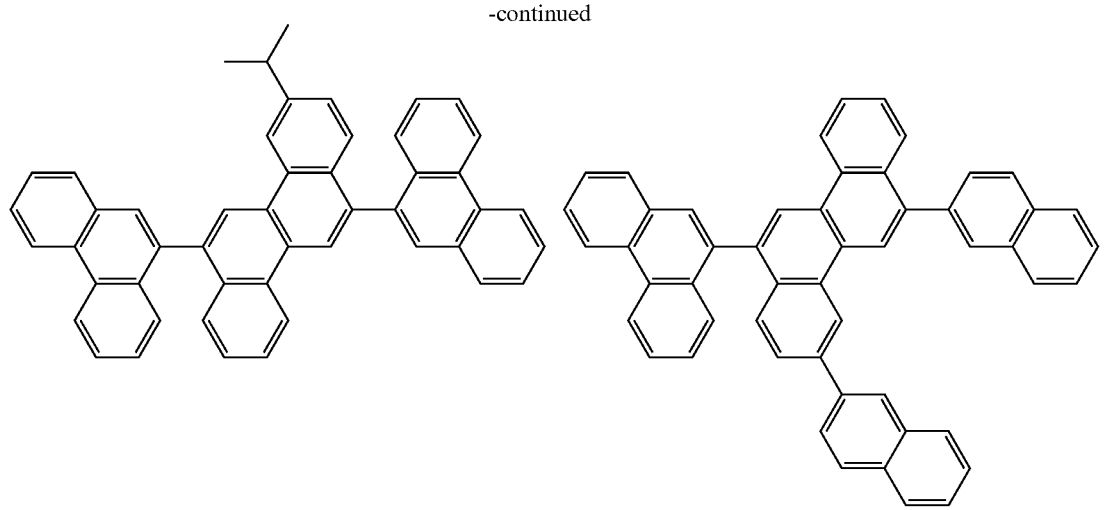
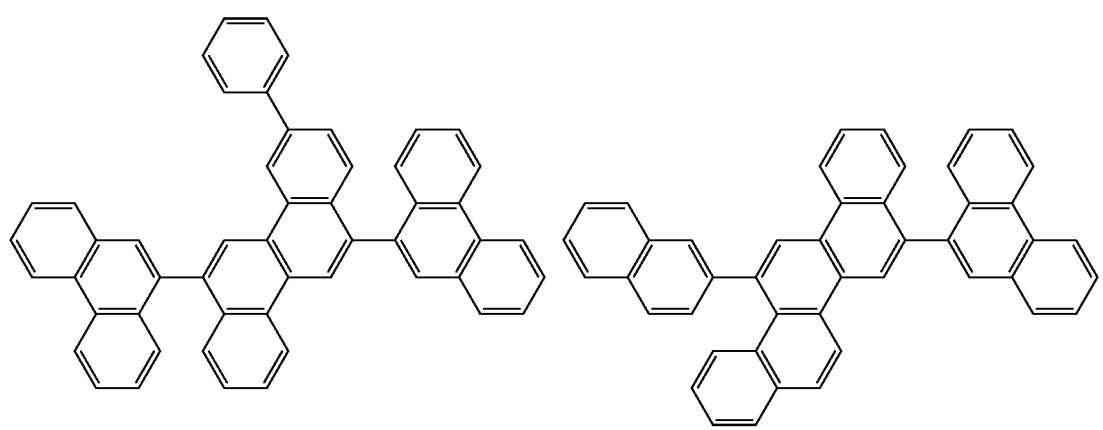
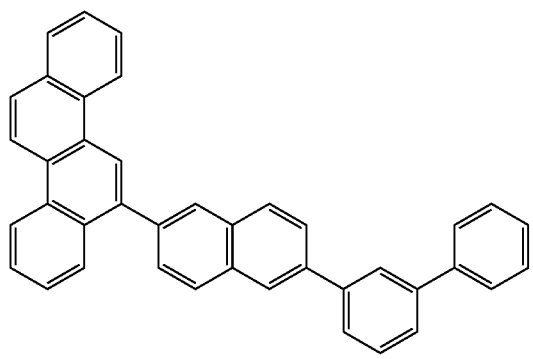
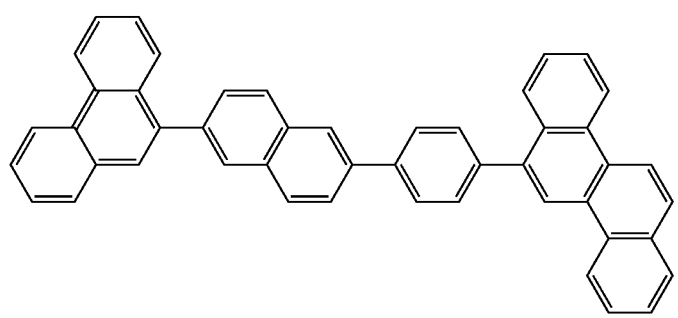

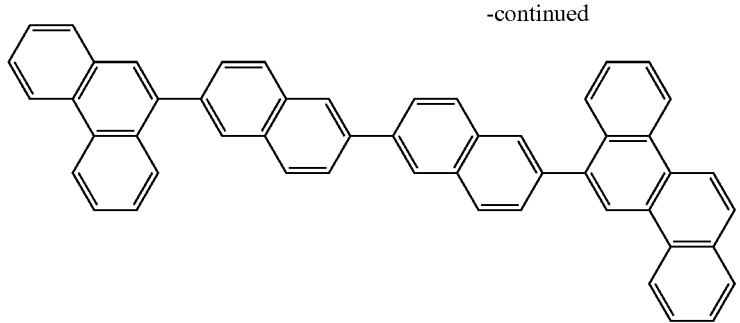
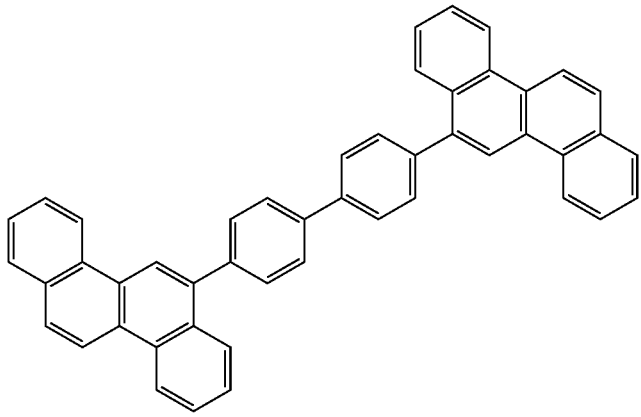
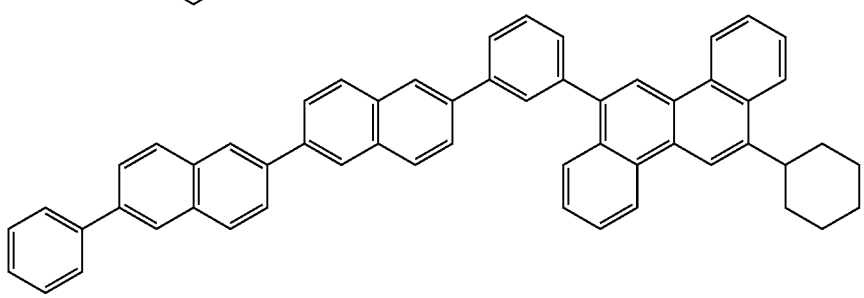
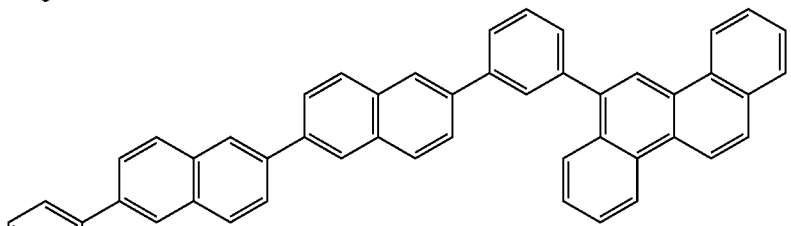
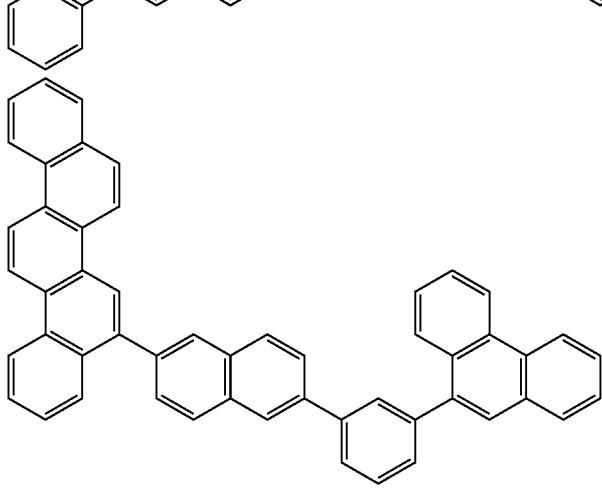

In the organic EL device of the invention, it is preferred that the above-mentioned fused polycyclic aromatic skeleton part be a compound shown by the following formula (7) (benzo [c]phenanthrene) or the derivative thereof.

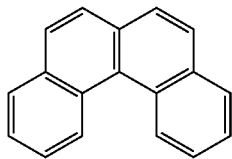

(7)

As such a benzo[c]phenanthrene derivative, one shown by the following formula (7A) can be given, for example.

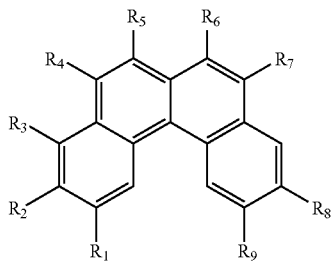

(7A)

In formula (7A), $R_1$ to $R_9$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

Specific examples of a benzo[c]chrysene derivative shown by formula (7A) include the following.

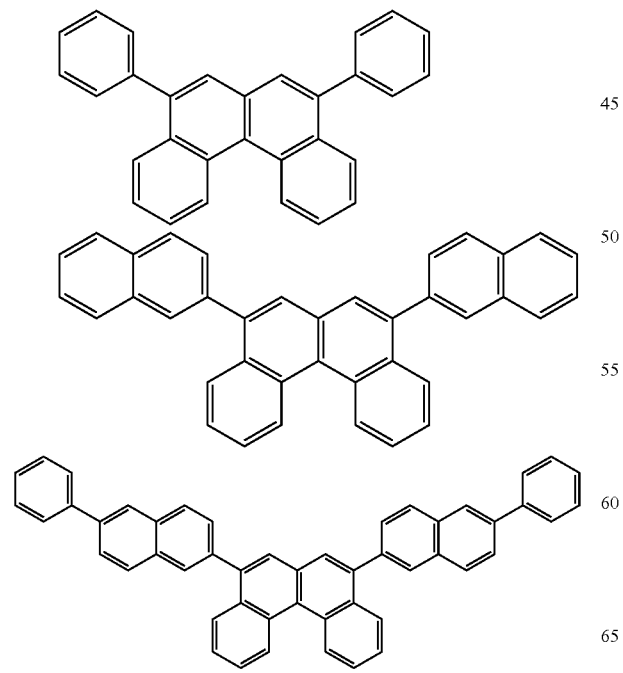

-continued

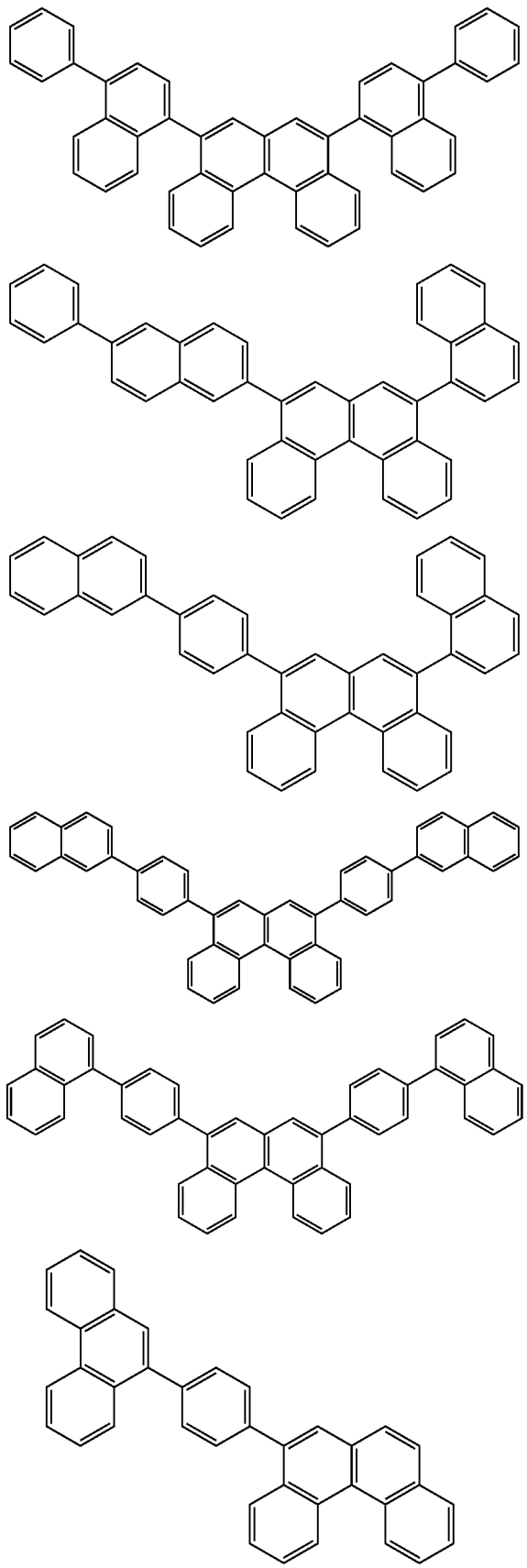

163
-continued
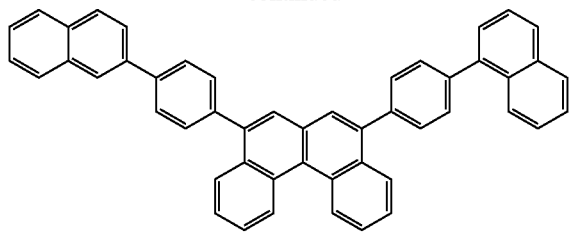
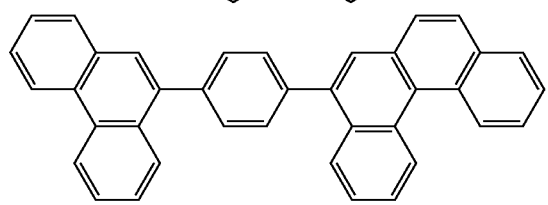
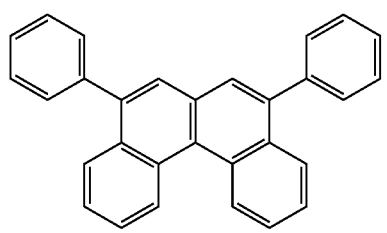
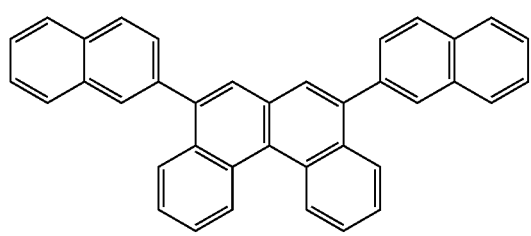
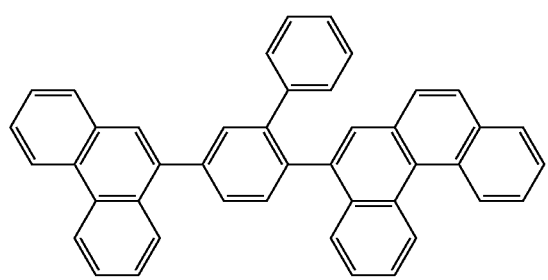
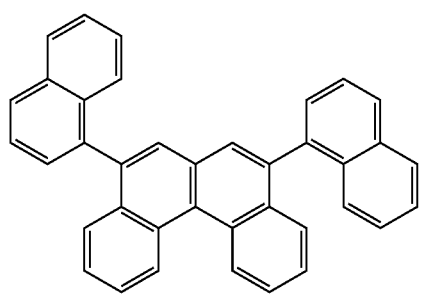
164
-continued
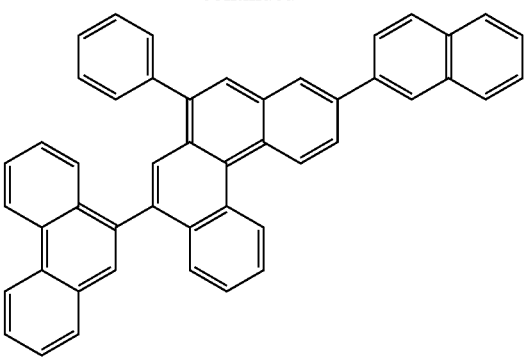
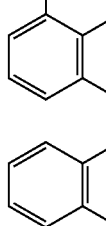
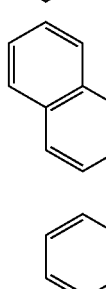
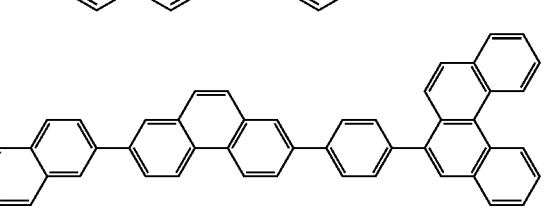
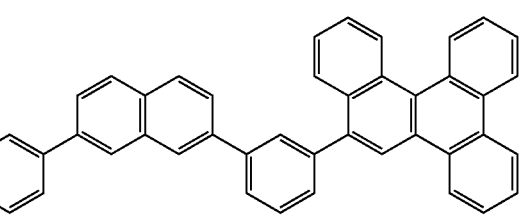
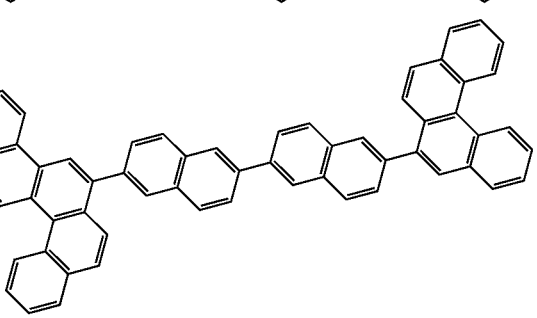

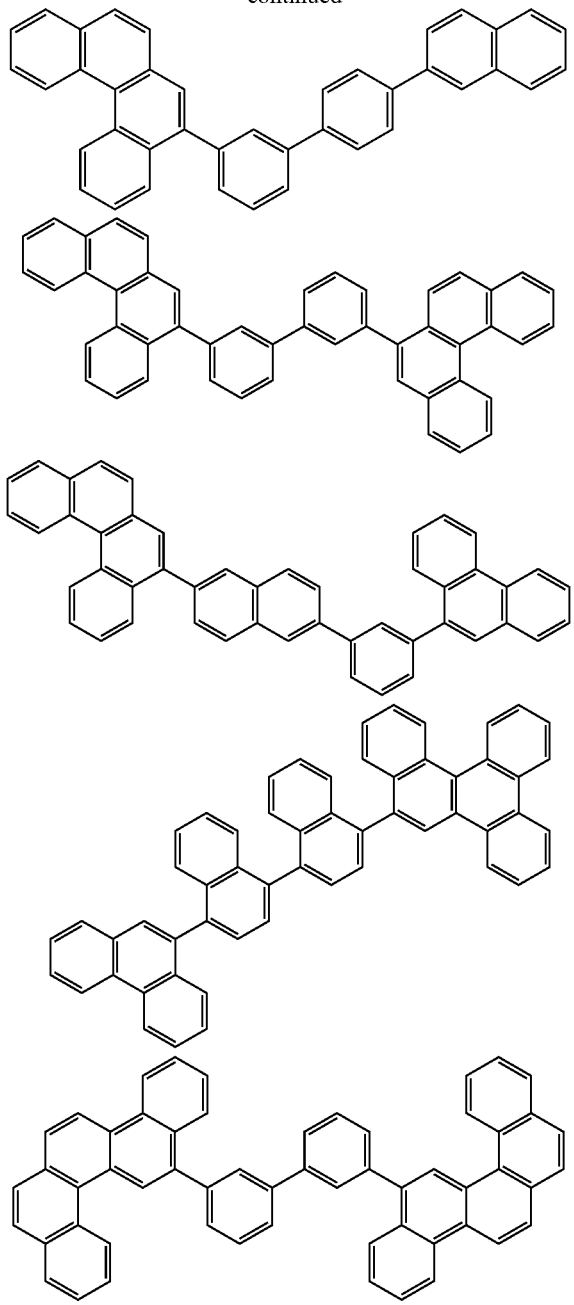

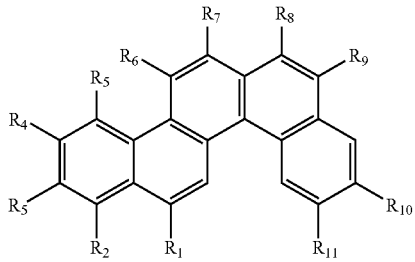

In formula (8A), $R_1$ to $R_{11}$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

Specific examples of a benzo[c]chrysene derivative shown by formula (8A) include the following.

As the derivative of such a compound, the following compounds can be given, for example.

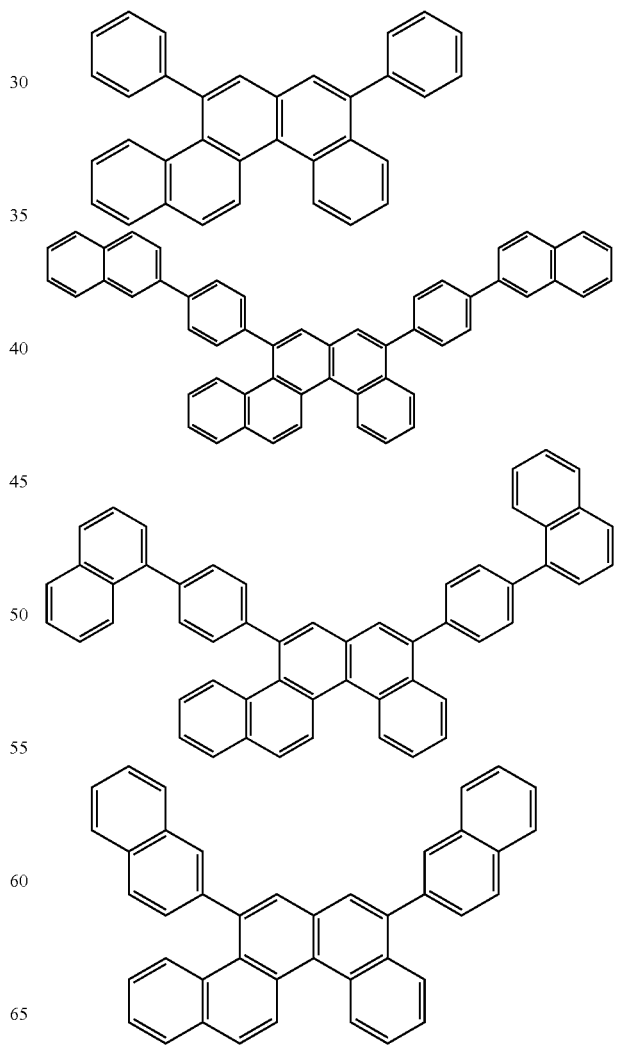

In the organic EL device of the invention, it is preferred that the above-mentioned fused polycyclic aromatic skeleton part be a compound shown by the following formula (8) (benzo [c]chrysene) or the derivative thereof.

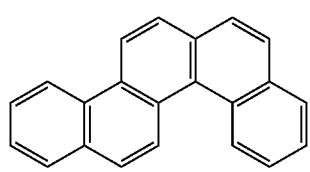

(8)

As such a benzo[c]chrysene derivative, one shown by the following formula (8A) can be given, for example.

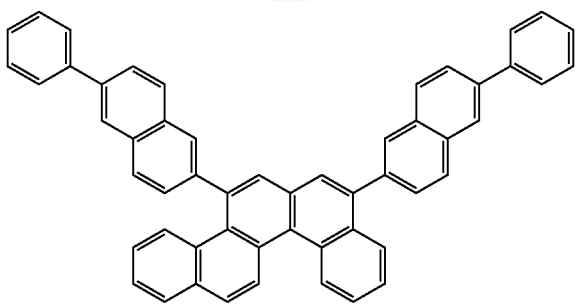

In the organic EL device of the invention, it is preferred that the above-mentioned fused polycyclic aromatic skeleton part be a compound shown by the following formula (9) or the derivative thereof.

(9)

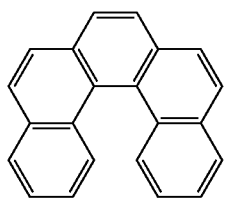

As the derivative of such compound, the following can be given, for example.

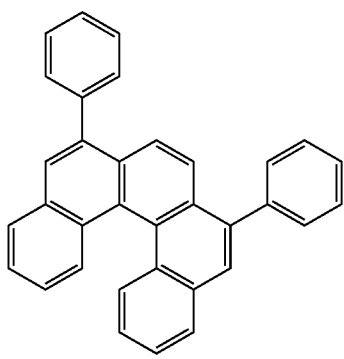

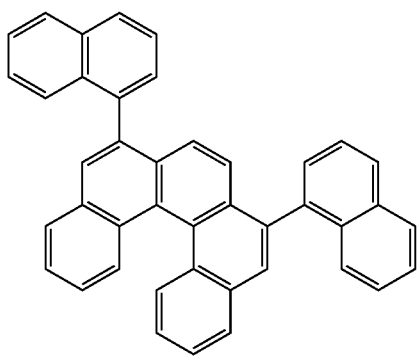

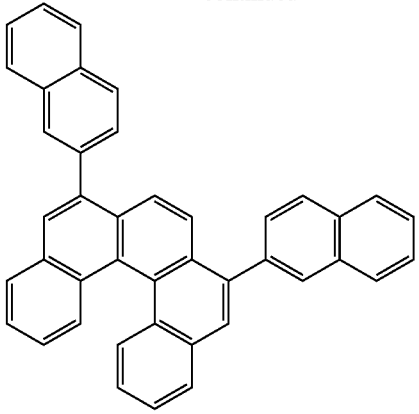

In the organic EL device of the invention, the above-mentioned fused polycyclic aromatic skeleton part be fluoranthene shown by the following formula (10) or the derivative thereof.

(10)

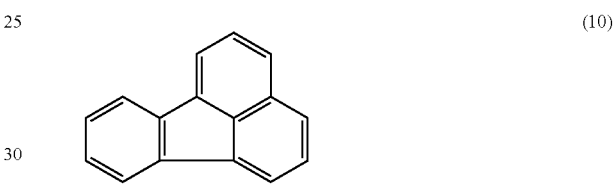

As such a fluoranthene derivative, one shown by the following formula (10A) can be given, for example.

(10A)

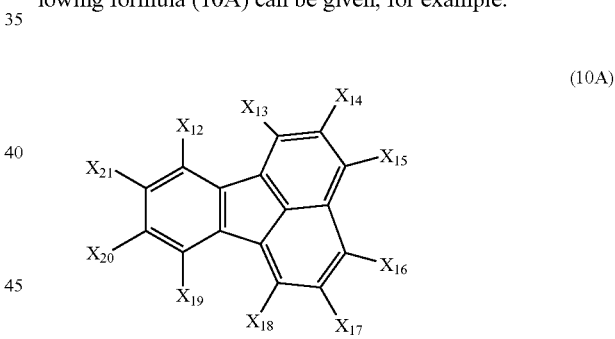

In formula (10A), $X_{12}$ to $X_{21}$ are a hydrogen atom, a halogen atom, a linear, branched or cyclic alkyl group, a linear, branched or cyclic alkoxy group, a substituted or unsubstituted aryl group or a substituted or unsubstituted heteroaryl group.

As examples of the aryl group, a phenyl group, a naphthyl group or the like can be given. As examples of the heteroaryl group, a furyl group, a thienyl group, a pyridyl group or the like can be given.

$X_{12}$ to $X_{21}$ are preferably a hydrogen atom, a halogen atom (for example, a fluorine atom, a chlorine atom, a bromine atom), a linear, branched or cyclic alkyl group having 1 to 16 carbon atoms (for example, methyl, ethyl, n-propyl, isopropyl, n-butyl, isobutyl, sec-butyl, tert-butyl, n-pentyl, isopentyl, neopentyl, tert-pentyl, cyclopentyl, n-hexyl, 3,3-dimethylbutyl, cyclohexyl, n-heptyl, cyclohexylmethyl, n-octyl, tert-octyl, 2-ethylhexyl, n-nonyl, n-decyl, n-dodecyl, n-tetradecyl, n-hexadecyl), a linear, branched or cyclic alkoxy group having 1 to 16 carbon atoms (for example, a methoxy group, an ethoxy group, a n-propoxy group, an isopropoxy group, a n-butoxy group, an isobutoxy group, a sec-butoxy group, a n-pentyloxy group, a neopentyloxy group, a cyclopentyloxy group, a n-hexyloxy group, a 3,3-dimethylbutyloxy group, a cyclohexyloxy group, a n-heptyloxy group, a n-octyloxy group, a 2-ethylhexyloxy group, a n-nonyloxy group, a n-decyloxy group, a n-dodecyloxy group, a n-tetradecyloxy group, a n-hexadecyloxy group), a substituted or unsubstituted aryl group having 4 to 16 carbon atoms (for example, a phenyl group, a 2-methylphenyl group, a 3-methylphenyl group, a 4-methylphenyl group, a 4-ethylphenyl group, a 4-n-propylphenyl group, a 4-isopropylphenyl group, a 4-n-butylphenyl group, a 4-tert-butylphenyl group, a 4-isopentylphenyl group, a 4-tert-pentylphenyl group, a 4-n-hexylphenyl group, a 4-cyclohexylphenyl group, a 4-n-octylphenyl group, a 4-n-decylphenyl group, a 2,3-dimethylphenyl group, a 2,4-dimethylphenyl group, a 2,5-dimethylphenyl group, a 3,4-dimethylphenyl group, a 5-indanyl group, a 1,2,3,4-tetrahydro-5-naphthyl group, a 1,2,3,4-tetrahydro-6-naphthyl group, a 2-methoxyphenyl group, a 3-methoxyphenyl group, a 4-methoxyphenyl group, a 3-ethoxyphenyl group, a 4-ethoxyphenyl group, a 4-n-propoxyphenyl group, a 4-isopropoxyphenyl group, a 4-n-butoxyphenyl group, a 4-n-pentyloxyphenyl group, a 4-n-hexyloxyphenyl group, a 4-cyclohexyloxyphenyl group, a 4-n-heptyloxyphenyl group, a 4-n-octyloxyphenyl group, a 4-n-decyloxyphenyl group, a 2,3-dimethoxyphenyl group, a 2,5-dimethoxyphenyl group, a 3,4-dimethoxyphenyl group, a 2-methoxy-5-methoxyphenyl group, a 3-methyl-4-methoxyphenyl group, a 2-fluorophenyl group, a 3-fluorophenyl group, a 4-fluorophenyl group, a 2-chlorophenyl group, a 3-chlorophenyl group, a 4-chlorophenyl group, a 4-bromophenyl group, a 4-trifluoromethylphenyl group, a 3,4-dichlorophenyl group, a 2-methyl-4-chlorophenyl group, a 2-chloro-4-methylphenyl group, a 3-chloro-4-methylphenyl group, a 2-chloro-4-methoxyphenyl group, a 4-phenylphenyl group, a 3-phenylphenyl group, a 4-(4'-methylphenyl)phenyl group, a 4-(4'-methoxyphenyl)phenyl group, a 1-naphthyl group, a 2-naphthyl group, a 4-ethoxy-1-naphthyl group, a 6-methoxy-2-naphthyl group, a 7-ethoxy-2-naphthyl group), or a substituted or unsubstituted heteroaryl group (a 2-furyl group, a 2-thienyl group, a 3-thienyl group, a 2-pyridyl group, a 3-pyridyl group, a 4-pyridyl group or the like). More preferably, $X_{12}$ to $X_{21}$ are a hydrogen atom, a fluorine atom, a chlorine atom, an alkoxy group having 1 to 10 carbon atoms, an alkoxy group having 1 to 10 carbon atoms, an aryl group having 6 to 12 carbon atoms or a heteroaryl group having 6 to 12 carbon atoms, with a hydrogen atom, a fluorine atom, a chlorine atom, an alkyl group having 1 to 6 carbon atoms, an alkoxy group having 1 to 6 carbon atoms or an aryl group having 6 to 10 carbon atoms being further preferable.

Specific examples of the fluoranthene derivative shown by formula (10A) include the following:

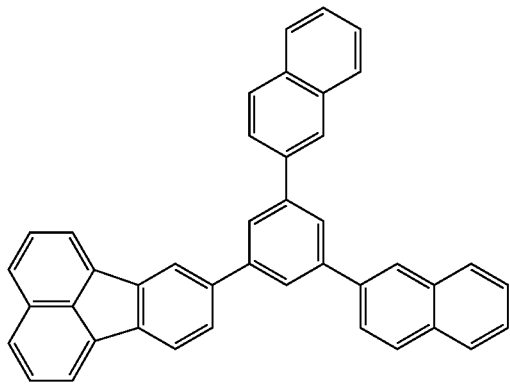

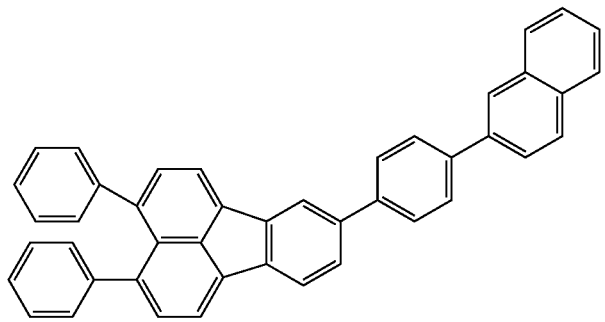

171
172
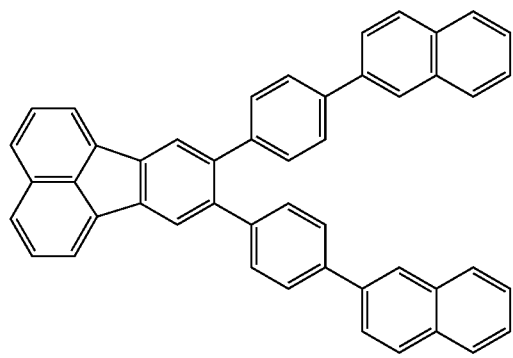
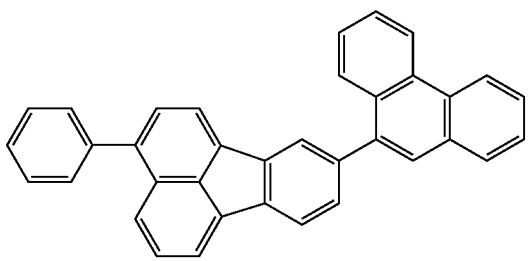
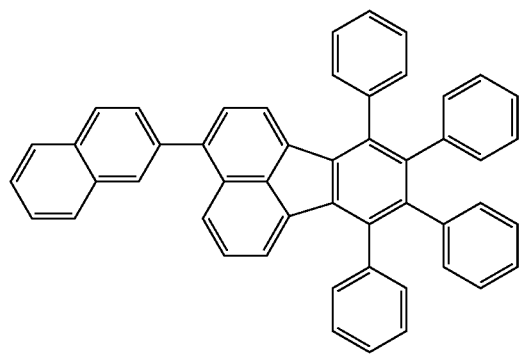
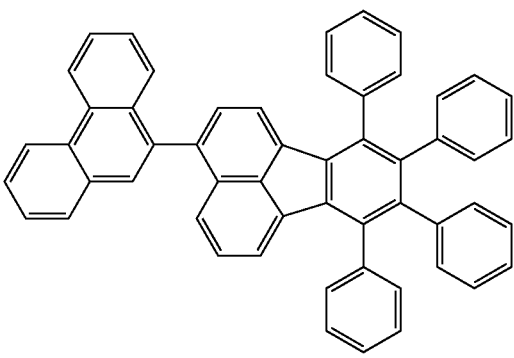
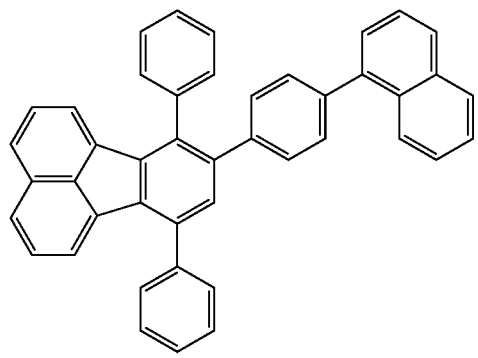
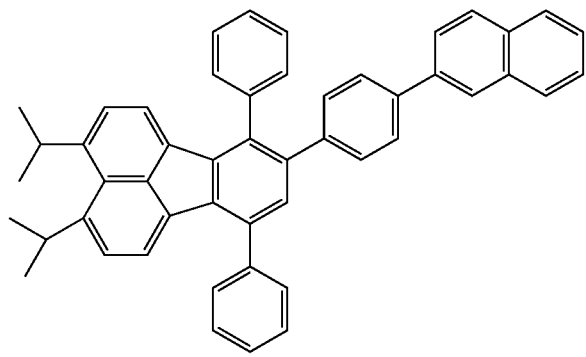
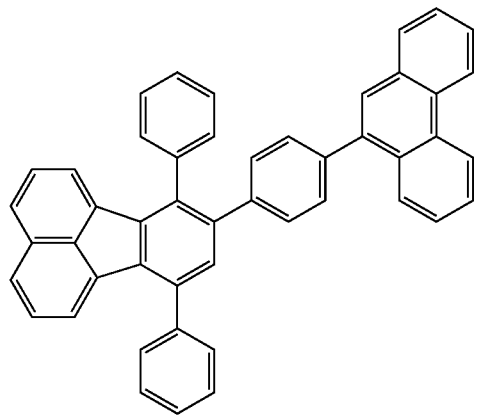
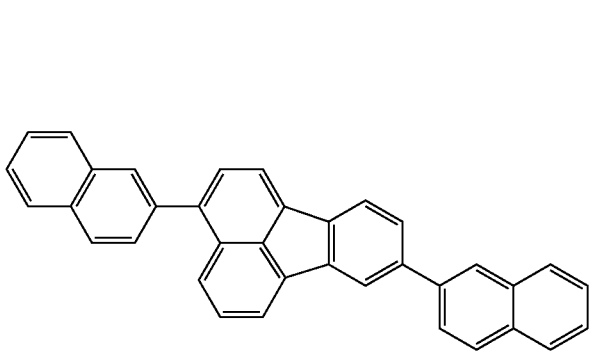

-continued
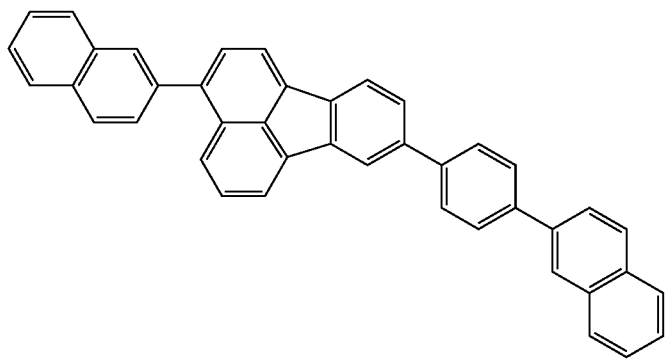
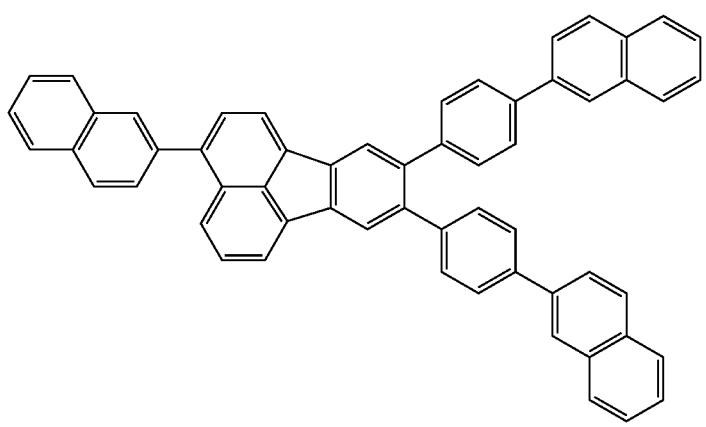
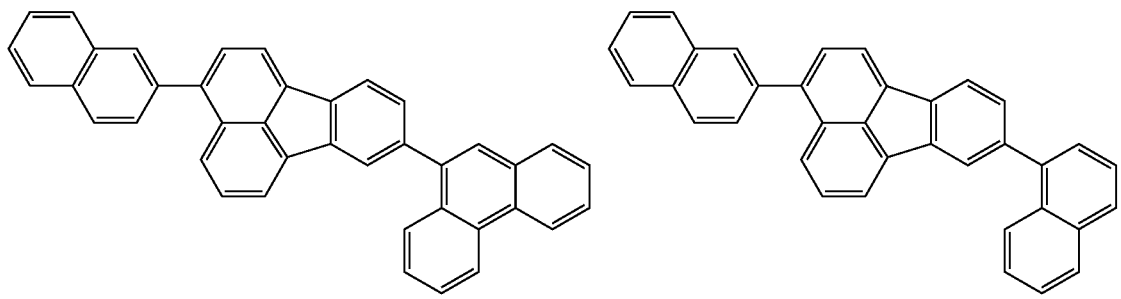
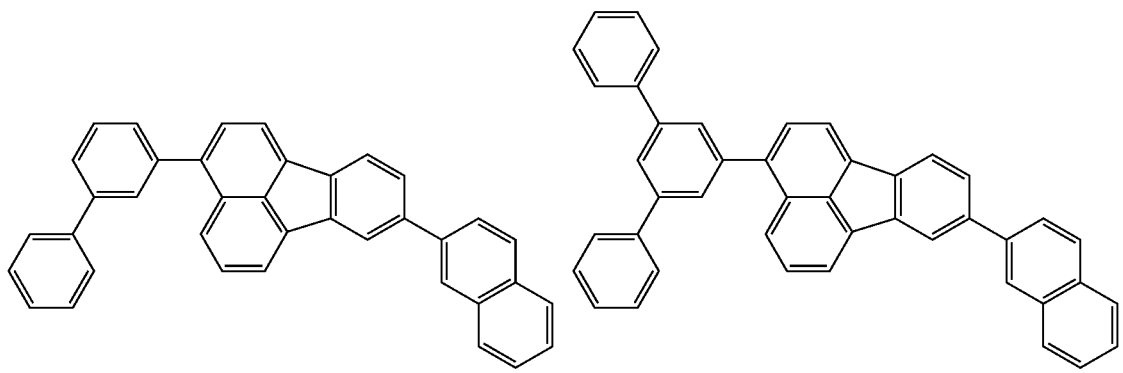

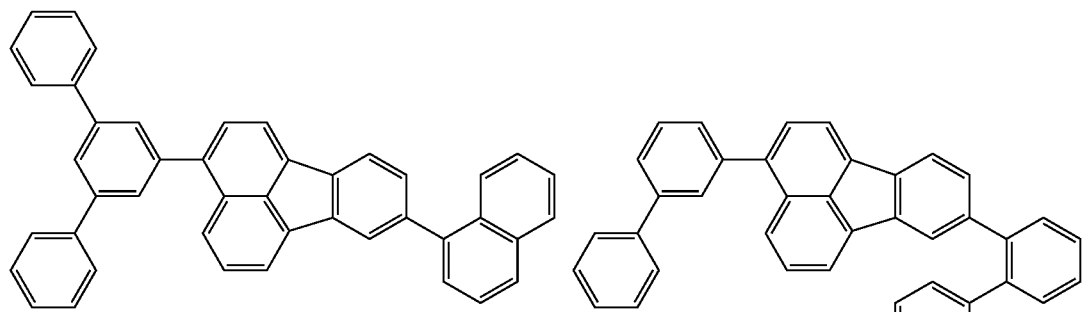
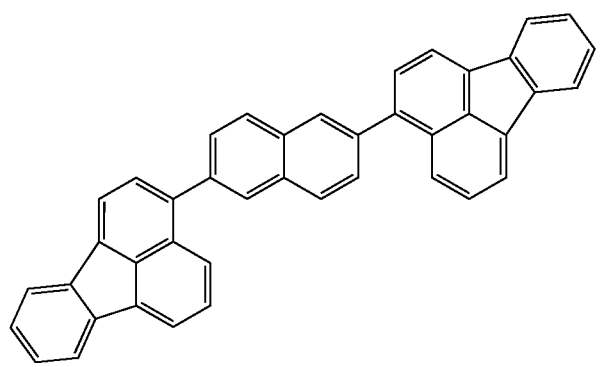
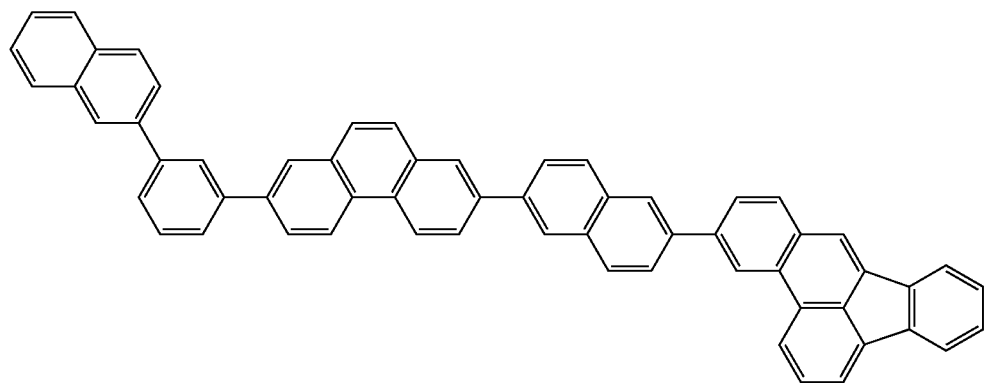
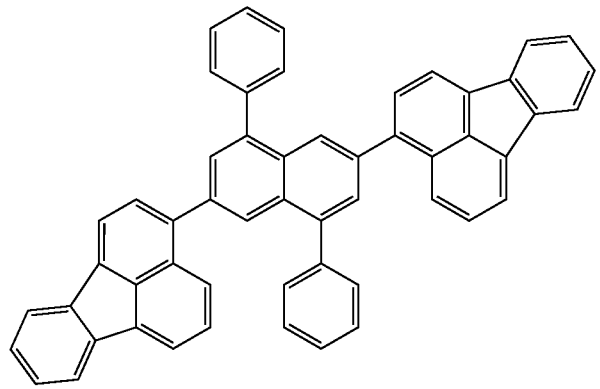

-continued
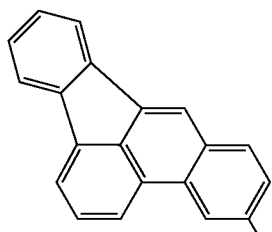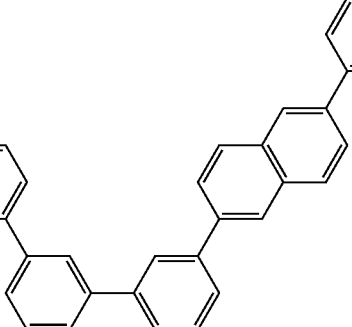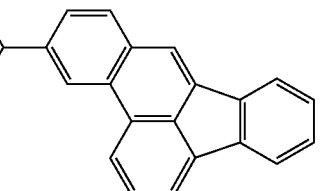
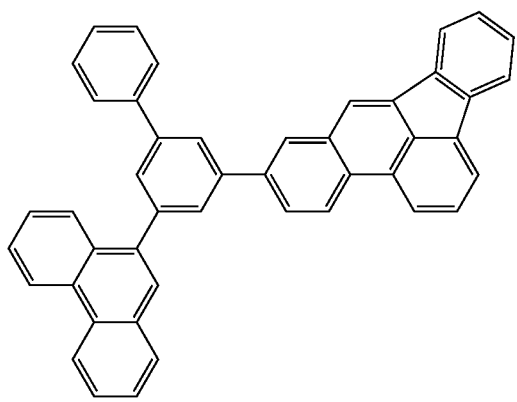
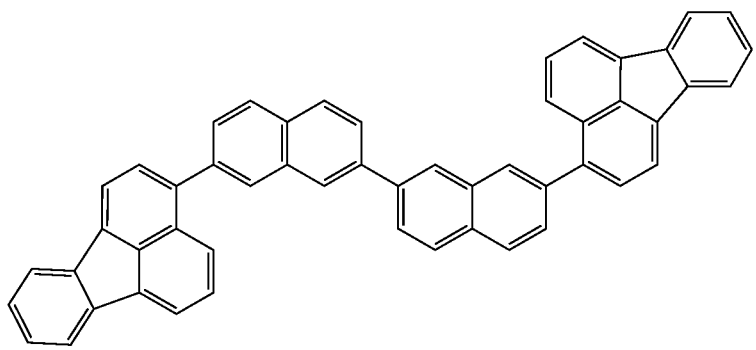
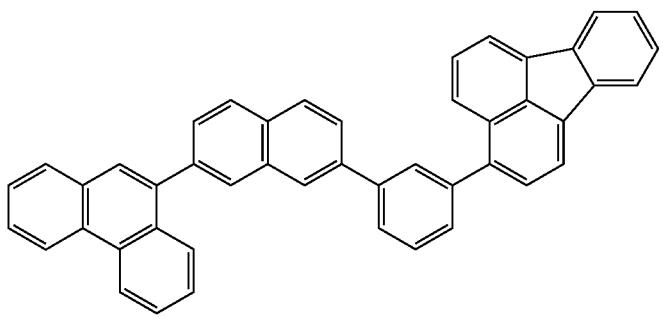
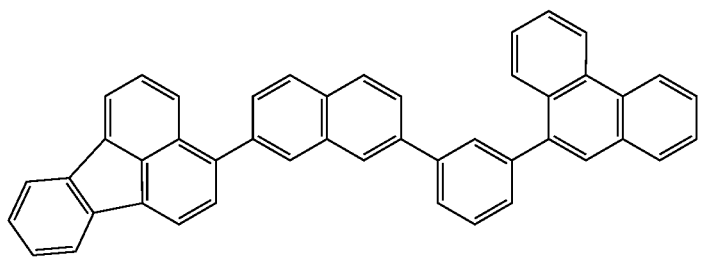

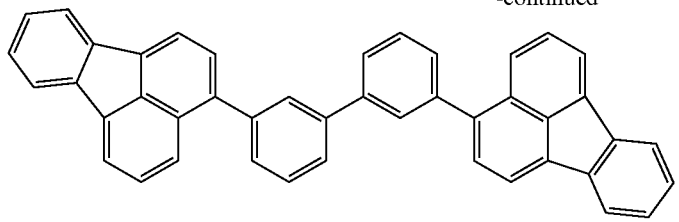

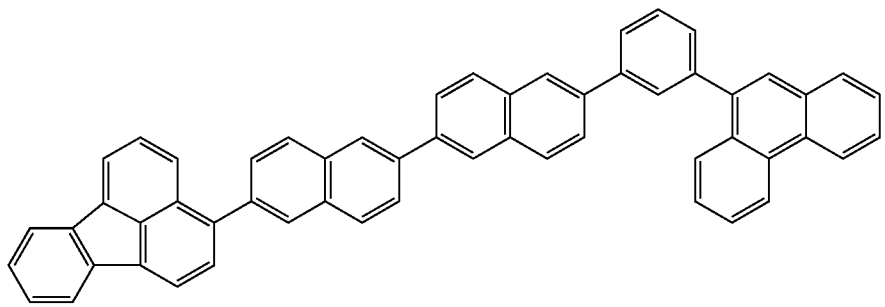

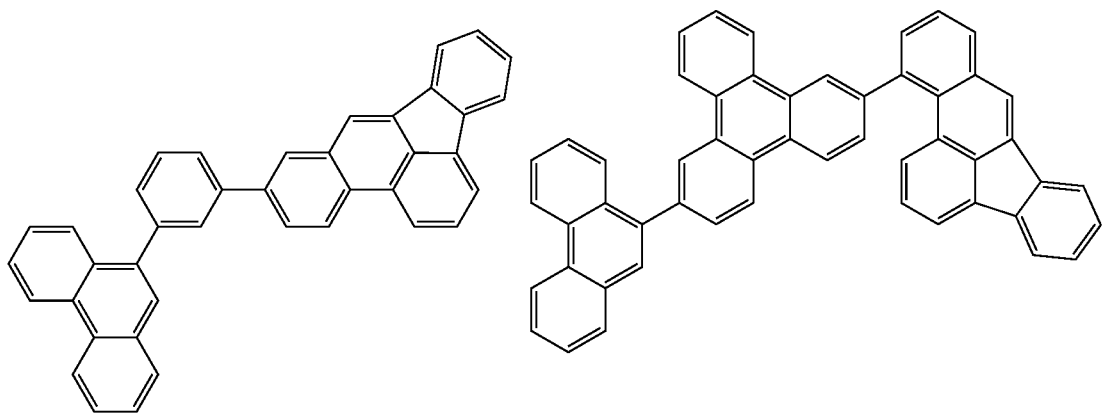

As the substituted or unsubstituted benzofluoranthene, for example, benzo[b]fluoranthene shown by the following formula (101) or the derivative thereof or benzo[k]fluoranthene shown by the following formula (102) or the derivative thereof can be given.

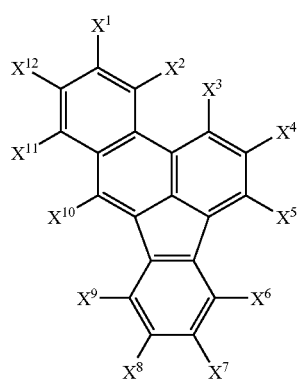

(101)

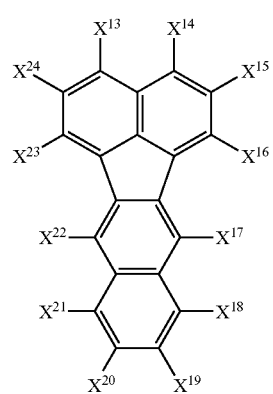

(102)

In formulas (101) and (102), $X^1$ to $X^{24}$ are a hydrogen atom, a halogen atom, a linear, branched or cyclic alkyl group, a linear, branched or cyclic alkoxy group, a substituted or unsubstituted aryl group or a substituted or unsubstituted heteroaryl group.

Examples of the aryl group include a phenyl group and a naphthyl group. As the heteroaryl group, a furyl group, a thienyl group, a pyridyl group or the like can be given.

$X^1$ to $X^{24}$ are preferably a hydrogen atom, a halogen atom (for example, a fluorine atom, a chlorine atom, a bromine atom), a linear, branched or cyclic alkyl group having 1 to 16 carbon atoms (for example, a methyl group, an ethyl group, a n-propyl group, an isopropyl group, a n-butyl group, an isobutyl group, a sec-butyl group, a tert-butyl group, a n-pentyl group, an isopentyl group, a neopentyl group, a tert-pentyl group, a cyclopentyl group, a n-hexyl group, a 3,3-dimethylbutyl group, a cyclohexyl group, a n-heptyl group, a cyclohexymethyl group, a n-octyl group, a tert-octyl group, a 2-ethylhexyl group, a n-nonyl group, a n-decyl group, a n-dodecyl group, a n-tetradecyl group, a n-hexadecyl group or the like), a linear, branched or cyclic alkoxy group having 1 to 16 carbon atoms (for example, a methoxy group, an ethoxy group, a n-propoxy group, an isopropoxy group, a n-butoxy group, an isobutoxy group, a sec-butoxy group, a n-pentyloxy group, a neopentyloxy group, a cyclopentyloxy group, a n-hexyloxy group, a 3,3-dimethylbutyloxy group, a cyclohexyloxy group, a n-heptyloxy group, a n-octyloxy group, a 2-ethylhexyloxy group, a n-nonyloxy group, a n-decyloxy group, a n-dodecyloxy group, a n-tetradecyloxy group, a n-hexadecyloxy group), a substituted or unsubstituted aryl group having 4 to 16 carbon atoms (for example, a phenyl group, a 2-methylphenyl group, a 3-methylphenyl group, a 4-methylphenyl group, a 4-ethylphenyl group, a 4-n-propylphenyl group, a 4-isopropylphenyl group, a 4-n-butylphenyl group, a 4-tert-butylphenyl group, a 4-isopentylphenyl group, a 4-tert-pentylphenyl group, a 4-n-hexylphenyl group, a 4-cyclohexylphenyl group, a 4-n-octylphenyl group, a 4-n-decylphenyl group, a 2,3-dimethylphenyl group, a 2,4-dimethylphenyl group, a 2,5-dimethylphenyl group, a 3,4-dimethylphenyl group, a 5-indanyl group, a 1,2,3,4-tetrahydro-5-naphthyl group, a 1,2,3,4-tetrahydro-6-naphthyl group, a 2-methoxyphenyl group, a 3-methoxyphenyl group, a 4-methoxyphenyl group, a 3-ethoxyphenyl group, a 4-ethoxyphenyl group, a 4-n-propoxyphenyl group, a 4-isopropoxyphenyl group, a 4-n-butoxyphenyl group, a 4-n-pentyloxyphenyl group, a 4-n-hexyloxyphenyl group, a 4-cyclohexyloxyphenyl group, a 4-n-heptyloxyphenyl group, a 4-n-octyloxyphenyl group, a 4-n-decyloxyphenyl group, a 2,3-dimethoxyphenyl group, a 2,5-dimethoxyphenyl group, a 3,4-dimethoxyphenyl group, a 2-methoxy-5-methylphenyl group, a 3-methyl-4-methoxyphenyl group, a 2-fluorophenyl group, a 3-fluorophenyl group, a 4-fluorophenyl group, a 2-chlorophenyl group, a 3-chlorophenyl group, a 4-chlorophenyl group, a 4-bromophenyl group, a 4-trifluoromethylphenyl group, a 3,4-dichlorophenyl group, a 2-methyl-4-chlorophenyl group, a 2-chloro-4-methylphenyl group, a 3-chloro-4-methylphenyl group, a 2-chloro-4-methoxyphenyl group, a 4-phenylphenyl group, a 3-phenylphenyl group, a 4-(4'-methylphenyl)phenyl group, a 4-(4'-methoxyphenyl)phenyl group, a 1-naphthyl group, a 2-naphthyl group, a 4-ethoxy-1-naphthyl group, a 6-methoxy-2-naphthyl group, a 7-ethoxy-2-naphthyl group), or a substituted or unsubstituted heteroaryl group (a 2-furyl group, a 2-thienyl group, a 3-thienyl group, a 2-pyridyl group, a 3-pyridyl group, a 4-pyridyl group, or the like). More preferably, $X_1$ to $X_{24}$ are a hydrogen atom, a fluorine atom, a chlorine atom, an alkyl group having 1 to 10 carbon atoms, an alkoxy group having 1 to 10 carbon atoms or an aryl group having 6 to 12 carbon atoms, with a hydrogen atom, a fluorine atom, a chlorine atom, an alkyl group having 1 to 6 carbon atoms, an alkoxy group having 1 to 6 carbon atoms or an aryl group having 6 to 10 carbon atoms being further preferable.

As the benzo[b]fluoranthene derivative shown by formula (101), the following can be given, for example.

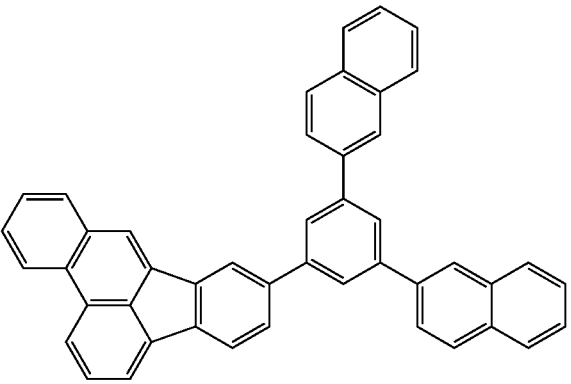

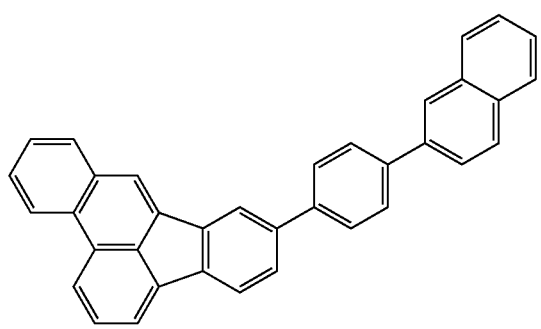

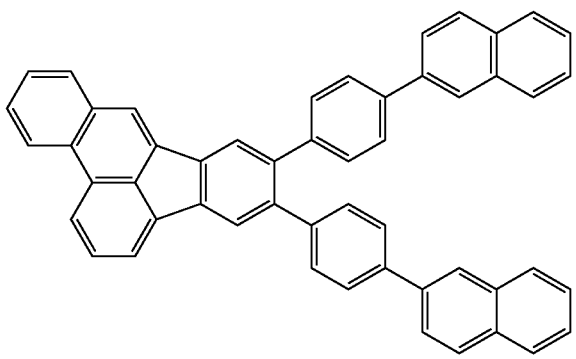

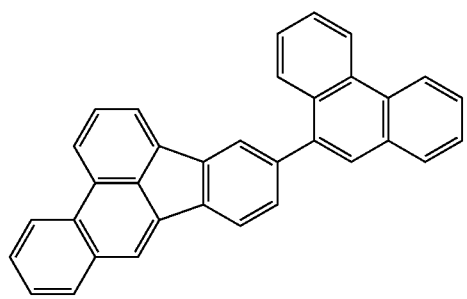

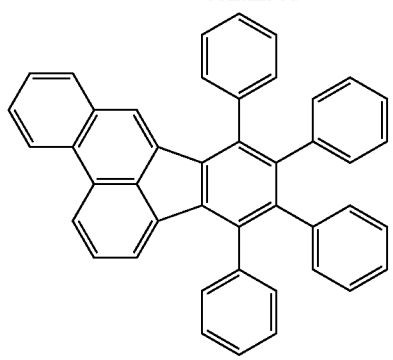
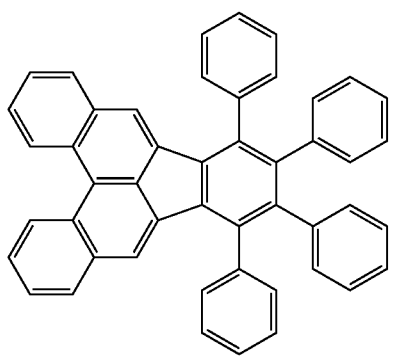
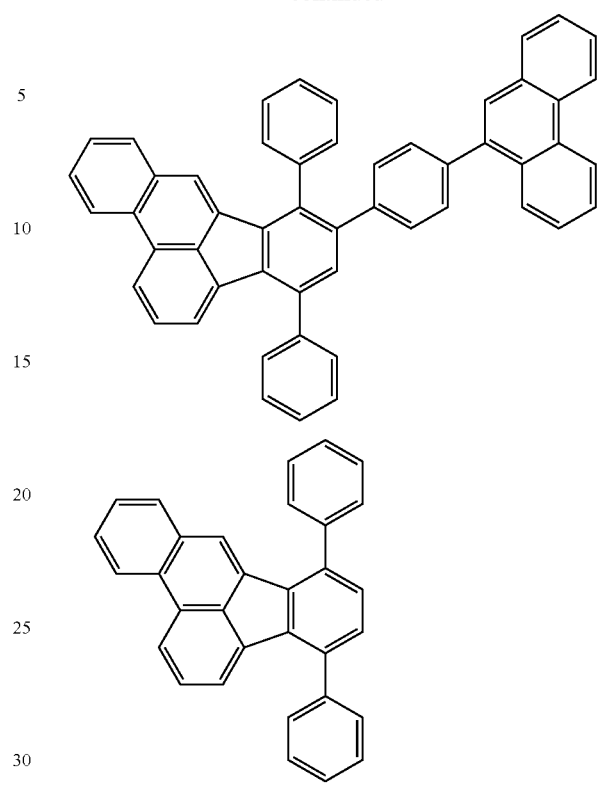
As the benzo[k]fluoranthene derivative shown by formula (102), the following can be given, for example.
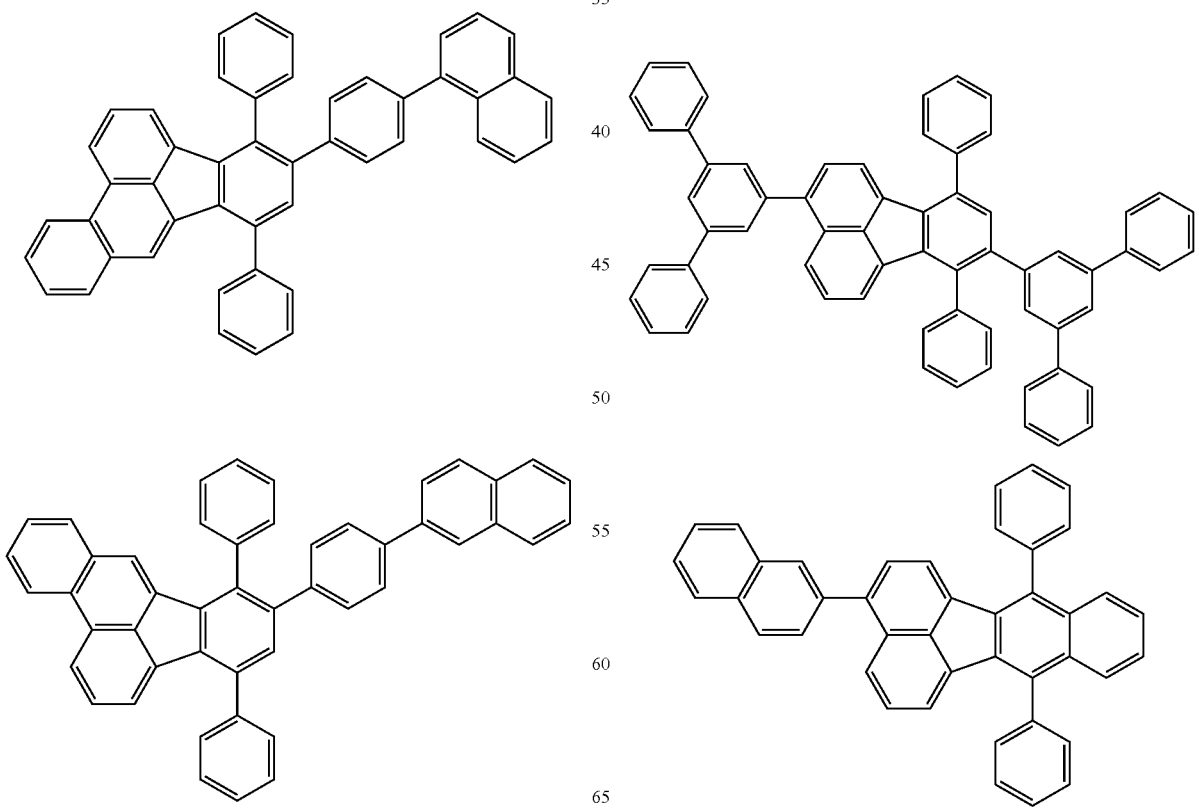

-continued

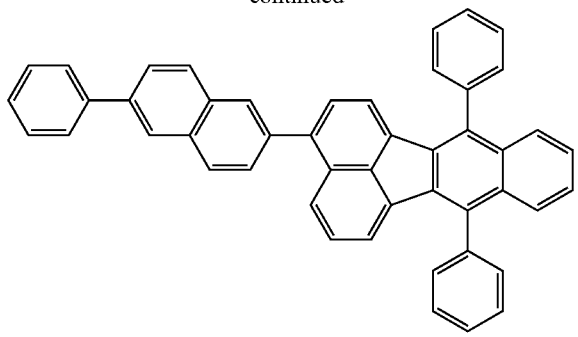

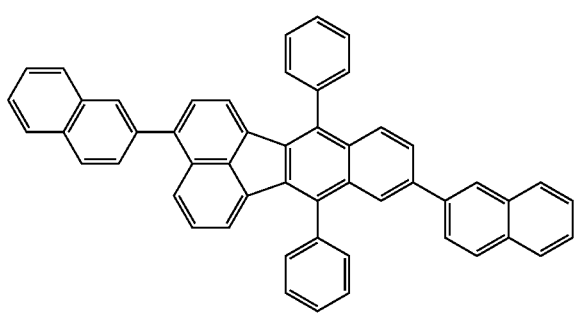

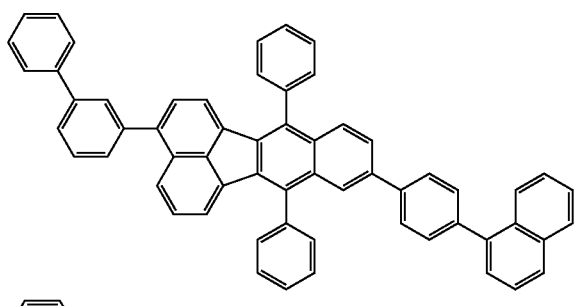

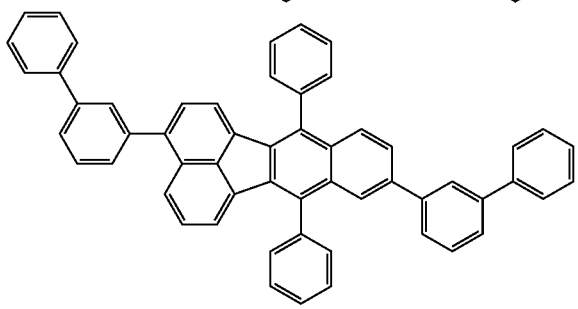

Furthermore, in the organic EL device of the invention, it is preferred that the above-mentioned fused polycyclic aromatic skeleton part be triphenylene shown by the following formula (11) or the derivative thereof.

(11)

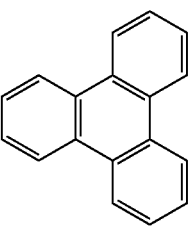

As such a triphenylene derivative, one shown by the following formula (11A) can be given, for example.

(11A)

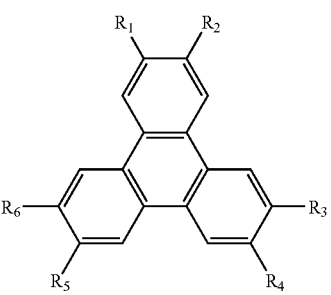

In formula (11A), $R_1$ to $R_6$ are independently a hydrogen atom, a substituent selected from a substituted or unsubstituted aryl group having 5 to 30 ring carbon atoms, a branched or linear alkyl group having 1 to 30 carbon atoms and a substituted or unsubstituted cycloalkyl group having 3 to 20 carbon atoms, or a substituent formed of a combination thereof.

Specific examples of the triphenylene derivative shown by formula (11A) include the following:

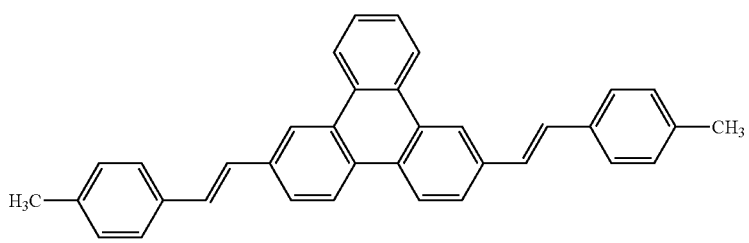

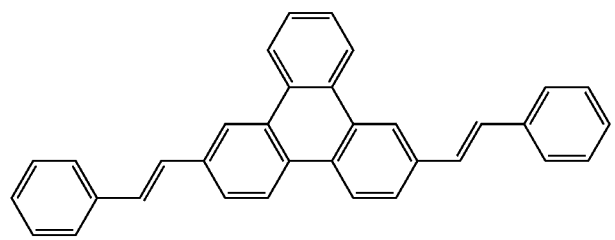
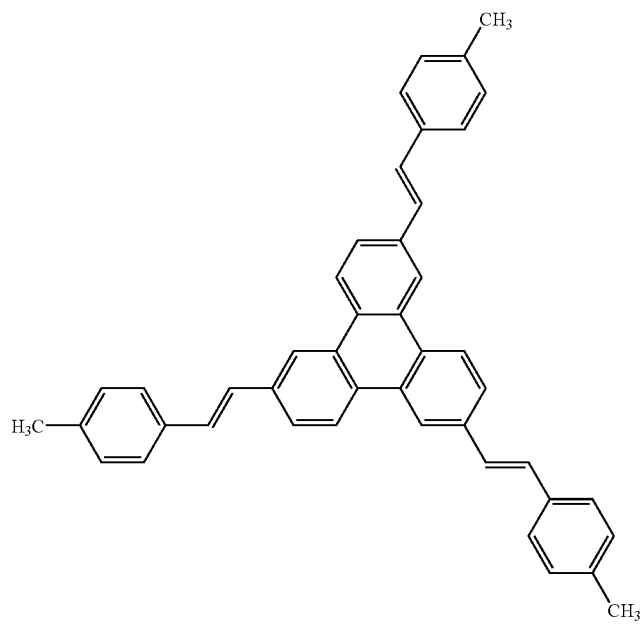
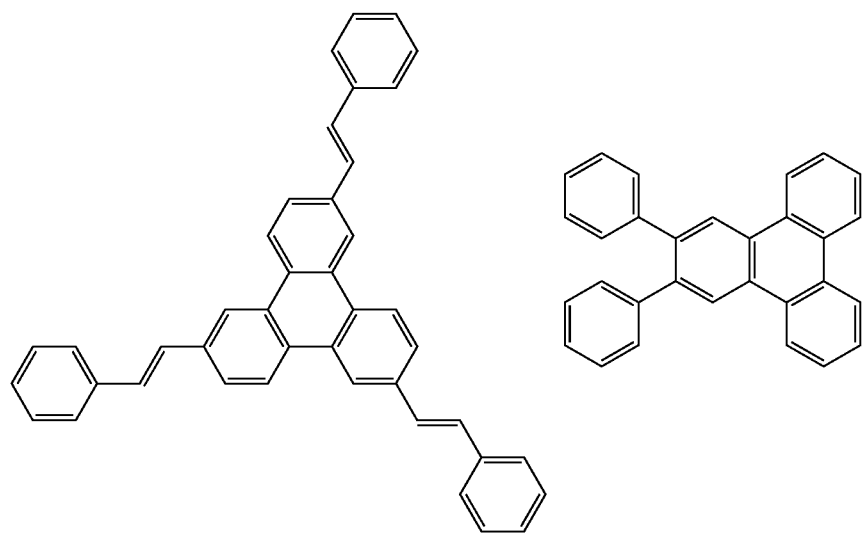

189
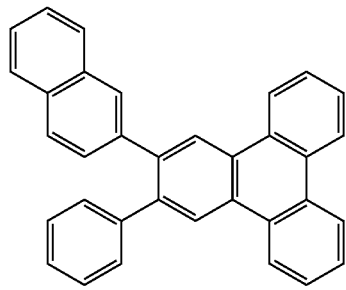
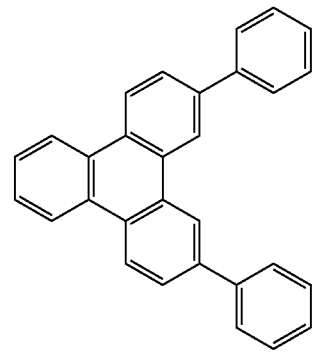
190
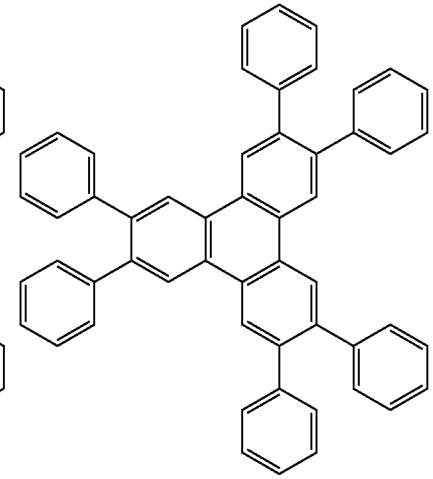
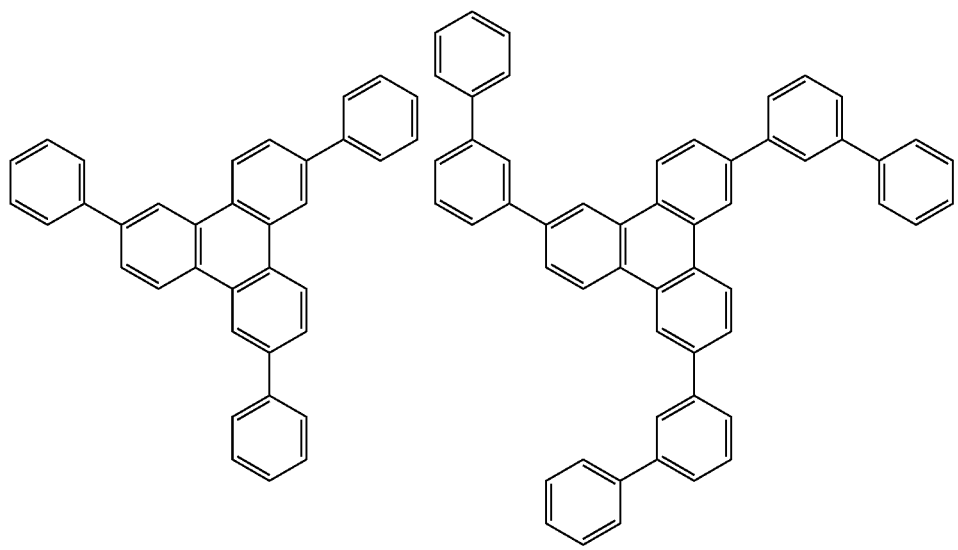
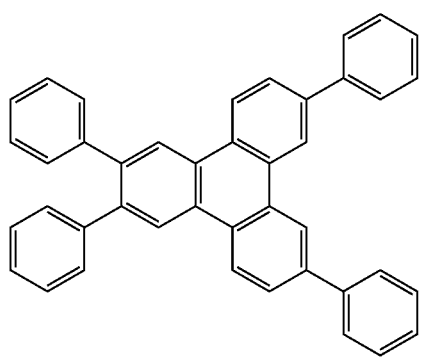
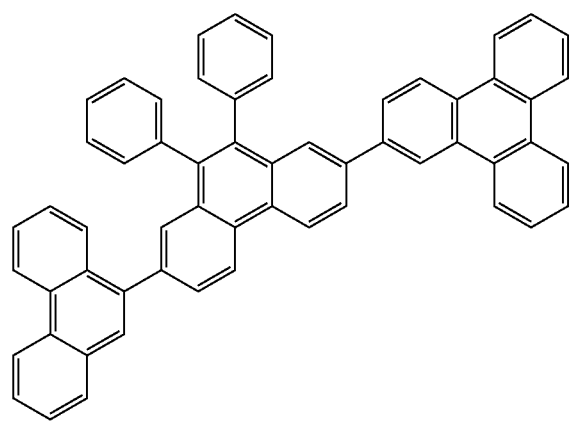

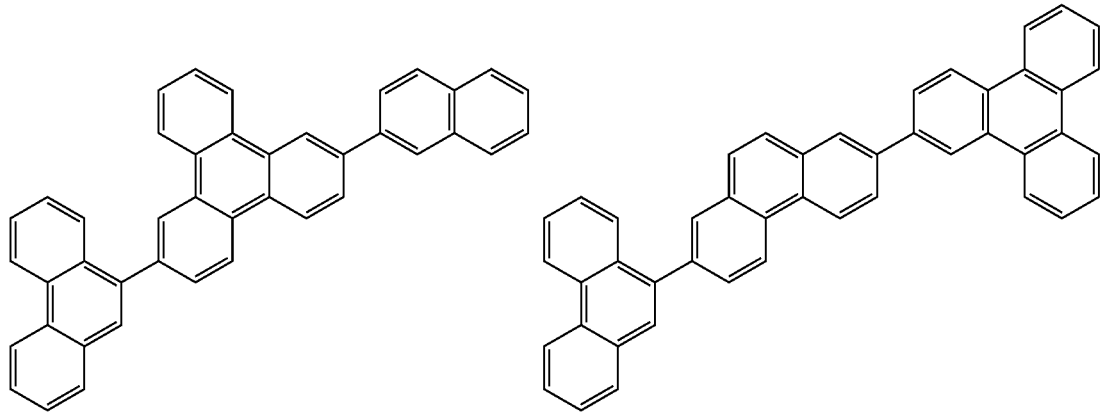
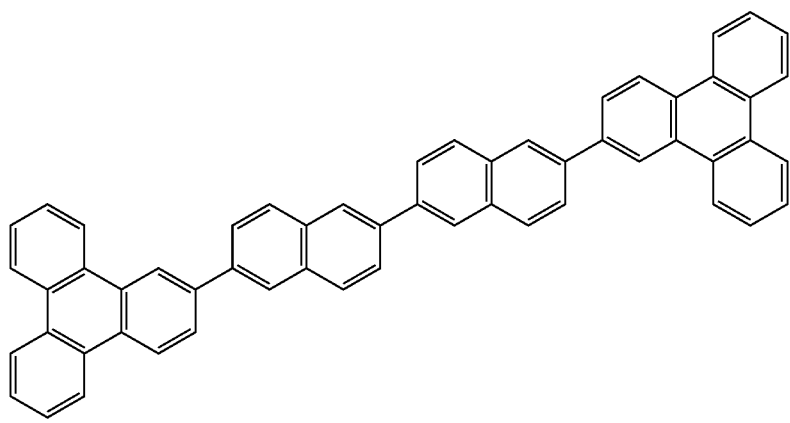
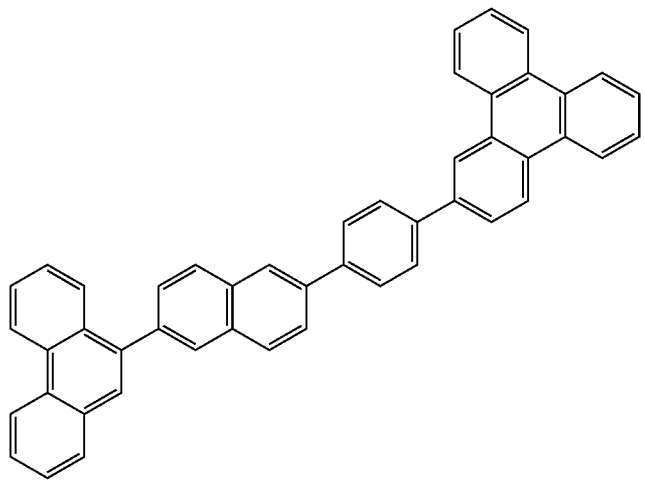
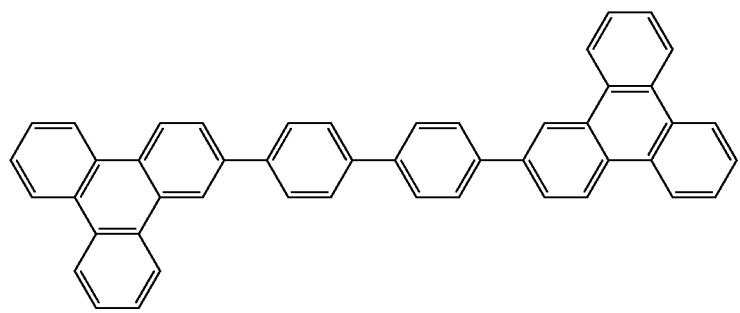

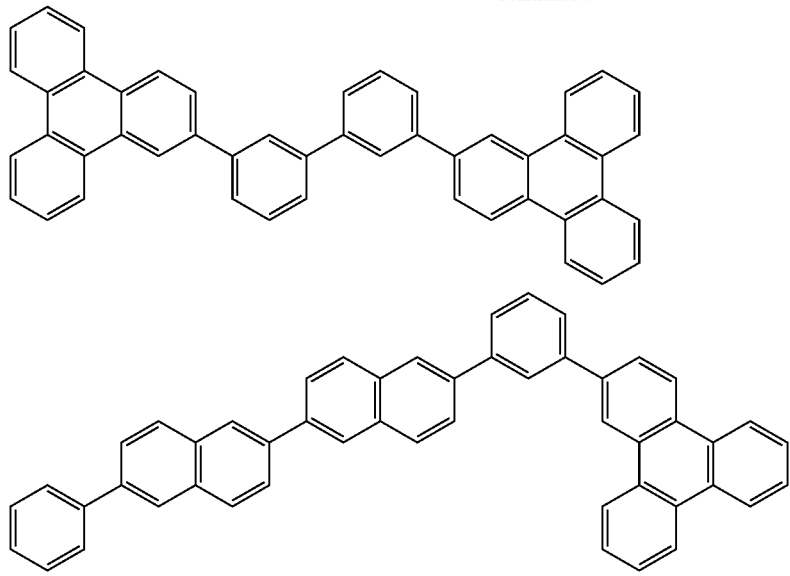
The fused polycyclic aromatic skeleton part may contain a nitrogen atom, and may be the following, for example.
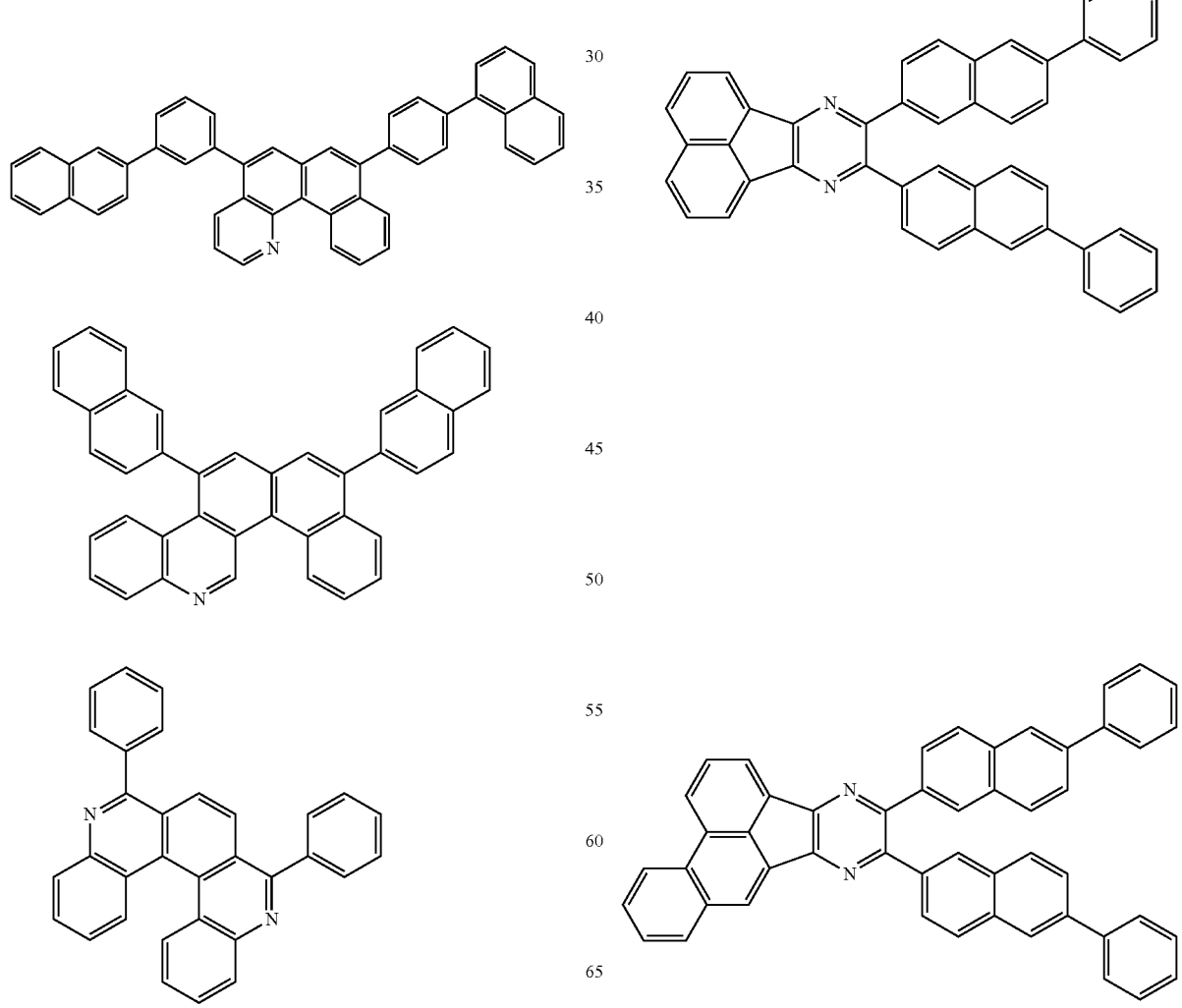

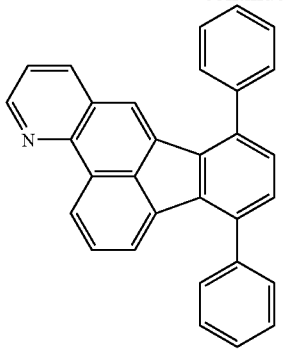 [SMILES: c1ccc(-c2ccc(-c3ccccc3)c3c2-c2cccc4c2c-3cc2cccnc24)cc1]

In the organic EL device of the invention, it is preferred that one or both of the host material of the emitting layer or the main material forming the electron-injecting controlling layer be shown by the following formula (5) or (6).

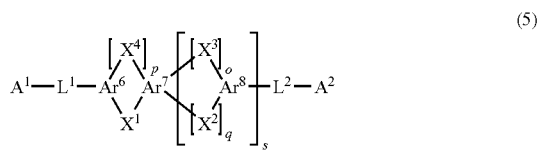

(5)

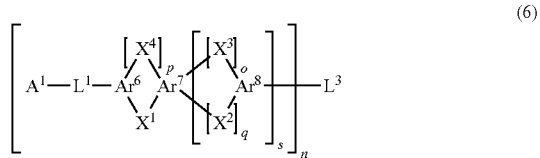

(6)

In formulas (5) and (6), $Ar^6$, $Ar^7$ and $Ar^8$ are independently a substituted or unsubstituted aromatic hydrocarbon group having 6 to 24 ring carbon atoms or a substituted or unsubstituted aromatic heterocyclic group having 3 to 24 ring atoms. However, $Ar^6$, $Ar^7$ and $Ar^8$ may have one or a plurality of substituent Y. Y is an alkyl group having a 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms which bonds to $Ar^6$, $Ar^7$ and $Ar^8$ via a carbon-carbon bond.

In formulas (5) and (6), $X^1$, $X^2$, $X^3$ and $X^4$ are independently O, S, N—$R^1$ or $CR^2R^3$. o, p and q are 0 or 1, s is 1, 2 or 3. $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In formulas (5) and (6), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to $Ar^6$ via a carbon-carbon bond.

In formula (5), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to $Ar^8$ via a carbon-carbon bond.

In formula (6), n is 2, 3 or 4, each forms a dimmer, a trimmer or a tetramer with $L^3$ being a linking group.

In formula (6), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to $Ar^8$ via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms or a substituted or unsubstituted trivalent aromatic heterocyclic group having 3 to 24 ring atoms which bonds to $Ar^8$ via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms or a substituted or unsubstituted tetravalent aromatic heterocyclic group having 3 to 24 ring atoms which bonds to $Ar^8$ via a carbon-carbon bond.

In formulas (5) and (6), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which bonds to $L^1$ via a carbon-carbon bond.

In formula (5), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atom or a substituted or unsubstituted aromatic heterocyclic group having 3 to 24 ring atoms which bonds to $L^2$ via a carbon-carbon bond.

It is preferred that the material for an organic EL device shown by formula (5) be a material for an organic EL device shown by any of the following formulas (10) to (13), (17), (19) and (21). It is preferred that the material for an organic EL device shown by formula (6) be a material for an organic EL device shown by any of the following formulas (9), (14) to (16), (18), (20) and (22).

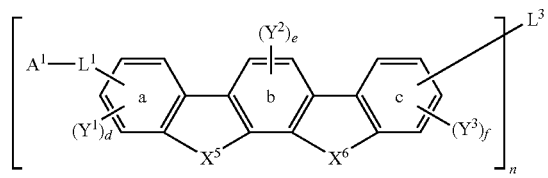

(9)

(10)

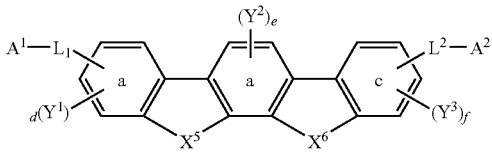

In formulas (9) and (10), $X^5$ and $X^6$ are independently O, S, N—$R^1$ or $CR^2R^3$. $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In formulas (9) and (10), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring a via a carbon-carbon bond.

In formula (9), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond.

In formula (10), n is 2, 3 or 4, each forms a dimmer, a trimmer or a tetramer with $L^3$ being a linking group.

In formula (10), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon atoms having 6 to 24 ring carbon atoms or a substituted or unsubstituted trivalent aromatic heterocyclic group having 3 to 24 ring atoms which bonds to the benzene ring c via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon atoms having 6 to 24 ring carbon atoms or a substituted or unsubstituted tetravalent aromatic heterocyclic group having 3 to 24 ring atoms which bonds to the benzene ring c via a carbon-carbon bond.

In formulas (9) and (10), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ via a carbon-carbon bond.

In formula (9), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ via a carbon-carbon bond.

In formulas (9) and (10), $Y^1$, $Y^2$ and $Y^3$ are independently an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 carbon atoms or a substituted or unsubstituted aromatic heterocyclic group having 3 to 24 ring atoms which bonds to the benzene rings a, b and c via a carbon-carbon bond. d and f are 0, 1, 2 or 3, and e is 0, 1 or 2.

In formulas (9) and (10), $A^1$, $A^2$, $L^1$, $L^2$ and $L^3$ do not contain a carbonyl group.

(11)

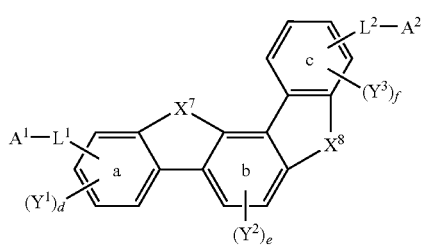

(12)

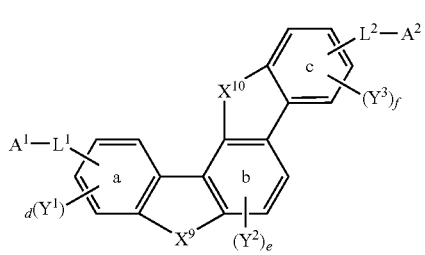

(13)

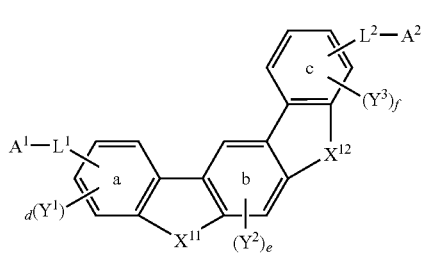

(14)

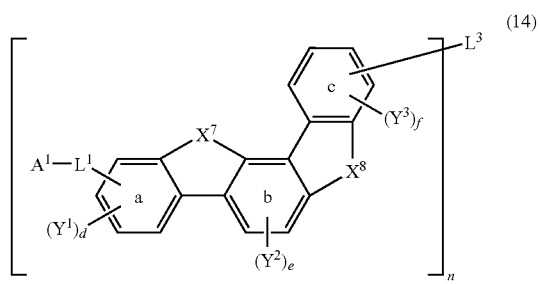

(15)

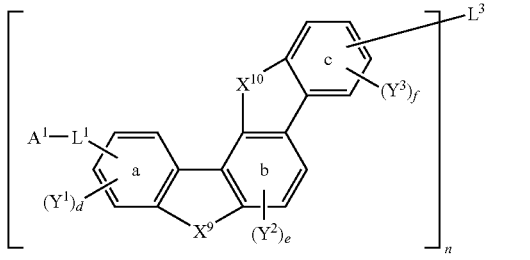

(16)

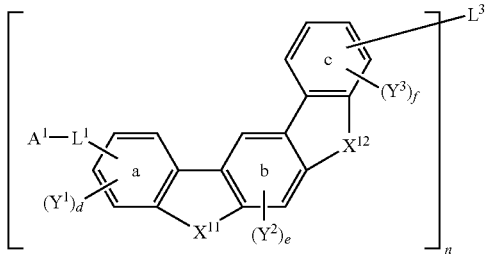

In formulas (11) to (16), $X^7$, $X^8$, $X^9$, $X^{10}$, $X^{11}$ and $X^{12}$ are independently O, S, N—$R^1$ or $CR^2R^3$.

In formulas (11) to (16), $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In formulas (11) to (16), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring a via a carbon-carbon bond.

In formulas (11) to (13), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond.

In formulas (14) to (16), n is 2, 3 or 4, each forms a dimmer, a trimmer or a tetramer with $L^3$ being a linking group.

In formulas (14) to (16), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon atoms having 6 to 24 ring carbon atoms or a substituted or unsubstituted trivalent aromatic heterocyclic group having 3 to 24 ring atoms which bonds to the benzene ring c via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon atoms having 6 to 24 ring carbon atoms or a substituted or unsubstituted tetravalent aromatic heterocyclic group having 3 to 24 ring atoms which bonds to the benzene ring c via a carbon-carbon bond.

In formulas (11) to (16), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ via a carbon-carbon bond.

In formulas (11) to (13), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ via a carbon-carbon bond.

In formulas (11) to (16), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which bonds to the benzene rings a, b or c via a carbon-carbon bond. d and f are 0, 1, 2 or 3, and e is 0, 1 or 2.

In formulas (11) to (16), $A^1$, $A^2$, $L^1$, $L^2$ and $L^3$ do not contain a carbonyl group.

(17)

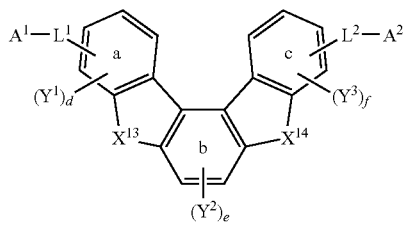

(18)

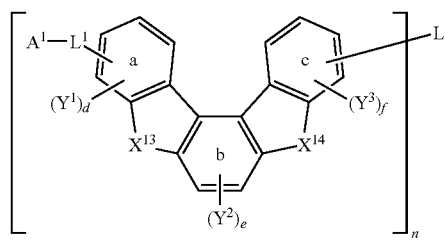

In formulas (17) and (18), $X^{13}$ and $X^{14}$ are independently O, S, N—$R^1$ or $CR^2R^3$. $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In formulas (17) and (18), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring a via a carbon-carbon bond.

In formula (17), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted mono- or divalent aromatic heterocyclic group having 3 to 24 ring atoms which bonds to the benzene ring c via a carbon-carbon bond.

In formula (18), n is 2, 3 or 4, each forms a dimmer, a trimmer or a tetramer with $L^3$ being a linking group.

In formula (18), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon atoms having 6 to 24 ring carbon atoms or a substituted or unsubstituted trivalent aromatic heterocyclic group having 3 to 24 ring atoms which bonds to the benzene ring c via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon atoms having 6 to 24 ring carbon atoms or a substituted or unsubstituted tetravalent aromatic heterocyclic group having 3 to 24 ring atoms which bonds to the benzene ring c via a carbon-carbon bond.

In formulas (17) and (18), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ via a carbon-carbon bond.

In formula (17), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ via a carbon-carbon bond.

In formulas (17) and (18), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which bonds to the benzene rings a, b or c via a carbon-carbon bond. d and f are 0, 1, 2 or 3, and e is 0, 1 or 2.

In formulas (17) and (18), $A^1$, $A^2$, $L^1$, $L^2$ and $L^3$ do not contain a carbonyl group.

It is preferred that the compound shown by formula (9) or (10) be a benzofuranodibenzofuran derivative shown by any of the following formulas (19) or (20):

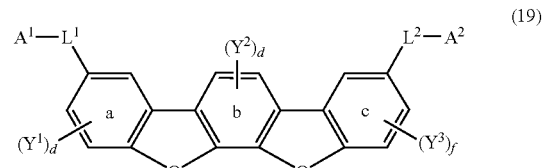

(19)

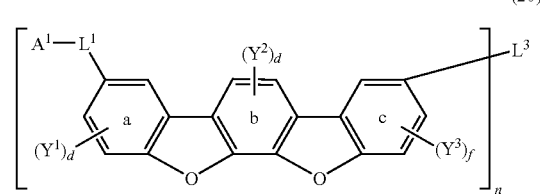

(20)

In formulas (19) and (20), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond.

In formula (19), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted mono- or divalent aromatic heterocyclic group having 3 to 24 ring atoms which bonds to the benzene ring c via a carbon-carbon bond.

In formula (19), n is 2, 3 or 4, each forms a dimmer, a trimmer or a tetramer with $L^3$ being a linking group.

In formula (20), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon atoms having 6 to 24 ring carbon atoms or a substituted or unsubstituted trivalent aromatic heterocyclic group having 3 to 24 ring atoms which bonds to the benzene ring c via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon atoms having 6 to 24 ring carbon atoms or a substituted or unsubstituted tetravalent aromatic heterocyclic group having 3 to 24 ring atoms which bonds to the benzene ring c via a carbon-carbon bond.

In formulas (19) and (20), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ via a carbon-carbon bond.

In formula (18), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^2$ via a carbon-carbon bond.

In formulas (19) and (20), $Y^1$, $Y^2$ and $Y^3$ are independently an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which bonds to the benzene rings a, b or c via a carbon-carbon bond. d and f are 0, 1, 2 or 3, and e is 0, 1 or 2.

In formulas (19) and (20), $A^1$, $A^2$, $L^1$, $L^2$ and $L^3$ do not contain a carbonyl group.

It is preferred that the compound shown by formula (13) or (16) be a benzofuranodibenzofuran derivative shown by any of the following formulas (21) or (22):

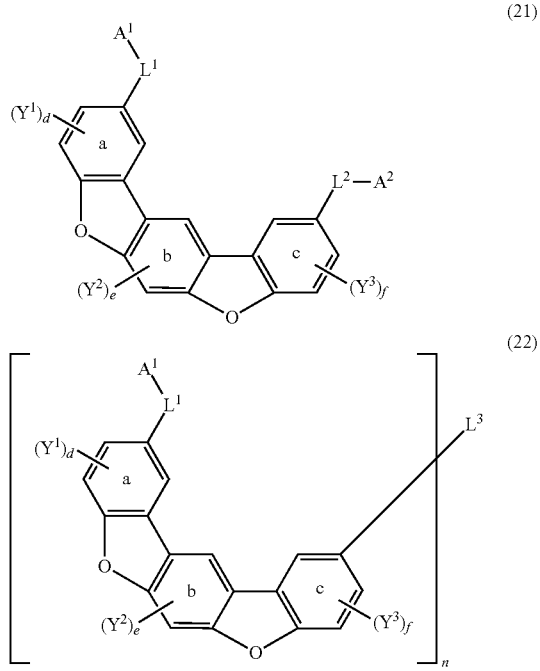

In formulas (21) and (22), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring a via a carbon-carbon bond.

In formula (21), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond.

In formula (22), n is 2, 3 or 4, each forms a dimmer, a trimmer or a tetramer with $L^3$ being a linking group.

In formula (22), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which bonds to the benzene ring c via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon atoms having 6 to 24 ring carbon atoms or a substituted or unsubstituted trivalent aromatic heterocyclic group having 3 to 24 ring atoms which bonds to the benzene ring c via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon atoms having 6 to 24 ring carbon atoms or a substituted or unsubstituted tetravalent aromatic heterocyclic group having 3 to 24 ring atoms which bonds to the benzene ring c via a carbon-carbon bond.

In formulas (21) and (22), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or an aromatic heterocyclic group having 3 to 24 ring atoms which bonds to $L^1$ via a carbon-carbon bond.

In formula (21), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which bonds to $L^2$ via a carbon-carbon bond.

In formulas (21) and (22), $Y^1$, $Y^2$ and $Y^3$ are an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which bonds to the benzene rings a, b or c via a carbon-carbon bond. d and f are 0, 1, 2 or 3, and e is 0, 1 or 2.

In formulas (21) and (22), $A^1$, $A^2$, $L^1$, $L^2$ and $L^3$ do not contain a carbonyl group.

In formulas (5) to (22), specific examples of each group are explained below.

As the substituted or unsubstituted aromatic hydrocarbon group having 6 to 24 ring carbon atoms shown by $Ar^6$ to $Ar^8$, $Y, Y^1$ to $Y^3, R^1$ to $R^3, L^1$ to $L^3$ and $A^1$ to $A^2$, residues with a corresponding valency of a substituted or unsubstituted benzene, naphthalene, biphenyl, terphenyl, fluorene, phenanthrene, triphenylene, perylene, chrysene, fluoranthene, benzofluorene, benzotriphenylene, benzochrysene, anthracene or the like can be given, for example. Benzene, naphthalene, biphenyl, terphenyl, fluorene and phenanthrene are preferable.

As the substituted or unsubstituted aromatic heterocyclic ring group having 3 to 24 ring atoms shown by $Ar^6$ to $Ar^8, Y, Y^1$ to $Y^3, R^1$ to $R^3, L^1$ to $L^3$ and $A^1$ to $A^2$, residues of a corresponding valency of pyridine, pyridazine, pyrimidine, pyrazine, 1,3,5-triazine, carbazole, dibenzofuran, dibenzothiophene, phenoxadine, phenothiazine and dihydroacrylidine can be given. Pyridine, pyridazine, pyrimidine, pyrazine, carbazole, dibenzofuran, dibenzothiophene, phenoxazine and dihydroacrydine are preferable. As the at least one monovalent substituted or unsubstituted fused aromatic heterocyclic group having 8 to 24 ring carbon atoms shown by $R^1$, one with a fused structure can be selected from the examples of the aromatic heterocyclic ring group.

As the alkyl group having 1 to 20 carbon atoms, the alkylene group, the trivalent or tetravalent alkane shown by $Y, Y^1$ to $Y^3, L^1$ to $L^3$ and $R^1$ to $R^3$, a methyl group, ethyl group, propyl group, isopropyl group, n-butyl group, s-butyl group, t-butyl group, isobutyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group or 3-methylpentyl group, or di- to tetravalent groups of these. Of these, a methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 1-pentylhexyl group, 1-butylpentyl group and 1-heptyloctyl group are preferable.

As the substituted or unsubstituted cycloalkyl group having 3 to 20 ring carbon atoms, the cycloalkylene group, the trivalent or tetravalent cycloalkane shown by $Y, Y^1$ to $Y^3, L^1$ to $L^3, R^1$ to $R^3$ and $A^1$ to $A^2$, a cyclopropyl group, cyclobutyl group, cyclopentyl group or a cyclohexyl group, or a di- to tetravalent groups of these can be given. Of these, a cyclobutyl group, cyclopentyl group and cyclohexyl group are preferable.

As the alkoxy group having 1 to 20 carbon atoms shown by $Y, Y^1$ to $Y^3$, a methoxy group, an ethoxy group, a methoxy group, an i-propoxy group, a n-propoxy group, a n-butoxy group, a s-butoxy group, a t-butoxy group or the like can be given. Of these, a methoxy group, an i-propoxy group and a n-propoxy group are preferable.

As the silyl group having 1 to 20 carbon atoms shown by $Y, Y^1$ to $Y^3, L^1$ to $L^3, R^1$ to $R^3$ and $A^1$ to $A^2$, a trimethylsilyl group, a triethylsilyl group, a tributylsilyl group, a trioctylsilyl group, a triisobutylsilyl group, a dimethylethylsilyl group, a dimethylisopropylsilyl group, a dimethylpropylsilyl group, a dimethylbutylsilyl group, a dimethyl-tert-butylsilyl group, a diethylisopropylsilyl group, a phenyldimethylsilyl group, a diphenylmethylsilyl group, a diphenyl-tert-butyl group or a triphenylsilyl group, or a di- to trivalent group of these can be given. Of these, a trimethylsilyl group, a triethylsilyl group and a tributylsilyl group are preferable.

As the aralkyl group having 7 to 24 carbon atoms shown by $Y, Y^1$ to $Y^3$ and $R^1$ to $R^3$, a benzyl group, a phenetyl group, a phenylpropyl group or the like can be given.

As the substituent which can be substituted to each group in formulas (5) to (22), an alkyl group having 1 to 10 carbon atoms (methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisobutyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitromethyl, 2-nitromethyl, 2-nitroisobutyl, 1,2-dinitroethyl, 1,3-dinitroisopropyl, 2,3-dinitro-t-butyl, 1,2,3-trinitropropyl or the like), a cycloalkyl group having 3 to 40 ring carbon atoms (cyclopropyl, cyclobutyl, cyclopentyl, cyclohexyl, 4-methylcyclohexyl, 1-adamantyl, 2-adamantyl, 1-norbonyl, 2-norbonyl or the like), an alkoxy group having 1 to 6 carbon atoms (ethoxy, methoxy, i-propoxy, n-propoxy, s-butoxy, t-butoxy, pentoxy, hexyloxy or the like), a cycloalkoxy group having 3 to 10 ring carbon atoms (cyclopentoxy, cylohexyloxy or the like), an aromatic hydrocarbon group having 6 to 40 ring carbon atoms, an aromatic heterocyclic group having 3 to 40 ring atoms, an amino group substituted by an aromatic hydrocarbon group having 6 to 40 ring carbon atoms, an ester group having an aromatic hydrocarbon group having 6 to 40 ring carbon atoms, an ester group, having an alkyl group having 1 to 6 carbon atoms, a cyano group, a nitro group, a halogen atom or the like can be given.

Of these, an alkyl group having 1 to 6 carbon atoms, a phenyl group, a pyridyl group, a carbazolyl group and a dibenzofuranyl group are preferable. The number of substituent is preferably 1 to 2.

In the material for an organic EL device shown by formulas (6), (9), (14) to (16), (18), (20) or (22), n is preferably 2.

In the formulas (9), (10) to (13), (17), (19) or (21), the total number of substituents shown by $Y^1, Y^2$ and $Y^3$ is preferably 3 or less. In the formulas (10), (14) to (16), (18), (20) or (22), the total number of substituents shown by $Y^1, Y^2$ and $Y^3$ in one structure in $[\ ]_n$ is preferably 3 or less.

In formula (5) or (6), it is preferred that $X^1$ and $X^2$ or $X^3$ and $X^4$ are respectively shown by N—$R^1$, and that N—$R^1$ of $X^1$ and N—$R^1$ of $X^2$, or N—$R^1$ of $X^3$ and N—$R^1$ of $X^4$ be different from each other.

In formula (9) or (10), it is preferred that $X^5$ and $X^6$ be respectively shown by N—$R^1$, and that N—$R^1$ of $X^1$ and N—$R^1$ of $X^6$ be different from each other.

In formulas (11) to (16), it is preferred that $X^7$ and $X^8$, $X^9$ and $X^{10}$ or $X^{11}$ and $X^{12}$ be respectively shown by N—$R^1$, and that N—$R^1$ of $X^7$ and N—$R^1$ of $X^8$, N—$R^1$ of $X^9$ and N—$R^1$ of $X^{10}$, and N—$R^1$ of $X^{11}$ and N—$R^1$ of $X^{12}$ be different from each other.

In formula (17) or (18), it is preferred that $X^{13}$ and $X^{14}$ are respectively shown by N—$R^1$, and that N—$R^1$ of $X^{13}$ and N—$R^1$ of $X^{14}$ be different from each other.

In formulas (5), (6), and (9) to (18), it is preferred that $X^1$ and $X^2$, $X^3$ and $X^4$, $X^5$ and $X^6$, $X^7$ and $X^8$, $X^9$ and $X^{10}$, $X^{11}$ and $X^{12}$, $X^{13}$ and $X^{14}$ and $X^{15}$ and $X^{16}$ be an oxygen atom.

Then, an explanation is made on the device structure of an organic EL device.

(1) Structure of an Organic EL Device

FIG. 1 shows the outline of the device structure of the organic EL device of the invention.

An organic EL device 1 has a transparent substrate 2, an anode 3, a hole-injecting/transporting layer 4, an emitting layer 5, an electron-injecting controlling layer 6, an electron-transporting layer 7 and a cathode 8.

It is not necessary to provide the hole-injecting/transporting layer 4.

An electron-blocking layer may be provided on the anode 3 side of the emitting layer 5 such that it is in contact with the emitting layer 5.

Due to such a configuration, it is possible to confine electrons within the emitting layer 5 to enhance the probability of exciton generation within the emitting layer 5.

(2) Substrate 2

The substrate 2 is a member for supporting the organic EL device, and is preferably a flat and smooth member having a 400-to-700-nm-visible-light transmittance of 50% or more. Specific examples of the substrate 2 include glass.

(3) Anode 3

The anode 3 plays a role for injecting holes into the hole-injecting/transporting layer 4 or the emitting layer 5. The anode effectively has a work function of 4.5 eV or more. Specific examples of the material for the anode include indium tin oxide alloy (ITO), tin oxide (NESA), indium-oxide-zinc oxide, gold, silver, platinum and copper.

(4) Hole-Injecting/Transporting Layer 4

The hole-injecting/transporting layer 4 is provided between the emitting layer 5 and the anode 3, and serves to help injection of the holes to the emitting layer 5, as well as to transport the holes to the emitting region. As the material for forming the hole-injecting/transporting layer 4, 4,4'-bis[N-(1-naphthyl)-N-phenylamino]biphenyl (hereinafter abbreviated as NPD) or the like can be given.

In addition to the above, specific examples of materials for the hole-injecting/transporting layer 4 include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrazoline derivatives and pyrazolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, and 54-119925, and others), arylamine derivatives (see U.S. Pat. Nos. 3,567,450, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. No. 3,717,462, JP-A-54-59143, 55-52063, 55-52064, 55-46760, 57-11350, 57-148749 and 2-311591, and others), stilbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive high molecular oligomers (in particular thiophene oligomers).

As the material for the hole-injecting/transporting layer 4, the substances as mentioned above can be used. The following can also be used: porphyrin compounds (disclosed in JP-A-63-295695 and others), aromatic tertiary amine compounds and styrylamine compounds (see U.S. Pat. No. 4,127,412, JP-A-53-27033, 54-58445, 55-79450, 55-144250, 56-119132, 61-295558, 61-98353 and 63-295695, and others). Aromatic tertiary amine compounds are particularly preferably used.

The following can also be given as examples: 4,4'-bis(N-(1-naphthyl)-N-phenylamino)biphenyl (abbreviated by NPD, hereinafter), which has in the molecule thereof two fused aromatic rings, disclosed in U.S. Pat. No. 5,061,569, and 4,4',4''-tris(N-(3-methylphenyl)-N-phenylamino)triphenylamine (abbreviated by MTDATA, hereinafter) wherein three triphenylamine units are linked to each other in a starburst form, disclosed in JP-A-4-308688.

In addition, inorganic compounds such as p-type Si and p-type SiC can be used as a material for forming the hole-injecting/transporting layer 4. Further, a hexaazatriphenylene derivative or the like disclosed in Japanese Patent Publication Nos. 3614405, 3571977 or the U.S. Pat. No. 4,780,536 can preferably be used as a material for forming the hole-injecting/transporting layer 4.

(5) Emitting Layer 5

The emitting layer 5 contains a host material and a dopant. As the host material, the fused polycyclic aromatic compound shown by the above-mentioned formulas (A), (B) and (C), or a compound having the above-mentioned substituted or unsubstituted fused polycyclic aromatic compound, in which the fused polycyclic aromatic skeleton part is contained in the chemical structure as a group of divalent or more valences can be given. It is also possible to use the rudder compound shown by the above-mentioned formulas (5) and (6). As the dopant, a phosphorescent dopant is preferable. Examples thereof include the above-mentioned materials, but are not limited thereto.

The thickness of the emitting layer is preferably 5 to 100 nm, more preferably 5 to 50 nm. The concentration of the phosphorescent dopant is preferably 2 to 20%, more preferably 5 to 15%.

(6) Electron-Injecting Controlling Layer 6

As mentioned above, it is desired that the electron-injecting controlling layer 6 be function as a hole-blocking layer.

As specific examples of the material forming the electron-injecting controlling layer 6, the materials exemplified above as the host material of the above-mentioned emitting layer 5 can be given, but are not limited thereto. As the phosphorescent dopant to be contained in the electron-injecting controlling layer 6, the above-mentioned materials can be used, although usable dopants are not limited thereto. The phosphorescent dopant contained in the electron-injecting controlling layer 6 may be either the same as or different from the phosphorescent dopant contained in the emitting layer 5.

The thickness of the electron-injecting controlling layer is preferably 5 to 50 nm, more preferably 5 to 20 nm. The concentration of the phosphorescent dopant is desirably 2 to 15%, more preferably 2 to 10%.

(7) Electron-Transporting Layer 7

The electron-transporting layer 7 serves to help injection of electrons to the emitting layer 5. In addition, the electron-transporting layer 7 may be configured to serve also as an electron-injection layer.

In the invention, the electron mobility of the material forming the electron-transporting layer 7 is $10^5$ cm$^2$/Vs or more in an electric field intensity of 400 to 500 $(V/cm)^{1/2}$. As the material for forming such electron-transporting layer 7, the materials mentioned above can be given.

In the invention, it is preferred that a reducing dopant be added in the interfacial region between the cathode 8 and the electron-transporting layer 7.

Due to such a configuration, the organic EL device can have an improved luminance and a prolonged lifetime.

The reducing dopant is defined as a substance which can reduce an electron-transferring compound. Accordingly, various substances which have given reducing properties can be used. For example, at least one substance can be preferably used which is selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, alkali metal organic complexes, alkaline earth metal organic complexes, and rare earth metal organic complexes.

More specific examples of the preferred reducing dopants include at least one alkali metal selected from the group consisting of Li (work function: 2.9 eV), Na (work function: 2.36 eV), K (work function: 2.28 eV), Rb (work function: 2.16 eV) and Cs (work function: 1.95 eV), and at least one alkaline earth metal selected from the group consisting of Ca (work function: 2.9 eV), Sr (work function: 2.0 to 2.5 eV), and Ba (work function: 2.52 eV). A reducing dopant having a work function of 2.9 eV or less is particularly preferable.

Among these, a more preferable reducing dopant is at least one alkali metal selected from the group consisting of K, Rb and Cs. Even more preferable is Rb or Cs. The most preferable is Cs. These alkali metals are particularly high in reducing ability. Thus, the addition of a relatively small amount thereof to an electron-injecting zone improves the luminance of the organic EL device and make the lifetime thereof long. As a reducing agent having a work function of 2.9 eV or less, combinations of two or more alkali metals are preferable, particularly combinations including Cs, such as Cs and Na, Cs and K, Cs and Rb, or Cs, Na and K are preferable. The combination containing Cs makes it possible to exhibit the reducing ability efficiently. The luminance of the organic EL device can be improved and the lifetime thereof can be made long by the addition thereof to its electron-injecting zone.

The thickness of the electron-transporting layer 7 is preferably 1 to 100 nm, although the thickness is not limited thereto.

(8) Cathode 8

As the material forming the cathode 8, aluminum or the like can be given, for example.

Next, the method for producing the organic EL device of the invention will be described below.

Using the materials as exemplified above, the organic EL device 1 can be fabricated by forming, on the substrate 2, the anode 3, the hole-injecting/transporting layer 4, the emitting layer 5, the electron-injecting controlling layer 6, the electron-transporting layer 7 and the cathode 8. The organic EL device can be fabricated in the order reverse to the above, i.e., the order from a cathode to an anode. A fabrication example is mentioned below.

The method for forming each layer of the organic EL device 1 is not particularly limited, and conventional vacuum vapor deposition, spin coating or the like can be used. That is, the electron-injection controlling layer can be formed by a known method such as vacuum vapor deposition, molecular beam epitaxy (MBE), or a coating method using a solution in which the material is dissolved in a solvent, such as dipping, spin coating, casting, bar coating, roll coating, and ink jetting.

The film thickness of each of the organic layers in the organic EL device 1 of the invention is not particularly limited. In general, defects such as pinholes are easily generated when the film thickness is too small. Conversely, when the film thickness is too large, a high applied voltage becomes necessary, leading to a low efficiency. Usually, the film thickness is preferably in the range of several nanometers to one micrometer.

The method for fabricating the organic EL device 1 is mentioned below more specifically.

In fabricating the organic EL device 1, first, a thin film made of an anode material is formed into a thickness of 1 µm or less, preferably 10 to 200 nm on an appropriate transparent substrate 2 by vapor deposition, sputtering or some other method, thereby forming the anode 3.

Next, the hole-injecting/transporting layer 4 is provided on this anode 3. The hole-injecting/transporting layer 4 can be formed by vapor vacuum deposition, spin coating, casting, the LB method, or the like. It is preferred that the film thickness be appropriately selected within a range of 5 nm to 5 µm.

Next, the emitting layer 5 provided on the hole-injecting/transportation layer 4 can be formed by using a desired organic emitting material and by forming this organic emitting material into a thin film according to a dry process, the representative example of which is vacuum vapor deposition, and a wet process such as spin coating and casing. It is preferred that the film thickness of the emitting layer 5 be within a range of from 5 nm to 50 nm.

Next, the electron-injecting controlling layer 6 is provided on the emitting layer 5. The electron-injecting controlling layer 6 can be formed by a method similar to the method for forming the emitting layer 5. It is preferred that the film thickness of the organic layer be within a range of from 5 nm to 50 nm.

The total film thickness of the emitting layer 5 and the electron-injecting controlling layer 6 is 10 nm to 60 nm, more preferably 10 nm to 50 nm.

The electron-transporting layer 7 is provided on this electron-injecting controlling layer 6. The electron-transporting layer 7 can be formed by a method similar to the method for forming the hole-injecting/transporting layer 4. It is preferred that the film thickness of the electron-transporting layer 7 be appropriately selected within a range of from 5 nm to 5 µm.

Lastly, the cathode 8 is stacked thereon to obtain the organic EL device 1. The cathode 8 is made of a metal, and can be formed by vacuum vapor deposition or sputtering. However, vapor vacuum deposition is preferred in order to protect underlying organic layers from being damaged when the cathode film is formed.

The invention is not limited to the above-mentioned embodiments, and various modifications, improvement or the like can be made insofar as the object of the invention can be attained.

EXAMPLES

The invention will be explained below in more detail with Examples and Comparative Examples, but is not limited thereto.

Example 1

A glass substrate (made by Geomatic Co.) measuring 25 mm by 75 mm by 0.7 mm-thickness with an ITO transparent electrode was subjected to ultrasonic wave cleaning in isopropyl alcohol for five minutes and then to UV ozone cleaning for thirty minutes. This glass substrate with the transparent electrode line was set on a vapor deposition apparatus, and following compound (HT1) was deposited in a thickness of 50 nm on the surface of a side on which the transparent electrode line was formed so as to cover the transparent electrode. The HT1 layer functions as a hole injecting/transporting layer. As a host of the emitting layer, following compound (H2) was formed in a thickness of 40 nm by a resistance heating deposition. At the same time, as a phosphorescent dopant, the following compound (D1) was deposited with a mass ratio to the compound (H2) of 10%. This layer functions as an emitting layer. Next, the following compound (H3) forming an electron-injecting controlling layer was formed in a thickness of 5 nm on the phosphorescent emitting layer.

Further, the following compound (J) was formed in a thickness of 35 nm. This layer functions as an electron-transporting layer. Then, as an electron-injecting electrode (cathode), LiF was formed in a thickness of 1 nm with a film-forming rate of 0.1 nm/min. A metal aluminum was deposited on the LiF layer as a metal cathode having a thickness of 80 nm to form an organic EL device.

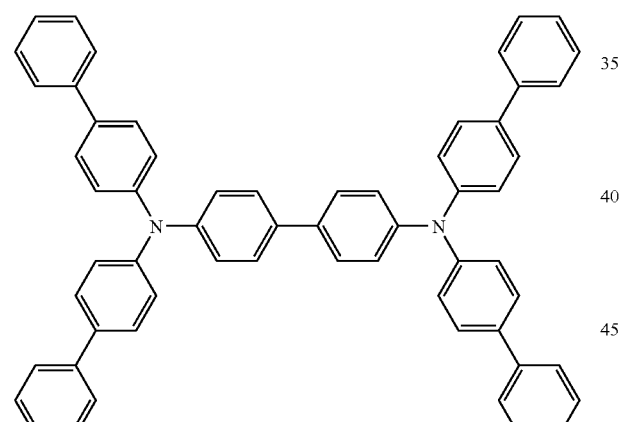
(HT1)

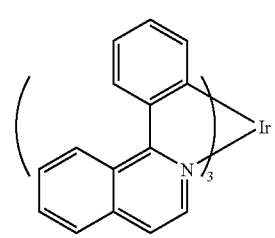
(D1)

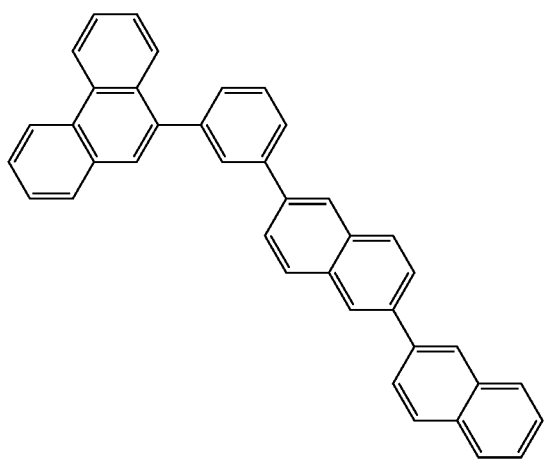
(H2)

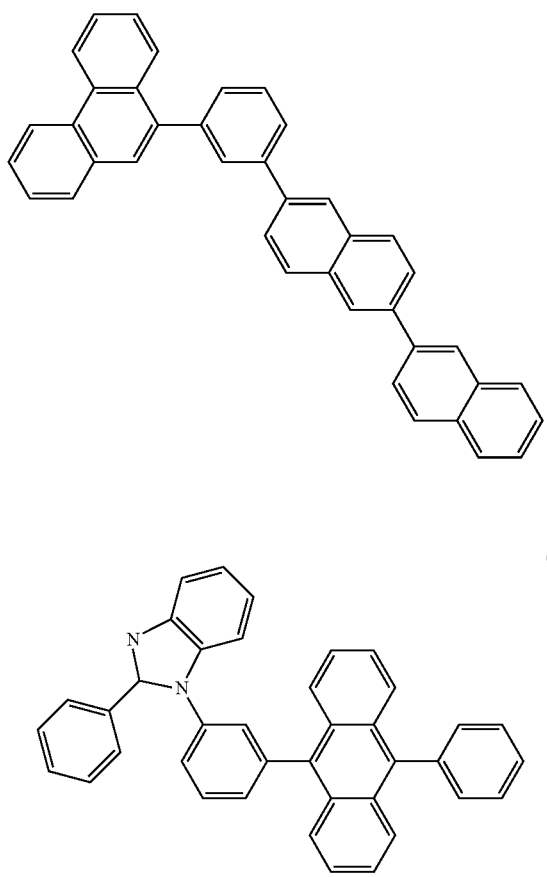
(J)

(H3)

Example 2

An organic EL device was prepared in the same manner as Example 1 expect for using the following compound (H4) as the electron-injecting controlling layer.

Example 3

An organic EL device was prepared in the same manner as Example 1 expect for using the following compound (H5) as the electron-injecting controlling layer.

Example 4

An organic EL device was prepared in the same manner as Example 1 expect for using the following compound (H6) as the electron-injecting controlling layer.

Example 5

An organic EL device was prepared in the same manner as Example 1 expect for using the following compound (H7) as the electron-injecting controlling layer.

Example 6

An organic EL device was prepared in the same manner as Example 1 expect for using the following compound (H8) as the electron-injecting controlling layer.

Example 7

An organic EL device was prepared in the same manner as Example 1 expect for using the following compound (H9) as the host of the emitting layer and using the following compound (H2) as the electron-injecting controlling layer.

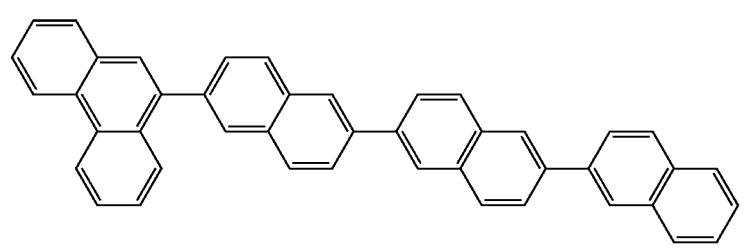

(H4)

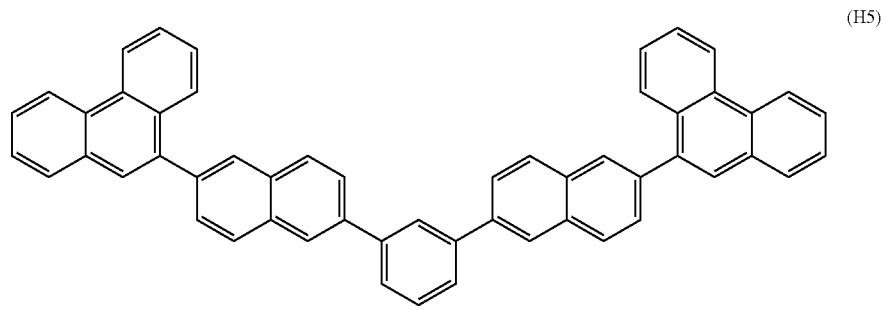

(H5)

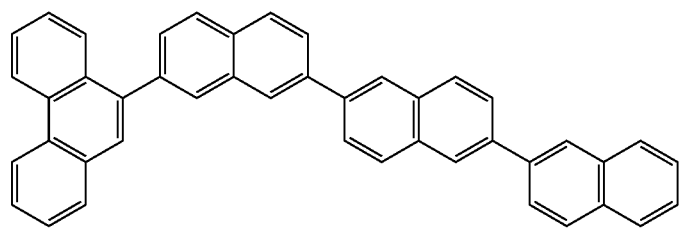

(H6)

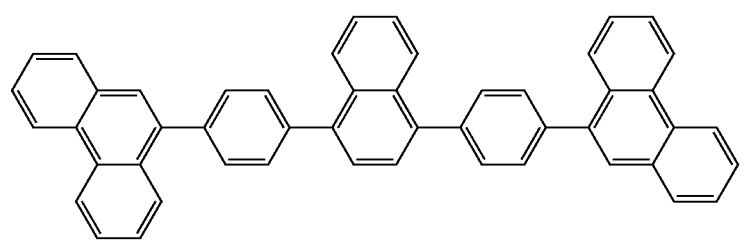

(H7)

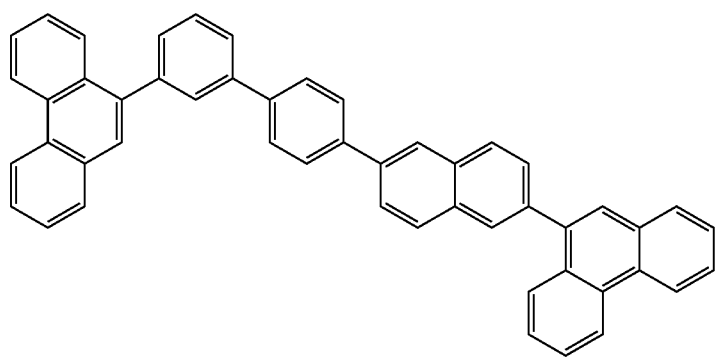
(H8)

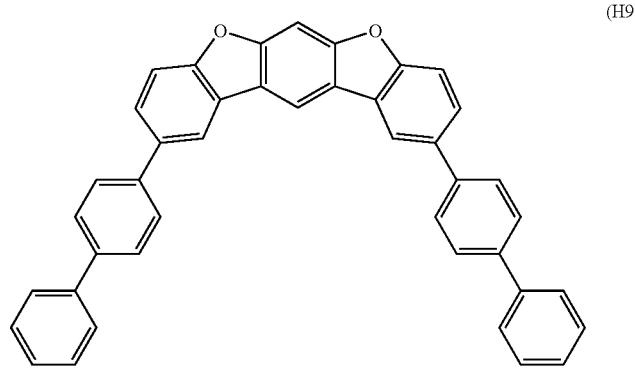 [SMILES: c1ccc(-c2ccc(-c3ccc4oc5cc6oc7ccc(-c8ccc(-c9ccccc9)cc8)cc7c6cc5c4c3)cc2)cc1]
(H9)

Comparative Example 1

An organic EL device was prepared in the same manner as Example 1 expect for using H2 as the electron-injecting controlling layer and using $Alq_3$ as the electron-transporting layer.

Comparative Example 2

An organic EL device was prepared in the same manner as Example 1 expect for using CBP as the emitting layer, using BCP as the electron-injecting controlling layer and using Bphen as the electron-transporting layer.

Comparative Example 3

An organic EL device was prepared in the same manner as Example 1 expect for using CBP as the emitting layer and using (H8) as the electron-injecting controlling layer.

Comparative Example 4

An organic EL device was prepared in the same manner as Example 1 expect for using CBP as the emitting layer and using Bphen as the electron-injecting controlling layer.

Comparative Example 5

An organic EL device was prepared in the same manner as Example 1 expect for using Balq as the emitting layer and using (H8) as the electron-injecting controlling layer.

Comparative Example 6

An organic EL device was prepared in the same manner as Example 1 expect for using $Alq_3$ as the electron-transporting layer.

Evaluation of the Organic EL Device

The organic EL device made as above was caused to emit light by passing 1 $mA/cm^2$ direct current. The luminous chromaticity, the luminous efficiency and the voltage were measured. From these, the external quantum efficiency EQE (%) was obtained. In addition, a continuous current test (room temperature/70° C.) of direct current with an initial luminance of 10000 $cd/m^2$ was conducted to measure the half life of each organic EL device.

The results are shown in Table 1.

TABLE 1

| | Current density ($mA/cm^2$) | Chromaticity X | Chromaticity Y | Luminous efficiency (cd/A) | E.Q.E. (%) | Life at room temperature @10000 $cd/m^2$ | Life at 70° C. @10000 $cd/m^2$ |
|---|---|---|---|---|---|---|---|
| Example 1 | 1 | 0.681 | 0.318 | 9.08 | 13.1 | 1815H | 246H |
| Example 2 | 1 | 0.681 | 0.318 | 8.38 | 12.3 | 1920H | 306H |
| Example 3 | 1 | 0.681 | 0.318 | 8.34 | 12.1 | 2100H | 160H |
| Example 4 | 1 | 0.682 | 0.318 | 8.14 | 12.1 | 1320H | 284H |
| Example 5 | 1 | 0.681 | 0.318 | 7.81 | 11.3 | 1732H | 212H |

TABLE 1-continued

|  | Current density (mA/cm$^2$) | Chromaticity X | Chromaticity Y | Luminous efficiency (cd/A) | E.Q.E. (%) | Life at room temperature @10000 cd/m$^2$ | Life at 70° C. @10000 cd/m$^2$ |
|---|---|---|---|---|---|---|---|
| Example 6 | 1 | 0.681 | 0.318 | 8.46 | 12.3 | 1520H | 160H |
| Example 7 | 1 | 0.681 | 0.318 | 8.22 | 12 | 1500H | 130H |
| Com. Ex. 1 | 1 | 0.68 | 0.32 | 7.06 | 9.95 | 1300H | 13H |
| Com. Ex. 2 | 1 | 0.681 | 0.319 | 5.83 | 8.33 | 10H | 2H |
| Com. Ex. 3 | 1 | 0.681 | 0.318 | 6.67 | 9.75 | 95H | 31H |
| Com. Ex. 4 | 1 | 0.681 | 0.319 | 6.61 | 9.34 | 52H | 2H |
| Com. Ex. 5 | 1 | 0.68 | 0.319 | 6.76 | 9.8 | 360H | 79H |
| Com. Ex. 6 | 1 | 0.68 | 0.32 | 7.1 | 10.1 | 1200H | 50H |

The electron mobilities (electric field intensity: 400-500 (V/cm)$^{1/2}$) of the compound (J), tris(8-quinolinol)aluminum (Alq$_3$) and Bphen are shown in the following Table 2. The measuring method is the same as mentioned above.

The lowest excited triplet energy Eg(T) of the compound (H2) to (H9), CBP, BCP, Balp and Bphen are shown in the following Table 2. The measuring method is the same as mentioned above.

The ionization potential Ip and the affinity Af of the compounds (H2) to (H9), BCP, Balp, Bphen, Alq$_3$, the compound (D1)(Ir(piq)$_3$) and compound (J) are shown in the following Table 2. The measuring method is the same as mentioned above.

The values of Ip and Af of CBP shown in Table 2 are those described in C. Adachi, R. Kwong, S. R. Forrest, Organic Electronics, vol. 2 37-43, 2001.

TABLE 2

| Compound | Ionization potential (eV) | Affinity (eV) | Lowest excited triplet energy (EgT) (eV) | Electron mobility (cm$^2$/Vs) |
|---|---|---|---|---|
| H2 | 6.04 | 2.55 | 2.44 | — |
| H3 | 6.05 | 2.66 | 2.38 | — |
| H4 | 6.10 | 2.77 | 2.40 | — |
| H5 | 6.23 | 2.69 | 2.50 | — |
| H6 | 6.09 | 2.69 | 2.44 | — |
| H7 | 6.25 | 2.73 | 2.52 | — |
| H8 | 6.17 | 2.71 | 2.50 | — |
| H9 | 5.95 | 2.35 | 2.70 | — |
| CBP | 6.30 | 3.00 | 2.60 | — |
| BCP | 6.60 | 3.00 | 2.80 | — |
| Balq | 5.80 | 2.80 | 2.20 | — |
| Bphen | 6.40 | 3.00 | 2.45 | $4.5 \times 10^{-4}$ |
| Alq$_3$ | 6.00 | 3.00 | — | $2.0 \times 10^{-6}$ |
| D1(Ir(piq)$_3$) | 5.30 | — | — | — |
| J | 6.00 | 3.00 | — | $3.5 \times 10^4$ |

It is obvious from Table 1 that the organic EL devices of Examples 1 to 7 using the above compound (H2) or (H9) for the emitting layer and the above compounds (H3) to (H8) for the electron-injecting controlling layer have a longer life (room temperature and high temperature condition) than that of Comparative Examples 1 to 7. The lives of the devices of Comparative Examples 1 to 7 were short particularly at high temperature conditions, since they do not satisfy the above relationships (i) to (iii) or do not have the electron mobility of the electron-transporting layer. Some values of the external quantum efficiency in Examples are lower than that of Comparative Examples, but not problematic on the practical level.

Example 8

A glass substrate (made by Geomatic Co.) measuring 25 mm by 75 mm by 0.7 mm-thickness with an ITO transparent electrode was subjected to ultrasonic wave cleaning in isopropyl alcohol for five minutes and then to UV ozone cleaning for thirty minutes. This glass substrate with the transparent electrode line was set on a vapor deposition apparatus, and above compound (HT1) was deposited in a thickness of 50 nm on the surface of a side on which the transparent electrode line was formed so as to cover the transparent electrode. The HT1 layer functions as a hole injecting/transporting layer. As a host of the emitting layer, above compound (H2) was formed in a thickness of 40 nm by resistance heating deposition. At the same time, as a phosphorescent dopant, the above compound (D1) was deposited with a mass ratio to the compound (H2) of 10%. This layer functions as an emitting layer. Next, the above compound (H6) forming an electron-injecting controlling layer was formed in a thickness of 5 nm on the phosphorescent emitting layer. At the same time, as a phosphorescent dopant, the above compound (D1) was deposited with a mass ratio to the compound (H6) of 2%.

Further, the above compound (J) was formed in a thickness of 35 nm. This layer functions as an electron transporting layer. Then, as an electron-injecting electrode (cathode), LIF was formed in a thickness of 1 nm with a film-forming rate of 1 Å/min. A metal aluminum was deposited on the LiF layer as a metal cathode having a thickness of 80 nm to form an organic EL device.

Comparative Example 7

An organic EL device was prepared in the same manner as Example 8 expect for using H2 as the electron-injecting controlling layer and using Alq$_3$ as the electron-transporting layer.

Comparative Example 8

An organic EL device was prepared in the same manner as Example 8 expect for using CBP as the emitting layer, using BCP as the electron-injecting controlling layer and using Bphen as the electron-transporting layer.

Comparative Example 9

An organic EL device was prepared in the same manner as Example 8 expect for using CBP as the emitting layer and using compound (H8) as the electron-injecting controlling layer.

Comparative Example 10

An organic EL device was prepared in the same manner as Example 8 expect for using CBP as the emitting layer and using Bphen as the electron-injecting controlling layer.

Comparative Example 11

An organic EL device was prepared in the same manner as Example 8 expect for using Balq as the emitting layer and using compound (H8) as the electron-injecting controlling layer.

Comparative Example 12

An organic EL device was prepared in the same manner as Example 8 expect for using H3 as the electron-injecting controlling layer and using Alq$_3$ as the electron-transporting layer.

Evaluation of the Organic EL Device

The organic EL devices made in Example 8 and Comparative Examples 7 to 12 was caused to emit light by passing direct current. The luminous chromaticity, the luminous efficiency and the voltage were measured. From these, the external quantum efficiency EQE (%) was obtained. In addition, a continuous current test (room temperature/70° C.) of direct current with an initial luminance of 10000 cd/m$^2$ was conducted to measure the half life of each organic EL device.

The results are shown in Table 3.

TABLE 3

| | Current density | Chromaticity | | Luminous efficiency | E.Q.E. | Life at room temperature | Life at 70° C. |
|---|---|---|---|---|---|---|---|
| | (mA/cm$^2$) | X | Y | (cd/A) | (%) | @10000 cd/m$^2$ | @10000 cd/m$^2$ |
| Example 8 | 1 | 0.682 | 0.318 | 8.26 | 12.2 | 1540H | 202H |
| Com. Ex. 7 | 1 | 0.68 | 0.319 | 7.1 | 9.99 | 1400H | 16H |
| Com. Ex. 8 | 1 | 0.68 | 0.319 | 5.99 | 8.43 | 5H | 2H |
| Com. Ex. 9 | 1 | 0.682 | 0.318 | 6.84 | 9.96 | 115H | 34H |
| Com. Ex. 10 | 1 | 0.681 | 0.319 | 6.64 | 9.35 | 79H | 1H |
| Com. Ex. 11 | 1 | 0.68 | 0.32 | 7.05 | 10.06 | 250H | 50H |
| Com. Ex. 12 | 1 | 0.68 | 0.315 | 6.9 | 9.91 | 1200H | 30H |

It is obvious from Table 3 that the organic EL device of Example 8 having the phosphorescent dopant for the electron-injecting controlling layer has a longer life than those of Comparative Examples 7 to 12 at both room temperature and high temperatures. The lives of the devices of Comparative Examples 7 to 12 were short particularly at high temperature conditions, since they do not satisfy the above relationships (i) to (iii) or do not have the electron mobility of the electron-transporting layer.

INDUSTRIAL APPLICABILITY

The organic EL device of the invention can be used as an organic EL device provided with a phosphorescent emitting layer.

The invention can provide an organic EL device which has a high luminous efficiency and has a prolonged lifetime even when it is driven at high temperatures.

The documents described in the specification are incorporated herein by reference in its entirety.

Of the above-mentioned specific examples, (1-1), (1-5), (1-7), (2-1), (3-1), (4-2), (4-6), (7-2), (7-7), (7-8), (7-9) and (9-7) are preferable, in particular.

The nitrogen-containing heterocyclic derivative of the invention may be a polymer compound containing the nitrogen-containing heterocyclic group or the nitrogen-containing heterocyclic derivative.

In the organic EL device of the invention, it is preferred that one or both of the host material of the emitting layer and the material forming the electron-injecting controlling layer be one or more compound selected from the group consisting of fused polycyclic aromatic compounds represented by the following formulas (A), (B) and (C),

Ra-Ar$^{101}$-Rb  (A)

Ra-Ar$^{101}$—Ar$^{102}$-Rb  (B)

Ra-Ar$^{101}$—Ar$^{102}$—Ar$^{103}$-Rb  (C)

The invention claimed is:

1. An organic electroluminescent device comprising an emitting layer, an electron-injecting controlling layer and an electron-transporting layer between an anode and a cathode in sequential order from the anode, bonding one to another,
    the emitting layer comprising a host material and a dopant,
    the ionization potential (Ips) of a main material forming the electron-injecting controlling layer and the ionization potential (Iph) of the host material of the emitting layer satisfying the following relationship (i),
    an electron mobility of an electron-transporting material forming the electron-transporting layer being 10$^{-5}$ cm$^2$/Vs or more at the electric field intensity of 16,000 to 25,000 (V/cm), and
    an affinity (Af1) of the host material of the emitting layer, an affinity (Af2) of the main material forming the electron-injecting controlling layer, and an affinity (Af3) of the electron-transporting material forming the electron-transporting layer satisfying the following relationships (ii) and (iii)

$$0.5 \text{ eV} > \text{Ip}s - \text{Ip}h > 0 \text{ eV} \quad (i)$$

$$\text{Af2} - \text{Af1} > 0 \text{ eV} \quad (ii)$$

$$\text{Af3} - \text{Af2} > 0.2 \text{ eV} \quad (iii).$$

2. The organic electroluminescent device according to claim 1, wherein the affinity (Af1) of the host material of the emitting layer, the affinity (Af2) of the main material forming the electron-injecting controlling layer, and the affinity (Af3) of the electron-transporting material forming the electron-transporting layer satisfy the following relationship (iv)

$$\text{Af1} < \text{Af2} < 2.75 \text{ eV} < \text{Af3} \quad (iv).$$

3. The organic electroluminescent device according to claim 1, wherein the lowest excited triplet energy (EgT(S)) of the main material forming the electron-injecting controlling layer and the lowest excited triplet energy (EgT(H)) of the host material of the emitting layer satisfy the following relationship (v)

$$0.5 \text{ eV} > \text{Eg}T(S) - \text{Eg}T(H) \geq 0 \text{ eV} \quad (v).$$

4. The organic electroluminescent device according to claim 1, wherein the ionization potential (Iph) of the host material of the emitting layer and the ionization potential (Ipd) of the dopant of the emitting layer satisfy the following relation ship (vi)

$$\text{Ip}h-\text{Ip}d>0.5 \text{ eV} \tag{vi}$$

5. The organic electroluminescent device according to claim 1, wherein the dopant of the emitting layer is a phosphorescent material.

6. The organic electroluminescent device according to claim 5, wherein the electron-injecting controlling layer comprises a phosphorescent dopant same as or different from the dopant of the emitting layer, and concentrations of the phosphorescent dopant in the emitting layer and the electron-injecting controlling layer satisfy the following relationship (vii)

$$\text{Concentration of dopant: emitting layer>electron-injecting controlling layer} \tag{vii}$$

7. The organic electroluminescent device according to claim 5, wherein the phosphorescent dopant comprises a metal complex composed of a metal selected from the group consisting of Ir, Pt, Os, Au, Cu, Re and Ru, and a ligand.

8. The organic electroluminescent device according to claim 6, wherein the phosphorescent dopant comprises a metal complex composed of a metal selected from the group consisting of Ir, Pt, Os, Au, Cu, Re and Ru, and a ligand.

9. The organic electroluminescent device according to claim 1, which comprises a hole-injecting/transporting layer adjacent to the emitting layer between the anode and the emitting layer.

10. The organic electroluminescent device according to claim 1, wherein the electron-transporting material forming the electron-transporting layer is a nitrogen-containing heterocyclic derivative other than a metal complex.

11. The organic electroluminescent device according to claim 1, wherein one or both of the host material of the emitting layer and the main material forming the electron-injecting controlling layer is one or more compound selected from the group consisting of fused polycyclic aromatic compounds represented by the following formulas (A), (B) and (C),

Ra-Ar¹⁰¹-Rb (A)

Ra-Ar¹⁰¹—Ar¹⁰²-Rb (B)

Ra-Ar¹⁰¹—Ar¹⁰²—Ar¹⁰³-Rb (C)

wherein Ar¹⁰¹, Ar¹⁰², Ar¹⁰³, Ra and Rb are independently a substituted or unsubstituted benzene ring, or a fused polycyclic aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring and a substituted or unsubstituted picene ring; provided that Ar¹⁰¹, Ar¹⁰², Ar¹⁰³, Ra and Rb are not a substituted or unsubstituted benzene ring at the same time.

12. The organic electroluminescent device according to claim 11, wherein one or both of the Ra and Rb is a group selected from a substituted or unsubstituted phenanthrene ring, a substituted or unsubstituted benzo[c]phenanthrene ring and a substituted or unsubstituted fluoranthene ring.

13. The organic electroluminescent device according to claim 1, wherein one or both of the host material of the emitting layer and the main material forming the electron-injecting controlling layer is a fused polycyclic aromatic compound, and the fused polycyclic aromatic skeleton part is contained in the chemical structure as a group of divalent or more valences.

14. The organic electroluminescent device according to claim 1, wherein one or both of the host material of the emitting layer and the main material forming the electron-injecting controlling layer is a fused polycyclic aromatic compound, the fused polycyclic aromatic skeleton part has a substituent, and the substituent is a substituted or unsubstituted aryl group or a substituted or unsubstituted heteroaryl group.

15. The organic electroluminescent device according to claim 14, wherein the substituent of the fused polycyclic aromatic compound dose not contain a carbazole skeleton.

16. The organic electroluminescent device according to claim 1, wherein one or both of the host material of the emitting layer and the main material forming the electron-injecting controlling layer is represented by the following formulas (5) or (6),

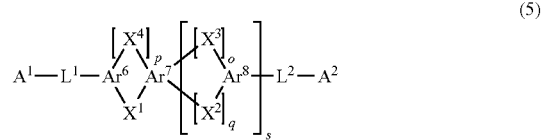

(5)

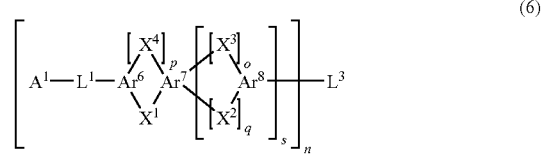

(6)

wherein in the formulas (5) and (6), Ar⁶, Ar⁷ and Ar⁸ are independently a substituted or unsubstituted aromatic hydrocarbon group having 6 to 24 carbon atoms that form a ring (6 to 24 ring carbon atoms) or a substituted or unsubstituted aromatic heterocyclic group having 3 to 24 ring atoms that form a ring, provided that Ar⁶, Ar⁷ and Ar⁸ may have one or plural substituent Y, plural Ys may be the same or different, and Y is an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms and bonding to Ar⁶, Ar⁷ and Ar⁸ via a carbon-carbon bond;

in the formulas (5) and (6), X¹, X², X³ and X⁴ are independently O, S, N—R¹ or CR²R³, o, p and q is 0 or 1, s is 1, 2 or 3, where R¹, R² and R³ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms;

in the formulas (5) and (6), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms and bonding to $Ar^6$ via a carbon-carbon bond;

in the formula (5), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms and bonding to $Ar^8$ via a carbon-carbon bond;

in the formula (6), n is 2, 3 or 4, and in each case a dimer, a trimer or a tetramer is formed via $L^3$ as a linking group;

in the formula (6), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms and bonding to $Ar^8$ via a carbon-carbon bond, when n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms or a substituted or unsubstituted trivalent aromatic heterocyclic group having 3 to 24 ring atoms and bonding to $Ar^8$ via a carbon-carbon bond, and when n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms or a substituted or unsubstituted tetravalent aromatic heterocyclic group having 3 to 24 ring atoms and bonding to $Ar^8$ via a carbon-carbon bond;

in the formulas (5) and (6), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms and bonding to $L^1$ via a carbon-carbon bond;

in the formula (5), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms, or a substituted or unsubstituted aromatic heterocyclic group having 3 to 24 ring atoms and bonding to $L^2$ via a carbon-carbon bond.

* * * * *